(12) United States Patent
Haridas et al.

(10) Patent No.: US 11,834,327 B2
(45) Date of Patent: Dec. 5, 2023

(54) MEMS BRIDGE DEVICES AND METHODS OF MANUFACTURE THEREOF

(71) Applicant: SOFANT TECHNOLOGIES LTD., Edinburgh (GB)

(72) Inventors: Nakul Haridas, Edinburgh (GB); Victor Steel, Driggs, ID (US)

(73) Assignee: SOFANT TECHNOLOGIES LTD, Edinburgh (GB)

( * ) Notice: Subject to any disclaimer, the term of this patent is extended or adjusted under 35 U.S.C. 154(b) by 704 days.

(21) Appl. No.: 16/585,242

(22) Filed: Sep. 27, 2019

(65) Prior Publication Data
US 2020/0102213 A1   Apr. 2, 2020

(30) Foreign Application Priority Data

Sep. 27, 2018   (GB) ...................................... 1815797

(51) Int. Cl.
| | | |
|---|---|---|
| *B81B 7/00* | (2006.01) | |
| *H01H 59/00* | (2006.01) | |
| *H01Q 1/50* | (2006.01) | |
| *H01P 1/18* | (2006.01) | |
| *H01P 3/08* | (2006.01) | |
| *H01P 11/00* | (2006.01) | |

(52) U.S. Cl.
CPC ....... *B81B 7/0006* (2013.01); *H01H 59/0009* (2013.01); *H01P 1/18* (2013.01);
(Continued)

(58) Field of Classification Search
CPC ............ B81B 7/0006; B81B 2201/014; B81B 2201/016; B81B 2201/018;
(Continued)

(56) References Cited

U.S. PATENT DOCUMENTS

| | | | |
|---|---|---|---|
| 4,566,192 A | | 1/1986 | Hankins et al. |
| 5,578,976 A | * | 11/1996 | Yao ..................... H01H 59/0009 |
| | | | 333/262 |

(Continued)

FOREIGN PATENT DOCUMENTS

| | | |
|---|---|---|
| CN | 107293449 A | 10/2017 |
| CN | 107293449 A | 10/2017 |

(Continued)

OTHER PUBLICATIONS

Tejinder Singh, "Computation of Beam Stress and RF Performance of a Thin Film Based Q-Band Optimized RF MEMS Switch", Transactions on Electrical and Electronic Materials; vol. 16, No. 4, pp. 173-178, Aug. 25, 2015 (7 pgs.).

(Continued)

*Primary Examiner* — Bernard Rojas
(74) *Attorney, Agent, or Firm* — Nixon & Vanderhye P.C.

(57) ABSTRACT

A microelectromechanical systems (MEMS) device comprising: a substrate; a signal conductor supported on the substrate; ground conductors supported on the substrate on either side of the signal conductor; and a MEMS bridge at least one end of which is mechanically connected to the substrate by way of at least one anchor, the MEMS bridge comprising an electrically conductive switching portion, the electrically conductive switching portion comprising a switching signal conductor region and a switching ground conductor region, the switching signal conductor region being provided over the signal conductor and the switching ground conductor region being provided over a said ground conductor, the electrically conductive switching region being movable relative to the said signal and ground conductors respectively to thereby change the inductances between the switching signal conductor region and the signal conductor and between the switching ground conductor region and the respective ground conductor, wherein (Continued)

there is no continuous electrically conductive path extending from the switching conductor region to the at least one anchor. Capacative and ohmic switches, a varactor, a phase shifter, a tuneable power splitter/combiner, tuneable attenuator, SPDT switch and antenna apparatus comprising said devices.

32 Claims, 49 Drawing Sheets

(52) U.S. Cl.
CPC ............... *H01P 3/08* (2013.01); *H01P 11/00* (2013.01); *H01Q 1/50* (2013.01); *B81B 2201/014* (2013.01); *B81B 2201/016* (2013.01); *B81B 2201/018* (2013.01); *B81B 2203/0109* (2013.01); *B81B 2203/019* (2013.01); *B81B 2203/0181* (2013.01); *B81B 2203/0307* (2013.01); *H01H 2239/006* (2013.01); *H01H 2239/018* (2013.01)

(58) Field of Classification Search
CPC ....... H01H 59/0009; H01P 1/18; H01P 11/00; H01P 3/08; H01Q 1/50
USPC ............................................ 335/78; 200/181
See application file for complete search history.

(56) References Cited

U.S. PATENT DOCUMENTS

| | | | | |
|---|---|---|---|---|
| 5,880,921 A | * | 3/1999 | Tham | H01G 5/16 333/262 |
| 6,307,452 B1 | * | 10/2001 | Sun | H01P 1/127 333/262 |
| 6,426,687 B1 | * | 7/2002 | Osborn | H01P 1/127 333/262 |
| 6,621,387 B1 | * | 9/2003 | Hopcroft | H01G 5/16 333/101 |
| 6,713,695 B2 | * | 3/2004 | Kawai | H01G 5/40 333/262 |
| 6,812,814 B2 | * | 11/2004 | Ma | H01H 59/0009 333/262 |
| 7,583,169 B1 | * | 9/2009 | Scardelletti | H01P 1/127 333/262 |
| 2007/0158775 A1 | | 7/2007 | Cunningham et al. | |
| 2008/0007888 A1 | | 1/2008 | Morris et al. | |
| 2009/0160584 A1 | | 6/2009 | Premerlani et al. | |
| 2010/0181866 A1 | | 7/2010 | DeReus | |
| 2011/0176252 A1 | | 7/2011 | DeReus | |
| 2018/0261415 A1 | * | 9/2018 | Koul | H01P 1/2005 |

FOREIGN PATENT DOCUMENTS

| | | |
|---|---|---|
| EP | 1429413 A1 | 6/2004 |
| EP | 1 461 828 B1 | 1/2008 |
| EP | 2 493 014 A2 | 8/2012 |
| EP | 2 845 216 B1 | 11/2016 |
| EP | 3 373 387 A2 | 9/2018 |
| WO | 03/043095 A2 | 5/2003 |

OTHER PUBLICATIONS

Examination Report under Section 18(3) issued for GB Application No. 1913986.4 dated Mar. 15, 2023, 4 pages.

* cited by examiner

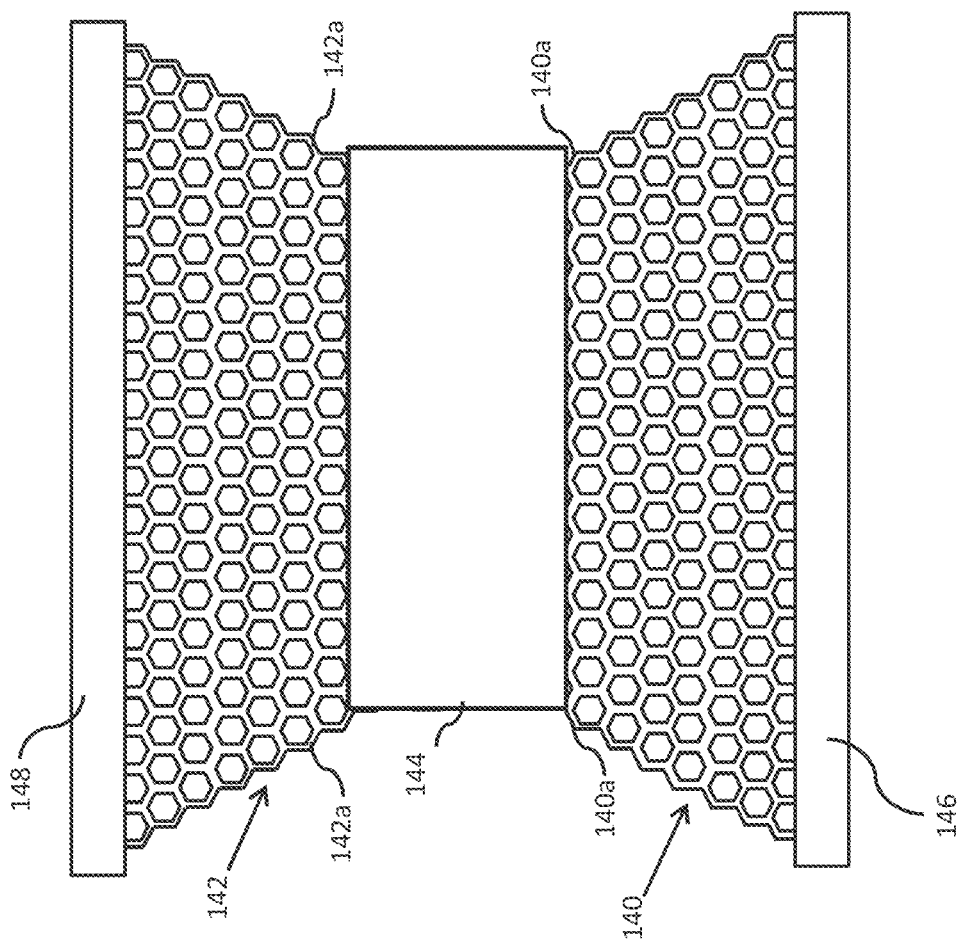

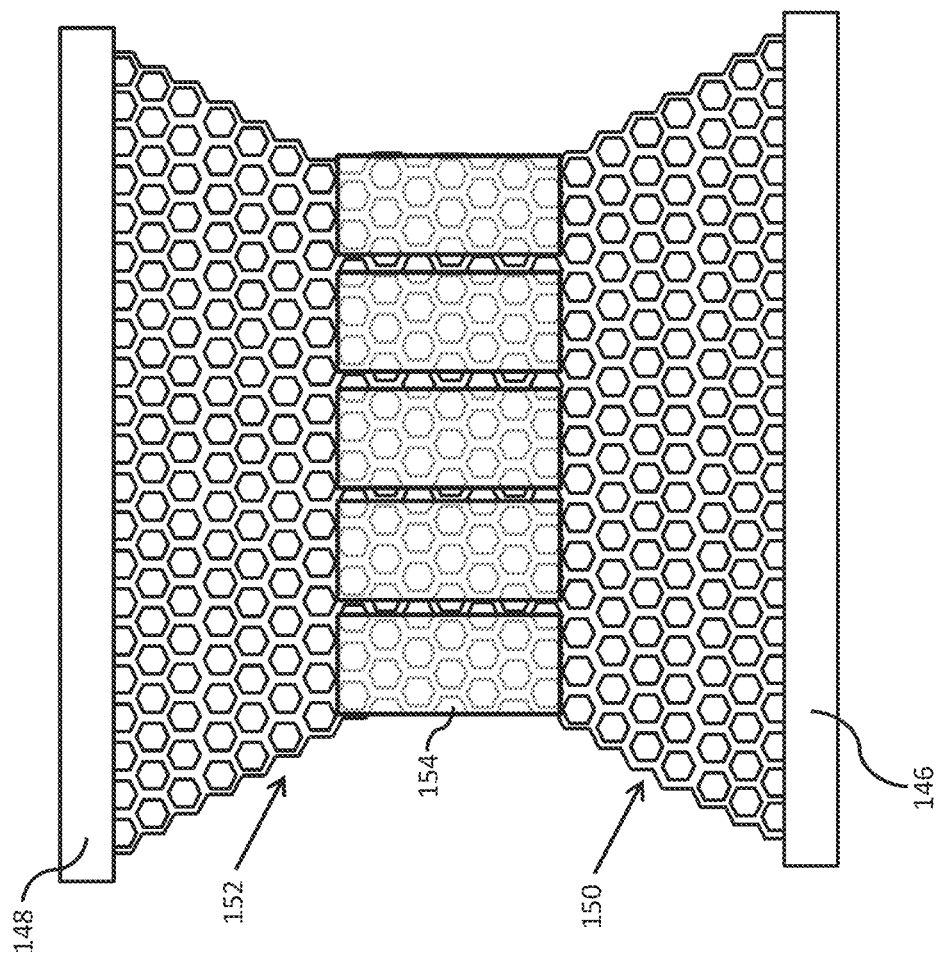

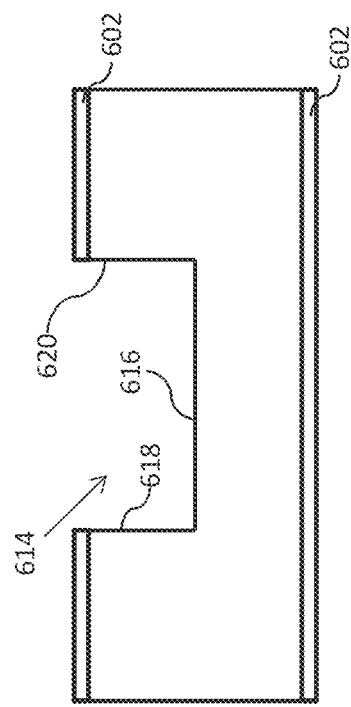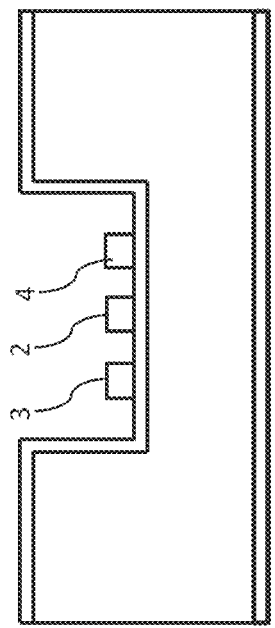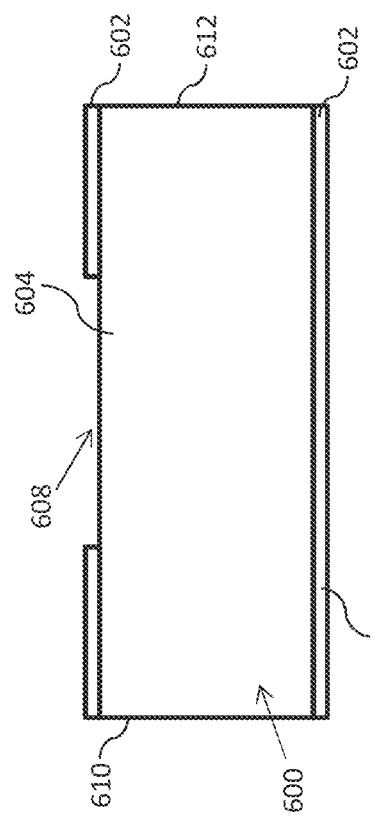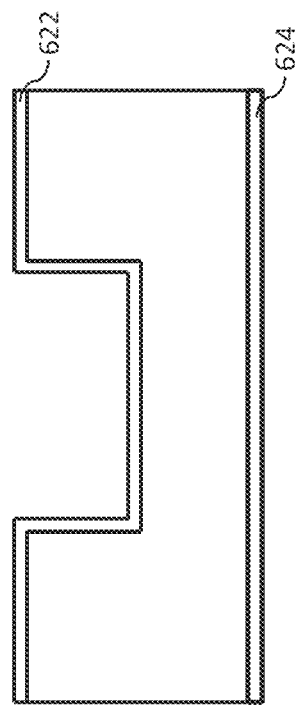

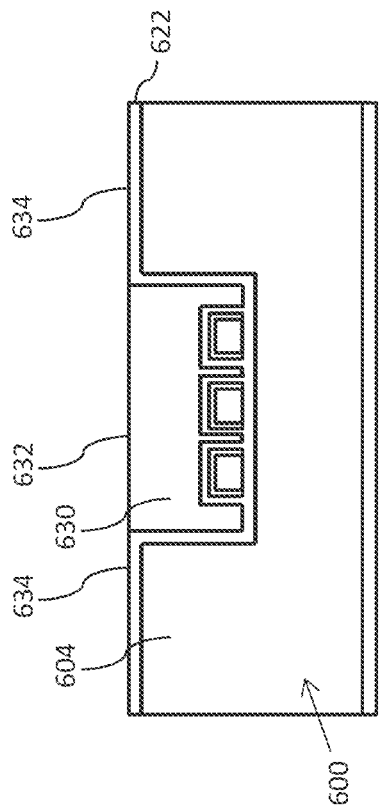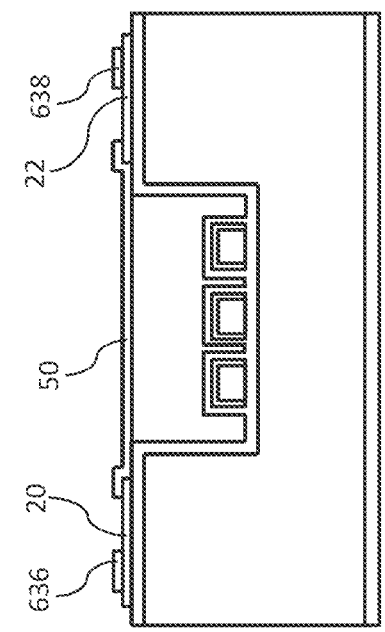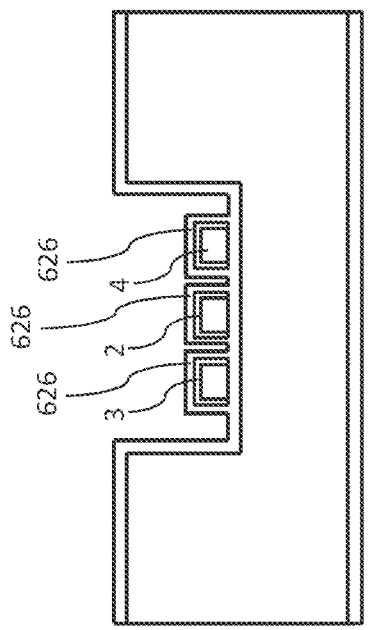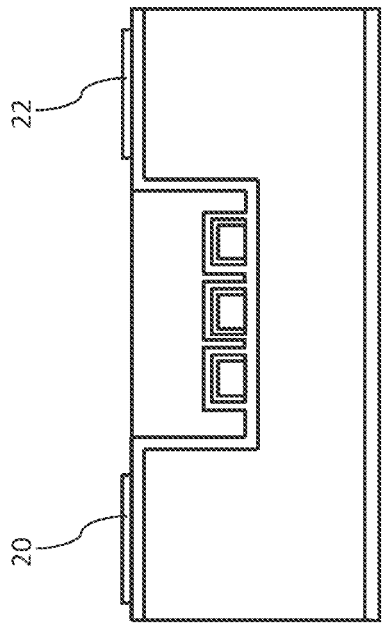

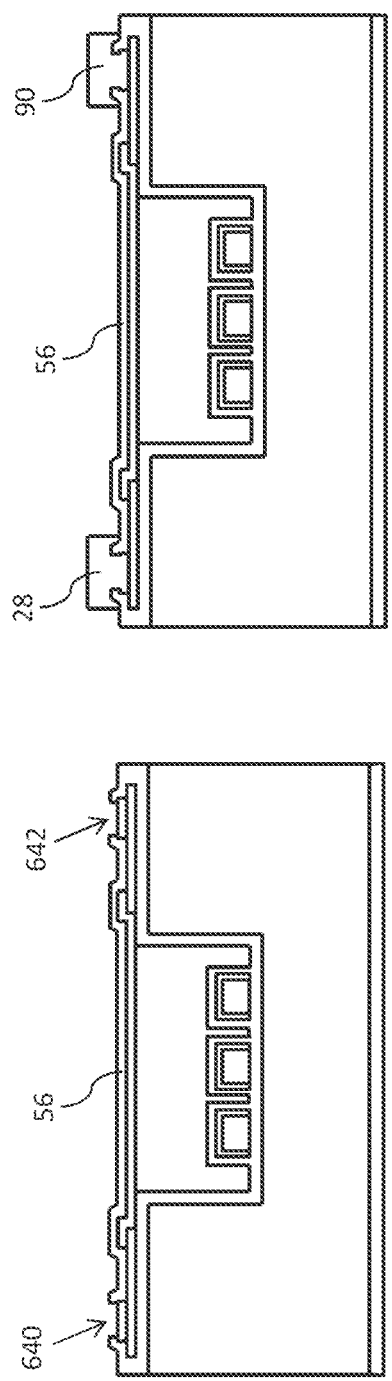

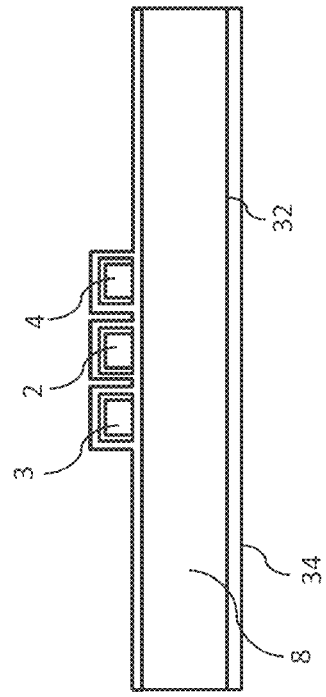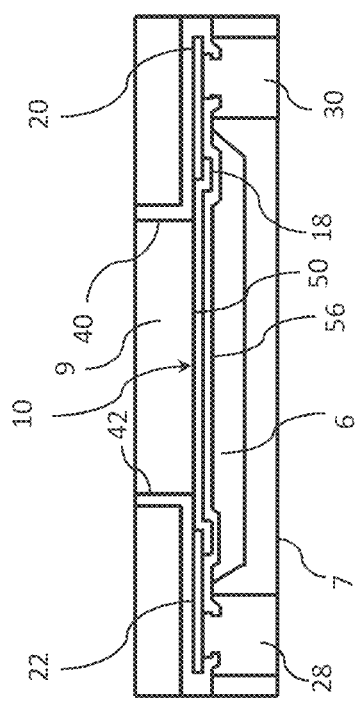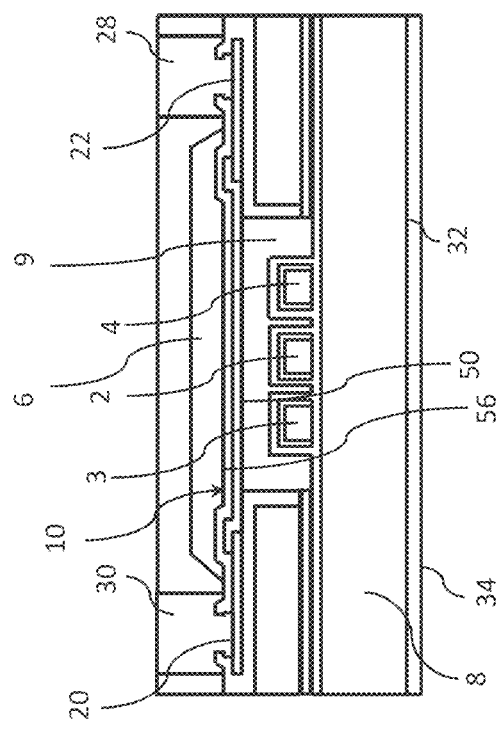

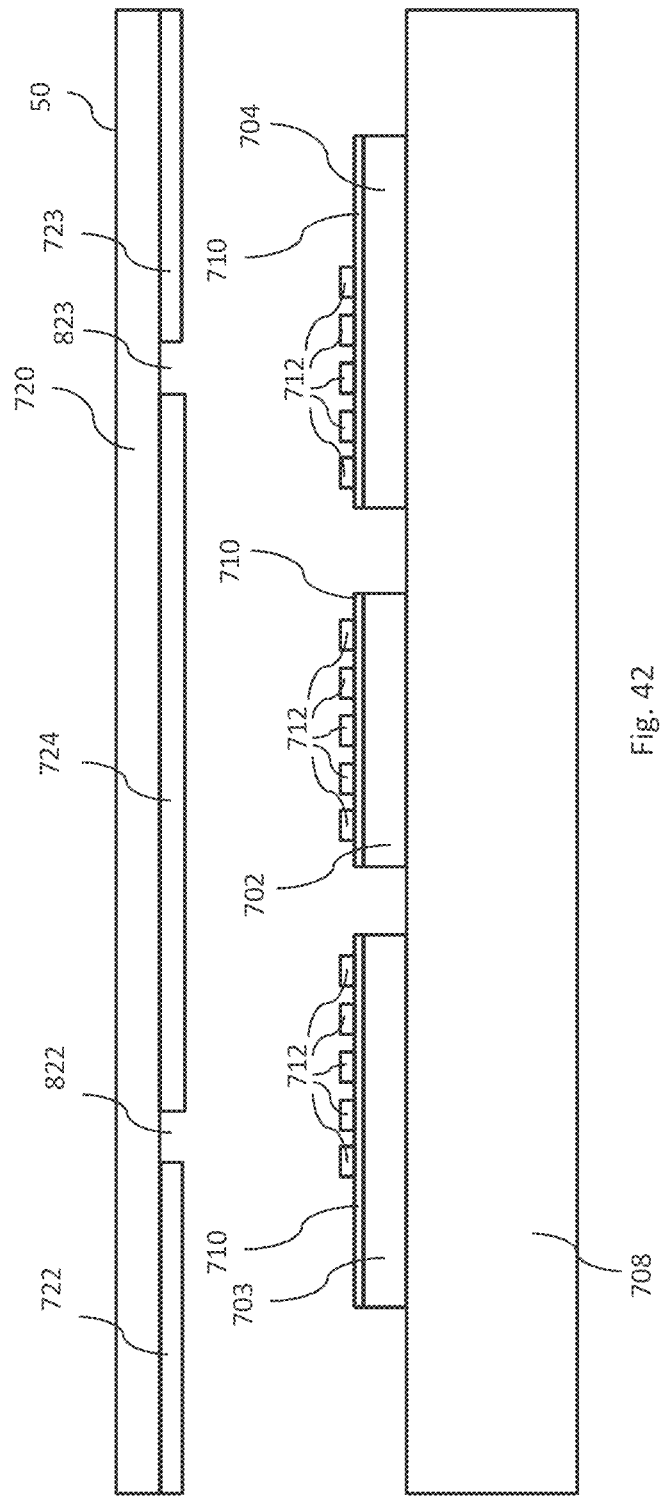

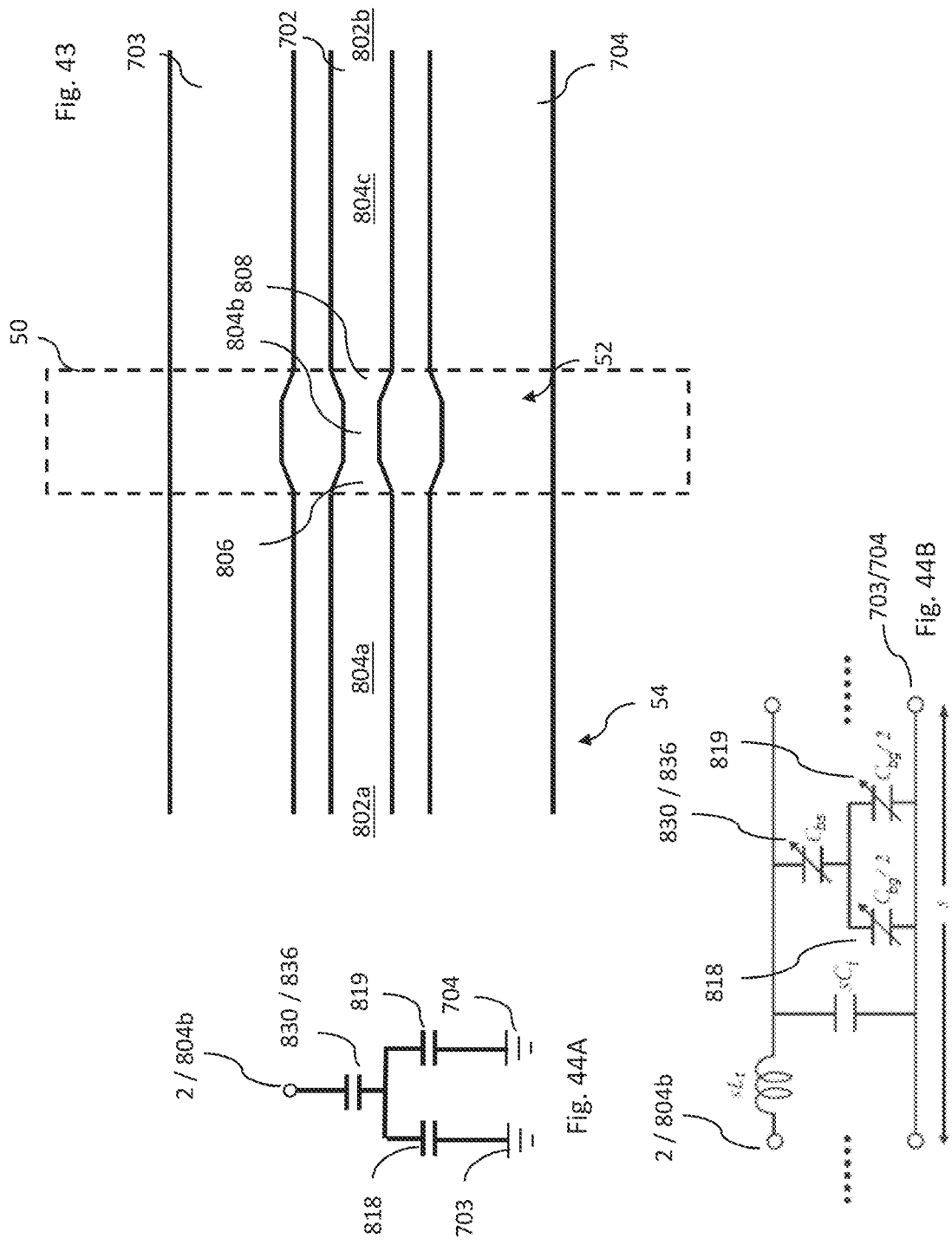

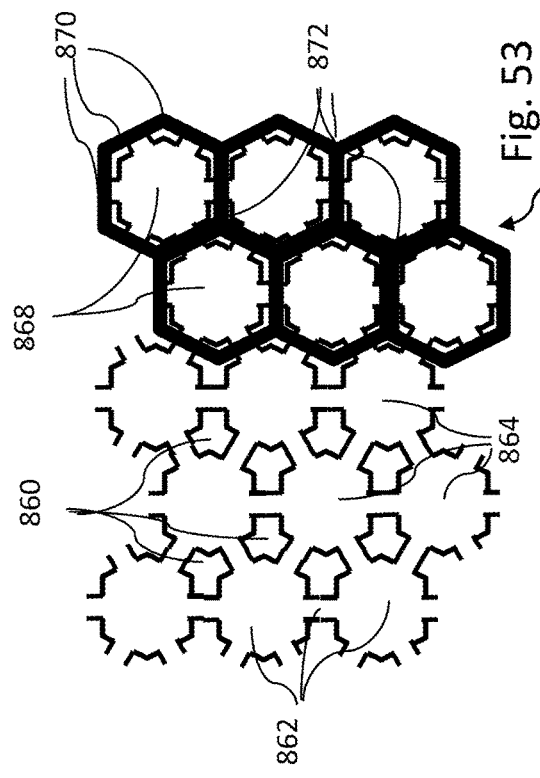
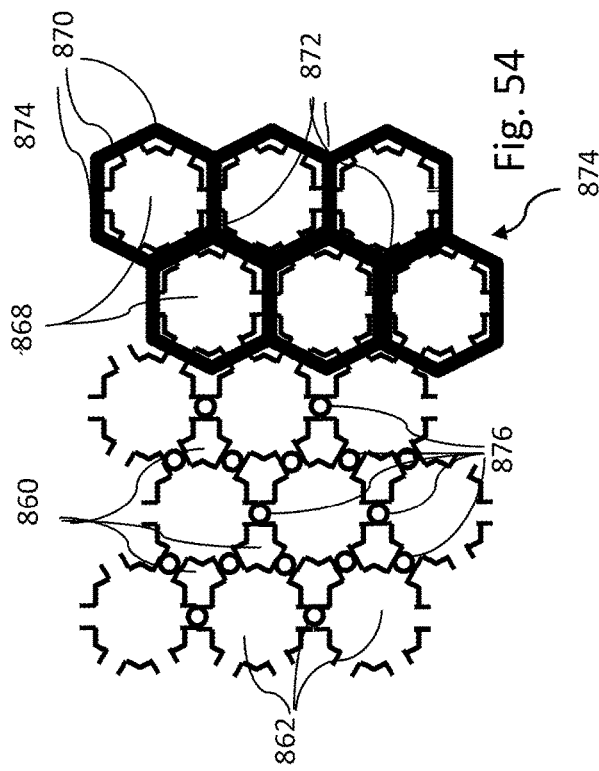
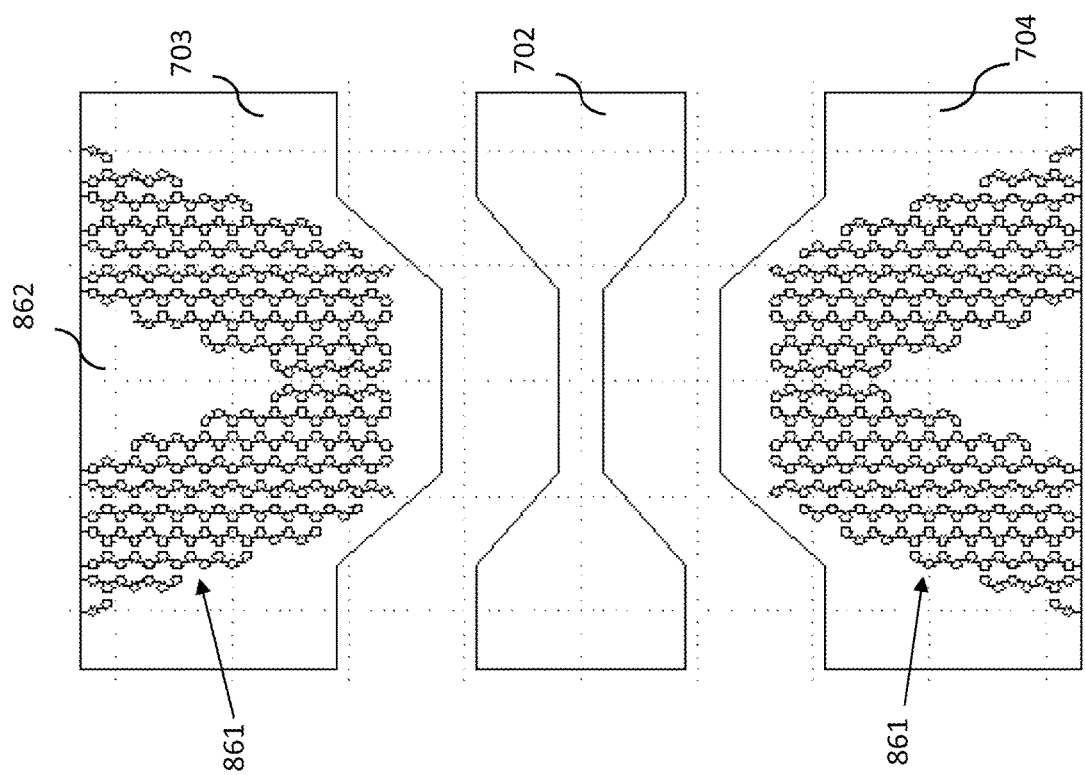

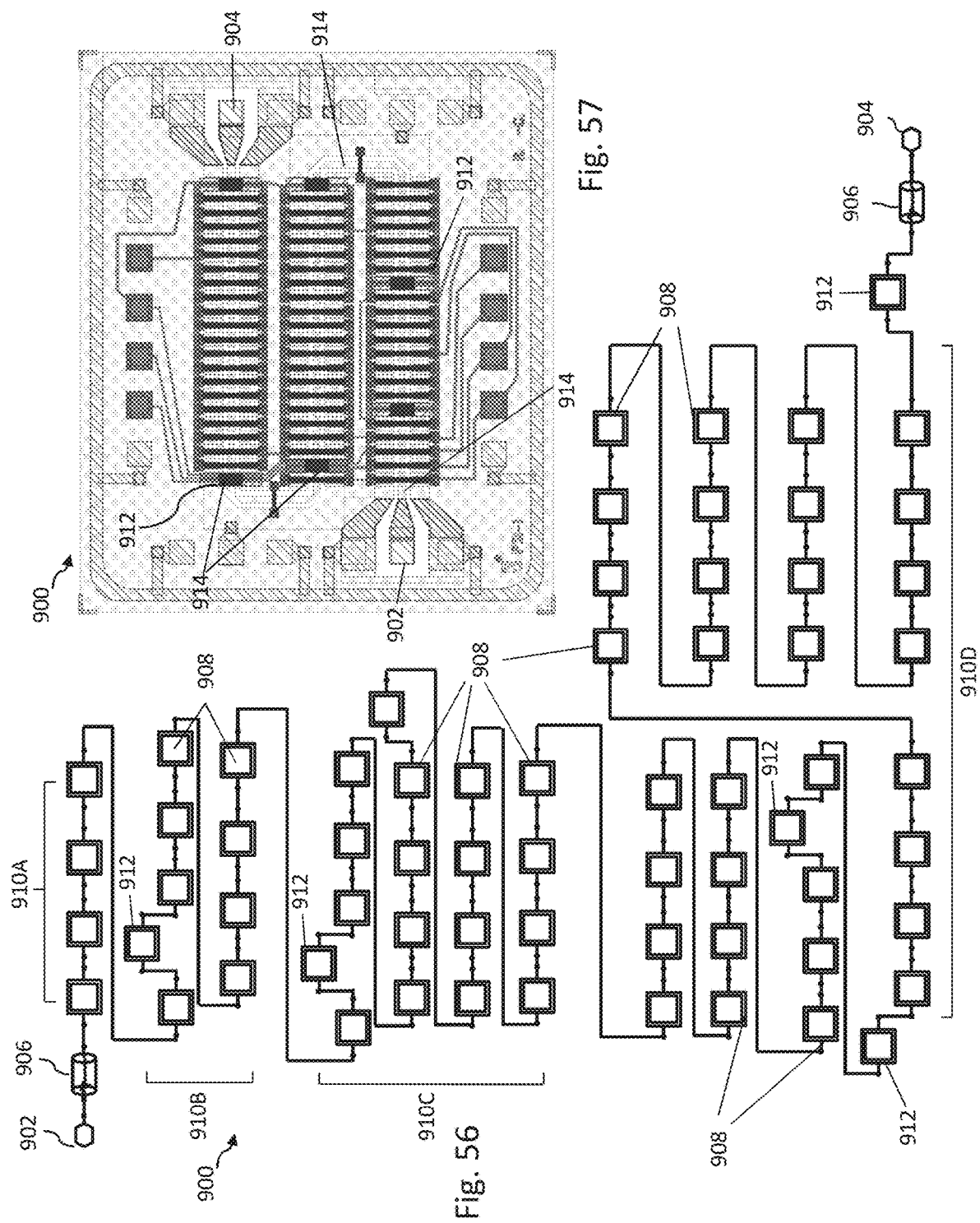

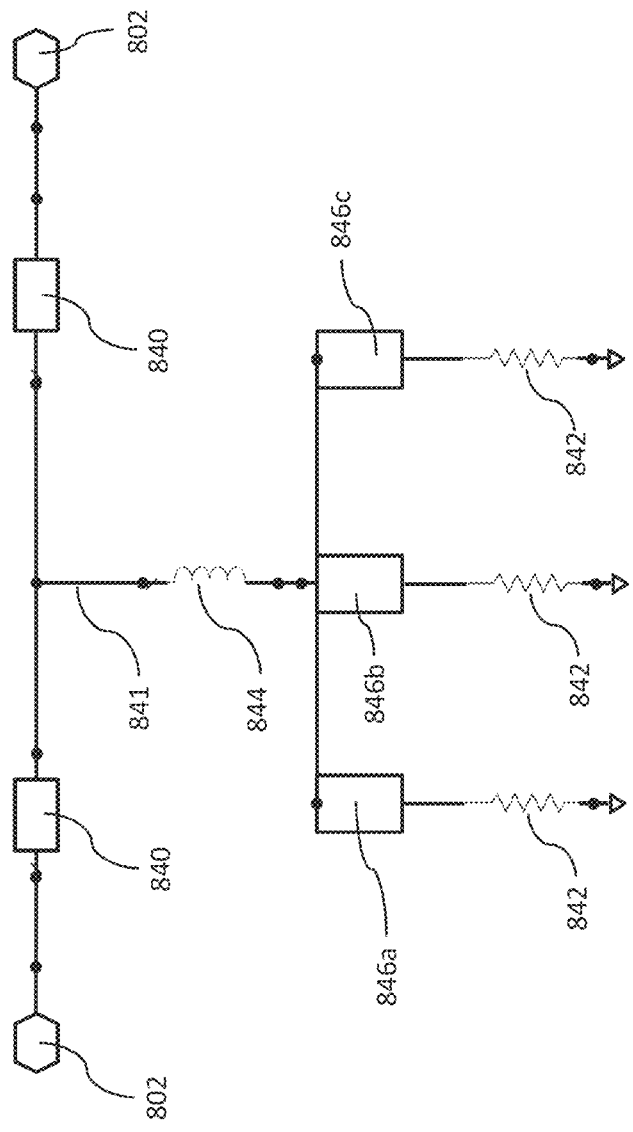

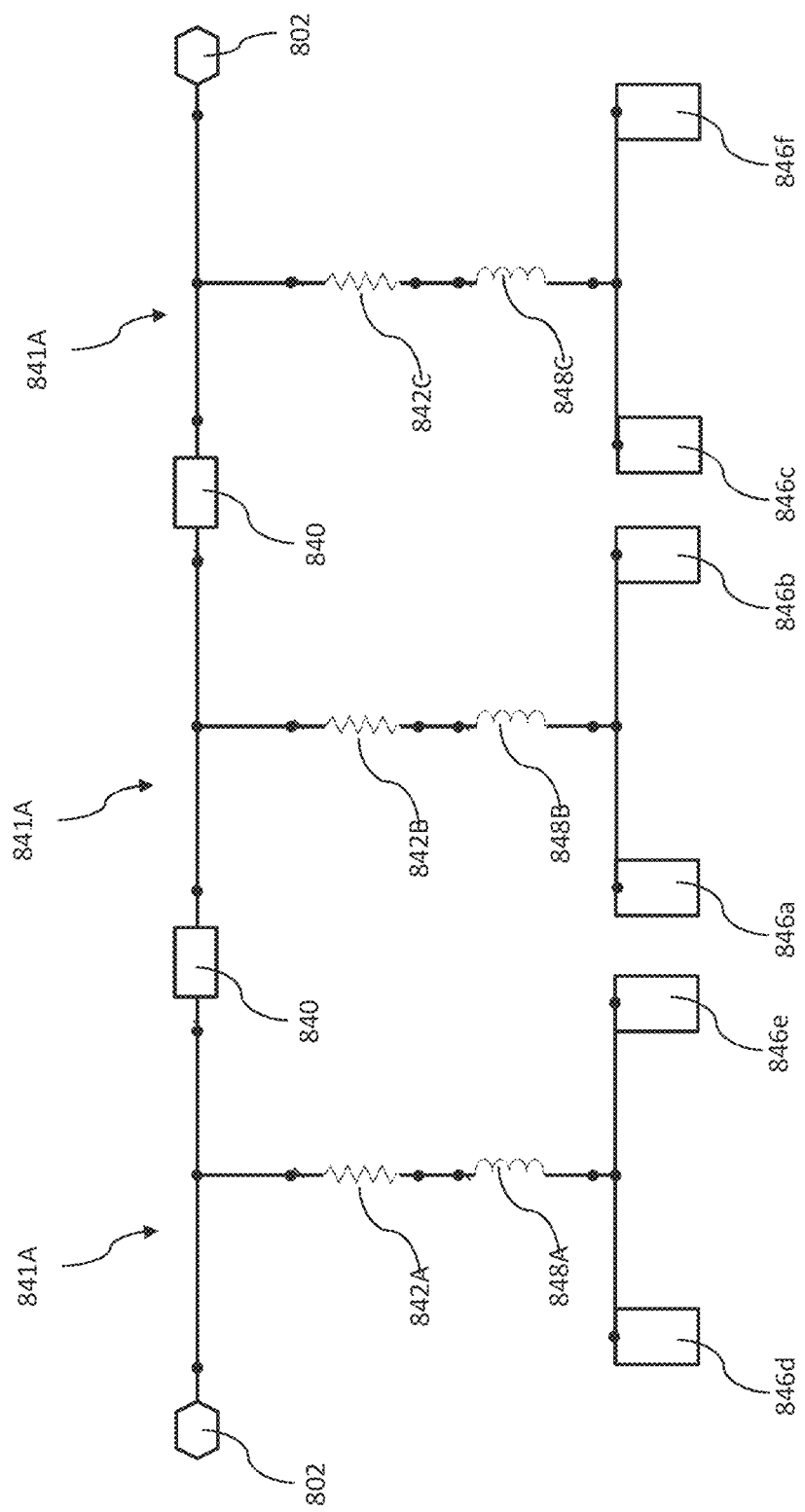

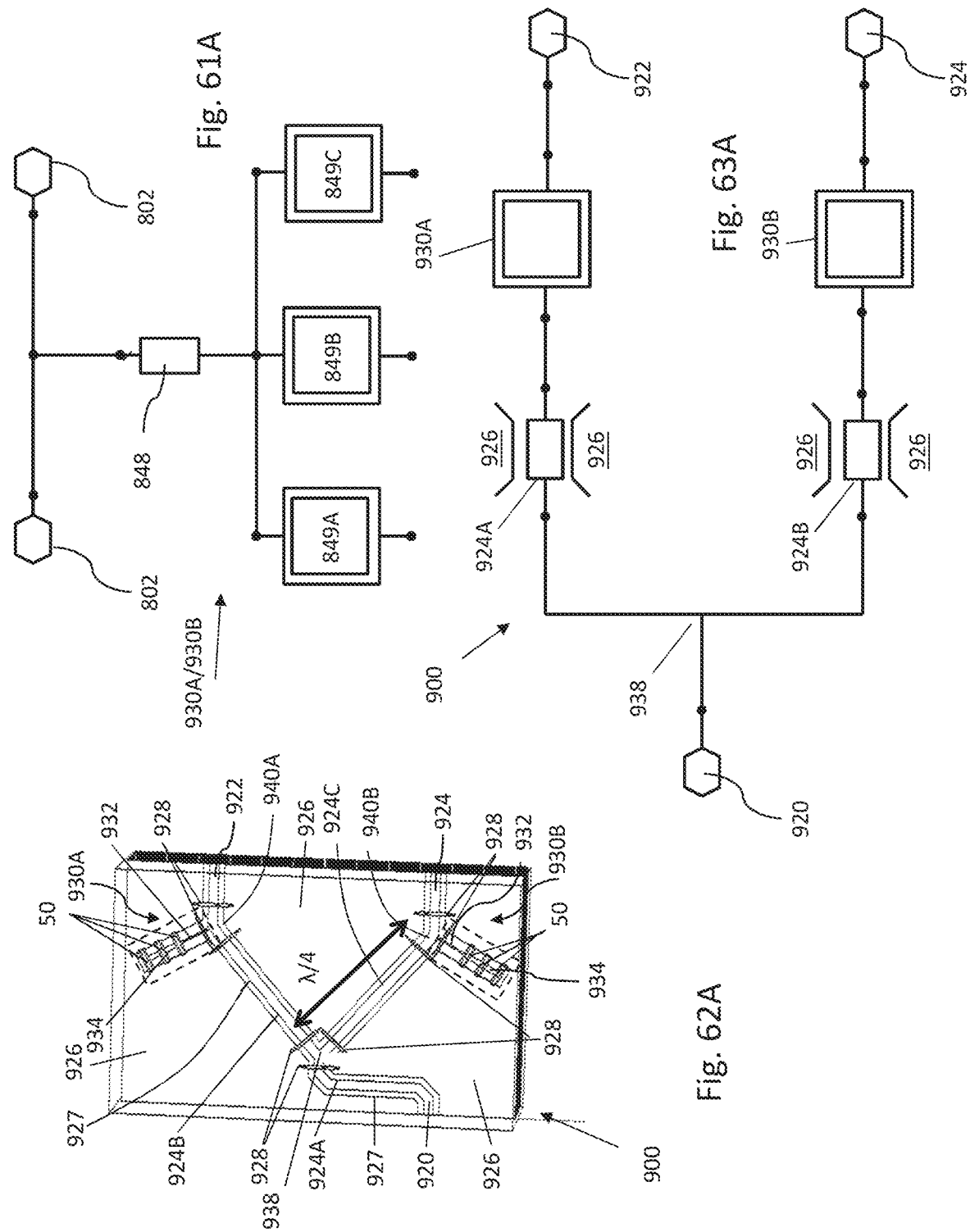

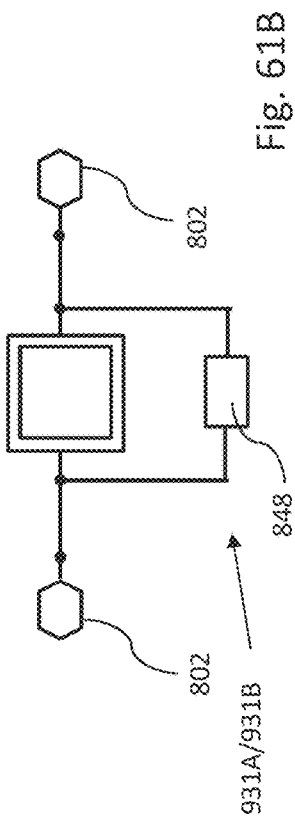
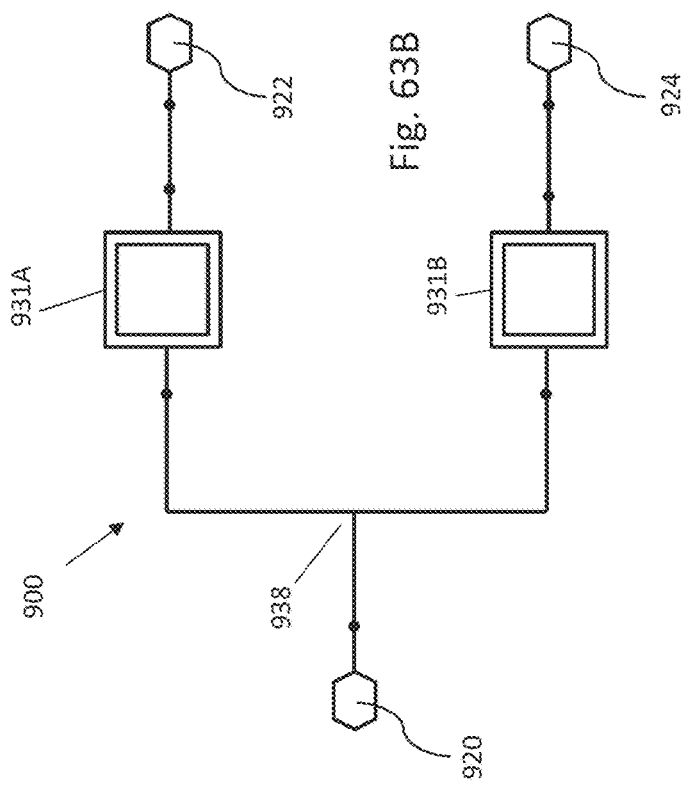
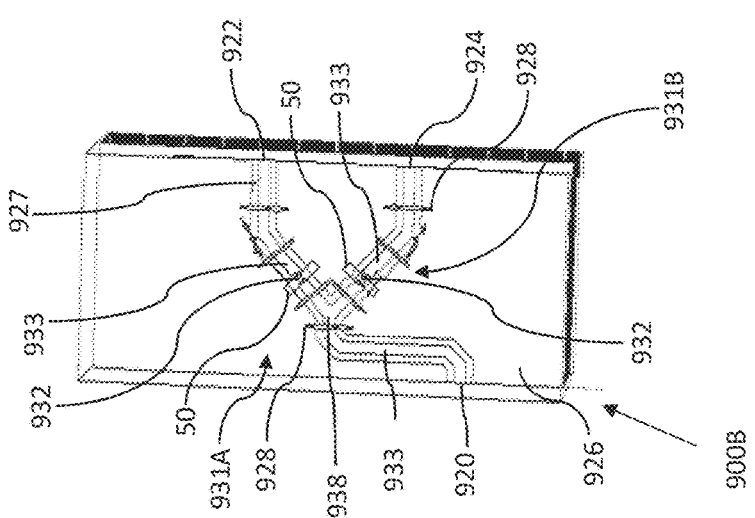

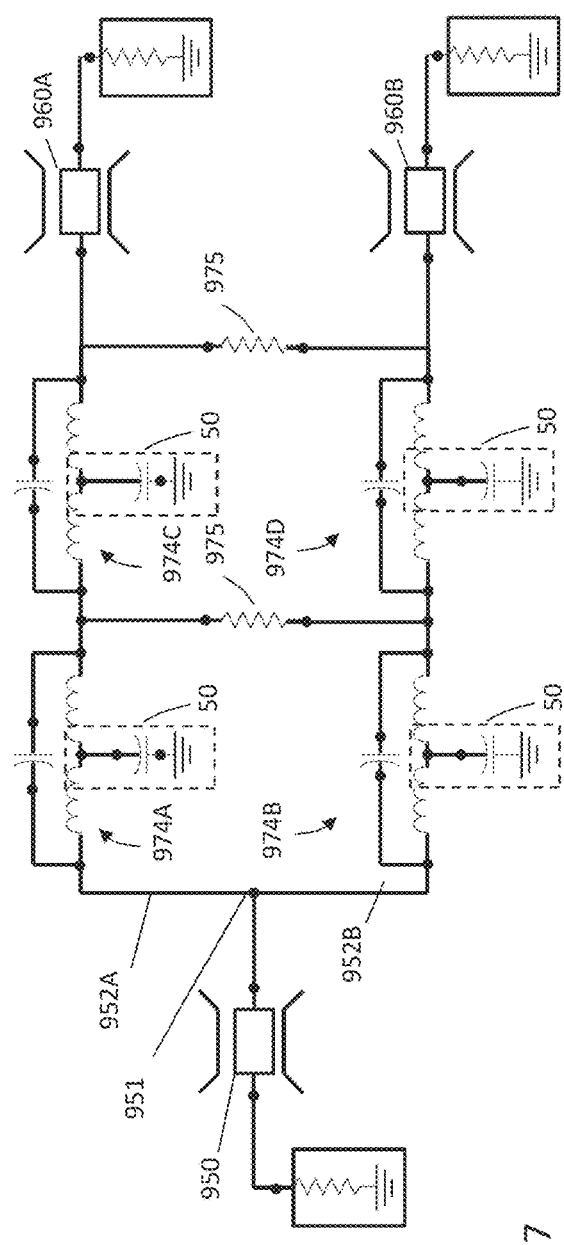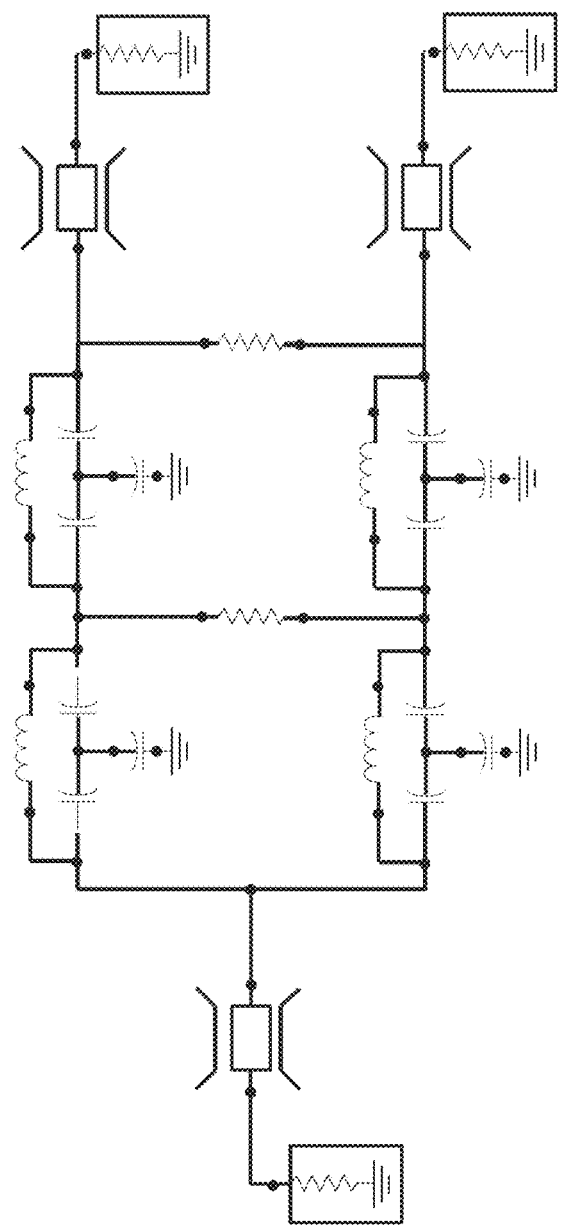
Fig. 67
Fig. 68

MEMS BRIDGE DEVICES AND METHODS OF MANUFACTURE THEREOF

This application claims priority to EP Patent Application No. 1815797.4 filed Sep. 27, 2018, the entire contents of which are hereby incorporated by reference.

FIELD OF THE INVENTION

The invention relates to microelectromechanical systems (MEMS) devices comprising a MEMS bridge, such as MEMS switches, including ohmic and capacitive switches, a varactor, a phase shifter, a tuneable power splitter/combiner, a variable (stepped) attenuator, SPDT switch and antenna apparatus comprising said devices, along with methods of changing a state of a MEMS switch; and methods of manufacturing a MEMS device in a hermetic environment.

BACKGROUND TO THE INVENTION

Radio frequency (RF) microelectromechanical systems (MEMS) switches typically comprise a signal conductor supported by a substrate and a bridge extending over the signal conductor, the bridge being movable between an up state and a down state to change one or more electrical properties, usually impedances, of the switch (i.e. MEMS switches are not typically switches in the sense of having an "on" state which completes a circuit and an "off" state which breaks a circuit, but rather have two or more states with different electrical properties). For example, an ohmic switch provides the switch with a significantly lower resistance when the bridge is in the down state than when it is in the up state. Alternatively, a capacitive MEMS switch (or a switched capacitor) provides the switch with a significantly greater capacitance when the bridge is in the down state than when it is in the up state.

A problem with existing MEMS switches is that the difference between the said electrical parameter values in the up and down states is insufficient and/or there are significant parasitic capacitances and inductances from the bridge members and surrounding structures. Some embodiments of the invention seek to address these problems.

Other uses for MEMS switches include MEMS varactors (i.e. voltage-controlled variable capacitors), MEMS phase switchers, waveguides and antenna apparatuses. A MEMS varactor would provide two or more states having two or more capacitances. A MEMS phase shifter would provide a phase shift of a (typically RF) signal.

Some embodiments of the invention address the problem of MEMS bridges becoming damaged by the stresses and strains which they bear as they move between their up and down states.

Some embodiments of the invention provide tuneable power divider circuits employing MEMS bridges.

SUMMARY OF THE INVENTION

Within this specification and the appended claims, by a MEMS switch we refer to a MEMS device which is switchable between at least a first state and a second state thereby changing at least one impedance (typically capacitance and/or resistance). In some embodiments, the MEMS device is a capacitive MEMS switch. In some embodiments, the MEMS device is an ohmic MEMS switch. In the present invention, the MEMS switch comprises a signal line support on a substrate and a MEMS bridge, which is moveable relative to the signal line between the first and second states, thereby changing at least one capacitance and/or resistance.

A first aspect of the invention provides a (typically radio frequency (RF)) microelectromechanical systems (MEMS) device comprising: a substrate; a signal conductor supported on (and typically mechanically coupled to) the substrate; ground conductors supported on the substrate on either side of the signal conductor (typically to form a co-planar waveguide on the substrate for guiding signals along the signal conductor); and a MEMS bridge at least one end of which is mechanically connected to the substrate by way of at least one anchor, the MEMS bridge comprising an electrically conductive switching portion, the electrically conductive switching portion comprising a switching signal conductor region and a switching ground conductor region, the switching signal conductor region being provided over the signal conductor and the switching ground conductor region being provided over a said ground conductor, the electrically conductive switching region being movable, relative to the substrate, between first and second positions, to thereby change the impedance (e.g. capacitances) between the switching signal conductor region and the signal conductor and between the switching ground conductor region and the respective ground conductor, wherein there is no continuous electrically conductive path extending (e.g. through the MEMS bridge) from the switching signal conductor region to the at least one anchor.

In many embodiments the impedances which change are capacitances. Thus, the MEMS device is typically a MEMS switch, which may be a capacitive switch, for example. The MEMS device may be a shunt capacitive switch. The MEMS device may be a phase shifter (wherein the change in impedance (in particular capacitance) between up and down states leads to a change in the phase of a signal in the signal conductor). However, in some embodiments the MEMS device is an ohmic switch and the impedance which change are resistances.

By providing the MEMS bridge with switching ground conductor regions on either side of the switching signal conductor region, whereby signal paths are provided to ground from the signal line through the capacitor formed between the signal line and the switching signal conductor region and through the parallel capacitors formed between the switching ground conductor regions and the ground conductors.

Accordingly, the signal path to ground in more typical capacitive MEMS switches which extends from the signal line through the capacitor formed between the signal line and a switching conductor on the bridge, along the MEMS bridge (which in typical designs is conductive along its length) to the anchor (which would typically be connected to the ground conductors) is not required (and is indeed omitted by virtue of their being no continuous electrically conductive path extending from the switching conductor to the anchor). Furthermore, the signal path through the capacitors formed between the switching ground conductor region and the ground conductor is shorter than the above mentioned more typical signal path to ground; this reduces the insertion loss of the device. More specifically, the inductance and resistance introduced by the device is lower than if the more typical signal path to ground is instead employed. As well as keeping the insertion loss of the device down, by keeping the inductance and resistance of the device down, the capacitance of the device more clearly dominates over its inductance and resistance. Accordingly, the MEMS device according to the invention is particularly suitable for use in a MEMS phase shifter (although it can also be used in a MEMS varactor), where minimising insertion loss is a key design driver and capacitance (rather than inductance or resistance) is the key parameter which needs to be altered by changing the state of the device. The said MEMS device can also be advantageous for applications in tuneable splitter/combiners; where the centre frequency of the splitter network can be tuned by a set or bank of MEMS varactors. The splitter combiner can also be made into compact forms saving 200% area compared to a typical multi-stage splitter combiner required to provide a wider bandwidth, by using MEMS varactors in series or shunt circuits combining the two or more branches of the splitter combiner networks.

Some known capacitive MEMS bridges comprise a signal line which extends from the signal line through the capacitor formed between the signal line and the switching signal conductor region, along the MEMS bridge (which is typically conductive along its length) to the anchor (which is typically connected to the ground conductors). However, in the present invention, this is not required (and is indeed omitted by virtue of there being no continuous electrically conductive path extending from the switching conductor region to the anchor). Instead, by providing the MEMS bridge with an electrically conductive switching portion comprising both switching signal and ground conductor regions, a signal path is provided to ground from the signal line through the capacitor formed between the signal line and the switching signal conductor region and through the capacitor formed between the switching ground conductor region and the ground conductor. There is no continuously electrically conductive path extending (e.g. through the MEMS bridge) from the switching conductor region to the at least one anchor and so there is no continuously electrically conductive path extending (e.g. through the MEMS bridge) from the electrically conductive switching portion to the at least one anchor.

The electrically conductive switching portion typically comprises or consists of a continuous conductor including the switching signal conductor region and the switching ground conductor region. It may be that the switching signal and ground conductor regions are integrally formed with each other. It may be that switching signal and ground conductor regions are connected by one or more conductive metal bridges which are narrower (in the plane of the bridge) than the switching signal and ground conductor region. For example, the electrically conductive switching portion may be formed as an H shaped conductor. This reduces the total amount of metal required and reduces stresses, in comparison to forming the elongate conductive switching portion as a single rectangular conductor with regions forming the switching signal and ground conductor regions.

By the switching signal conductor region being provided over the signal conductor and the switching ground conductor region being provided over a said ground conductor, we refer to the direction away from the substrate in which the conductors are formed, irrespective of the orientation of the device. By an up state of the MEMS bridge, switch or device we refer to a state in which the MEMS bridge is spaced apart from the substrate, at least over the signal conductor, and by the down state we refer to a state in which the MEMS bridge is in contact with the substrate (typically through intervening layers).

It may be that the MEMS bridge is cantilevered. The MEMS bridge may have one anchor and there is no continuous electrically conductive path extending (e.g. through the MEMS bridge) from the switching signal conductor region to the anchor. Alternatively, it may be that the MEMS bridge has opposing first and second ends which are connected to the substrate by respective anchors. Typically, there is no continuous electrically conductive path extending (e.g. through the MEMS bridge) from the switching signal conductor region to either of the anchors.

It may be that the MEMS device is a teeter-totter switch. In this case the bridge is typically mechanically connected to the substrate through a pivot, which typically also functions as the anchor or to which the anchor may be connected. This can be seen as a MEMS bridge with one anchor and no continuous electrically conductive path extending (e.g. through the MEMS bridge) from the switching signal conductor region to the anchor. A teeter-totter switch may comprise two MEMS devices according to the first aspect of the invention with a bridge member supported by a pivot functioning as the MEMS bridge of each MEMS device, with respective signal conductors and electrically conductive switching portions on either side of the pivot. Accordingly, the invention extends to a (typically RF) MEMS teeter-totter switch comprising a substrate; a MEMS bridge supported on the substrate through an anchor comprising a pivot, a first signal conductor supported on (and typically mechanically coupled to) the substrate on a first side of the pivot and a second signal conductor supported on (and typically mechanically coupled to) the substrate on a second side of the pivot; ground conductors supported on the substrate on either side of and between the first and second signal conductors (typically to form two co-planar waveguides on the substrate for guiding signals along the respective signal conductors); the MEMS bridge comprising a first electrically conductive switching portion on the first side of the pivot and a second electrically conductive switching portion on the second side of the pivot, the first electrically conductive switching portions comprising a first switching signal conductor region and a first switching ground conductor region, the second electrically conductive switching portions comprising a second switching signal conductor region and a second switching ground conductor region, the first switching signal conductor regions being provided over the first signal conductor, the second switching signal conductor regions being provided over the second signal conductor and the switching ground conductor regions being provided over a said ground conductor, the first and second electrically conductive switching regions being movable relative to the said signal and ground conductors respectively to thereby change the impedance (e.g. capacitances) between the respective switching signal conductor region and the respective signal conductor and between the respective switching ground conductor region and the respective ground conductor, wherein there is no continuous electrically conductive path extending (e.g. through the MEMS bridge) from either switching conductor region to the pivot. Typically, the teeter-totter switch is actuatable so that the MEMS bridge is in a first (up) state on the first side of the pivot and in a second (down) state on the second side of the pivot, or vice versa.

The MEMS bridge may be mechanically connected to the (first) substrate by way of the anchor and the anchor may be formed on the (first) substrate. However, it may be that the MEMS bridge is mechanically coupled to the (first) substrate by virtue of the bridge being coupled to a second substrate and the second substrate being mechanically coupled to the (first) substrate. An example of this circumstance is discussed below with reference to the tenth and eleventh aspects of the invention.

Typically, the electrically conductive switching portion (and thereby the switching signal and ground conductor regions) is moveable from a first position to a second position, e.g. in first and second positions of the MEMS bridge. Typically, in the second position, the electrically conductive switching portion is closer to the substrate than in the first position. Typically, in the second position, the electrically conductive switching portion is closer to the signal line (and the ground conductor(s)) than in the first position. Typically, in the second position, a portion of the MEMS bridge is closer to the substrate than when the MEMS bridge is in the first position. Typically, in the second position, a portion of the MEMS bridge is closer to the signal line (and ground conductor(s)) than when the MEMS bridge is in the first position. Typically, the anchor(s) do not move when the MEMS bridge moves from its first position to its second position.

Typically, in the first position the switching signal and ground conductor regions are spaced from the respective signal and ground conductors and in the second position they are closer to the respective signal and ground conductors than in the first position. Typically the electrically conductive switching portion is moved from the first to the second position in use by way of an electrostatic actuation force, typically by way of deformation of the MEMS bridge (from a first position of the MEMS bridge to a second position of the MEMS bridge), for example by elastic deformation of the resilient planar support Typically, the capacitances between the switching signal conductor region and the signal conductor and between the switching ground conductor region and the ground conductor are greater when the electrically conductive switching portion (and thereby the MEMS bridge) is in the second positions than the first position.

Typically, the MEMS bridge is resilient. Typically, the electrically conductive switching portion (and typically the MEMS bridge) is movable from the second position to the first position by way of a restoring force of the MEMS bridge (e.g. when the electrostatic actuation force is removed). Typically, at least a majority of the restoring force is provided by the resilience (e.g. elasticity) of the MEMS bridge (e.g. the resilient planar support). That is, typically at least a majority of the restoring force is a resilient (e.g. elastic) restoring force.

The MEMS bridge typically comprises a resilient planar support. Typically, the resilient planar support extends between the anchor(s) and the electrically conductive switching portion. The electrically conductive switching portion may be formed on the resilient planar support. The switching signal conductor region and switching ground conductor region may be formed on the resilient planar support. The resilient planar support may be electrically deformed from planar when the electrically conductive switching portion (and the MEMS bridge) is in the second position. The resilient planar support may be stretched when the electrically conductive switching portion (and the MEMS bridge) is in the second position.

According to a second aspect of the invention there is provided a method of operating a MEMS device according to the first aspect of the invention (or the third, fifth, seventh or tenth aspect) comprising applying a potential difference between at least one conductor on the substrate (e.g. the one or more ground conductors, or a signal conductor, or a pull down conductor (a conductor configured to selectively pull down the bridge)) and at least one conductor on the MEMS bridge (e.g. the electrically conductive switching portion or an actuatable conductor of the MEMS bridge) to thereby cause the MEMS bridge to move from a first position (up state) to a second position (down state), (typically wherein the electrically conductive switching portion is closer to the substrate in the second position than in the first position), by electrostatic actuation (generating an attractive electrostatic force between the conductors on the substrate and the MEMS bridge and thereby pulling the MEMS bridge down). The potential difference (or biasing potential) may be DC. For example, the method may comprise applying a step change in a DC potential difference. However, the potential difference may be AC, typically with a frequency of less than 10 kHz (or less than 5 kHz). The potential of the actuatable conductor of the MEMS bridge may be changed to cause electrostatic actuation (whether a DC potential or an alternating potential). The potential of a pull-down conductor supported on the substrate may be changed to cause electrostatic actuation (whether a DC potential or an alternating potential). A DC potential offset may be applied to a conductor carrying an RF signal (e.g. the signal conductor). A biasing signal (e.g. a DC signal, or an AC signal, typically with a frequency of less than 10 kHz (or less than 5 kHz)) may be applied to a conductor carrying an RF signal (e.g. the signal conductor).

The MEMS bridge (and the electrically conductive switching portion) may be actuatable from the first position to the second position by applying a potential difference between at least one conductor on the substrate (e.g. the one or more ground conductors, or a signal conductor, or a pull down conductor (a conductor configured to selectively pull down the bridge)) and at least one conductor on the MEMS bridge (e.g. the electrically conductive switching portion or an actuatable conductor of the MEMS bridge) to thereby cause the MEMS bridge to move from a first position (up state) to a second position (down state) by electrostatic actuation. The MEMS bridge (and the electrically conductive switching portion) may be actuatable from the second position to the first position by changing (e.g. reducing) or removing the potential difference between the at least one conductor on the substrate (e.g. the one or more ground conductors, or a signal conductor, or a pull down conductor (a conductor configured to selectively pull down the bridge)) and at least one conductor on the MEMS bridge (e.g. the electrically conductive switching portion or an actuatable conductor of the MEMS bridge) whereupon the MEMS bridge returns to the first position due to its resilience (i.e. reversing elastic deformation from the first to the second position). Typically, the MEMS bridge comprises a resilient (e.g. planar) support which is deformed by electrostatic forces when the MEMS bridge is actuated from the first position to the second position and which is restored to the first position when the electrostatic forces are removed or reduced, as a result of its resilience.

Typically, the MEMS bridge comprises at least one actuatable conductor. The MEMS bridge may comprise an actuatable conductor on either side of the electrically conductive switching portion. In some embodiments, the MEMS device comprises at least one actuatable conductor between the electrically conductive switching portion and the anchor (or between the switching conductor region and the anchor). The or each actuatable conductor is typically directly above a said ground conductor. The actuatable conductor is typically connected through the anchor (e.g. through the resilient planar support) to an actuation signal input. A bias signal may be applied in use to the actuatable conductor to thereby actuate the bridge (e.g. to cause it to move closer to the signal conductor, to pull it down).

By providing said actuatable conductor, the bias signal is separated from the (typically RF) signal propagating on the signal line. This has the advantage of keeping the RF circuitry and control circuitry simple (as there is no need for DC or bandpass, band blocking, high pass, or RF filters to separate the (DC or AC) bias signal and (typically RF) signal components). Additionally, separation of the bias and (typically) RF signals means that the switching signal conductor region can be provided with a smaller surface area (as it is not required to electrostatically actuate the bridge), thereby making the device more robust to self-actuation by an (e.g. RF) signal propagating on the signal conductor.

Typically, the electrically conductive switching portion (and thereby the switching signal and ground conductor regions) is electrically isolated from the or each actuatable conductor. Thus, the or each actuatable conductor may be connected to the anchor by an electrically conductive connection while the switching signal and ground conductor regions are not.

The electrically conductive switching portion comprises the switching signal conductor region and the switching ground conductor region. It may be that an electrically conductive connecting region extends between the switching signal conductor region and the switching ground conductor region. As they are part of the same conductive portion, the generation of any capacitance between the switching signal conductor region and the switching ground conductor region is prevented. Such capacitance could otherwise dominate over the capacitances between the switching signal and ground conductor regions and the signal and ground conductors respectively.

It may be that the said electrically conductive connecting region has a width which is less than the widths of the switching signal conductor region and/or the switching ground conductor region, the said widths extending in a direction perpendicular to a longitudinal axis of the signal conductor and perpendicular to the direction in which the electrically conductive switching region moves to thereby change the impedances (e.g. capacitances) between the switching signal conductor region and the signal conductor and between the switching ground conductor region and the respective ground conductor.

By providing the said electrically conductive connecting region with a said width less than said widths of the signal and/or ground conductors, the mechanical stress on the MEMS bridge is kept low during deformation of the bridge as the electrically conductive switching portion moves to change the impedances (e.g. capacitances) between the switching signal and ground conductor regions and the signal and ground conductors. This also helps to keep warping of the bridge down during deformation.

It may be that the MEMS bridge comprises a switching ground conductor region on either side of the switching signal conductor region, the switching ground conductor regions being provided over the respective ground conductors and being movable relative to the respective ground conductors to thereby change the impedances (e.g. capacitances) between the switching ground conductor regions and the respective ground conductors.

By providing the MEMS bridge with both switching ground conductor regions on either side of the switching signal conductor region, signal paths are provided to ground from the signal line through the capacitor formed between the signal line and the switching signal conductor region and through the parallel capacitors formed between the switching ground conductor regions and the ground conductors.

It may be that the switching signal conductor region is electrically connected to the switching ground conductor regions by respective electrically conductive connecting regions of the electrically conductive switching portion.

As before, electrically connecting the switching signal conductor region to the switching ground conductor regions by respective electrically conductive connecting regions of the MEMS bridge avoids generating any capacitance between the switching signal conductor region and the switching ground conductor regions which could dominate over the capacitances between the switching signal and ground conductor regions and the signal and ground conductors respectively.

It may be that the signal conductor extends further from the substrate than the ground conductors. Thus, the signal conductor may stand proud of the ground conductors. This facilitates pull-down of the bridge such that the switching signal conductor region is pulled down against the signal conductor, without contact between the switching ground conductor region and the ground conductor (or pull-down pads on the ground conductor where provided) or between the switching ground conductor region and the signal conductor.

In some embodiments, there is no conductor between the signal conductor and the ground conductor on either side of the signal conductor. However, in some embodiments there are one or more further signal conductors between the ground conductors, on either side of the signal conductor. These one or more further signal conductors are typically parallel to the signal conductor. For example, a signal input line and a signal output line.

In this case, it may be that the switching signal conductor region extends above each signal conductor. Thus, when the MEMS bridge is pulled down a parallel capacitor circuit is formed by the signal conductor and the two or more signal conductors.

However, in this case, the MEMS bridge may comprise two electrically conductive switching portions, each comprising a respective switching signal conductor region above a respective signal conductor and a switching ground conductor region above a respective ground conductor, the two electrically conductive switching portions being separated by a gap and not in conductive electrical communication, such that when the MEMS bridge (and the electrically conductive switching portion) is in the second (down) position, separate capacitors are provided between each signal line and the respective ground conductor.

Typically the said electrically conductive connecting portions of the MEMS bridge have respective widths which are each less than the widths of the switching signal conductor region and/or the widths of one or both of the switching ground conductor regions, the said widths extending in a direction perpendicular to a longitudinal axis of the signal conductor and perpendicular to the direction in which the electrically conductive switching portion moves to thereby change the impedances (e.g. capacitances) between the switching signal conductor region and the signal conductor and between the switching ground conductor region and the respective ground conductor.

This arrangement helps to reduce stress within the MEMS bridge, during operation, and reduces the amount of metal between the signal and ground switching conductors.

Typically, a solid electrically insulating layer is provided between the switching signal conductor region and the signal conductor (so as to prevent a short circuit between them when the electrically conductive switching portion/MEMS bridge is in the second position). Typically, a solid electrically insulating layer is provided between the switching ground conductor region(s) and the (respective) ground conductor(s). A said solid electrically insulating layer may be provided on the surface of the MEMS bridge facing the substrate or the surface of the signal and/or ground conductors facing the MEMS bridge.

Typically, the switching signal conductor region comprises (e.g. is) an electrically conductive plate. Typically, the ground conductor comprises (e.g. is) an electrically conductive plate. The switching and ground conductor regions may be different regions of an electrically conductive plate. The electrically conductive switching portion may be an electrically conductive plate comprising the switching and ground conductor regions.

In embodiments in which the MEMS bridge comprises switching ground conductor regions on either side of the switching signal conductor region and is anchored to the substrate at each end, it may be that the MEMS bridge comprises actuatable electrically conductive portions between a first of the switching ground conductor regions and a first of the said anchors and between a second of the said switching ground conductor regions and a second of the said anchors.

Typically, the switching signal and ground conductor regions are (and typically the electrically conductive switching portion is) provided with a layer of dielectric material thereon.

Typically, the switching signal and ground conductor regions (and typically the electrically conductive switching portion) each have first sides which face the signal and ground conductors and second sides opposite the first sides which face away from the signal and ground conductors. Typically, the said dielectric layer is provided on the second sides of the switching signal and ground conductor regions. Typically, the said dielectric layer is provided on the second side of the electrically conductive switching portion.

Typically, the switching signal and ground conductor regions are mechanically supported by the said layer of dielectric material. Typically, the electrically conductive switching portion is supported by the said layer of dielectric material. Typically, the switching signal and ground conductor regions are mechanically connected to each other by the said layer of dielectric material.

It may be that the dielectric material comprises or consists of silicon nitride, silicon dioxide, polysilicon, any dielectric or polymer, created with deposition, sputtering, layer transfer or spin coat methods. More typically, the dielectric material comprises or consists of a polymer. Typically, the said polymer may comprise or consists of poly-monochoropara-xylene (parylene-C).

By mechanically supporting the switching signal and ground conductor regions (and the electrically conductive switching portion) with a dielectric material, the switching signal and ground conductor regions (and the electrically conductive switching portion) can be made thinner (in a direction parallel to the direction in which they move to change the impedances (e.g. capacitances) between the switching signal and ground conductor regions and the signal and ground conductors respectively). Typically, the dielectric material has a density which is less than that of the conductive (typically metallic) material used to form the switching signal and ground conductor regions. Additionally or alternatively, the dielectric material is more flexible than the material used to form the switching signal and ground conductor regions (and typically the whole of the electrically conductive switching portion). Accordingly, the bridge can be made more lightweight and more flexible than if the entire bridge was formed from metal. Typically, the dielectric layer extends between the switching signal conductor region and the anchor(s).

It may be that the MEMS bridge comprises a metallic layer (e.g. a metal layer) extending over but electrically insulated from the electrically conductive switching portion and switching signal and ground conductor regions, for example electrically insulated by way of an intervening insulating (e.g. dielectric) layer.

The metallic layer is typically provided to increase the strength of the MEMS bridge and to reduce warping of the bridge. It may be that the metallic layer extends from a location at least partially (or wholly) overlapping with the switching signal conductor region, to the anchor(s). Typically, there is no continuous electrically conductive path extending (e.g. through the MEMS bridge) from the switching signal conductor to the anchor.

It may be that the resilient planar support comprises a mesh, the mesh comprising a plurality (e.g. an array) of discrete (e.g. tessellated) cells. Typically, the mesh comprises a plurality (e.g. an array) of discrete (e.g. tessellated) cells which have more than four sides. The resilient planar support may have one or two arms, extending to the anchor(s) with the mesh therein.

The resilient planar support comprising a mesh is useful in a range of MEMS devices, including ohmic switches, phase shifters and so forth, as well as capacitive switches.

Accordingly, in a third aspect of the invention, there is provided a (typically RF) MEMS device comprising: a substrate; a signal conductor supported by (and typically mechanically coupled to) the substrate; a MEMS bridge comprising an electrically conductive switching portion and at least one (movable, typically deformable, typically elastically deformable) resilient planar support, the electrically conductive switching portion being mechanically coupled to the substrate by the at least one planar support, the electrically conductive switching portion being movable between first and second positions (e.g. up-state and down-state, respectively) by deformation of the at least one resilient support, (typically wherein the electrically conductive switching portion is closer to the substrate in the second position than in the first position), wherein the at least one resilient support typically comprises a (e.g. skeletal) mesh, the mesh comprising a plurality (e.g. an array) of discrete (typically tessellated) cells which have more than four sides.

In some embodiments the MEMS device of the third aspect comprises (e.g. is) a capacitive switch, which may be a shunt capacitive switch. In some embodiments the MEMS device of the third aspect comprises (e.g. is) an ohmic switch. In some embodiments the MEMS device of the third aspect comprises (e.g. is) a varactor. In some embodiments the MEMS device of the third aspect comprises (e.g. is) a phase shifter.

It may be that the resilient planar support (e.g. the mesh) comprises electrically insulating material (e.g. silicon nitride, parylene, polyimide, aluminium oxide, aluminium nitride, silicon dioxide, hafnia, zirconia, etc.). It may be that the resilient planar support comprises a first, electrically conducting layer (e.g. a metallic layer) and a second, electrically insulating layer (e.g. silicon nitride, parylene, etc.), above (in the direction away from the substrate) or below (in the direction towards the substrate) the first layer. It may be that the resilient planar support (e.g. the mesh) comprises no electrically conductive material. In some embodiments the resilient planar support comprises a said electrically conducting layer which functions as an actuatable conductor, wherein the application of a potential difference between the actuatable conductor and the ground conductors causes the electrically conductive switching portion (and typically the bridge) to be pulled down from the first position to the second position during use.

Typically, the electrically conductive switching portion comprises at least one switching signal conductor located directly above the signal conductor. It may be that the substrate comprises the signal conductor (e.g. an electrically conductive line) and ground conductors supported on the substrate on either side of the signal conductor (e.g. to form a co-planar waveguide on the substrate for guiding signals along the signal conductor). The electrically conductive switching portion may comprise a switching signal conductor region and a switching ground conductor region (which are typically regions of the same continuous conductor).

It may be that the resilient planar support electrically isolates the electrically conductive switching portion of the bridge (e.g. the switching portion) from the substrate. It may be that the MEMS device of the third aspect of the invention is a MEMS switch according to the first aspect of the invention. However, this is not essential. The MEMS device of the third aspect is also useful for MEMS switches in which an electrically conductive switching portion (e.g. a switching portion) is connected to the substrate through a continuous electrically conductive path (e.g. on or through the anchor).

Typically, the resilient planar support comprises a (e.g. skeletal) mesh, the mesh comprising a plurality (e.g. an array) of discrete (typically tessellated) cells which have more than four sides.

Typically, the (e.g. skeletal) mesh comprises a plurality of (typically deformable, typically elastically deformable) elongate links which at least partially define one or more or each of the said discrete cells. Typically, the (e.g. skeletal) mesh comprises a plurality of (typically deformable, typically elastically deformable) elongate links which define one or more or each of the said plurality of discrete cells.

Typically, the ratio of the surface area of the openings (defined by the elongate links) in the cells to the surface area of the elongate links is at least 2, at least 4 or at least 8.

It may be that each of the said discrete cells has a hexagonal shape.

It may be that each of one or more (or two or more or three or more or each) of the discrete cells has, or conforms to, a (e.g. respective) polygonal shape (e.g. in the said tessellation plane).

It may be that each of one or more (or two or more or three or more or each) of the discrete cells has two or more (or three or more or four or more) sides which together conform to a (e.g. respective) polygonal shape (e.g. in the said tessellation plane).

Typically, each of the said discrete cells (e.g. has two or more sides which together) conforms to a respective polygonal shape (e.g. in the tessellation plane).

Typically, each of one or more (or two or more or three or more or each) of the said cells has a polygonal shape (e.g. in the tessellation plane).

It may be that the said polygonal shape has more than two sides. Preferably the said polygonal shape has more than three sides, even more preferably more than four sides. Preferably the said polygonal shape has twenty sides or fewer, more preferably fifteen sides or fewer, even more preferably twelve sides or fewer. It may be that the said polygonal shape has five (pentagon), six (hexagon), seven (heptagon) or eight (octagon) sides. Typically, the polygonal shape has six sides.

Typically, each cell comprises a hole which passes (e.g. at least partially, typically completely) through the support.

Typically, the cells are arranged in a regular pattern and/or tessellate. As such, the support typically comprises a skeletal structure (e.g. a mesh, web or lattice-like structure). While in some embodiments the plurality of cells comprises cells which are all substantially the same shape, in some embodiments some cells may be a first shape while other cells are a second or subsequent shape different to the first shape.

Typically, the support comprises a plurality of discrete cells which are tessellated in a tessellation plane. Typically, the electrically conductive switching portion comprises a planar first surface. Typically, the electrically conductive switching portion comprises a planar second surface. Typically, the planar second surface is opposite the planar first surface. Typically, the planar first surface faces the electrically conductive signal line. Typically, the tessellation plane is parallel or co-planar with the planar first surface when the electrically conductive portion is in the first position. Typically, the tessellation plane is parallel or co-planar with the planar second surface when the electrically conductive portion is in the first position. Typically, a portion of the tessellation plane is parallel or co-planar with the planar first surface when the electrically conductive portion is in the second position.

Typically, the resilient planar support mechanically couples the electrically conductive switching portion to the substrate by way of an anchor (the anchor typically being connected to the substrate).

By providing the bridge with a resilient planar support comprising a (e.g. skeletal) mesh by which the electrically conductive switching portion is mechanically coupled to the substrate, and by providing the mesh with a plurality of discrete (typically tessellated) cells, greater control is obtained over the shape of the bridge as the electrically conductive switching portion (and the bridge) moves between the first and second positions. For example, the bridge is less prone to unintentional warping when it moves between the first and second positions, which makes the structure more stable and improves reliability and longevity. This also helps to keep the electrically conductive switching portion of the bridge flat (typically parallel to the electrically conductive line), particularly when it is in the second position, but also typically when it is in the first position and also typically as it moves between the first and second positions (i.e. in all states of operation). Keeping the electrically conductive switching portion of the bridge flat (typically parallel to the electrically conductive line) in the second position is important when the MEMS device is a capacitive MEMS switch, because it helps to maximise the difference in capacitance of the capacitive MEMS switch when the electrically conductive switching portion is in the second position as compared to when it is in the first position.

Similarly, keeping the electrically conductive switching portion of the bridge flat (typically parallel to the electrically conductive line) in the second position is important when the device is an ohmic switch, because it helps to minimise the off-state capacitance of the switch when the switching portion is in the second position as compared to when it is in the first position. In addition, the skeletal mesh structure of the support provides it with a high level of flexibility, which helps to reduce the (typically electrostatic) force required to deform it in order to move the electrically conductive switching portion from the first position to the second position, thereby also reducing the actuation voltage of the switch thereby making it more power efficient and reducing circuit complexity. The skeletal mesh structure of the support also provides it with a high level of resilience (e.g. elasticity); indeed, the resilience (e.g. elasticity) of the structure typically provides a majority of the restoring force required to move the electrically conductive switching portion of the bridge from the second position back to the first position. Providing the support with discrete cells also helps to reduce the inductance of the support, thereby reducing the insertion loss of the device (and making it more suitable for use in a RF phase shifter). The deformation of the support as the electrically conductive switching portion of the bridge moves from the first position to the second position is also more uniform across a given range of temperatures.

Typically, the electrically conductive switching portion comprises an electrical conductor. The electrically conductive switching portion may comprise a switching signal conductor region and a switching ground conductor region.

The substrate may comprise ground conductors supported on the substrate on either side of the signal conductor (typically to form a co-planar waveguide on the substrate for guiding signals along the signal conductor).

The MEMS device may be a MEMS device according to the first aspect of the invention.

It may be that the resilient planar support is formed in whole or part of one or more conductors (e.g. one or more actuatable conductors). It may be that the mesh is formed of one or more conductors (e.g. conductive metal). The mesh may be formed of one or more actuatable conductors. This may for example enable the MEMS bridge (and typically the electrically conductive switching portion) to be pulled into the second position by electrostatic forces between the resilient planar support (e.g. mesh) and a conductive layer (e.g. the one or more ground conductors, or a pull-down conductor) of the substrate. The mesh may have an insulating layer (e.g. on the side of the conductor facing the substrate). In this case, where there is no conductive path from the switching signal conductor region to the anchor, the resilient planar support and/or mesh is not conductively connected to both the anchor and the switching signal conductor region. It may be that the resilient planar support and/or mesh are conductively coupled to an actuation input, through one or (where present) both anchors, for use in electrostatic actuation of the MEMS bridge/electrically conductive switching portion.

It may be that each of one or more (or two or more or three or more or each) of the discrete cells has an opening. Typically, the resilient planar support comprises a (typically skeletal) mesh, the mesh comprising a plurality of (typically deformable, typically resiliently deformable, typically elastically deformable) elongate links which at least partially define the openings of one or more or each of the said discrete cells. Typically, the resilient planar support comprises a (typically skeletal) mesh, the mesh comprising a plurality of (typically deformable, typically resiliently deformable, typically elastically deformable) elongate links which define the openings of one or more of the said plurality of discrete cells.

Typically, one or more, or two or more, or three or more, or each of the said cells has an opening having a polygonal shape (e.g. in the tessellation plane or in a plane parallel to the tessellation plane). Typically, one or more, or two or more, or three or more, or each of the said discrete cells has an opening which (e.g. has two or more, or three or more sides which together) conforms to a polygonal shape (e.g. in the tessellation plane or in a plane of the support parallel to the tessellation plane). Preferably, the said polygonal shape has more than two sides, more preferably more than three sides, even more preferably more than four sides. Preferably, the said polygonal shape has twenty sides or fewer, more preferably fifteen sides or fewer, even more preferably twelve sides or fewer. Typically, the polygonal shape has five sides (pentagon), six sides (hexagon), seven sides (heptagon) or eight sides (octagon). Typically, the polygonal shape has six sides (hexagon).

By providing the cells and/or the openings with said polygonal shapes (or by providing cells and/or openings which conform to the said polygonal shape), the sides of the cells/openings provide well-defined routes along which mechanical loads, stresses and strains can be dispersed and controlled. This reduces the quantity of mechanical loads, stresses and strains which are borne by the solid material of individual cells of the support which helps to increase the reliability and lifetime of the switch, and improves control of the shape of the bridge, thereby helping to keep the electrically conductive switching portion of the bridge flat (typically parallel to the signal conductor). Hexagonal cells/openings have been found to be particularly effective. It may be that the cells and/or openings are hexagonal and arranged with two sides orthogonal to the longitudinal axis of the bridge (which is typically orthogonal to the signal conductor). Thus, the remaining four sides are oriented at 30° (in alternate senses) to the longitudinal axis of the bridge. This means that when the bridge is pulled down, these sides can readily flex and be stretched out. More generally, the elongate links may comprise a plurality of links formed in chains which are not parallel to the longitudinal axis of the bridge, for example forming a zig-zag (e.g. the links alternating between virtual parallel lines which are parallel to the longitudinal axis of the bridge, without the links extending parallel to the longitudinal axis of the bridge). This provides a concertina like arrangement, enabling the mesh to readily expand when pulled down.

Typically, solid material forms a continuous boundary around the (typically the entire) perimeter of the openings of each of one or more (or each) of the said cells.

Typically, solid material fully encloses the openings of each of one or more (or each) of the said discrete cells in a plane of the opening (which is typically co-planar with or parallel to the tessellation plane). It may be that the openings are co-planar with each other. It may be that the said plane of the openings is a flat plane (e.g. when the electrically conductive switching portion of the bridge is in the first position); alternatively it may be that the said plane of the openings is a curved plane (e.g. when the electrically conductive switching portion of the bridge is in the second position). By providing a continuous boundary around the (typically the entire) perimeter of the openings of each of one or more (or each) of the said cells and/or by fully enclosing the openings of each of one or more (or each) of the said discrete cells in a plane of the opening, mechanical loads, stresses and strains can be better dispersed throughout the resilient planar support (typically throughout the mesh), again reducing quantity of mechanical loads, stresses and strains which are borne by the solid material of individual cells of the support which helps to increase the reliability and lifetime of the switch. This also improves control of the shape of the support when it deforms, thereby helping to keep the electrically conductive switching portion of the bridge flat (typically parallel to the electrically conductive line) particularly when the electrically conductive switching portion (and the MEMS bridge) is in the second position.

Typically, the openings of two or more neighbouring (typically the openings of each of the) cells of the said plurality of discrete cells are separated (discretised) from each other (typically around their entire perimeters) by solid material (e.g. by one or more elongate links).

It may be that the resilient planar support comprises a (typically skeletal) mesh, the mesh comprising solid material which at least partially defines the said openings.

It may be that one or more of the discrete cells (and typically the openings of the said one or more discrete cells) are partly defined by the said electrically conductive switching portion. It may be that the switching portion has two or more sides which together conform to (and typically form part of) a polygonal shape of a said discrete cell.

It may be that the resilient planar support comprises: a first end mechanically coupled to (e.g. connected to or integrally formed with) the electrically conductive switching portion of the bridge; a second end opposite the first end and mechanically coupled (e.g. connected) to the substrate; and a (typically skeletal) mesh, the mesh comprising opposing (typically external, typically planar) first and second sides which extend between the first and second ends, the first side comprising a plurality of said openings, wherein a surface area of the said solid material on the first side of the mesh is less than a total area of the said openings on the first side.

It may be that the electrically conductive switching portion has one or more lines of apertures therethrough extending perpendicular to the span of the MEMS bridge (typically parallel to the signal conductor), and typically extending across the breadth of the bridge. It may be that said one or more lines of apertures are formed over the gaps between the signal conductor and the ground conductors. The said lines of apertures can improve mechanical stress distribution within the electrically conductive switching portion.

The total area of the said openings on the first side of the support is typically the sum of the areas of each of the openings on the said first side of the support. For example, it may be that the surface area of the said solid material on the said first side is less than 75%, or less than 50%, or less than 40% of a total area of the said openings of the said first side.

Typically, the resilient planar support (e.g. the mesh) has opposing first and second edges extending between the first and second ends (and typically between the first and second sides). Typically, the said first and second edges are provided by edges of one or more (typically a plurality) of the said discrete cells. Typically, the first and second edges have shapes which (e.g. two or more, or three or more, or four or more sides which together) conform (e.g. in the tessellation plane) to polygons having more than two sides, preferably more than three sides, preferably more than four sides, preferably more than five sides, preferably six, seven, eight, nine, ten, eleven, twelve, thirteen or fourteen sides (typically in the tessellation plane). Typically, (at least portions of or all of) the said first and second edges form parts of polygons (e.g. in the tessellation plane) each having more than two sides, preferably more than three sides, preferably more than four sides, preferably more than five sides, preferably six, seven, eight, nine, ten, eleven, twelve, thirteen or fourteen sides (typically in the tessellation plane). Typically, (at least portions of or all of) the said first and second edges are stepped. Thus, the lengths of the first and second edges are greater than, for example, straight or gently curved profiles; this allows mechanical stresses and strains to be better dispersed within the support.

However, it may be that the resilient planar support comprises a mesh having circular apertures. The circular apertures may for example be arranged in a hexagonal packing arrangement, although other circular packing arrangements are possible. Forming the resilient planar support as a mesh having circular apertures reduces the stress on the resilient planar support and reduces the amount of material used to form the support, in comparison to a solid resilient planar support.

It may be that the said openings are openings of pores which extend between the first and second sides of the support. The pores may for example be polygonal, e.g. hexagonal, or circular. It may be that one or more (or two or more) of the pores comprises an electrically conductive element (e.g. plate), such as a said actuatable conductor. By providing one or more (or two or more) of the pores with an electrically conductive element, the effect of the electrostatic actuation is enhanced (particularly for embodiments in which the electrically conductive switching portion of the bridge (and the bridge) is moved from the first to the second position by electrostatic actuation of the support). This reduces the required actuation voltage of the bridge which improves power efficiency and reduces circuit complexity.

Typically, each of a subset of the pores comprising fewer pores than the total number of pores of the resilient planar support (e.g. the mesh) comprises a said electrically conductive element. Typically, not all of the pores of the support are provided with a said electrically conductive element. Typically, one or more pores of the resilient planar support (e.g. the mesh) adjacent to (e.g. connected to) the electrically conductive switching portion of the bridge comprise a said electrically conductive element. Typically, the said pores provided with conductive elements are closer to the electrically conductive switching portion of the bridge than to the portion of the support coupled to the substrate. It will be understood that a portion of the support coupled to the electrically conductive switching portion of the bridge typically has a greater freedom of movement than a portion of the support coupled to the substrate. Accordingly, the closer to the electrically conductive switching portion of the bridge are the said pores with electrically conductive elements, the greater the enhancement of the effect of the electrostatic actuation.

Typically, the electrically conductive elements are or comprise electrically conductive plates. Typically, the electrically conductive elements cover at least part of (e.g. at least 50%, at least 60%, at least 70% or at least 80%, typically less than 100%, or less than 95% of the area of) the openings of the pores in which they are provided. Typically, the electrically conductive elements do not entirely cover the openings of the pores in which they are provided. Typically, the electrically conductive elements are mechanically coupled to their respective pores by way of a plurality of respective (typically elongate) connecting links.

Typically, the electrically conductive elements have the same shapes (but not typically the same size) as the openings of the pores in which they are provided (typically in the tessellation plane or in a plane parallel to the tessellation plane). For example, it may be that the electrically conductive elements comprise hexagonal electrically conductive plates provided in hexagonal pores.

Typically, the second side has a plurality of openings. Typically, the said openings on the second side are openings of the said pores on opposite ends of the said pores to the said openings on the first side. Typically, a surface area of the said solid material on the second side of the resilient planar support (e.g. the mesh) is less than a total area of the said openings on the second side.

It may be that a greatest extent of each of one or more or each of the said openings is greater than the shortest distance between that opening and the opening of a neighbouring said discrete cell. Typically, an average (e.g. mean) extent of each of one or more or two or more or three or more or each of the said openings is greater than the shortest distance between that opening and the opening of a neighbouring said discrete cell. Typically, an extent of each of one or more or two or more or three or more or each of the said openings passing through a centre of that opening is greater than the shortest distance between that opening and the opening of a neighbouring said discrete cell.

It may be that two or more discrete cells of the said plurality of discrete cells are different from each other. It may be that one or more cells of the said plurality of discrete cells have a different shape to one or more other cells of the said plurality of discrete cells. It may be that one or more cells of the said plurality of discrete cells have openings having a different shape to the openings of one or more other cells of the said plurality of discrete cells. It may be that one or more cells of the said plurality of discrete cells have a different size to one or more other cells of the said plurality of discrete cells (even though they may have the same shape). It may be that one or more cells of the said plurality of discrete cells have openings having a different size to the openings of one or more other cells of the said plurality of discrete cells.

It may be that two or more or a majority (e.g. 50% or more, 70% or more, 80% or more) of the cells are identical to each other. It may be that two or more or a majority (e.g. 50% or more, 70% or more, 80% or more) of the cells have openings which are identical to each other.

Typically, the support has a honeycomb structure (e.g. a mesh, web or lattice-like structure) comprising the said plurality of discrete cells. Typically, one or more or each of the discrete cells of the honeycomb structure conforms (or have two or more or three or more or four or more sides which together conform) to a hexagonal shape (e.g. in the tessellation plane). Typically, one or more or each of the discrete cells of the honeycomb structure has a hexagonal shape (e.g. in the tessellation plane). Typically, one or more or each of the discrete cells of the honeycomb structure has an opening which conforms to (e.g. has two or more or three or more or four or more sides which together conform to) or has a hexagonal shape (e.g. in the tessellation plane or in a plane parallel to the tessellation plane).

The MEMS bridge may be mechanically connected to the (first) substrate by way of the anchor and the anchor may be formed on the (first) substrate. However, it may be that the MEMS bridge is mechanically coupled to the (first) substrate by virtue of the bridge being coupled to a second substrate and the second substrate being mechanically coupled to the (first) substrate. An example of this circumstance is discussed below with reference to the tenth and eleventh aspects of the invention.

It may be that the bridge is a cantilever bridge. In this case, typically a first end of the resilient planar support is coupled to (e.g. integrally formed with or connected to) the electrically conductive switching portion and the second end of the support is coupled (e.g. integrally formed with or connected to) the substrate. It may be that the electrically conductive switching portion has a free end opposite an end coupled to the support.

Alternatively, it may be that the bridge comprises a first resilient planar support mechanically coupling a first end of the electrically conductive switching portion to the substrate and a second resilient planar support mechanically coupling a second end of the electrically conductive switching portion opposite the first end to the substrate. Either or both of the first and second supports may have any of the features of the support described herein. It may be that the bridge is symmetrical about the conductive switching portion.

Typically, the support(s) (e.g. the mesh(es)) is (are) resiliently (e.g. elastically) deformed when the electrically conductive switching portion of the bridge is in the second position (and when the MEMS bridge is in the second position). Typically, the support(s) (e.g. the mesh(es)) is (are) relaxed when the electrically conductive switching portion of the bridge is in the first position (and when the MEMS bridge is in the second position).

It may be that the MEMS bridge is (e.g. vertically) spaced from the signal conductor when the electrically conductive switching portion of the bridge is in the first position. Typically, the bridge extends over the signal conductor when the electrically conductive switching portion of the bridge is in the first position. Typically, the electrically conductive switching portion of the bridge is provided over the signal conductor at least when the electrically conductive switching portion of the bridge is in the first position. Typically, the electrically conductive switching portion of the bridge is provided directly over the signal conductor at least when the electrically conductive switching portion of the bridge is in the first position (e.g. the electrically conductive switching portion of the bridge is provided in an imaginary volume extending from a perimeter of the signal conductor).

Typically, the signal conductor is an electrically conductive signal line configured to carry an input electromagnetic (typically RF) signal.

It may be that the electrically conductive switching portion of the bridge comprises an electrically conductive plate which is configured to be substantially flat when the electrically conductive switching portion of the bridge is in the second position. The electrically conductive plate may comprise a said switching signal conductor region and a said switching ground conductor region.

Typically, the resilient planar support(s) is (are) configured such that the electrically conductive switching portion is substantially flat in the second position (and optionally when in the first position and/or between the first and second positions). Typically, the electrically conductive switching portion has a planar surface which is parallel to a planar surface of the conductive line (and/or parallel to a planar surface of a solid insulating layer provided on the conductive line), at least in the second position (and optionally when in the first position and/or between the first and second positions). It may be that the electrically conductive switching portion comprises a solid insulating layer which has a planar surface facing a planar surface of the conductive line, and wherein the said planar surface of the solid insulating layer is parallel to the planar surface of the conductive line in the second position (and optionally when in the first position and/or between the first and second positions).

It may be that the electrically conductive switching portion comprises one or more stress relief holes extending therethrough.

Typically, the electrically conductive switching portion has a first surface facing the conductive line and a second surface opposite the first surface. Typically, the said holes extend through solid material of the conductive plate between the first and second surfaces. Typically, the holes have openings on the first surface. Typically, a surface area of the said solid material on the first surface of the electrically conductive switching portion is greater than a total area of the said openings on the first surface of the electrically conductive switching portion.

The total area of the said openings on the first surface of the electrically conductive switching portion is typically the sum of the areas of each of the openings on the said first surface of the electrically conductive switching portion. For example, it may be that the surface area of the said solid material on the said first surface is greater than 75%, or less than 50%, or less than 40% of a total area of the said openings of the said first surface.

Typically, a greatest extent of each of one or more or each of the said openings of the said holes is less than the shortest distance between that opening and the opening of a neighbouring said hole. Typically, an average (e.g. mean) extent of each of one or more or two or more or three or more or each of the said openings of the said holes is less than the shortest distance between that opening and the opening of a neighbouring said hole. Typically, an extent of each of one or more or two or more or three or more or each of the said openings of the said holes passing through a centre of that opening is less than the shortest distance between that opening and the opening of any neighbouring said hole or holes.

Typically, the resilient planar support (e.g. the mesh) is (typically resiliently, typically elastically) deformed when the electrically conductive switching portion is in the second position (and when the MEMS bridge is in the second position).

Typically, the resilient planar support is co-planar with the electrically conductive switching portion of the bridge. Alternatively, it may be that the support is on a different plane from the electrically conductive switching portion of the bridge.

Typically, the bridge is configured to exert a restoring force acting to move the electrically conductive switching portion of the bridge towards the first position when the electrically conductive switching portion of the bridge is in the second position. Typically, the resilient planar support(s) (e.g. mesh(es)) is (are) configured to exert the majority (e.g. if there is also an electrostatic restoring force) or all of the restoring force acting to move the electrically conductive switching portion of the bridge towards the first position when the electrically conductive switching portion of the bridge is in the second position. Typically, the said restoring force exerted by the supports(s) is a resilient (e.g. elastic) restoring force exerted as a result of resilient (e.g. elastic) deformation of the bridge when moving from the first position to the second position.

An insulating layer may be provided overlying the signal conductor. An insulating layer may be provided on the side of the MEMS bridge facing the signal conductor. In either case, the insulating layer typically insulates the signal conductor and the electrically conductive switching portion from each other.

It may be that when the electrically conductive switching portion of the MEMS bridge is in the second position, the electrically conductive switching portion of the MEMS bridge and the signal conductor (sandwich the solid insulating layer. Typically, more than 40% (preferably more than 60%, even more preferably more than 80%, even more preferably more than 90%) of a surface area of the electrically conductive switching portion of the bridge which faces the signal conductor engages the said solid insulating layer when the electrically conductive switching portion is in the second (down state) position. Typically, more than 40% (preferably more than 60%, even more preferably more than 80%, even more preferably more than 90%) of a surface area of the solid insulating layer which faces the signal conductor engages the said signal conductor when the MEMS bridge is in the second (down state) position. Typically, there are no air gaps between the electrically conductive switching portion of the bridge and the solid insulating layer and typically no air gaps between the solid insulating layer and the signal conductor when the electrically conductive switching portion is in the second (down state) position.

Typically, an electrical insulator (e.g. an electrical insulating layer) is provided between the electrically conductive switching portion of the bridge and the signal conductor (at least when the electrically conductive switching portion of the bridge is in the first position). Typically, a solid electrically insulating layer (e.g. silicon, silicon nitride or parylene, polymers, oxides or nitrides) is provided between the electrically conductive switching portion of the bridge and the signal conductor (and typically between the electrically conductive switching portion of the bridge and the ground(s) adjacent to the signal conductor).

It may be that the solid insulating layer is formed on a surface of the signal conductor facing the electrically conductive switching portion of the bridge. In this case, the electrically conductive switching portion of the bridge typically engages the insulating layer when in the second (down state) position but is typically spaced from the insulating layer when in the first (up state) position.

It may be that the solid insulating layer is formed on a surface of the electrically conductive switching portion of the bridge facing the signal conductor. In this case, the solid insulating layer on the electrically conductive switching portion of the bridge typically engages the signal conductor when the electrically conductive switching portion of the bridge is in the second position (and when the MEMS bridge is in the second position).

It may be that the MEMS device is an ohmic switch. In this case, it may be that the electrically conductive switching portion of the bridge (typically the switching signal conductor region) engages the signal conductor when the electrically conductive switching portion of the bridge is in the second position (and when the MEMS bridge is in the second position) to thereby reduce the electrical resistance of the switch. It may be that more than 10%, more than 25%, more than 50% or more than 70%, more than 80%, or more than 90%) of a surface area of the electrically conductive switching portion of the bridge which faces the signal conductor engages the signal conductor when the electrically conductive switching portion is in the second position (and when the MEMS bridge is in the second position). It may be that less than 90% or less than 75% or less than 50% or even less than 25% or less than 10% of the surface area of the electrically conductive switching portion of the bridge which faces the signal conductor engages the signal conductor when the electrically conductive switching portion is in the second position (and when the MEMS bridge is in the second position). This is to avoid the electrically conductive switching portion and the signal conductor contacting across an excessively large area.

Typically, the resilient planar support(s) is (are) substantially flat (typically parallel to the signal conductor) when the electrically conductive switching portion of the bridge is in the first position (and when the MEMS bridge is in the first position). It may be that the resilient planar support(s) is (are) curved (e.g. concave) when the electrically conductive switching portion is in the second position (and when the MEMS bridge is in the second position). However, the resilient planar support(s) may be formed of one or more planar sections in the second position, for example in embodiments where the resilient planar support(s) are formed of expandable skeletal mesh.

It may be that the resilient planar support comprises a first support arm having one or more of the said discrete cells and a second support arm having one or more said discrete cells, wherein the first and second support arms are separated by a gap (e.g. thereby forming a "V" shape when viewed in plan (i.e. in a direction parallel to the principal direction of movement of the electrically conductive switching portion of the bridge when it moves from the first to the second position)).

Typically, the first and second support arms extend from the same side of the electrically conductive switching portion of the bridge.

Typically, the gap has a larger maximum extent than any of the discrete cells and/or openings of the discrete cells of the resilient planar support (e.g. the mesh) (typically in the tessellation plane or in a plane parallel to the tessellation plane). Typically, the said gap is provided between opposing edges of the first and second supports. It may be that the gap is provided by one or more cut-outs in the resilient planar support, the said cut-out thereby forming the first and second support arms. Typically, the gap is provided in the tessellation plane of the (e.g. first surface of the) resilient planar support.

Typically, each of the first and second support arms have a first end mechanically coupled to the electrically conductive switching portion and a second end opposite the first end mechanically coupled to the substrate. Typically, the first and second support arms each have opposing first and second edges which extend between first and second ends of respective support arm. Typically, the said first and second edges of each of the respective support arms are provided by edges of one or more (typically a plurality) of the said discrete cells of the said respective support arm. Typically, the first and second edges of each of the respective support arms have shapes which conform (e.g. have two or more sides which together conform) to a polygon (e.g. in the tessellation plane) having more than two sides, preferably more than three sides, preferably more than four sides, preferably more than five sides, preferably six, seven, eight, nine, ten, eleven, twelve, thirteen or fourteen sides. Typically, (at least portions of or all of) the said first and second edges form part of a polygon (e.g. in the tessellation plane) having more than two sides, preferably more than three sides, preferably more than four sides, preferably more than five sides, preferably six, seven, eight, nine, ten, eleven, twelve, thirteen or fourteen sides. Typically, (at least portions of or all of) the said first and second edges of each of the respective support arms are stepped.

The tessellation plane may be a flat plane (e.g. in the first position); alternatively the plane may be a curved plane (e.g. in the second position).

Typically, the portions of the first and second support arms which are mechanically coupled to the substrate are separated by the said gap.

Typically, the gap between the first and second support arms extends for a portion of the distance between the portions of the support arms coupled to the electrically conductive switching portion of the bridge and the portions of the support arms coupled to the substrate, the said gap increasing in size for a portion of the length of the support arms from portions of the support arms closer to the electrically conductive switching portion of the bridge towards portions of the support arms further from the electrically conductive switching portion of the bridge (i.e. towards the portions of the support arms mechanically coupled to the substrate). Typically, the gap increases in extent for a portion of the lengths of the support arms from portions of the support arms closer to the electrically conductive switching portions of the bridge towards portions of the support arms further from the electrically conductive switching portion of the bridge.

In embodiments in which the bridge comprises a first resilient planar support mechanically coupling a first end of the electrically conductive switching portion to the substrate and a second resilient planar support mechanically coupling a second end of the electrically conductive switching portion opposite the first end to the substrate, it may be that each of the first and second supports comprise first and second support arms. In this case, the combination of the first and second supports may form an X-shape when viewed in plan (i.e. in a direction parallel to the principal direction of movement of the electrically conductive switching portion of the bridge when it moves from the first to the second positions).

By providing each resilient planar support with a plurality of support arms, the number of edges of the support is increased, thereby increasing the mechanical stress distribution within the support. In addition, the required actuation voltage is further reduced.

The invention extends in a fourth aspect to a method of operating a MEMS device according to the third aspect of the invention comprising applying a potential difference between at least one conductor on the substrate (e.g. the one or more ground conductors, or a signal conductor, or a pull down conductor (a conductor configured to selectively pull down the bridge)) and at least one conductor on the MEMS bridge (e.g. the electrically conductive switching portion or an actuatable conductor of the MEMS bridge) (typically wherein the electrically conductive switching portion is closer to the substrate in the second position than in the first position) to thereby cause the MEMS bridge to move from a first position (up state) to a second position (down state) by electrostatic actuation (generating an attractive electrostatic force between the conductors on the substrate and the MEMS bridge and thereby pulling the MEMS bridge down).

It may be that the resilient planar support of the MEMS bridge comprises a said mesh of electrically conductive material and the substrate has a conductor supported thereon, under the mesh. This conductor may be the said ground conductor(s). The conductor may be a separate substrate switching conductor (i.e. separate to the ground conductor(s)). Where it is the ground conductor(s) a potential difference (typically a DC bias or possibly an AC signal, typically with a frequency of less than 10 kHz) is typically applied to the ground conductor(s) or to the actuatable conductor of the bridge. Where the conductor is a separate substrate switching conductor, a circuit is configured to selectively apply the potential (e.g. to alternate between two DC potentials, one of which is typically zero, or to module or switch on and off an AC signal) to the substrate switching conductor to actuate pull-down.

The conductor under the mesh may comprise one or more gaps which are complementary with the apertures of the mesh.

It may be that the MEMS bridge comprises one or more actuatable conductors and the substrate comprises one or more pull-down substrate conductors, which are optionally regions of the ground conductor, wherein the one or more pull-down substrate conductors and the at least one resilient planar support and/or the one or more actuatable conductors are configured to be at least partially interleaved with each other (e.g. in projection on the substrate) when the electrically conductive switching portion (and typically the MEMS bridge) is in the second position (e.g. where the bridge is held in contact with the signal conductor, optionally spaced apart by insulator on the signal conductor).

More generally, in a fifth aspect of the invention there is provided a (typically radio frequency) MEMS device comprising: a substrate, a signal conductor supported on (and typically mechanically coupled to) the substrate, one or more pull-down substrate conductors supported on the substrate; and a MEMS bridge, at least one end of which is mechanically connected to the substrate by way of at least one anchor, the MEMS bridge comprising at least one resilient planar support and one or more actuatable conductors, the MEMS bridge being movable between first and second positions (e.g. up-state and down-state respectively) by deformation of the at least one resilient planar support (due to electrostatic forces) responsive to the application of a potential difference between the one or more pull-down substrate conductors and the one or more actuatable conductors, wherein the one or more pull-down substrate conductors and the at least one resilient planar support and/or the one or more actuatable conductors are configured to be at least partially interleaved with each other (e.g. in projection on the substrate) when the MEMS bridge is in the second position (e.g. where the bridge is held in contact with the signal conductor, optionally spaced apart by insulator on the signal conductor). Typically, the MEMS bridge is closer to the substrate in the second position than in the first position. The MEMS bridge may comprise an electrically conductive switching portion which is closer to the substrate in the second position than in the first position.

This reduces (or avoids) overlapping surface area (as seen in projection on the substrate) when the MEMS bridge is in the second state, reducing charging and stiction, while still enabling the MEMS bridge to be selectively actuated to the second position.

The pull-down substrate conductors may be ground conductor regions (i.e. regions of metal conductively coupled to ground). It may be that the MEMS device comprises ground conductors supported on the substrate on either side of the signal conductor (for example to form a co-axial waveguide). In this case, the one or more pull-down substrate conductors may be regions of the ground conductor(s), for example conductor regions which are spaced apart from, but conductively connected to, the ground conductor(s).

The pull-down substrate conductors may be separate to ground. The pull-down substrate conductors may be electrically connected to a switch (e.g. one or more transistors) configured to switch the pull-down substrate conductors between at least two different potentials. Typically, of the at least two different potentials, one is ground and one is a pull-down potential selected to cause the MEMS bridge (and electronically conductive switching portion, where present) to be pulled to the second position by electrostatic attraction.

It may be that the overlapping area between the actuatable conductor of the bridge and the respective ground conductor and/or pull-down substrate conductor (where provided) is greater than the overlapping area between the signal conductor and the switching signal conductor region. It may be that the overlapping area between the actuatable conductor of the bridge and the respective ground conductor and/or pull-down substrate conductor (where provided) is greater than the overlapping area between the ground conductor and the switching ground conductor region.

Advantageously, this has the result that a lower voltage is typically required to actuate the device by way of the actuatable conductor and the respective ground conductor and/or pull-down substrate conductor (where provided) than if the potential difference were applied between the switching signal conductor region and the signal conductor, or between the switching ground conductor region and the ground conductor.

It may be that the total overlapping area between the actuatable conducting portions of the bridge and each said respective ground conductor and/or pull-down substrate conductor (where provided) is greater than the overlapping area between each said signal conductor and the switching signal conductor region. It may be that the total overlapping area between each actuatable conducting portion of the bridge and each said respective ground conductor and/or pull-down substrate conductor (where provided) is greater than the overlapping area between each said switching ground conductor region and the respective ground conductor over which it is provided.

The one or more actuatable conductors may be connected to ground. The one or more actuatable conductors may be conductively connected to a said anchor. It may be that the device comprises ground conductors supported on the substrate on either side of the signal conductor and the bridge comprises an electrically conductive switching portion (e.g. comprising a switching signal conductor region and a switching ground conductor region) which is electrically isolated from the one or more actuatable conductors. The one or more actuatable conductors may be electrically connected to a switch (e.g. one or more transistors) configured to switch the one or more actuatable conductors between at least two different potentials. Typically, of the at least two different potentials, one is ground and one is a pull-down potential selected to cause the bridge to be pulled to the second position by electrostatic attraction.

The MEMS device may for example be a MEMS device according to the first or second aspect of the invention.

The interleaving may be interspersing. The interleaving may be interdigitating. It may be that one or more pull-down substrate conductors and the resilient planar support and/or the one or more actuatable conductors have interdigitating regions. For example, it may be that the resilient planar support and/or one or more actuatable conductors have edges having one or more indentations and the one or more pull-down substrate conductors have protrusions extending into the indentations (in projection on the substrate when the bridge is in the second position), or vice versa.

It may be that the resilient planar support and/or the one or more actuatable conductors comprise a plurality of apertures and the one or more pull-down substrate conductors have interstitial conductor regions (in projection on the substrate when the bridge is in the second position) located within the apertures.

The resilient planar support and/or the one or more actuatable conductors may be formed as a web having elongate links which define the plurality of apertures. The apertures may be polygons (typically having 4 or more sides), for example hexagons, but can be circular for example. Some or all of the aperture may comprise islands of conductor supported within the apertures and connected to the remainder of the actuatable conductor by joining portions.

Typically, the interstitial conductor regions are connected to other interstitial conductor regions along the substrate surface and so there is some conductor extending between apertures (e.g. under said elongate links) (in projection on the substrate when the bridge is in the second position). However, preferably for at least 50%, at least 75% or at least 90% of the surface area of the one or more actuatable conductors, there is no pull-down substrate conductor directly underneath (in projection on the substrate when the bridge is in the second position).

Some or all of the surface area of the pull-down substrate conductors may be covered with insulator. It may be that discrete regions of insulator (e.g. dimples) are formed (e.g. in a pattern) on the pull-down substrate conductors. This keeps the pull-down substrate conductor from contacting the one or more actuatable conductors when the MEMS bridge (and electrically conductive switching portion) is in the second position.

The invention also extends in a sixth aspect to a method of changing a switching state of a (typically RF) MEMS device, the MEMS device comprising: a signal conductor supported by (and typically mechanically coupled to) a substrate; and a bridge comprising an electrically conductive switching portion and a (typically deformable, typically resiliently deformable, typically elastically deformable) resilient planar support, the electrically conductive switching portion being mechanically coupled to the substrate by the support, the support comprising one or more discrete cells (optionally a mesh comprising one or more discrete cells), the method comprising: deforming the support to thereby move the electrically conductive switching portion between first and second positions (and thereby moving the electrically conductive switching portion between positions further from and closer to the substrate respectively). The MEMS device is typically a MEMS device according to the third aspect of the invention. Moving the electrically conductive switching portion between first and second positions typically moves the MEMS bridge from a first position to a second position.

The method typically comprises applying a potential difference between at least one conductor on the substrate (e.g. the one or more ground conductors, or a signal conductor, a pull-down conductor) and at least one conductor in the bridge (e.g. the electrically conductive switching portion or an actuatable conductor), to thereby cause the electrically conductive switching portion (and MEMS bridge) to move from a first position to a second position by electrostatic actuation (generating an attractive electrostatic force between the conductors on the substrate and the MEMS bridge thereby pulling the MEMS bridge down).

Typically, the first position is an up state where the electrically conductive switching portion (and MEMS bridge) is spaced away from the substrate, over the signal conductor and the second position is a down state where the electrically conductive switching portion (and MEMS bridge) is in contact with the signal conductor or a (e.g. insulating) layer formed over the signal conductor.

Typically, a shortest (e.g. vertical) distance between the electrically conductive switching portion and the signal conductor is less when the electrically conductive switching portion (and MEMS bridge) is in the second position than when it is in the first position.

Typically, the method further comprises relaxing the resilient planar support to thereby move the electrically conductive switching portion from the second position to the first position such that the electrically conductive plate (and/or electrically conductive switching portion) is flat (e.g. parallel to the signal conductor) when the electrically conductive switching portion is in the first position (and typically when the MEMS bridge is in the first position).

Typically, the method further comprises deforming or relaxing the resilient planar support (e.g. the mesh) such that the electrically conductive plate (and/or electrically conductive switching portion) remains flat (typically parallel to the signal conductor) when the MEMS bridge moves (e.g. is deformed) between (typically throughout movement between) the first and second positions.

Typically, the method comprises deforming the resilient planar support (e.g. the mesh) to thereby move the electrically conductive switching portion (and typically the MEMS bridge) from the first position to the second position such that a capacitance (or resistance) of the device increases (e.g. by at least a factor of 5, preferably by at least a factor of 10, in some embodiments by a factor of at least 100).

Typically, the method comprises relaxing the resilient planar support (e.g. the mesh) to thereby move the electrically conductive switching portion (and typically the MEMS bridge) from the second position to the first position such that a capacitance (or resistance) of the device decreases (e.g. by at least a factor of 5, preferably by at least a factor of 10, in some embodiments by a factor of at least 100).

Typically, the method comprises deforming the resilient planar support (e.g. the mesh) to thereby move the electrically conductive switching portion (and typically the MEMS bridge) from the first position to the second position by electrostatic actuation.

It may be that the electrostatic actuation is provided by applying an electrostatic force to the electrically conductive switching portion of the bridge. It may be that the resilient planar support (e.g. the mesh) comprises electrically conductive material. It may be that the electrostatic force is applied to the support.

It may be that the electrostatic actuation is provided by applying an electrostatic force to the resilient planar support (e.g. to the mesh).

It may be that the electrostatic actuation is provided by applying a bias, for example a DC bias potential or an AC biasing signal (typically at a frequency of less than 10 kHz). For example, the bias may be applied to the signal conductor or to the electrically conductive switching portion of the bridge. Alternatively, the bias may be applied to one or more actuatable conductors in the MEMS bridge, e.g. in resilient planar support. The substrate may comprise one or more electrically conductive pull down conductors. The substrate may comprise one more electrical grounds to which the MEMS bridge (e.g. one or more actuatable conductors) are selectively electrostatically attracted (by virtue of a selectively applied potential difference). The electrical ground(s) may be supported by the substrate and provided adjacent to the signal conductor. Typically, the ground(s) is (are) co-planar with the signal conductor. Typically, the ground(s) and the signal conductor form a co-planar waveguide. Typically, the ground(s) is (are) electrically isolated from the signal conductor.

It may be that the method comprises moving the electrically conductive switching portion of the bridge from the second position to the first position by a resilient (e.g. elastic) force applied by the resilient planar support. It may be that the method comprises moving the MEMS bridge from the second position to the first position by a resilient (e.g. elastic) force applied by the resilient planar support.

It may be that the said resilient planar support is a first resilient planar support. It may be that the bridge comprises a second resilient planar support mechanically coupling a second end of the electrically conductive switching portion opposite the first end to the substrate. In this case, the method may comprise deforming the second resilient planar support to thereby move the electrically conductive switching portion between first and second positions, typically such that the electrically conductive plate is flat (typically parallel to the signal conductor) when the electrically conductive switching portion is in the second position (and typically when it is in the first position and typically between the first and second positions). It may be that the method further comprises relaxing the second support to thereby move the electrically conductive switching portion from the second position to the first position.

It may be that the method comprises moving the electrically conductive switching portion of the bridge from the second position to the first position by resilient (e.g. elastic) forces applied by the first and second resilient planar support.

It may be that the electrically conductive switching portion of the bridge is moved from the first position to the second position by electrostatic actuation of the first and second supports. It may be that the bias (e.g. DC or AC biasing potential difference) is applied to respective first and second electrically pull-down conductors in electrostatic communication with the first and second supports respectively.

By providing the said electrically conductive connecting portion of the MEMS bridge with a said width less than said widths of the signal and/or ground conductors, the mechanical stress on the MEMS bridge is limited during deformation of the bridge as the electrically conductive switching portion moves to change the impedances (e.g. capacitances) between the switching signal and ground conductor regions and the signal and ground conductors. This also limits warping of the bridge during deformation.

Typically, the position of the electrically conductive switching portion of the bridge determines whether the MEMS device is in a first (e.g. off, or up, and/or lower capacitance) state or a second (e.g. on, or down, and/or higher capacitance) state. For example, it may be that the MEMS device is in a first (e.g. off or up, and/or lower capacitance) state when the electrically conductive switching portion is in the first position and that the MEMS device is in a second (e.g. on or down, and/or higher capacitance) state when the electrically conductive switching portion is in the second position.

As before, electrically connecting the switching signal conductor region to the switching ground conductor regions by respective electrically conductive connecting portions of the MEMS bridge prevents the generation of any capacitance between the switching signal conductor region and the switching ground conductor regions which otherwise could dominate over the capacitances between the switching signal and ground conductor regions and the signal and ground conductors respectively.

Typically, the said electrically conductive connecting portions of the MEMS bridge have respective widths which are each less than the widths of the switching signal conductor region and/or the widths of one or both of the switching ground conductor regions, the said widths extending in a direction perpendicular to a longitudinal axis of the signal conductor and perpendicular to the direction in which the switching signal and ground conductor regions move to thereby change the impedances (e.g. capacitances) between the switching signal conductor region and the signal conductor and between the switching ground conductor region and the respective ground conductor.

Typically, a solid electrically insulating layer is provided between the switching signal conductor region and the signal conductor to thereby prevent a short circuit between the switching signal conductor region and the signal conductor when the electrically conductive switching portion is in the second position (and when the MEMS bridge is in the second position). Typically, a solid electrically insulating layer is provided between the switching ground conductor region(s) and the (respective) ground conductor(s).

Typically, the electrically conductive switching portion of the bridge is electrically coupled (e.g. electrically connected) to an electrical ground. It may be that the electrically conductive switching portion of the bridge is connected to the electrical ground by the resilient planar support (in which case it may be that the support is electrically conductive).

It may be that the bridge is configured to be electrostatically actuated. It may be that the electrically conductive switching portion of the bridge is configured to move from the first position to the second position by virtue of an electrostatic force which causes the said deformation of the resilient planar support. It may be that the MEMS bridge is configured to move from the first position to the second position by virtue of an electrostatic force which causes deformation of the MEMS bridge, for example of the resilient planar support. It may be that the electrostatic force is applied to the bridge. It may be that the electrostatic force is applied to the resilient planar support (optionally to the mesh) of the bridge. It may be that the electrostatic force is applied to the electrically conductive switching portion of the bridge.

It may be that the electrostatic force is controlled by applying, a potential, e.g. a direct current (DC) (typically voltage) bias or a low frequency alternating (AC) signal, typically up to a few KHz, for example less than 10 kHz. The bias, (e.g. DC or AC bias), may be applied to the signal conductor. In this case, the electrostatic force typically attracts the electrically conductive switching portion of the bridge towards the signal conductor, thereby causing the resilient planar support to deform. Additionally or alternatively, the bias may be applied to the electrically conductive switching portion of the bridge. In this case, the electrostatic force typically repels the electrically conductive switching portion of the bridge towards the signal conductor. Additionally or alternatively, the bias may be applied to the planar support. In this case, the electrostatic force typically repels the planar support towards the substrate.

Additionally, or alternatively, it may be that a potential (e.g. a DC or AC signal) is applied to one or more pull-down conductors. In this case, the said one or more pads are typically provided in electrostatic communication with the resilient planar support (optionally the (typically skeletal) mesh) and the support (optionally the (typically skeletal) mesh) typically comprises electrically conductive material. It may be that the pads are provided beneath the support. In this case, the electrostatic force typically attracts the support (e.g. the mesh) towards the pads. Alternatively, it may be that the pads are provided adjacent to (and typically electrically connected to) the support.

It may be that the pad(s) is (are) supported by the substrate. It may be that the pad(s) is (are) supported on the substrate.

Typically, an (first) electrically conductive ground is provided adjacent to the signal conductor (typically adjacent to a first edge of the signal conductor). Typically, the said (first) electrically conductive ground is supported by the substrate. Typically, a second electrically conductive ground is provided adjacent to the signal conductor (typically adjacent a second edge of the signal conductor opposite the first edge). Typically, the second electrically conductive ground is supported by the substrate. Typically, each of the electrically conductive grounds comprises a ground plane. Typically, the electrically conductive ground(s) is (are) separated and electrically isolated from the signal conductor. Typically, the first and second electrically conductive grounds and the signal conductor together form a co-planar waveguide (for (typically RF) signals propagating on the signal conductor).

It may be that one or more said pull-down conductors are provided by the said electrically conductive ground(s) provided adjacent to the signal conductor. It may be that the electrostatic force is applied to the resilient planar support by applying a DC bias (or an AC biasing signal, typically of less than 10 kHz) to a ground plane supported by (e.g. provided on) the substrate and in electrostatic force communication with the support.

It may be that the signal conductor is part of a (RF) transmission line. Typically, the signal conductor is provided between ground conductors, e.g. to form a co-planar waveguide which functions as the (RF) transmission line. It may be that the transmission line has an impedance which varies from a characteristic impedance (typically 50 Ω) at an input port to a higher impedance, different to the characteristic impedance (typically by at least 5 or at least 10 Ω), under the MEMS bridge. Typically, the higher impedance is greater than 50 Ω. Typically, the MEMS bridge allows for impedance matching with the transmission line.

A measure of measuring an impedance match is through the reflection coefficient, r, as according to the following equation, $$\Gamma = \frac{Z_1 - Z_2}{Z_1 + Z_2}$$

Where, $Z_1$ and $Z_2$ are the first and second characteristic impedances (for example, the characteristic impedance of the transmission line and the characteristic impedance of the MEMS bridge). With perfectly matched impedance, $\Gamma=0$, and as $\Gamma$ increases, so does loss.

It may be that the signal conductor and the ground conductors form a co-planar waveguide. It may be that the co-planar waveguide comprises a bridged portion over which the MEMS bridge extends and an offset portion offset from the bridged portion along the length of the signal conductor, wherein the bridged portion of the co-planar waveguide has a characteristic impedance having a magnitude greater than the magnitude of the characteristic impedance of the offset portion, typically at least when the electrically conductive switching portion (and typically the MEMS bridge) is in the first position, and wherein the characteristic impedance of the signal conductor tapers up in magnitude as it extends from the offset portion to the bridged portion.

A seventh aspect of the invention provides a (typically shunt) capacitive RF MEMS device comprising: a substrate; a co-planar waveguide on the substrate, the co-planar waveguide comprising a signal conductor supported on (and mechanically coupled to) the substrate and ground conductors supported on either side of the signal conductor; and a MEMS bridge comprising an electrically conductive switching portion, the electrically conductive switching portion comprising (or consisting of) a switching signal conductor region provided over the signal conductor, the electrically conductive switching portion being movable between first and second positions (typically in first (up-state) and second (down-state) positions of the MEMS bridge) to change the distance between the switching signal conductor region and the signal conductor, and to thereby the impedances (e.g. capacitances) between the respective switching signal conductor region and the signal conductor (typically by (typically electrostatically actuated, typically resilient) deformation of the bridge), the switching signal conductor region being closer to the signal conductor in the second position than in the first position, wherein the co-planar waveguide comprises a bridged portion over which the MEMS bridge extends and an offset portion offset from the bridged portion along the length of the signal conductor, wherein the bridged portion of the co-planar waveguide has a characteristic impedance having a magnitude greater than the magnitude of the characteristic impedance of the offset portion at least when the electrically conductive switching portion is in the first position, and wherein the characteristic impedance of the signal conductor tapers up in magnitude as it extends from the offset portion to the bridged portion. This could be due to a change in width of the signal conductor.

In some embodiments the signal conductor has a width perpendicular to its longitudinal axis (typically perpendicular to the direction in which the MEMS bridge is movable to change the impedance (e.g. capacitance) between the switching signal conductor region and the signal conductor), and wherein the said width of a bridged portion of the signal conductor over which the said switching signal conductor region is provided is less than the said width of an offset portion of the signal conductor offset from the switching signal conductor region along the longitudinal axis of the said signal conductor.

Accordingly the invention extends to a (typically shunt) capacitive RF MEMS device comprising: a substrate; a co-planar waveguide on the substrate, the co-planar waveguide comprising a signal conductor supported on (and mechanically coupled to) the substrate and ground conductors supported on either side of the signal conductor; and a MEMS bridge comprising an electrically conductive switching portion, the electrically conducting switching portion comprising (or consisting of) a switching signal conductor region being provided over the signal conductor, the electrically conductive switching portion being movable between first and second positions (e.g. of the electrically conductive switching portion or of the MEMS bridge) to change the distance between the switching signal conductor region and the signal conductor, to thereby change the impedances (e.g. capacitances) between the respective switching signal conductor region and the signal conductor (typically by (typically electrostatically actuated, typically resilient) deformation of the bridge), the switching signal conductor region being closer to the signal conductor in the second position than in the first position, wherein the co-planar waveguide comprises a bridged portion over which the MEMS bridge extends and an offset portion offset from the bridged portion along the length of the signal conductor, wherein the width of a bridged portion of the signal conductor over which the said switching signal conductor region is provided is less than the width of an offset portion of the signal conductor offset from the switching signal conductor region along the longitudinal axis of the said signal conductor.

Typically, the width of the signal conductor tapers narrower as it extends from the offset portion to the bridge portion. Typically, this has the effect that the bridged portion of the co-planar waveguide has a characteristic impedance having a magnitude greater than the magnitude of the characteristic impedance of the offset portion at least in the first position, and wherein the characteristic impedance of the signal conductor tapers up in magnitude as it extends from the offset portion to the bridged portion.

Typically, the said width of the said switching signal conductor region changes as it extends over the signal conductor between the offset portion and the bridged portion.

Typically, the said width of the said switching signal conductor region changes as it extends over the portion of the signal conductor having a characteristic impedance having a magnitude which tapers up as it extends between the offset portion and the bridged portion.

Typically, the said width of the said first portion of the said switching signal conductor region increases as it extends over a portion of the signal conductor at which the co-planar waveguide has a characteristic impedance having a magnitude which tapers up along its length as it extends from the offset portion and the bridged portion.

By providing the said bridged portion of the signal conductor with a width less than that of the offset portion, the overlapping area between the switching signal conductor region and the signal conductor is thereby reduced, thereby increasing the (e.g. pull-down) voltage between the switching signal conductor region and the signal conductor to cause actuation of the bridge. This makes the device more robust against unintentional self-actuation or latching. In addition, the characteristic impedance of the bridged portion has a magnitude greater than the magnitude of the impedance of the offset portion, which helps to reduce signal losses along the signal line. This is because, although the magnitude of the characteristic impedance of the bridged portion reduces when the switching signal conductor region moves closer to it when the device is operated, the magnitude of the characteristic impedance reduces from a higher baseline than the magnitude of the characteristic impedance of the offset portion (preferably to a value within 30%, or preferably within 20%, or preferably within 10% of the magnitude of the impedance of the offset portion).

Nevertheless, in some embodiments, the width of a bridged portion of the signal conductor over which said switching signal conductor region is provided is the same or greater than the said width of an offset portion of the signal conductor. In this case, another factor must vary between the bridged and offset portions, such as the distance between the signal conductor one or both adjacent ground conductor(s), or the dielectric constant of the substrate.

Accordingly the invention extends to a (typically shunt) capacitive RF MEMS device comprising: a substrate; a co-planar waveguide on the substrate, the co-planar waveguide comprising a signal conductor supported on (and mechanically coupled to) the substrate and ground conductors supported on either side of the signal conductor; and a MEMS bridge comprising an electrically conductive switching portion, the electrically conductive switching portion comprising (or consisting of) a switching signal conductor region being provided over the signal conductor, the switching signal conductor region being movable relative to the signal conductor between first and second positions to thereby change the impedances (e.g. capacitances) between the respective switching signal conductor regions and the signal conductor (typically by (typically electrostatically actuated, typically resilient) deformation of the bridge), the switching signal conductor region being closer to the signal conductor in the second position than in the first position, wherein the co-planar waveguide comprises a bridged portion over which the MEMS bridge extends and an offset portion offset from the bridged portion along the length of the signal conductor wherein the width of the said first portion of the said switching signal conductor region increases as it extends over a portion of the signal conductor where the co-planar waveguide has a characteristic impedance having a magnitude which tapers up along its length as it extends from the offset portion and the bridged portion.

Typically, the said width of the said second portion of the said switching signal conductor region decreases as it extends over a portion of the signal conductor at which the co-planar waveguide has a characteristic impedance having a magnitude which tapers down along its length as it extends from the bridged portion and the offset portion.

Typically, the second portion of the switching signal conductor region overlaps the portion of the signal conductor having the said tapered impedance. Typically, any one or more or each of the said bridged portion, the said offset portion(s) and the said further offset portion(s) (where provided) have constant widths along their lengths, said widths being provided in a direction perpendicular to the longitudinal axis of the signal conductor and perpendicular to the direction in which the switching signal conductor region is moveable between the first and second positions.

In some embodiments the spacing between the signal conductor and the ground conductor(s) on one or both sides of the signal conductor varies to change the impedance of the waveguide (typically coplanar waveguide) formed by the signal conductor and ground conductor(s). The spacing between the bridged portion of the signal conductor and the ground conductor(s) on one or both sides of the bridged portion of the signal conductor may be greater than the spacing between the offset portion of the signal conductor and the ground conductor(s).

In some embodiments, the dielectric constant of coating or material between the signal and ground conductors is greater or lower at the bridged portion of the signal conductor than on one or both sides of the bridged portion of the signal conductor.

The input impedance of a MEMS switch is often dictated by a requirement to interface with external components which have pre-defined characteristic impedances (e.g. 50 Ω). In addition, the greater the impedance of the co-planar waveguide, the lossier it typically becomes. Accordingly, there are design drivers for providing the offset portion with relatively low impedance. By providing the bridged portion of the co-planar waveguide with a characteristic impedance having a magnitude greater than the magnitude of the characteristic impedance of the offset portion at least when the electrically conductive switching portion (and MEMS bridge) is in the first position, losses through the capacitor between the signal conductor and the switched signal conductor when the electrically conductive switching portion (and MEMS bridge) is in the second position (thereby increasing the capacitance between the signal conductor and the switched signal conductor, thereby reducing the impedance of the bridged portion of the co-planar waveguide) are reduced, at least when compared to a MEMS switch in which the bridged portion and the offset portion of the co-planar waveguide have the same characteristic impedances when the electrically conductive switching portion (and MEMS bridge) is in the said first position.

Further, by tapering the magnitude of the characteristic impedance of the signal conductor between the bridged portion and the offset portion, a better impedance match is provided between the bridged portion and the offset portion than if the bridged portion was directly concatenated to the offset portion (which would otherwise lead to a significant impedance mismatch, and thus significant signal losses). In addition, by tapering the magnitude of the characteristic impedance of the signal conductor between the bridged portion and the offset portion to thereby improve the impedance match between the offset and bridged portions (rather than using other impedance matching methods), any signal losses resulting from an impedance mismatch between the characteristic impedance of the bridged portion when the electrically conductive switching portion (and MEMS bridge) is in the second position (thereby reducing the impedance of the bridged portion) and the impedance matching circuitry (i.e. the tapered signal conductor) can be kept low (so that signal losses through the capacitance between the switching signal conductor region and signal conductor dominate) by providing the tapered portion with a length along the longitudinal axis of the signal conductor which is low relative to the wavelength of the RF signal propagating along the signal conductor. For example, it may be that the length of the tapered portion is less than 100 µm, more preferably less than 50 µm, even more preferably less than 20 µm (e.g. 15 µm).

Typically, the switched signal conductor is electrically connected to ground (either directly or by way of one or more capacitors).

Typically, the characteristic impedance of the signal conductor tapers up in magnitude as it extends from the offset portion to the bridged portion from a characteristic impedance having a magnitude relatively closer to the magnitude of the characteristic impedance of the offset portion to a characteristic impedance having a magnitude relatively closer to the magnitude of the characteristic impedance of the bridged portion.

Typically, the characteristic impedance of the signal conductor tapers up in magnitude as it extends from the offset portion to the bridged portion from a characteristic impedance having a magnitude equal to the magnitude of the characteristic impedance of the offset portion to a characteristic impedance having a magnitude equal to the magnitude of the characteristic impedance of the bridged portion.

Typically, the characteristic impedance of the signal conductor tapers up in magnitude as it extends from the offset portion to the bridged portion to thereby provide an impedance match between the offset portion and the bridged portion.

By providing a further offset portion and tapering the magnitude of the characteristic impedance of the co-planar waveguide as it extends from the further offset portion to the offset portion, the magnitude of the characteristic impedance of the co-planar waveguide can be tapered more gradually, which results in lower signal reflections, and therefore lower insertion loss.

Typically, the characteristic impedance of the signal conductor tapers up in magnitude as it extends from each of the offset portions to the bridged portion from respective characteristic impedances having magnitudes relatively closer to the magnitudes of the characteristic impedances of the respective offset portion to characteristic impedances having magnitudes relatively closer to the magnitude of the characteristic impedance of the bridged portion.

Typically, the characteristic impedance of the signal conductor tapers up in magnitude as it extends from each of the offset portions to the bridged portion from respective characteristic impedances having magnitudes equal to the magnitudes of the characteristic impedances of the respective offset portion to characteristic impedances having magnitudes equal to the magnitude of the characteristic impedance of the bridged portion.

Typically, the characteristic impedance of the signal conductor tapers up in magnitude as it extends from each of the offset portions to the bridged portion to thereby provide impedance matches between the offset portions and the bridged portion. By gradually increasing and/or gradually reducing the capacitance between the switching signal conductor region and the signal conductor along the length of the signal conductor, a better impedance match is provided between the offset portion(s) and the bridged portion of the co-planar waveguide than if the capacitance between the switching signal conductor region and the signal conductor along the length of the signal conductor stepped up in capacitance.

By gradually increasing and/or gradually reducing the capacitance between the switching signal conductor region and the signal conductor along the length of the signal conductor, a better impedance match is provided between the offset portion(s) and the bridged portion of the co-planar waveguide than if the capacitance between the switching signal conductor region and the signal conductor along the length of the signal conductor stepped up in capacitance.

Typically, the first portion of the switching signal conductor region overlaps the portion of the signal conductor having the said tapered impedance.

Typically, the said switching signal conductor region is provided by an electrically conductive plate.

According to an eighth aspect of the invention there is provided a method of operating a MEMS device according to the seventh aspect of the invention comprising applying a potential difference between at least one conductor on the substrate (e.g. the one or more ground conductors, or a signal conductor, or a pull down conductor (a conductor configured to selectively pull down the bridge)) and at least one conductor on the MEMS bridge (e.g. the electrically conductive switching portion or an actuatable conductor of the MEMS bridge) to thereby cause the MEMS bridge to move from a first position (up state) to a second position (down state) by electrostatic actuation (generating an attractive electrostatic force between the conductors on the substrate and the MEMS bridge and thereby pulling the MEMS bridge down), thereby reducing the difference in impedance between the offset and the bridged portions of the co-planar waveguide.

A ninth aspect of the invention provides a method of manufacturing a (typically RF) MEMS device according to any one of the first, third, fifth, seventh or tenth aspects of the invention, the method comprising: providing a substrate; providing a signal conductor supported by the substrate; providing a MEMS bridge comprising an electrically conductive switching portion and a resilient planar support, wherein the electrically conductive switching portion is mechanically coupled to the substrate by the support, the MEMS bridge (and thereby the electrically conductive switching portion) being movable between first and second positions by (typically resilient, typically elastic) deformation of the support. The method may comprise forming the support with a (typically skeletal) mesh, the mesh comprising a plurality of discrete (typically tessellated) cells.

The signal conductor may be a signal conductor provided on the substrate. Ground conductors may be provided on the substrate on either side of the signal conductor, for example to form a co-planar waveguide.

Typically, the step of providing the signal conductor on the substrate comprises forming a trench in the substrate and providing the signal conductor in the trench. This step may comprise providing a (e.g. silicon dioxide) trench mask on the substrate and forming the trench in one or more gaps defined by the trench mask. Typically, the trench is formed by selectively removing (e.g. etching) substrate material from the first surface.

It may be that the method comprises providing (e.g. depositing) a solid insulator layer on a first surface of the substrate. It may be that the method comprises providing a solid insulator layer on a (e.g. exposed) surface of the trench.

It may be that the method comprises providing the signal conductor on the solid insulator layer provided on the surface of the trench.

It may be that the method comprises providing (e.g. depositing) a solid insulator layer on a second surface of the substrate opposite the first surface.

It may be that the method comprises removing (e.g. stripping, optionally dissolving, for example dissolving with (e.g. buffered) hydrofluoric acid (HF)) the trench mask from the substrate after the trench has been formed, and before the solid insulator layer is provided (e.g. deposited) on the first surface of the substrate (and typically before the solid insulator layer is provided on the exposed surface of the trench). Deposition may for example be by sputtering, plasma deposition, additive manufacturing, e-beam writing etc.

It may be that the method further comprises providing conductive grounds on either side of the signal conductor, the electrically conductive grounds being mechanically spaced (and typically electrically isolated) from the signal conductor by portions of the solid insulator layer provided on the said surface of the trench.

It may be that the method further comprises providing (e.g. depositing) a solid insulator layer on the signal conductor (and, where provided, the electrically conductive grounds).

It may be that the method comprises filling the trench with a sacrificial material such as oxide, polysilicon and/or polymers such as PMMA, parylene, polyimide, photoresist, etc. It may be that the method further comprises polishing the sacrificial material so that it is flush with the solid insulator layer provided on the first surface of the substrate.

It may be that the method further comprises forming the MEMS bridge on a bridge surface comprising the solid insulator layer provided on the first surface of the substrate and the sacrificial material provided in the trench. Typically, the method comprises forming the MEMS bridge by depositing material in gaps defined by a removable (lift-off) bridge mask or deposit and etch process. In this case, the bridge mask typically comprises gaps in the shape of the resilient planar support. That is, the bridge mask typically comprises (typically elongate) gaps (typically cut-outs) defining a resilient planar support comprising a (e.g. skeletal) mesh with a plurality (typically an array) of (typically tessellated) discrete cells. The method thus typically comprises forming the resilient planar support (e.g. comprising a mesh) of the bridge by depositing material in the shape of the support (e.g. the mesh).

The method may comprise removing (e.g. cutting out) material from the support to form two or more support arms separated from each other by a gap (the gap typically having a larger maximum extent than any of the cells of the resilient planar support e.g. the mesh)); alternatively, the method may comprise forming the resilient planar support of the bridge by depositing material in the shape of two or more support arms separated from each other by a gap (the gap typically having a larger maximum extent than any of the cells of the resilient planar support (e.g. the mesh)).

It may be that the MEMS bridge comprises a plurality of layers (e.g. first and second layers). It may be that the method further comprises providing (e.g. depositing) a first bridge layer in gaps defined by a first removable bridge mask; and providing (e.g. depositing) a second bridge layer in gaps defined by a second removable bridge mask, wherein at least a portion of the second bridge layer is stacked on (e.g. stacked on top of) the first bridge layer.

It may be that the first and second removable bridge masks are the same bridge mask; alternatively, it may be that the first and second removable bridge masks are different bridge masks. It may be that the method comprises removing the first removable bridge mask before providing the second bridge layer using the second removable bridge mask. It may be that one or each of the first and second bridge masks comprises gaps in the shape of a mesh (e.g. a mesh of a resilient planar support). That is, one or each of the first and second bridge masks typically comprises (typically elongate) gaps (typically cut-outs) defining a plurality (typically a tessellated array) of solid portions to thereby provide the resilient planar support with a mesh, the mesh comprising a plurality (typically an array) of (typically tessellated) discrete cells.

It may be that one of the first and second bridge layers (typically the first bridge layer) comprises electrically conductive material. It may be that the other of the first and second bridge layers (typically the second bridge layer) comprises electrically insulating material (and typically does not comprise electrically conductive material).

It may be that the method comprises providing (e.g. depositing) one or more pull-down conductors on the solid insulator layer provided on the first surface of the substrate (typically prior to forming the bridge). It may be that the method comprises forming the bridge in electrical communication with one or more actuatable conductors. It may be that the method comprises anchoring the bridge to the substrate, typically by way of the actuatable conductor(s). It may be that the method further comprises providing one or more electrical contacts in electrical communication with the said actuatable conductor(s).

It may be that the method comprises removing the sacrificial material from the trench (e.g. by providing etchant, such as (e.g. buffered) HF, into the trench).

The invention extends in a tenth aspect to a MEMS device comprising a first (track) substrate and a second (bridge) substrate, the first substrate supporting a signal conductor and one or more ground lines, the second substrate comprising a channel, a MEMS bridge across the channel, the channel extending to either side of the MEMS bridge, the first and second substrates joined (e.g. bonded) together thereby defining a sealed cavity including the MEMS bridge extending over the signal conductor, the sealed cavity retaining the MEMS bridge, the signal conductor and the one or more ground lines.

The invention extends in an eleventh aspect to a method of manufacturing a MEMS device, the method comprising forming a first (track) substrate supporting a signal conductor and one or more ground lines, forming a second (bridge) substrate having a channel, a MEMS bridge across the channel, the channel extending to either side of the MEMS bridge, and sealing the first and second substrates together to form a sealed cavity including the MEMS bridge extending over the signal conductor, so that the sealed cavity retains the MEMS bridge, the signal conductor and the one or more ground lines.

The one or more ground lines may be ground conductors on either side of the signal conductor (for example to form a co-axial waveguide). The MEMS bridge may comprise a switching signal conductor region and a switching ground conductor region. It may be that there is no electrically conductive path extending (e.g. through the MEMS bridge) from the switching signal conductor region to the at least one anchor. The bridge may comprise an electrically conductive switching portion, which may comprise said switching signal conductor region and switching ground conductor region. The bridge may comprise at least one resilient planar support. The at least one resilient support may comprise an (e.g. skeletal) mesh. The mesh may comprise a plurality (e.g. an array) of discrete (typically tessellated) cells which have more than four sides.

The MEMS device may for example be a MEMS device according to the first, third, fifth, seventh or tenth aspects of the invention. The MEMS bridge is mechanically connected to the first substrate through the sealing together of the second and first substrates.

Typically, the first substrate comprises a first surface. Typically, the method comprises providing a signal conductor and one or more ground lines comprises: forming (e.g. etching) a channel (e.g. trench) in the first surface of the first substrate to thereby form a channel surface, parallel to the first surface of the first substrate; and forming (e.g. depositing or transferring) a signal conductor and one or more ground lines on the channel surface. In some embodiments, the method further comprises depositing one or more insulating layers on the signal conductor and/or on the one or more ground lines. Alternatively, providing a signal conductor and one or more ground lines may comprise forming the signal conductor and the one or more ground lines (e.g. directly) on the first surface of first substrate.

Typically, the second substrate comprises a first surface. Typically, the method comprises providing a bridge comprising an electrically conductive switching portion and a resilient planar support comprises: forming (e.g. etching) a channel (e.g. a trench) in the first surface of the second substrate; filling the trench with a sacrificial material to thereby form a sacrificial material surface, flush with the first surface of the second substrate; building (e.g. by depositing or transferring) the electrically conductive switching portion and the resilient planar support (i.e. such that the electrically conductive switching portion and the resilient planar support are on top of the sacrificial material surface and the first surface of the second substrate (typically supported on (and/or by) the first surface)); and removing the sacrificial material (e.g. by dissolving) to thereby form a channel beneath the electrically conductive switching portion and the resilient planar support. Therefore, the method typically comprises providing the electrically conductive switching portion and resilient planar suspended over a channel in the second substrate (optionally supported on (and/or by) the second substrate).

Typically, the method comprises joining (e.g. bonding) together the first substrate and second substrate (typically bonding the said first surface of the first substrate to the said first surface of the second substrate) to thereby form a (typically hermetically) sealed cavity, the sealed cavity retaining the electrically conductive switching portion and the resilient planar support, the signal conductor and the one or more ground lines. In some embodiments the method further comprises (e.g. at least partially) filling the sealed cavity with an inert substance (e.g. nitrogen gas).

Typically, the sealed cavity is a hermetically sealed cavity. Optionally, the sealed cavity further comprises (optionally is filled with) an inert substance (e.g. nitrogen gas, helium, etc.) to facilitate efficient operation and/or long lifetime of the MEMS device. Typically, the second substrate is layer transferred onto the first substrate. Alternatively, the second substrate may be bonded with the first substrate to thereby form the sealed cavity, to thereby enclose the MEMS bridge such that the two substrates are contained within the channel of the second substrate The invention also extends to a method of manufacturing a (typically RF) MEMS device comprising: providing a first (track) substrate and a second (bridge) substrate; providing a signal conductor supported by the first (track) substrate; providing on the second (bridge) substrate a bridge comprising an electrically conductive switching portion and a resilient planar support (e.g. by depositing material in the shape of the electrically conductive portion) (optionally wherein the support comprises a (typically skeletal) mesh), wherein the electrically conductive switching portion is mechanically coupled to the second (bridge) substrate by the support, the electrically conductive switching portion (and thereby the MEMS bridge) being movable between first and second positions by (typically resilient, typically elastic) deformation of the support and wherein the support (e.g. the mesh) comprises one or more discrete cells.

It may be that the MEMS device is provided as part of a phase shifter. The invention extends in a twelfth aspect to a (typically RF) phase shifter comprising a MEMS device according to the first, third, fifth, seventh or tenth aspect of the invention, which MEMS device is a capacitive switch. Typically, the phase shifter comprises a plurality of said MEMS devices connected in series along a signal conductor, each of which causes a phase shift to selectively be applied to a (RF) signal conducted along the signal conductor, the phase shift combining (typically summing) to cause an overall phase shift.

Typically, the MEMS devices amongst the plurality of MEMS devices are configured in a plurality of groups of one or more MEMS devices which are switchable as a group by the application of a potential difference. As before, the potential difference may for example be applying by introducing a DC bias or an AC biasing signal The potential difference may be applied to the signal or ground conductors of the MEMS devices in the group. The potential difference may be applied (in parallel) to the actuatable conductors of the MEMS bridges of the group. There may be groups comprising different numbers of MEMS devices. The groups may comprise numbers of MEMS devices which differ by a factor of two.

It may be that the MEMS devices of two or more said groups of two or more MEMS devices are interspersed along the length of the signal conductor. This can reduce the reflection or attenuation of signal when the MEMS bridge of a number of adjacent MEMS devices are in the second position/down (high capacitance) state.

The invention also extends in a thirteenth aspect to a MEMS device comprising a (typically RF) antenna apparatus, the antenna apparatus comprising an antenna (e.g. a directional antenna comprising a plurality of antenna elements whose inputs and/or outputs are combinable by beam steering in order to define the directionality of the antenna) and a MEMS bridge according to the first, third, fifth, seventh or tenth aspect of the invention.

The invention extends in an fourteenth aspect to an antenna circuit comprising an antenna element having first and second terminals (e.g. wherein the antenna element comprises antenna conductor extending from the first to the second terminals), the circuit having a signal input (for transmission of an RF signal) or output (for receiving an RF signal) and a junction for splitting or combining a signal into or from first and second signal line branches, the first and second signal line branches extending between the junction and the first and second terminals respectively, one or both of the branches comprising a phase shifter configured to cause a phase difference in signals applied to or received from the first and second terminals, wherein the phase shifter comprises a MEMS device according to the first, third, fifth, seventh or tenth aspect of the invention.

One or both (where present) phase shifters typically comprises a plurality of MEMS devices according to the first, third, fifth, seventh or tenth aspect of the invention connected in series along a signal conductor. One or both (where present) phase shifters may be a phase shifter according to the twelfth aspect of the invention.

Typically, the one or both phase shifters are configured to selectably apply a phase difference of 0°, 90°, 180° or 270° between the signals applied to or received from the first and second terminals. The antenna element may be thereby reconfigurable between two or more of left circular polarised, right circular polarised or linearly polarised antenna circuit configurations (by selective actuation of the MEMS bridges from the first to second positions). It may be that one of the branches comprises a fixed phase shift component and optionally also a said phase shifter. The fixed phase shift component may be a 90° phase shifter.

Typically, the antenna is substrate mounted. The antenna may be planar. The antenna may have a spiral form.

The invention extends in a fifteenth aspect to a method of operating an antenna circuit according to the fourteenth aspect of the invention comprising causing the MEMS bridges of some or all of the MEMS devices of a or the phase shifter to be actuated from the first (up state) position to the second (down state) position (e.g. by application of a potential difference between one or more conductors on the substrate and one or more conductors in the MEMS bridge), or vice versa (e.g. by removing the potential difference) to thereby change the antenna circuit configuration from one or left circular (or elliptical) polarised, right circular (or elliptical) polarised, or linearly polarised to a different one of one or left circular (or elliptical) polarised, right circular (or elliptical) polarised, or linearly polarised. The MEMS devices of a phase shifter may be operated by the method of the second aspect of the invention.

The invention extends in a sixteenth aspect to an attenuator circuit comprising a MEMS device according to the first, third, fifth, seventh or tenth aspect of the invention.

The attenuator circuit may comprise a substrate supporting a signal conductor (optionally located between ground conductors supported on the substrate, e.g. to form a coaxial waveguide) for transmitting RF signals, a branch conductor extending from the signal conductor to ground through a branch circuit comprising one or more resistors, one or more inductances and one or more MEMS devices being a capacitive MEMS switch, wherein the one or more MEMS devices are operable between a first state (e.g. an up state) and a second state (e.g. a down state) wherein the capacitance of the one or more MEMS devices are higher (typically by at least 1, 2, 3 or more orders of magnitude) in the second state than the first state, configured such that when the one or more capacitive MEMS switches are in the first state, the branch circuit does not significantly attenuate RF signals in the signal conductor and wherein in the second state, the branch circuit presents a path to ground (optionally through the one or more MEMS switches and/or) through the (e.g. one or more) resistor(s) (optionally wherein the one or more MEMS switches and/or one or more resistor(s) are in parallel) and thereby attenuates the RF signals. The branch circuit may comprise the inductance, the one or more resistors and the one or more capacitive MEMS switches connected in series to ground. It may be that the inductance is connected between the signal conductor and the one or more capacitive MEMS switches and the one or more resistors are connected between the one or more capacitive MEMS switches and ground. Thus, the resistors are preferably not connected between the signal conductor and the one or more MEMS switches. We have found that this configuration provides the advantage of increasing the efficiency of the attenuator circuit.

Typically, the inductance and the capacitance of the one or more MEMS devices in the second state are selected such that the branch circuit is resonant at the frequency of the RF signal (i.e. at a predetermined frequency).

It may be that when the one or more MEMS devices are in the second state, the branch circuit presents a reactance which partially attenuates the RF signal. The branch circuit may comprise one or more resistors (e.g. in series with the one or more inductance and a circuit element comprising the one or more MEMS devices (which may be in parallel if there are multiple MEMS devices)). Again, the branch circuit is resonant at the frequency of the RF signal (i.e. at a predetermined frequency, for which the circuit is configured) when the one or more MEMS devices are in the second state. When the one or more MEMS devices are in the first state, the branch circuit is not resonant and the RF signal does not conduct the RF signal to ground through the resistor. The resistors are typically resistor components. The inductances may be regions of signal conductor having an inductance determined by the properties and environment of a signal conductor, for example its width, distance between the signal conductor and adjacent ground conductors, dielectric constant of substrate or other adjacent materials etc.

Typically, the MEMS device is a MEMS device according to the first, third, fifth, seventh of tenth aspect of the invention, e.g. where the first state of the MEMS device is the first position of the MEMS bridge/electrically conductive switching portion and the second state of the MEMS device is the second position of the MEMS bridge/electrically conductive switching portion.

The invention extends in a seventeenth aspect to a method of operating the attenuator circuit according to the sixteenth aspect of the invention comprising actuating the one or more MEMS devices from the first to the second state (e.g. by the method of the second aspect) thereby causing at least some of the RF signal conducted in the signal conductor to pass through the branch conductor to ground through the one or more resistors, thereby attenuating the RF signal in the signal conductor.

The invention extends in an eighteenth aspect to a (e.g. single pole double throw) (typically bidirectional) switch circuit for RF signals comprising a substrate supporting a signal conductor (optionally located between ground conductors supported on the substrate, e.g. to form a co-planar waveguide) extending from a common port (e.g. an input, or output) to a junction with first and second branch conductive lines supported on the substrate (typically also signal conductors located between ground conductors supported on the substrate to form co-planar waveguides) and extending from the junction to respective first and second switched ports (e.g. outputs or inputs respectively depending on the direction of signal propagation), the circuit further comprising first and second switchable stub circuits connected to the first and second branch conductive lines respectively between the junction and the respective switched port, each switchable stub circuit comprising one or more MEMS devices being MEMS capacitive switches according to any one of the first, third, fifth, seventh or tenth aspects of the invention and having a first configuration in which the switchable stub circuit presents an open circuit to RF signals at a predetermined wavelength in the respective branch conductive line, and a second configuration in which the switchable stub circuit presents a short circuit (to ground) to RF signals at the predetermined wavelength in the respective branch conductive line such that the electrical distance at the predetermined wavelength from the junction to the respective switchable stub circuit is an integer multiple of (or equal to) one quarter of the predetermined wavelength.

The invention extends in a nineteenth aspect to a (e.g. single pole double throw) (typically bidirectional) switch circuit for RF signals comprising a substrate supporting a signal conductor (optionally located between ground conductors supported on the substrate, e.g. to form a co-planar waveguide) extending from a common port (e.g. an input, or output) to a junction with first and second branch conductive lines supported on the substrate (typically also signal conductors located between ground conductors supported on the substrate to form co-planar waveguides) and extending from the junction to respective first and second switched ports (e.g. outputs or inputs respectively depending on the direction of signal propagation), the circuit further comprising first and second switchable circuits connected to the first and second branch conductive lines respectively, between the junction and the respective switched port, each switchable circuit comprising one or more MEMS devices being MEMS capacitive switches according to any one of the first, third, fifth, seventh or tenth aspects of the invention and having a first configuration in which the switchable circuit presents a short circuit to RF signals (e.g. at a predetermined wavelength) in the respective branch conductive line, and a second configuration in which the switchable circuit presents an open circuit to RF signals at the common port. Typically, the MEMS capacitive switches of the first and second switchable circuits are connected in parallel to inductors to form a parallel resonant switch circuit, (and so there is no requirement for a switchable stub circuit being an integer multiple of (or equal to) one quarter of the predetermined wavelength). This nineteenth aspect of the invention has the advantage of reducing the overall size of the device in comparison to the eighteenth aspect of the invention. Also, it may operate at various wavelengths, as it does not require an element sized with reference to a predetermined wavelength.

The invention extends in a twentieth aspect to a method of switching a switch circuit according to the eighteenth aspect of the invention so that RF signals are conducted between the common port and the second switched port (e.g. from the common port to the second switched port, or vice versa) instead of the first switched port by causing the first switchable stub circuit to switch from the first (open circuit) to the second (short circuit) configuration and the second switchable stub circuit to switch from the second (short circuit) to the first (open circuit) configuration, or so that RF signals are conducted between the common port and the first switched port (e.g. from the common port to the second switched port, or vice versa) instead of the second switched port by causing the first switchable stub circuit to switch from the second (closed circuit) to the first (open circuit) configuration and the second switchable stub circuit to switch from the first (open circuit) to the second (short circuit) configuration, by controlling the MEMS devices of the first and second switchable stub circuits.

Typically, the switchable stub circuits are switchable from the first configuration to the second configuration by actuating the one or more MEMS bridges of the respective one or more MEMS devices from a first (typically up state) position to a second (typically down state position), thereby changing (typically increasing) the capacitance of the respective MEMS device (typically by a factor of at least 15, which may give a change in impedance of a factor of at least 1000).

Thus, when the first switchable stub circuit is in the first configuration and the second switchable stub circuit is in the second configuration, the second switchable stub circuit shorts the RF signal, which presents an open circuit at the quarter wave junction reflecting it, and the RF signal is conducted between the common port and the first switched port, and when the first switchable stub circuit is in the second configuration and the second switchable stub circuit is in the first configuration, the first switchable stub circuit shorts the RF signal, which presents an open circuit at the quarter wave junction reflecting it, and the RF signal conducted between the common port and the second switched port.

The switchable stub circuits may comprise a stub conductor (typically located between ground conductors to form a coaxial waveguide) configured to have a predetermined inductance and extending from the respective branch conductive line (e.g. to ground) and one or more said MEMS devices wherein the stub conductor is the signal conductor of the MEMS device and the MEMS bridge of the MEMS device extends over the stub conductor. There may be a plurality of said MEMS devices in series along the stub conductor. The variation in impedance (e.g. inductance) of the stub conductor along its length and the position and capacitance in the first and second positions of the MEMS bridges of the MEMS device are selected so that a short circuit to ground is presented to signals of the predetermined wavelength when the MEMS bridges of the MEMS devices of the respective switchable stub circuit are in the second position and/or when the respective switchable stub circuit is in its second configuration but signals of the predetermined wavelength are presented with an open circuit and so are not affected when the MEMS bridges of the MEMS devices of the switchable stub circuit are in the first position and/or when the respective switchable stub circuit is in its first configuration.

The predetermined wavelength is the wavelength of the RF signal (e.g. baseband signal) for which the circuit is configured.

The switchable stub circuits typically comprise one or more inductances and one or more MEMS capacitive switches, wherein the inductances and capacitances of the switchable stub circuits are selected to form a resonant circuit (and therefore a path to ground) to RF signals at the predetermined wavelength when the MEMS bridges (of the MEMS devices) are in the second position but not when they are in the first position.

The inductances may be regions of signal conductor having an inductance determined by the properties and environment of a signal conductor, for example its width, distance between the signal conductor and adjacent ground conductors, dielectric constant of substrate or other adjacent materials etc.

Typically, when the first or second switchable stub circuit is in the first (open circuit) configuration, the MEMS bridges of the respective switchable stub circuit are in the first (up state) position and when the first or second switchable stub circuit is in the second (short circuit) configuration, the MEMS bridges of the respective switchable stub circuit are in the second (down state) position. The MEMS bridges may be actuated from the first position to the second position by the method of the second aspect of the invention.

The invention extends in a twenty-first aspect to a method of switching a switch circuit according to the nineteenth aspect of the invention so that RF signals are conducted between the common port and the second switched port (e.g. from the common port to the second switched port, or vice versa) instead of the first switched port by causing the first switchable circuit (i.e. of the first branch conductive line) to switch from a first (short circuit) configuration to a second (open circuit) configuration and the second switchable circuit (i.e. of the second branch conductive line) to switch from the second (open circuit) to the first (short circuit) configuration, so that RF signals are conducted between the common port and the second switched port (e.g. from the common port to the second switched port, or vice versa), by controlling the MEMS devices of the first and second switchable circuits.

Typically, the switchable circuits are switchable from the first configuration to the second configuration by actuating the one or more MEMS bridges of the respective one or more MEMS devices from a first position to a second position, thereby changing the capacitance of the respective MEMS device (typically by a factor of at least 15, which may give a change in impedance of a factor of at least 1000). Typically, in the first (short circuit) configuration the MEMS bridges are in the up state and in the second (open circuit) configuration they are in the down state, however this may be reversed. The switchable circuits form a parallel LC circuit at least in the second (open circuit) configuration. A fixed inductor is provided in parallel with the switchable capacitance of the MEMS bridges.

The invention extends in a twenty-second aspect to an RF splitter and/or combiner circuit formed on a substrate and having a common port and at least two split ports thereon, the common port and at least two split ports connected by transmission lines comprising a signal conductor supported on (and typically mechanically connected) to the substrate and ground conductors supported on the substrate on either side of the signal conductor (typically to form a co-planar waveguide on the substrate), the circuit configured to split an input RF signal received through the common port into equal phase outputs at the two split ports and/or to combine equal phase inputs received at the two split ports into a combined signal output through the common port, the circuit comprising one or more MEMS devices according to any one of the first, third, fifth, seventh or tenth aspects of the invention, the MEMS devices being MEMS capacitive switches having MEMS bridges actuatable between first and second positions to vary a capacitance, wherein the frequency response (e.g. optimum RF frequency or passband) of the RF splitter and/or combiner circuit is selectable in dependence on the positions of the MEMS bridges.

Thus, by actuating the one or more MEMS bridges, the optimum RF frequency of the RF splitter and/or combined circuit can be varied (typically by at least 1% or at least 2% or at least 5%). In an example, the optimum RF frequency (or the centre of the passband) is thereby switchable from 28 GHz to 24 GHz or 20 GHz or 39 GHz.

The invention extends in a twenty-third aspect to a method of operating an RF splitter and/or combiner circuit according to the twenty-second aspect of the invention comprising actuating the MEMS bridges of the one or more MEMS devices from a first position (e.g. an up state) to a second position (e.g. a down state), or vice versa, and thereby varying one or more capacitances of the MEMS devices, thereby changing the optimum RF frequency of the RF splitter and/or combiner circuit. The optimum frequency may be changed from a first standards compatible frequency (e.g. 28 GHz) to a second standards compatible frequency (e.g. 24 GHz or 20 GHz or 39 GHz), for example between first and second 5G communications standard compatible frequencies. This may enable an electronic device (such as a portable telephone) to be selectively usable in first and second territories (e.g. the United States and one or more European countries) with different standard frequencies for wireless RF communication, without requiring duplicate circuits or excessive power consumption.

The RF splitter and/or combiner circuit may for example be a split Tee power divider, unequal split power divider, resistive power divider or Wilkinson power divider. Of them all, the Wilkinson power divider is the most efficient and provides the best isolation of the output ports. Wilkinson power dividers rely on quarter-wave transformers to match the second ports to the first port. However, the quarter-wave transformer limits the Wilkinson power divider to a certain bandwidth with a specific optimum RF frequency. It is known to improve the bandwidth of a Wilkinson power divider by having multiple branches, however this increases the size of the circuit.

It may be that the RF splitter and/or combiner is a Wilkinson power divider. It may be that RF splitter and/or combiner comprises a common port junction conductively connected to the common port and two or more transmission lines extending from the common port junction to a respective split port, one or more junction elements connecting the transmission lines, wherein the electrical distance between the common port and the junction elements is selectable between at least two lengths by actuating the MEMS bridge of the MEMS devices from a first position to a second position. Typically, the optimum wavelength (or passband) of the RF splitter and/or combiner is thereby changed from a first wavelength to a second wavelength. Typically, the electrical length between the common and the junction elements is thereby selectable between an integer multiple of a quarter of (or a quarter of) the first wavelength (when the MEMS bridges are in the first position) and an integer multiple of a quarter of (or a quarter of) the second wavelength (when the MEMS bridges are in the second position).

It may be that there are a plurality of junction elements connecting the transmission lines. In that case, it may be that the electrical length between two junction elements distributed along a transmission line between the common port junction and the respective split port is selectable between at least two lengths by actuating the MEMS bridge of the MEMS devices from a first position to a second position, optionally in addition to the electrical length between the common port junction and one or more junction elements. It may be that the electrical length between two junction elements distributed along a transmission line between the common port junction and the respective split port is thereby selectable between an integer multiple of a quarter of (or a quarter of) the first wavelength (when the MEMS bridges are in the first position) and an integer multiple of a quarter of (or a quarter of) the second wavelength (when the MEMS bridges are in the second position).

The junction elements typically comprise a resistor. The transmission lines may thereby be connected through a resistor. The junction elements may comprise one or more reactive elements. The junction elements may comprise a capacitor. The junction elements may comprise a resistor and a capacitor in series. The junction elements may be configured to connect the transmission lines through a series resistance and capacitance. This isolates the transmission lines and thereby the split ports.

The transmission lines typically comprise one or more inductances between the common port junction and a junction element. The transmission lines typically comprise one or more inductances between junction elements (when there are two or more located along a transmission line between the common port junction and a split port).

The transmission lines typically comprise one or more reactive circuit elements (which can be seen as lumped elements) comprising at least one capacitor and at least one inductance between the common port junction and a junction element (e.g. the junction element or first junction element along the transmission line from the common port junction towards the respective split port). The transmission lines typically comprise one or more said reactive elements comprising at least one capacitor and at least one inductance between junction elements (when there are two or more located along a transmission line between the common port junction and a split port).

The one or more MEMS devices may be configured to connect a respective transmission line to ground through a switchable capacitance, the capacitance of the capacitor being greater (e.g. by a factor of at least 15 or which may give a change in impedance of a factor of at least 1000) when the MEMS bridge of the MEMS device is in the second position (down state) then when the MEMS bridge is in the first position (up state). This changes the electrical length of the transmission line.

The transmission line may comprise a transmission line portion having an inductance connected in parallel with series capacitors, with the one or more MEMS devices configured to couple a conductor intermediate the series capacitors to ground through a switchable capacitance, or equivalent thereto. The transmission line may comprise a transmission line portion having one or more capacitances connected in parallel with series inductances with the one or more MEMS devices configured to couple a conductor intermediate the series inductances to ground through a switchable capacitance. The MEMS devices may be actuatable to thereby change the electrical length of the transmission line portion from a quarter of (or an integer multiple of a quarter of) the first wavelength to a quarter of (or an integer multiple of a quarter of) the second wavelength. A said transmission line portion may extend from the common port junction to the junction element. A said transmission line portion may extend between two junction elements in a transmission line extending from the common port junction to the respective split port.

Features described above under any of the aspects of the invention are optional features of each aspect of the invention. Any of the aspects and features of the present invention can be used in conjunction with any other aspect, embodiment or feature where appropriate. For example, apparatus features may where appropriate be interchanged with method features.

Clauses

1. A microelectromechanical systems (MEMS) device comprising: a substrate; a signal conductor supported on the substrate; ground conductors supported on the substrate on either side of the signal conductor; and a MEMS bridge at least one end of which is mechanically connected to the substrate by way of at least one anchor, the MEMS bridge comprising an electrically conductive switching portion, the electrically conductive switching portion comprising a switching signal conductor region and a switching ground conductor region, the switching signal conductor region being provided over the signal conductor and the switching ground conductor region being provided over a said ground conductor, the electrically conductive switching region being movable, relative to the substrate, between first and second positions, to thereby change the impedances between the switching signal conductor region and the signal conductor and between the switching ground conductor region and the respective ground conductor, wherein there is no continuous electrically conductive path extending from the switching signal conductor region to the at least one anchor.

2. A MEMS device according to clause 1, wherein the impedances which change are capacitances and the MEMS device is a MEMS capacitive switch or a phase shifter.

3. A MEMS device according to clause 1 or clause 2, wherein the MEMS bridge comprises switching ground conductor regions on either side of the switching signal conductor region, whereby signal paths are provided to ground from the signal line through the capacitor formed between the signal line and the switching signal conductor region and through the parallel capacitors formed between the switching ground conductor regions and the ground conductors.

4. A MEMS device according to any one preceding clause which is cantilevered, having one anchor and no continuous electrically conductive path extending from the switching signal conductor region to the anchor, or the MEMS bridge has opposing first and second ends which are connected to the substrate by respective anchors and there is no continuous electrically conductive path extending from the switching signal conductor region to either of the anchors or the MEMS device is a teeter-totter switch wherein the MEMS bridge is mechanically connected to the substrate through a pivot.

5. A MEMS device according to any one preceding clause, wherein the MEMS bridge comprises a resilient planar support which extends between the anchor(s) and the electrically conductive switching portion and wherein the MEMS bridge is deformable from a first position in which the switching signal and ground conductor(s) are spaced from the respective signal and ground conductor(s) to a second position in which the switching signal and ground conductor(s) are closer to the respective signal and ground conductor(s) than in the first position by way of an electrostatic actuation force, wherein the capacitances between the switching signal conductor region and the signal conductor and between the switching ground conductor region(s) and the ground conductor(s) are greater when the MEMS bridge is in the second position than when the MEMS bridge is in the first position.

6. A MEMS device according to any one preceding clause, wherein the MEMS bridge comprises at least one actuatable conductor between the electrically conductive switching portion and the anchor.

7. A MEMS device according to any one preceding clause, wherein the electrically conductive switching portion comprises the switching signal conductor region and the switching ground conductor region and an electrically conductive connecting region which extends between the switching signal conductor region and the switching ground conductor region, wherein the said electrically conductive connecting region has a width which is less than the widths of the switching signal conductor region and/or the switching ground conductor region.

8. A MEMS device according to any one preceding clause, wherein the signal conductor extends further from the substrate than the ground conductors.

9. A MEMS device according to any one preceding clause, wherein there are one or more further signal conductors between the ground conductors, on either side of the signal conductor.

10. A MEMS device according to any one preceding clause, wherein a solid electrically insulating layer is provided between the switching signal conductor region and the signal conductor.
11. A MEMS device according to clause 10, wherein when electrically conductive switching portion is in the second position, the electrically conductive switching portion of the MEMS bridge and the signal conductor sandwich the solid insulating layer and more than 60% of a surface area of the electrically conductive switching portion of the bridge which faces the signal conductor engages the said solid insulating layer.
12. A MEMS device according to any one preceding clause, wherein the MEMS bridge comprises a resilient planar support, wherein the resilient planar support comprises a mesh, the mesh comprising a plurality of discrete cells which have more than four sides.
13. A MEMS device according to any one preceding clause, wherein the electrically conductive switching portion comprises one or more stress relief holes extending therethrough, the electrically conductive switching portion has a first surface facing the conductive line and a second surface opposite the first surface, the said holes extend through solid material of the conductive plate between the first and second surfaces and have openings on the first surface wherein a surface area of the said solid material on the first surface of the electrically conductive switching portion is greater than a total area of the said openings on the first surface of the electrically conductive switching portion.
14. A MEMS device according to any one preceding clause, wherein the MEMS bridge comprises a mesh of electrically conductive material and the substrate has a ground conductor or substrate switching conductor supported thereon, under the mesh, wherein the conductor under the mesh comprises one or more gaps which are complementary with the apertures of the mesh.
15. A MEMS device according to any one preceding clause, wherein the MEMS bridge comprises one or more actuatable conductors and the substrate comprises one or more pull-down substrate conductors, which are optionally regions of the ground conductor, wherein the one or more pull-down substrate conductors and the at least one resilient planar support and/or the one or more actuatable conductors are configured to be at least partially interleaved with each other when the electrically conductive switching portion is in the second position, for example one or more pull-down substrate conductors and the resilient planar support and/or the one or more actuatable conductors have interdigitating regions and/or the resilient planar support and/or the one or more actuatable conductors comprise a plurality of apertures and the one or more pull-down substrate conductors have interstitial conductor regions located within the apertures.
16. A MEMS device according to any one preceding clause, wherein the total overlapping area between the actuatable conducting portions of the bridge and each said respective ground conductor and/or pull-down substrate conductor is greater than the overlapping area between each said signal conductor and the switching signal conductor region.
17. A MEMS device according to any one preceding clause, wherein the signal conductor and the ground conductors form a co-planar waveguide and wherein the co-planar waveguide comprises a bridged portion over which the MEMS bridge extends and an offset portion offset from the bridged portion along the length of the signal conductor, wherein the bridged portion of the co-planar waveguide has a characteristic impedance having a magnitude greater than the magnitude of the characteristic impedance of the offset portion at least when the MEMS bridge is in the first position, and wherein the characteristic impedance of the signal conductor tapers up in magnitude as it extends from the offset portion to the bridged portion.
18. A MEMS device comprising: a substrate; a signal conductor supported by the substrate; a MEMS bridge comprising an electrically conductive switching portion and at least one resilient planar support, the electrically conductive switching portion being mechanically coupled to the substrate by the at least one planar support, the electrically conductive switching portion being movable between first and second positions by deformation of the at least one resilient support, wherein the electrically conductive switching portion is closer to the substrate in the second position than in the first position, wherein the at least one resilient support typically comprises a mesh, the mesh comprising a plurality of discrete cells which have more than four sides.
19. A MEMS device according to clause 18, wherein the resilient planar support comprises a plurality of elongate links which at least partially define one or more or each of the said discrete cells, wherein the ratio of the surface area of the openings in the cells to the surface area of the elongate links is at least 2.
20. A MEMS device according to clause 18 or clause 19, wherein each of the discrete cells has a hexagonal shape.
21. A MEMS device according to clause 1 which is an ohmic switch, wherein the switching signal conductor region engages the signal conductor when the MEMS bridge is in the second position.
22. A phase shifter comprises a plurality of MEMS devices according to any one of clauses 1 to 20 connected (optionally in series) along a signal conductor, each of which causes a phase shift to selectively be applied to a (RF) signal conducted along the signal conductor, the phase shifts combining to cause an overall phase shift
23. A phase shifter according to clause 22, wherein the MEMS devices of the plurality of MEMS devices are configured in a plurality of groups of one or more MEMS devices which are switchable as a group by the application of a potential difference, wherein the MEMS devices of two or more said groups of two or more MEMS devices are interspersed along the length of the signal conductor.
24. A method of operating a MEMS device according to any one preceding clause comprising applying a potential difference between at least one conductor on the substrate and at least one conductor on the MEMS bridge to thereby cause the MEMS bridge to move from a first position to a second position by electrostatic actuation, wherein the electrically conductive switching portion is closer to the substrate in the second position than in the first position.
25. A capacitive RF MEMS switch comprising: a substrate; a co-planar waveguide on the substrate, the co-planar waveguide comprising a signal conductor supported on the substrate and ground conductors supported on either side of the signal conductor; and a MEMS bridge comprising an electrically conductive switching portion, the electrically conducting switching portion comprising a switching signal conductor region being provided over the signal conductor, the electrically conductive switching portion being movable between first and second positions to change the distance between the switching signal conductor region and the signal conductor to thereby change the impedances between the respective switching signal conductor region and the signal conductor, the switching signal conductor region being closer to the signal conductor in the second position than in the first position, wherein the co-planar waveguide comprises a bridged portion over which the MEMS bridge extends and an offset portion offset from the bridged portion along the length of the signal conductor, wherein the bridged portion of the co-planar waveguide has a characteristic impedance having a magnitude greater than the magnitude of the characteristic impedance of the offset portion at least when the electrically conductive switching portion is in the first position, and wherein the characteristic impedance of the signal conductor tapers up in magnitude as it extends from the offset portion to the bridged portion.

26. A capacitive RF MEMS switch according to clause 25, wherein the signal conductor has a width perpendicular to its longitudinal axis, and wherein the said width of a bridged portion of the signal conductor over which the said switching signal conductor region is provided is less than the said width of an offset portion of the signal conductor offset from the switching signal conductor region along the longitudinal axis of the said signal conductor.

27. A capacitive RF MEMS switch according to clause 25 or clause 26, wherein the spacing between the signal conductor and the ground conductor(s) one or both sides of the signal conductor varies to change the impedance of the waveguide formed by the signal conductor and ground conductor(s) or wherein the dielectric constant of coating or material between the signal and ground conductors is greater or lower at the bridged portion of the signal conductor than on one or both sides of the bridged portion of the signal conductor.

28. A method of operating a capacitive MEMS switch according to any one of clauses 25 to 27, comprising applying a potential difference between at least one conductor on the substrate and at least one conductor on the MEMS bridge to thereby cause the MEMS bridge to move from a first position (up state) to a second position (down state) by electrostatic actuation, wherein the electrically conductive switching portion is closer to the substrate in the second position than in the first position, thereby reducing the difference in impedance between the offset and the bridged portions of the co-planar waveguide.

29. A method of manufacturing a (typically RF) MEMS device according to any one of clauses 1 to 21, the method comprising: providing a substrate; providing a signal conductor supported by the substrate; providing a MEMS bridge comprising an electrically conductive switching portion and a resilient planar support, wherein the electrically conductive switching portion is mechanically coupled to the substrate by the support, the MEMS bridge (and thereby the electrically conductive switching portion) being movable between first and second positions by deformation of the support.

30. A MEMS device comprising a first (track) substrate and a second (bridge) substrate, the first substrate supporting a signal conductor and one or more ground lines, the second substrate comprising a channel, a MEMS bridge across the channel, the channel extending to either side of the MEMS bridge, the first and second substrates joined (e.g. bonded) together thereby defining a sealed cavity including the MEMS bridge extending over the signal conductor, the sealed cavity retaining the MEMS bridge, the signal conductor and the one or more ground lines.

31. A method of manufacturing a MEMS device, the method comprising forming a first (track) substrate supporting a signal conductor and one or more ground lines, forming a second (bridge) substrate having a channel, a MEMS bridge across the channel, the channel extending to either side of the MEMS bridge, and sealing the first and second substrates together to form a sealed cavity including the MEMS bridge extending over the signal conductor, so that the sealed cavity retains the MEMS bridge, the signal conductor and the one or more ground lines.

32. A MEMS device or a method according to clause 31 wherein the MEMS device is a MEMS device according to any one of clauses 1 to 21.

33. A MEMS device comprising: a substrate, a signal conductor supported on the substrate, one or more pull-down substrate conductors supported on the substrate; and a MEMS bridge, at least one end of which is mechanically connected to the substrate by way of at least one anchor, the MEMS bridge comprising at least one resilient planar support and one or more actuatable conductors, the MEMS bridge being movable between first and second positions by deformation of the at least one resilient planar support responsive to the application of a potential difference between the one or more pull-down substrate conductors and the one or more actuatable conductors, wherein the one or more pull-down substrate conductors and the at least one resilient planar support and/or the one or more actuatable conductors are configured to be at least partially interleaved with each other when the MEMS bridge is in the second position.

34. A MEMS device according to clause 33 wherein the one or more pull-down substrate conductors and the resilient planar support and/or the one or more actuatable conductors have interdigitating regions and/or the resilient planar support and/or the one or more actuatable conductors comprise a plurality of apertures and the one or more pull-down substrate conductors have interstitial conductor regions located within the apertures.

35. An antenna circuit comprising an antenna element having first and second terminals, the circuit having a signal input for transmission of an RF signal or output for receiving an RF signal and a junction for splitting or combining a signal into or from first and second signal line branches, the first and second signal line branches extending between the junction and the first and second terminals respectively, one or both of the branches comprising a phase shifter configured to cause a phase difference in signals applied to or received from the first and second terminals, wherein the phase shifter comprises a MEMS device according to any one of clauses 1 to 20 or any one of clauses 25 to 27, or is a phase shifter according to any one of clauses 22 or 23.

36. An antenna circuit according to clause 35, wherein one or both phase shifters are configured to selectably apply a phase difference of 0°, 90°, 180° or 270° between the signals applied to or received from the first and second terminals wherein the antenna element is thereby reconfigurable between two or more of left circular polarised, right circular polarised or linearly polarised antenna configurations.

37. A method of operating an antenna circuit according to clause 35 or clause 36, comprising causing the MEMS bridges of some or all of the MEMS devices of a or the phase shifter to be actuated from the first position to the second position, or vice versa, to thereby change the antenna circuit configuration from one of left circular (or elliptical) polarised, right circular (or elliptical) polarised, or linearly polarised to a different one of one or left circular (or elliptical) polarised, right circular (or elliptical) polarised, or linearly polarised.

38. An attenuator circuit comprising a substrate supporting a signal conductor for transmitting RF signals, a branch conductor extending from the signal conductor to ground through a branch circuit comprising one or more resistors, one or more inductances and one or more MEMS devices being a capacitive MEMS switch, wherein the one or more MEMS devices are operable between a first state and a second state wherein the capacitance of the one or more MEMS devices are higher in the second state than the first state, configured such that when the one or more capacitive MEMS switches are in the first state, the branch circuit does not significantly attenuate RF signals in the signal conductor and wherein in the second state, the branch circuit presents a path to ground through the resistor and thereby attenuates the RF signals, wherein the one or more MEMS devices are capacitive MEMS switches according to any one of clauses 1 to 20 or any one of clauses 25 to 27.

39. An attenuator circuit according to clause 38, wherein in the second state, the branch circuit presents a path to ground through the one or more MEMS switches and one or more resistors in parallel and thereby attenuates the RF signals, wherein the one or more MEMS devices are capacitive MEMS switches according to any one of clauses 1 to 20 or any one of clauses 25 to 27.

40. A method of operating the attenuator circuit according to clause 38 or 39, comprising actuating the one or more MEMS devices from the first to the second state thereby causing at least some of the RF signal conducted in the signal conductor to pass through the branch conductor to ground through the one or more resistors, thereby attenuating the RF signal in the signal conductor.

41. A switch circuit for RF signals comprising a substrate supporting a signal conductor extending from a common port to a junction with first and second branch conductive lines supported on the substrate and extending from the junction to respective first and switched ports, the circuit further comprising first and second switchable stub circuits connected to the first and second branch conductive lines respectively between the junction and the respective switched port, each switchable stub circuit comprising one or more MEMS devices being MEMS capacitive switches according to any one of clauses 1 to 20, or any one of clauses 25 to 27, and having a first configuration in which the switchable stub circuit presents an open circuit to RF signals at a predetermined wavelength in the respective branch conductive line, and a second configuration in which the switchable stub circuit presents a short circuit to ground to RF signals at the predetermined wavelength in the respective branch conductive line such that the electrical length at the predetermined wavelength from the junction to the respective switchable stub circuit is an integer multiple of one quarter of the predetermined wavelength.

42. A switch circuit for RF signals comprising a substrate supporting a signal conductor extending from a common port to a junction with first and second branch conductive lines supported on the substrate and extending from the junction to respective first and switched ports, the circuit further comprising first and second switchable stub circuits connected to the first and second branch conductive lines respectively between the junction and the respective switched port, each switchable stub circuit comprising one or more MEMS devices being MEMS capacitive switches according to any one of clauses 1 to 20, or any one of clauses 25 to 27, and having a first configuration in which the switchable stub circuit presents an open circuit to RF signals in the respective branch conductive line, and a second configuration in which the MEMS capacitive switches are connected in parallel to (optionally fixed) inductors to form a parallel resonant switch circuit.

43. A switch circuit according to clause 41 or clause 42 wherein RF signals are conducted between the common port and the second switched port instead of the first switched port by causing the first switchable stub circuit to switch from the first (open circuit) to the second (short circuit) configuration and the second switchable stub circuit to switch from the second (short circuit) to the first (open circuit) configuration, or so that RF signals are conducted between the common port and the first switched port instead of the second switched port by causing the first switchable stub circuit to switch from the second (closed circuit) to the first (open circuit) configuration and the second switchable stub circuit to switch from the first (open circuit) to the second (short circuit) configuration, by controlling the MEMS devices of the first and second switchable stub circuits.

44. An RF splitter and/or combiner circuit formed on a substrate and having a common and at least two split ports thereon, the common port and at least two split ports connected by transmission lines comprising a signal conductor supported on the substrate and ground conductors supported on the substrate on either side of the signal conductor, the circuit configured to split an input RF signal received through the common port into equal phase outputs at the two split ports and/or to combine equal phase inputs received at the two split ports into a combined signal output through the common port, the circuit comprising one or more MEMS devices according to any one of clauses 1 to 20, or any one of clauses 25 to 27, the MEMS devices being MEMS capacitive switches having MEMS bridges actuatable between first and second positions to vary a capacitance, wherein the frequency response of the RF splitter and/or combiner circuit is selectable in dependence on the positions of the MEMS bridges.

45. A method of operating an RF splitter and/or combiner circuit according to clause 44, comprising actuating the MEMS bridges of the one or more MEMS devices from a first position to a second position, or vice versa, and thereby varying one or more capacitances of the MEMS devices, thereby changing the optimum RF frequency of the RF splitter and/or combiner circuit.

46. A circuit or method of operating a circuit according to clause 44 or clause 45, wherein the RF splitter and/or combiner comprises a common port junction conductively connected to the common port and two or more transmission lines extending from the common port junction to a respective split port, one or more junction elements connecting the transmission lines, wherein the electrical length between the common port and the junction elements is selectable between at least two lengths by actuating the MEMS bridge of the MEMS devices from a first position to a second position to thereby change the optimum wavelength of the RF splitter and/or combiner from a first wavelength to a second wavelength, wherein the electrical length between the common and the junction elements is thereby selectable between an integer multiple of a quarter of the first wavelength and an integer multiple of a quarter of the second wavelength.

DESCRIPTION OF THE DRAWINGS

An example embodiment of the present invention will now be illustrated with reference to the following Figures in which:

FIGS. 5 to 22 are plan views of variations of the MEMS bridge of FIGS. 1 to 4;

FIGS. 27 to 37 are sectional views through the capacitive MEMS switch of FIG. 1 at various stages of its manufacture;

FIGS. 39 to 41 are sectional views of an embodiment wherein the MEMS is enclosed within two substrates which are bonded together to thereby form a cavity;

FIG. 42 is a cross section of an embodiment wherein the MEMS comprises a varactor with actuatable conductors and an electrically isolated switching conductor;

FIG. 43 is a plan view of tracks on a substrate extending under a MEMS bridge;

FIG. 44A is a simplified circuit diagram of the key capacitances in the MEMS bridge and FIG. 44B is a circuit diagram of a section of waveguide;

FIG. 52 is a plan view of the signal and ground tracks for a capacitive MEMS switch with interstitial pull-down pads;

FIGS. 53 and 54 are details of the image of FIG. 52, also showing part of the skeletal web structure of the overlying MEMS bridge;

FIG. 56 is a circuit diagram of a MEMS phase shifter with unit cells and a FIG. 57 is a plan view of a MEMS phase shifter with unit cells;

FIG. 59A is a circuit diagram of an attenuator circuit unit cell and FIG. 59B is a circuit diagram of an attenuator circuit unit cell with a varied attenuation effect;

FIG. 60A is a circuit diagram of a controllable attenuator with three consecutive unit cells and FIG. 60B is a circuit diagram of a controllable attenuator with three consecutive unit cells and a varied attenuation effect;

FIG. 61A is a schematic diagram of a series resonant switch corresponding to FIG. 59A but omitting the resistance and FIG. 61B is a schematic diagram of a parallel resonant switch of a MEMS switch circuit in parallel to an inductor;

FIG. 62A is a plan view of and FIG. 63A is a schematic circuit diagram of a bidirectional MEMS SPDT (single-pole, double-throw) switch for an RF signal;

FIG. 62B is a plan view of and FIG. 63B is a schematic circuit diagram of a bidirectional MEMS SPDT (single-pole, double-throw) switch for an RF signal in an alternative configuration;

FIGS. 67 and 68 are circuit diagrams for multistage MEMS splitters and FIG. 69 is a set of S-parameter plots of the behaviour of multistage MEMS splitters;

FIG. 72 is a lumped element power divider and FIG. 69 is a series of S-parameter plots for the circuit of FIG. 72;

DETAILED DESCRIPTION OF EXAMPLE EMBODIMENTS

Figure 1:
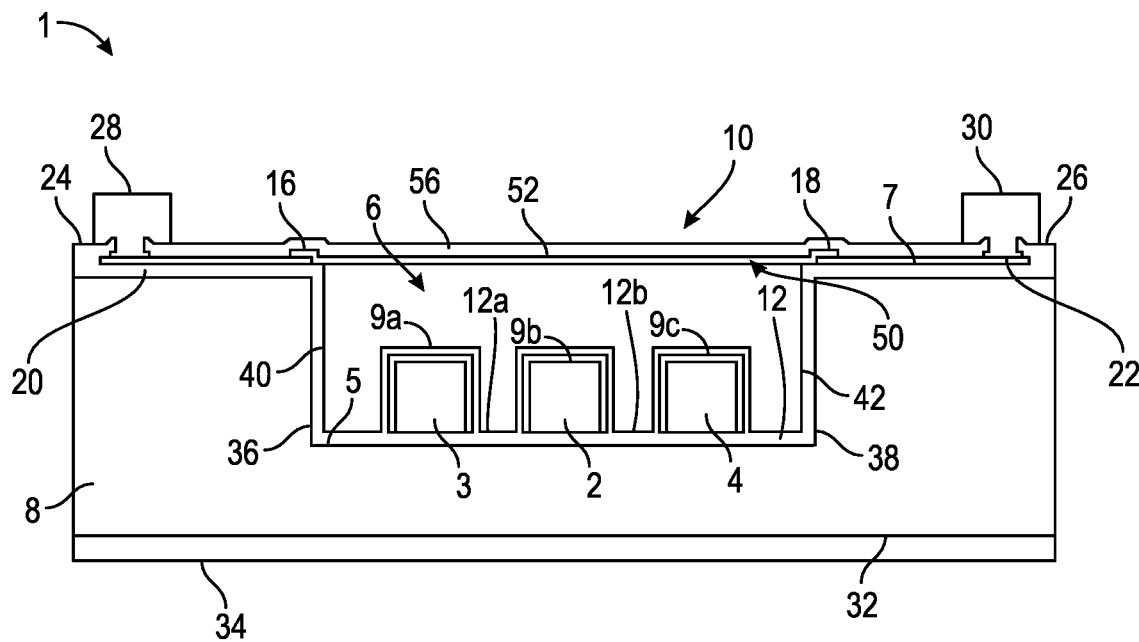
FIG. 1 is a sectional view through a capacitive MEMS switch comprising a MEMS bridge having an electrically conductive central switching portion in an up state (first position) and resilient planar supports (in the form of meshes) extending from either side of the central portion, mechanically coupling it to the substrate.

FIG. 1 is a sectional view (not to scale) of a radio frequency (RF) microelectromechanical (MEMS) capacitive switch 1 (being an example of a MEMS device which is a MEMS switch) having a central electrically conductive (typically metallic, for example aluminium, gold or molybdenum) signal line 2 supported between a pair of electrical ground conductors 3, 4 (also typically metallic, for example aluminium, gold or molybdenum) by a surface 5 of a longitudinally extending trench 6 formed in an upper surface 7 of a (typically high resistivity undoped silicon) substrate 8 (the ground conductors 3, 4 also being supported by the surface 5 of the trench 6). The signal line 2 and the ground conductors 3, 4 are co-planar such that together they form a co-planar waveguide structure for RF signals to propagate on the conductive signal line 2. The signal line 2 and the ground conductors 3, 4 are also covered with respective insulating layers 9a, 9b, 9c.

A MEMS bridge 10 extends over a portion of the trench 6, including over portions of the signal line 2 and the ground conductors 3, 4, in a direction perpendicular to a longitudinal axis of the signal line 2 (the longitudinal axis of the signal line extending in and out of the page in the view of FIG. 1). The signal line 2 and the ground conductors 3, 4 are provided on an electrically insulating layer 12 (typically silicon nitride or parylene although one skilled in the art would appreciate that other materials may also be suitable) provided on the surface 5 of the trench 6. The signal line 2 is spaced (and electrically isolated) from the ground conductors 3, 4 in a plane of the surface 5 of the trench 6 in a direction perpendicular to a longitudinal axis of the signal line 2 by portions 12a, 12b of the said insulating layer 12. The MEMS bridge 10 is mechanically coupled to the substrate 8 by respective anchors 16, 18 provided on either side of the trench 6. The anchors 16, 18 mechanically couple the bridge 10 to respective electrically conductive pads 20, 22 provided on respective insulating layers 24, 26 provided on the surface 7 of the substrate 8 on either side of the trench 6. The electrically conductive pads 20, 22 are electrically and mechanically connected to externally accessible electrical contacts 28, 30. A lower surface 32 of the substrate 8 opposite the upper surface 7 of the substrate 8 is also provided with an insulating layer 34 which has the advantage of reducing the occurrence of short circuits. Similarly, side walls 36, 38 of the trench 6 extending between the surface 5 of the trench 6 and the upper surface 7 of the substrate 8 are provided with insulating layers 40, 42. The insulating layers 24, 40, 12, 42 and 26 form a continuous insulating layer across the upper surface 7 of the substrate 8 and the surface 5 of the trench 6.

The MEMS bridge 10 comprises a first, electrically conductive (typically metallic, for example gold, aluminium or molybdenum) layer 50 having upper and lower surfaces 52, 54. The lower surface 54 of the first, electrically conductive layer 50 is exposed to and faces the trench 6. The conductive layer 50 is electrically coupled to the conductive pads 20, 22 (and thus to the electrical contacts 28, 30) by way of the anchors 16, 18. The bridge 10 further comprises a second, electrically insulating layer 56 stacked on top of the first layer 50. The second layer 56 may for example comprise silicon nitride layer; more preferably, the second layer 56 comprises parylene.

Figure 2:
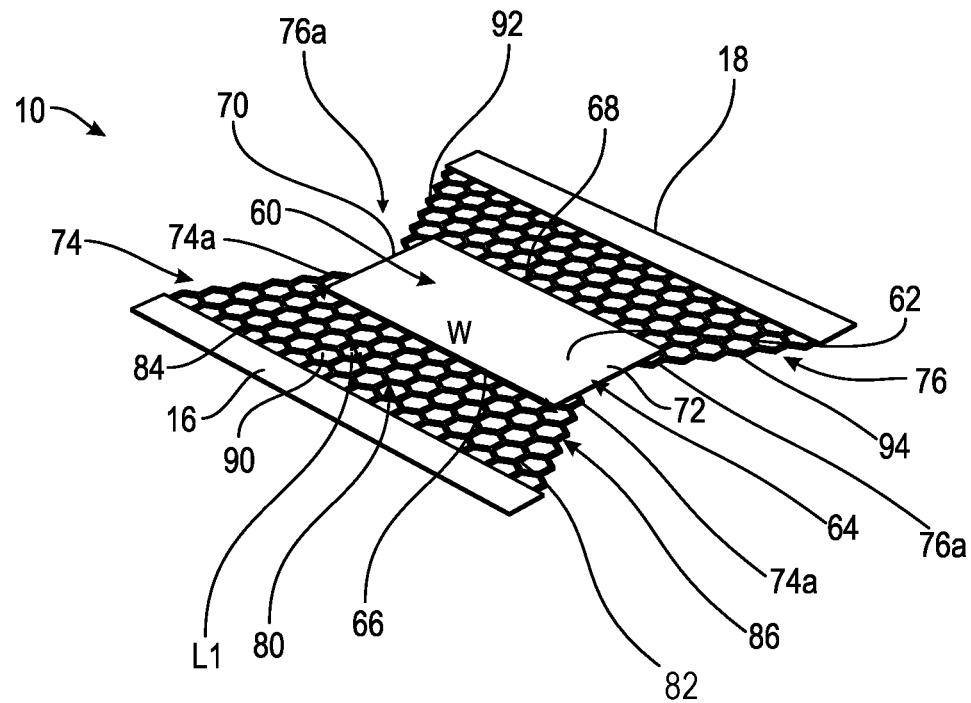
FIG. 2 is a perspective view of the MEMS bridge of FIG. 1 with the electrically conductive central switching portion in the up state.

As shown in FIG. 2, the MEMS bridge 10 comprises a (rectangular) central electrically conductive plate 60 (functioning as the electrically conductive switching portion) having a rectangular planar upper surface 62 opposite a rectangular planar lower surface 64, and first, second, third and fourth edges 66-72 extending between the planar upper and lower surfaces 62, 64. The first and second (longer) edges 66, 68 are parallel to each other and perpendicular to the third and fourth (shorter) edges 70, 72 which are also parallel to each other. The first and second (longer) edges 66, 68 extend between (and are connected to) the third and fourth (shorter) edges 70, 72. The electrically conductive plate 60 is mechanically coupled to the respective anchors 16, 18 by respective resilient planar supports in the form of a skeletal mesh 74, 76 which are mechanically coupled to (e.g. integrally formed with), and extend from, the first and second (longer) edges 66, 68 of the plate 60 respectively. The skeletal meshes 74, 76 thus support the electrically conductive central switching plate along its length. The skeletal meshes 74, 76 extend symmetrically from the plate 60 towards the anchors 16, 18. The skeletal meshes 74, 76 are substantially identical, so only a first skeletal mesh 74 will be described in detail, it being understood that the second skeletal mesh 76 has the same structure and works in the same way.

The skeletal mesh 74 comprises an array of discrete interlinked cells 80 tessellated in a tessellation plane and formed from a plurality of elongate links 82 of substantially equal length. The elongate links 82 are formed from solid material comprising the first (conductive) and second (insulating) layers 50, 56. Each of the discrete cells 80 has at least three sides which together conform to a hexagonal shape in the tessellation plane, but only some of the discrete cells have a fully hexagonal shape; some discrete cells 80 (directly) connected to the plate 60 and to the anchor 16 have part hexagon shapes. The discrete cells all have at least three sides which together conform to a hexagonal shape of the same size, which helps to provide an even distribution of mechanical load, stress and strain across the mesh.

The skeletal mesh 74 has first (upper) and second (lower) planar sides 84, 86 each of which extends in a plane from the plate 60 to the anchor 16 parallel to the tessellation plane. Each of the discrete cells 80 comprises a respective (hollow) pore extending between the first and second sides 84, 86, the respective pores terminating in openings 90 on the first and second sides 84, 86. The openings 90 (and the pores) are fully enclosed by the solid material of the skeletal mesh 74 (i.e. the skeletal mesh) such that the solid material forms continuous boundaries around the perimeters of the openings 90. The sides 84, 86 of the skeletal mesh 74 have respective widths W (see FIG. 2) which increase along their lengths from the plate 60 towards the respective anchors 16, 18 (the widths W1, W2 extending in the tessellation plane perpendicular to the direction in which the skeletal mesh 74 extends between the plate 60 and the respective anchors 16, 18). This allows stresses during actuation to dissipate along the width, through the mesh.

The widths W of the skeletal meshes 74, 76 increase symmetrically with respect to the first and second sides of the plate 60. The thickness of solid material between the first and second sides of the skeletal mesh 74 extending around the pores is typically substantially uniform and substantially constant from the plate 60 towards the anchor 16.

The skeletal mesh 74 comprises five rows of discrete cells (each row comprising a plurality of cells aligned with each other in the tessellation plane in a direction perpendicular to the principle direction in which the skeletal mesh 74 extends between the central plate 60 and the anchor 16): a first row connected to the plate 60, a fifth row connected to the anchor 16 and second to fourth rows extending between the first and fifth rows. Outer discrete cells 74a, 74b of the first row of the mesh 74 extend beyond the shorter edges 70, 72 of the conductive plate 60. The number of discrete cells in each row increases by one with each successive row from the first to the fifth row (from twelve discrete cells in the first row to sixteen discrete cells in the fifth row) to provide the increase in width of the mesh 74 towards the anchor 16. Increasing the number of cells towards the anchors causes the stress to be distributed away from the centre of the device. Two discrete cells (which have part hexagon shapes) extend between the first row of cells and the third and fourth edges 70, 72 of the plate 60 to help support the plate 60 at the third and fourth edges 70, 72 (i.e. at both ends) and to distribute stress, providing the mesh 74 with seventy-two discrete cells in total).

A (exposed) surface area of solid material (in this embodiment, the surface area of electrically insulating material of the second layer 56) of the first side 84 of the mesh 74 is less than a total area of the openings 90 in the first side 84 of the mesh 74. Similarly, a surface area of solid material (in this embodiment, the surface area of electrically conductive material in the first layer 50) on the second side 86 of the mesh is less than a total area of the openings 90 in the second side 86 of the mesh 74. In addition, the greatest extent L1 of the openings 90 of the discrete cells in the tessellation plane is greater than the shortest distance between the openings 90 of neighbouring cells 80 (which is typically defined by the width of the said elongate links 82 separating the neighbouring cells in the tessellation plane).

Figure 3:
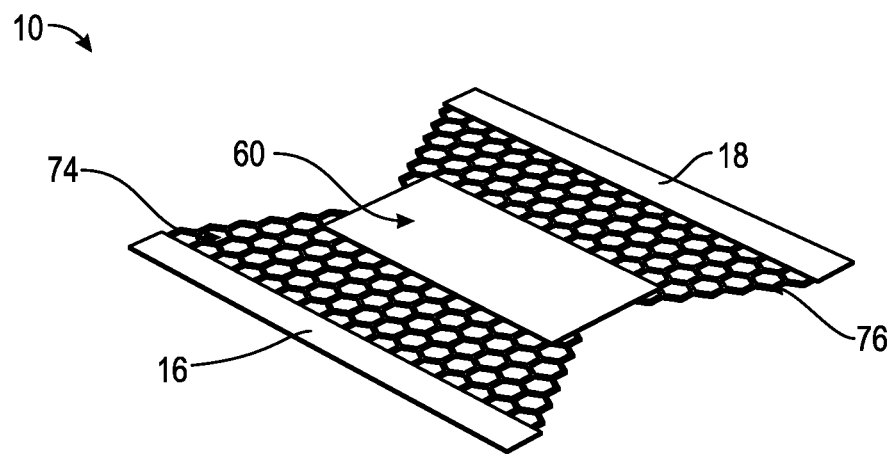
FIG. 3 is a perspective view of the MEMS bridge of FIGS. 1 and 2 with the electrically conductive central switching portion in the down state.

The electrically conductive plate 60 is movable between an up state (a first position, equating to a first position of the MEMS bridge, and equating to the first position of the electrically conductive switching portion, shown in FIGS. 1 and 2) and a down state (a second position, equating to a second position of the MEMS bridge, and equating to a second position of the electrically conductive switching portion, shown in FIG. 3) by electrostatic actuation. In the up state, the electrically conductive plate 60 and the skeletal meshes 74, 76 are substantially flat and co-planar, while the skeletal meshes 74, 76 are in a relaxed state. In the down state, the skeletal meshes 74, 76 (and thus their tessellation planes) are resiliently and elastically deformed towards the surface 5 of the trench 6 to form a concave shape about the conductive plate 60 such that the planar lower surface 64 of the conductive plate 60 engages the insulating layers 9a, 9b, 9c on the signal line 2 and the ground conductors 3, 4. Typically, when in the down state, portions of the (bent, deformed) tessellation planes of the meshes 74, 76 are parallel to the planar lower surface 64 of the plate 60. When the lower surface 64 of the conductive plate 60 engages the insulating layers 9a, 9b, 9c on the signal line 2 and the ground conductors 3, 4, the capacitance of the switch increases compared to the capacitance of the switch when the conductive plate 60 is in the first position. The meshes 74, 76 are configured such that the lower surface 64 of the conductive plate 60 remains substantially flat and parallel to upper planar surfaces of the insulation layers provided on the signal line 2 and the ground conductors 3, 4, as the plate 60 moves between the first and second positions, corresponding to first and second positions of the MEMS bridge respectively. In this way a capacitance ratio between the up state and the down state of greater than 20 can be achieved.

The electrostatic actuation of the conductive plate 60 is controlled by way of a direct current (DC) bias voltage applied to the conductive pads 20, 22 by a controller (not shown) in electrical communication with the electrical connectors 28, 30 (which are themselves in electrical communication with the conductive pads 20, 22). As the conductive pads 20, 22 are electrically coupled to the conductive layer 50 of the MEMS bridge, the voltage applied to the conductive pads 20, 22 is thereby applied to the conductive layer 50 of the MEMS bridge, thereby creating a DC voltage difference between the conductive layer 50 of the MEMS bridge and the conductive signal line 2 and between the conductive layer 50 of the MEMS bridge and the ground conductors 3, 4. This in turn causes an electrostatic force to act on the skeletal meshes 74, 76, causing them (and thus their tessellation planes) to bend (deform) towards the surface 5 of the trench 6 until the electrically conductive plate 60 engages the insulating layers 9a, 9b, 9c on the signal line 2 and the ground conductors 3, 4. Although in these examples a DC bias voltage is applied in some embodiments a low frequency (e.g. a few kHz) AC signal is applied instead, with the same effect.

By providing the skeletal meshes 74 with a plurality of discrete cells 80 having polygonal shapes (typically hexagonal shapes, typically with straight edges) in the tessellation plane, and by the skeletal meshes 74 supporting the central electrically conductive switching plate 60 along its length and at both ends, improved control of the skeletal meshes 74 and the conductive plate 60 is achieved as the skeletal mesh 74 deforms to move the conductive plate 60 between the first (up state) and second (down state) positions. This helps to prevent warping of the mesh 74 (and thus of the conductive plate 60), which in turn helps to provide the conductive plate 60 with a substantially flat profile in the second position (and typically also when the plate 60 is in the first position and between the first and second positions). Importantly, the lower surface of the conductive plate 60 is substantially parallel to upper planar surfaces of the insulation layers provided over the conductive line 2 and the ground conductors 3, 4 (and typically parallel to upper planar surfaces of the conductive line 2 and the ground conductors 3, 4) when they engage in the second position. This ensures good contact between the conductive plate 60 and the co-planar waveguide structure when the conductive plate 60 is in the down state, which helps to improve the capacitance ratio of the switch. That is, the difference in capacitance of the switch when it is in the down state compared to when it is in the up state is increased over prior art switches. In addition, the skeletal mesh 74 has well-defined load paths through which mechanical loads, stresses and strains are dispersed throughout the mesh 74, which helps to improve the longevity of the switch. The improved control of the mesh 74 also allows the plate 60 to be substantially flat when it is in the up state (first) position.

This helps to make the capacitance ratio of the switch more reliable. By providing the meshes 74, 76 with more space (in the form of openings 90 and associated pores) than solid material, a flexible structure with a high elasticity is achieved and the electrostatic actuation voltage required to move the plate 60 from the first position to the second position is thereby reduced. The flexibility and elasticity of the meshes 74, 76 is further assisted by the use of parylene as the insulating layer of the bridge, parylene being a highly flexible material. Accordingly, it is not typically necessary to electrostatically actuate the bridge 10 in order to move the conductive plate 60 from the down state to the up state. Rather, when the conductive plate 60 (and the MEMS bridge) moves from the first position to the second position, the skeletal meshes 74, 76 resiliently and elastically deform such that, when the DC bias voltage is reduced or removed, the resilience and elasticity of the skeletal meshes 74, 76 provides a majority, or all, of the restoring force required to move the conductive plate from the second position to the first position.

As most clearly shown in FIG. 2, the meshes 74, 76 each comprise opposing first and second edges 92, 94 which extend between the conductive plate 60 and the anchors 16, 18 and are provided by edges of the discrete cells 80 of the respective meshes 74, 76. Accordingly, because the edges 92, 94 conform to hexagonal shapes, or form parts of hexagonal shapes, the edges 92, 94 are stepped. This increases the lengths of the edges 92, 94 (as compared to straight or gently curved edges) which further help the meshes to distribute mechanical loads, stresses and strains.

Figure 4:
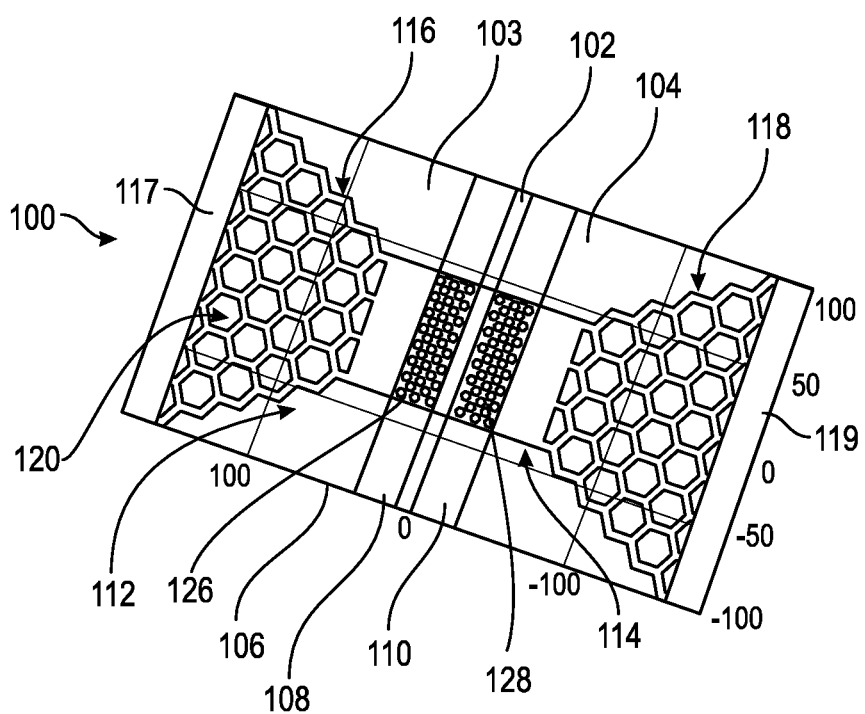
FIG. 4 is a plan view of an alternative MEMS bridge of FIGS. 1 and 2 with the electrically conductive central switching portion in the down state.

FIG. 4 is a schematic plan view of an alternative RF MEMS capacitive switch 100 comprising a central electrically conductive (typically metallic, for example aluminium, gold or molybdenum) signal line 102 supported between a pair of electrical ground planes 103, 104 (also typically metallic, for example aluminium, gold or molybdenum) by a substrate 106. The signal line 102 and the ground planes 103, 104 are physically spaced and electrically isolated from each other by electrically insulating layers 108, 110 on the substrate 106. The signal line 102 and the ground planes 103, 104 are also covered with respective insulating layers (not shown). A MEMS bridge 112 extends over portions of the signal line 102 and the ground conductors 103, 104, in a direction perpendicular to a longitudinal axis of the signal line 102. The MEMS bridge 112 is similar to the MEMS bridge 10 of FIGS. 1 to 3 in that it comprises a central (rectangular) electrically conductive switching plate 114 having opposing planar upper and lower surfaces and being mechanically coupled to the substrate (and supported) by a pair of skeletal meshes 116, 118 which are identical to each other and which extend symmetrically between the plate 114 and respective anchors 117, 119.

The meshes 116, 118 of the bridge of FIG. 4 are attached to the shorter edges of the plate 114 rather than the longer edges (see FIGS. 2 and 3). The plate 114 comprises a first portion 121 provided directly above (and facing) a first one of the ground planes 103; a second portion 122 provided directly above (and facing) the signal line 102; a third portion 124 provided directly above (and facing) a second one of the ground planes 104; a fourth portion 126 provided between the first and second portions 121, 122; and a fifth portion 128 provided between the second and third portions 122, 124. The fourth and fifth portions 126, 128 are provided directly above insulating portions provided between (and electrically isolating) the signal line 102 and the ground planes 103, 104. The fourth and fifth portions 126, 128 are provided with holes extending therethrough to improve the mechanical stress distribution in the plate 114. The first, second and third portions 121, 122, 124 do not comprise holes. This helps to maximise the surface areas of the first, second and third portions 121, 122, 124 of the plate 114 which engage the signal line 102 and the ground planes 103, 104, thereby helping to maximise the capacitance ratio of the switch 100.

The skeletal meshes 116, 118 comprise a plurality of discrete cells tessellated in a tessellation plane which is parallel or co-planar with the planar upper and lower surfaces of the plate 114 when the bridge is in the up state. Similarly to the skeletal meshes 74, 76 of the MEMS bridge 10 described above, the skeletal meshes 116, 118 have opposing planar first and second sides extending between the plate 114 and the respective anchors 117, 119 with pores 120 extending between the first and second sides. The first and second sides of the meshes 116, 118 have widths which increase along their lengths from the plate 114 to the respective anchors 117, 119 symmetrically about the plate 114 (in a direction perpendicular to the direction in which the respective meshes 116, 118 extend from the plate 114 towards the respective anchors 117, 119). The solid material of the meshes 116, 118 extending around the pores is provided with substantially uniform and constant thickness between the first and second sides as the meshes extend from the plate 114 to the anchors 117, 119.

The meshes 116, 118 support the rectangular plate 114 across its width, but the skeletal meshes 116, 118 comprise fewer discrete cells than the skeletal meshes 74, 76. Where fewer cells are present, less material is required which in turn has the result of providing a system with a lower spring constant and, as such, a lower actuation voltage is required. Each of the meshes 116, 118 comprise six rows of discrete cells: a first row connected to the plate 114; a sixth row connected to the substrate 106 by way of a respective one of the anchors 117, 119; and second to fifth rows extending between the first and sixth rows. The discrete cells of the second to fifth rows (and their respective pores) are hexagonal in the tessellation plane; the discrete cells of the first and sixth rows (and their respective pores) have at least two sides which together conform to hexagonal shapes in the tessellation plane, but only form part-hexagon shapes. The number of discrete cells in each row increases by one from the first row to the sixth row, there being three discrete cells in the first row and eight discrete cells in the sixth row, thereby providing thirty-three discrete cells in total per meshes 116, 118. The discrete cells of the meshes 116, 118 (and their respective pores) all have two or more sides which together conform to a hexagonal shape of the same size. The outer edges of the meshes 116, 118 which extend between the conductive plate 114 and the respective anchors 117, 119 are provided by the edges of the discrete cells of the meshes 116, 118 and are therefore stepped.

The meshes 116, 118 (and thus their tessellation planes) resiliently and elastically deform by electrostatic actuation (applied by way of a DC bias to conductive pads (not shown) to move the plate 114 from the up state to a down state in a similar way to the meshes 74, 76 described above. Again, the plate 114 and the meshes 116, 118 are configured such that the rectangular lower planar surface of the plate 114 remains substantially flat (typically parallel to upper planar surfaces of the insulation layers provided over the signal conductor 102 and the ground conductors 103, 104) in the down state (and typically in the up state and typically between the up and down states) thereby helping to maximise the capacitance ratio of the switch 100. Typically, when in the down state, portions of the (bent, deformed) tessellation planes of the meshes 116, 118 are parallel to the planar lower surface of the plate 114.

FIGS. 5 to 22 illustrate various alternative bridges which work in a similar way to, and could be used in place of, the bridge 10 of FIGS. 1-3 or the bridge 112 of FIG. 4, in the switches 1, 100. The bridges are illustrated in their up states. In each case, the bridges comprise a conductive plate coupled to a substrate by a pair of skeletal meshes each having a plurality of discrete cells tessellated in a tessellation plane, the skeletal meshes (and thus their tessellation planes) deforming resiliently and elastically by electrostatic actuation (applied by a DC bias) to move the conductive plate between a first position (up state, corresponding to a first position of the MEMS bridge) and a second position (down state, corresponding to a second position of the MEMS bridge) to change the capacitance of the switch. The discrete cells of the skeletal meshes have openings extending between first and second planar sides of the meshes, and the tessellation planes of the skeletal meshes are typically co-planar with, or on a parallel plane to, a planar lower surface of the central conductive plate. Typically, at least portions of the tessellation planes of the skeletal meshes are co-planar with, or on a parallel plane to, a planar lower surface of the central conductive plate when the conductive plate is in the second position (down state). In addition, a (exposed) surface area of solid material of the first side of each of the meshes is less than a total area of the openings in the first side of the said meshes. Similarly, a surface area of solid material on the second side of each of the meshes is less than a total area of the openings in the second side of the said meshes. In addition, the greatest extent of the openings of the discrete cells is greater than the shortest distance between neighbouring cells (which is typically defined by the width of the elongate links separating the neighbouring cells).

The bridge of FIG. 5 comprises a pair of skeletal meshes 140, 142 which are identical to each other and which connect the longer edges of a central electrically conductive (rectangular) switching plate 144 to respective anchors 146, 148, the plate 144 having opposing planar rectangular upper and lower surfaces supported by the meshes 140, 142 along their lengths. The skeletal meshes 140, 142 have opposing planar first and second sides (being co-planar with or on parallel planes to the tessellation planes of the meshes) extending between the plate 144 and the respective anchors 146, 148 with pores extending between openings on the first and second sides. The first and second sides of the meshes 140, 142 have widths (perpendicular to the respective directions in which they extend from the plate 144 and the respective anchor 146, 148) which increase symmetrically (with respect to the plate 144) along their lengths from the plate 144 to the respective anchors 146, 148. The solid material extending around the pores of the meshes 140, 142 is provided with substantially uniform and constant thickness between the first and second sides as the meshes 140, 142 extend from the plate 144 to the anchors 146, 148.

The skeletal meshes 140, 142 comprise seven rows of discrete cells: a first row connected to the central electrically conductive switching plate 144; a seventh row connected to a respective one of the anchors 146, 148; and second to sixth rows extending between the first to the seventh rows. Outer discrete cells 140a, 142a of the first rows of the meshes 140, 142 extend beyond the longer edges of the conductive plate 144. Again, the number of discrete cells per row increases by one from the first to the seventh row (from fifteen in the first row to twenty-one in the seventh row). Two discrete cells extend between the opposing ends of the first row and the shorter edges of the rectangular plate 144 to thereby provide support to the opposing shorter ends of the plate 144, and to thereby provide a total of one hundred and twenty eight discrete cells per meshes 140, 142. The discrete cells of the first to sixth rows (and their respective pores) are hexagonal in the tessellation planes, while the discrete cells of the seventh row (and their respective pores) each have four sides which together conform to a hexagonal shape but are only partly hexagonal. The discrete cells of the meshes 140, 142 (and their respective pores) all have three or more sides which together conform to a hexagonal shape of the same size, which helps to more evenly distribute mechanical loads, stresses and strains across the meshes 140, 142. Similarly to the meshes 74, 76 of the bridge of FIGS. 1 to 3, the outer edges of the meshes 140, 142 which extend between the conductive plate 144 and the respective anchors 146, 148 are provided by the edges of the discrete cells of the meshes 140, 142 and are therefore stepped.

FIG. 6 is a schematic plan view showing another variation of the bridge 10 of the switch 1 of FIGS. 2, 3. The bridge of FIG. 6 comprises a pair of skeletal meshes 150, 152 which are identical to the skeletal meshes 140, 142 of FIG. 5. However, the skeletal meshes 150, 152 of the bridge of FIG. 6 mechanically couples an alternative central electrically conductive rectangular switching plate 154 to the substrate to the embodiment of FIG. 5. More specifically, the plate 154 is made up of five separate parts connected by hexagonal cells. The hexagonal cells which appear overlaid on the switching plates 154 are integrally comprised within the plate 154. Again, the outer discrete cells of the first rows of the meshes 150, 152 extend beyond the longer edges of the conductive plate 154. The discrete cells of the meshes 150, 152 (and their respective pores) all have three or more sides which together conform to a hexagonal shape of the same size in the tessellation plane, which helps to more evenly distribute mechanical loads, stresses and strains across the meshes 150, 152.

Figure 7:
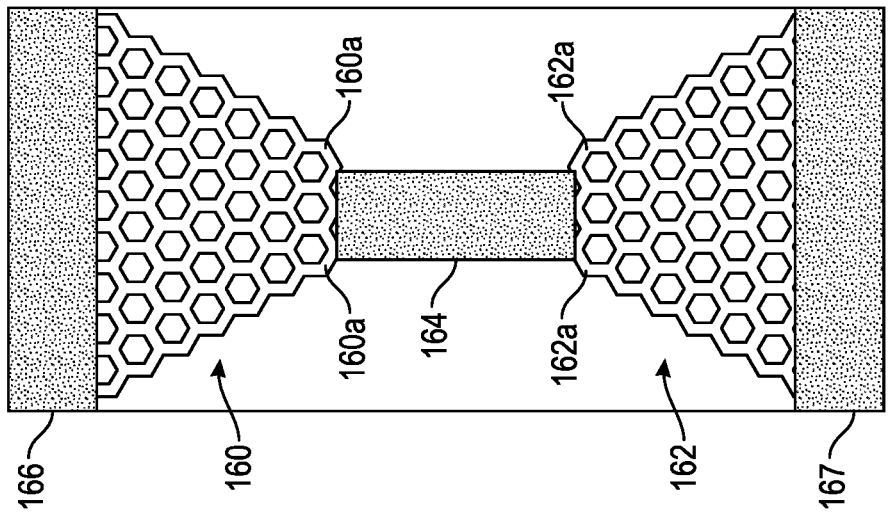

FIG. 7 is a schematic plan view of another variation of the bridge 10 of the switch 1 of FIGS. 2, 3. The bridge of FIG. 7 comprises a pair of skeletal meshes 160, 162 each comprising a plurality of cells tessellated in a tessellation plane and which mechanically couple the shorter edges of a (rectangular) central electrically conductive switching plate 164 to the substrate by way of respective anchors 166, 167, the plate 164 comprising opposing rectangular upper and lower surfaces supported by the meshes 160, 162 across its width. The skeletal meshes 160, 162 are different from each other. The skeletal meshes 160, 162 each have opposing planar first and second sides (being co-planar with or on parallel planes to the tessellation planes of the meshes 160, 162) extending between the plate 164 and the respective anchors 166, 167 with pores extending between openings on the first and second sides. The first and second sides of the meshes 160, 162 each have widths (perpendicular to the respective directions in which they extend from the plate 164 and the respective anchor 166, 167) which increase symmetrically along their lengths from the plate 164 to the respective anchors 166, 167. The solid material of the meshes 160, 162 extending around the pores is provided with substantially uniform and constant thickness between the first and second sides as the meshes extend from the plate 164 to the respective anchors 166, 167.

The first skeletal mesh 160 comprises seven rows of discrete cells: a first row connected to the central plate 164; a seventh row connected to an anchor 166; and second to sixth rows extending between the first and seventh rows. The number of discrete cells per row increases by one from the first to the seventh rows from three in the first row to nine in the seventh row. The discrete cells of the first to sixth rows (and their respective pores) are hexagonal in the tessellation plane. The discrete cells of the seventh row (and their respective pores) each have four sides which conform to a hexagonal shape in the tessellation plane but have an only part hexagonal shape. The second skeletal mesh 162 has six rows of discrete cells: a first row connected to the central plate 164; a sixth row connected to an anchor 167; and second to fifth rows extending between the first to sixth rows. The number of discrete cells per row increases by one from the first to the sixth rows from three in the first row to eight in the sixth row to thereby provide the increase in the width of the skeletal mesh 162 towards the anchor 167. The discrete cells of each row are hexagonal in the tessellation plane. The discrete cells of the meshes 160, 162 all have four or more sides which together conform to a hexagonal shape of the same size in the tessellation plane, which helps to more evenly distribute mechanical loads, stresses and strains across the meshes 160, 162. Outer discrete cells 160*a*, 162*a* of the first rows of the meshes 160, 162 extend beyond the longer edges of the conductive plate 164. This allows better control of stress and causes the plate 164 to be flat. The outer edges of the meshes 160, 162 which extend between the conductive plate 164 and the respective anchors 166, 167 are provided by the edges of the discrete cells of the meshes 160, 162 and are therefore stepped.

Figure 8:
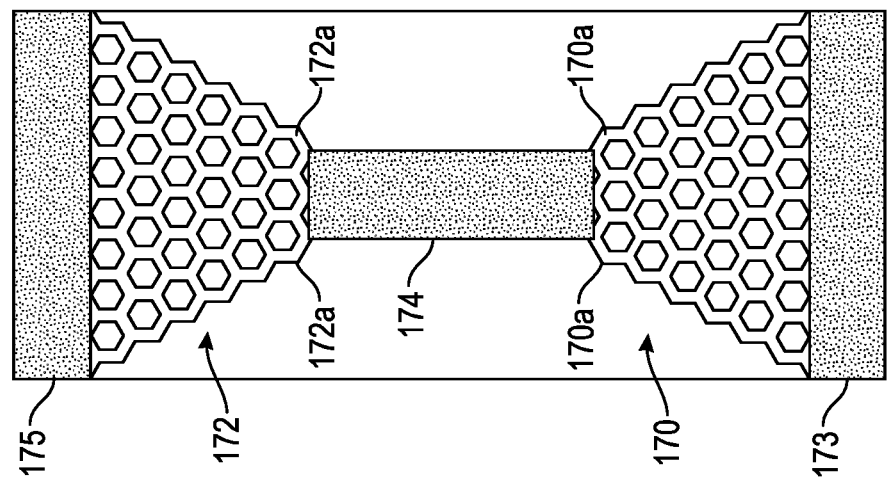

FIG. 8 is a schematic plan view of another variation of the bridge 10 of the switch 1 of FIGS. 2, 3. The bridge of FIG. 8 comprises skeletal meshes 170, 172 which are identical to each other and which mechanically couple the shorter edges of a central electrically conductive (rectangular) switching plate 174 to the substrate by way of respective anchors 173, 175, the plate 174 having opposing planar rectangular upper and lower surfaces being supported by the meshes 170, 172 across its width. The skeletal meshes 170, 172 each comprise a plurality of discrete cells tessellated in a tessellation plane. The skeletal meshes 170, 172 each have opposing planar first and second sides (being co-planar with or on parallel planes to the tessellation planes of the meshes 170, 172) extending between the plate 174 and the respective anchors 173, 175 with pores extending between openings on the first and second sides. The first and second sides of the meshes 170, 172 have widths (perpendicular to the respective directions in which they extend from the plate 174 and the respective anchor 173, 175) which increase along their lengths from the plate 174 to the respective anchors 173, 175. The solid material of the meshes 170, 172 extending around the pores is provided with substantially uniform and constant thickness between the first and second sides as the meshes extend from the plate 174 towards the respective anchors 173, 175.

Each of the skeletal meshes 170, 172 has six rows of discrete cells: a first row connected to the central plate 174; a sixth row connected to a respective anchor 176, 177; and second to fifth rows extending between the first and sixth rows. Outer discrete cells 170*a*, 172*a* of the first rows of the meshes 170, 172 extend beyond the longer edges of the conductive plate 174. The number of discrete cells per row increases by one from the first to the sixth rows from three in the first row to eight in the sixth row, thereby providing thirty-three discrete cells per meshes 170, 172. The discrete cells of the first to fifth rows are hexagonal in the tessellation plane; the cells of the sixth row each have four sides which together conform to a hexagonal shape in the tessellation plane, but form only part hexagons. The discrete cells of the meshes 170, 172 all have four or more sides which together conform to a hexagonal shape of the same size in the tessellation plane, which helps to more evenly distribute mechanical loads, stresses and strains across the meshes 170, 172. The outer edges of the meshes 170, 172 which extend between the conductive plate 174 and the respective anchors 176, 177 are provided by the edges of the discrete cells of the meshes 170, 172 and are therefore stepped.

Figure 9:
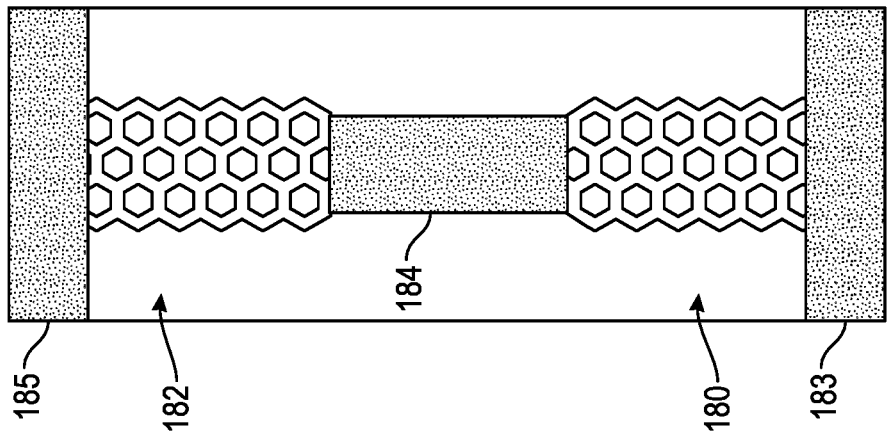

FIG. 9 is a schematic plan view of another variation of the bridge 10 of the switch 1 of FIGS. 2, 3. The bridge of FIG. 9 comprises a pair of skeletal meshes 180, 182 which are identical to each other and which symmetrically mechanically couple a central electrically conductive (rectangular) switching plate 184 to the substrate by way of respective anchors 183, 185, the plate 184 having opposing planar rectangular surfaces supported by the meshes 180, 182 across their widths. The skeletal meshes 180, 182 each comprise a plurality of discrete cells tessellated in a tessellation plane.

The skeletal meshes 180, 182 each have opposing planar first and second sides (being co-planar with or on parallel planes to the tessellation planes of the meshes 180, 182) extending between the plate 184 and the respective anchors 183, 185 with pores extending between openings on the first and second sides. The first and second sides of the meshes 180, 182 each have widths (perpendicular to the respective directions in which they extend from the plate 184 and the respective anchors 183, 185) which are substantially constant along their lengths (and the solid material of the meshes 180, 182 extending around the pores is provided with substantially uniform and constant thickness between the first and second sides as the meshes extend) from the plate 184 to the respective anchors 183, 185, although there are minor variations (steps) in the said widths due to the outer edges of the meshes conforming to the hexagonal shapes of the discrete cells (similarly to the meshes 74, 76 of the bridge of FIGS. 1 to 3). The said widths are greater than the widths of the first and second sides of the plate 184.

Each of the skeletal meshes 180, 182 comprises three columns of discrete cells extending between the conductive plate 184 and the anchors 183, 185 (the columns extending generally parallel to the direction in which the respective mesh 180, 182 extends between the central plate 184 and a respective anchor 186, 188 which connects it to the substrate): a second column provided between first and third columns, the cells of the second column being offset from the cells of the first and third rows in the principle direction in which the respective mesh 180, 182 extends between the central plate 184 and the respective anchor 186, 188. Each of the first, second and third columns comprise six cells, providing eighteen discrete cells in total per mesh 180, 182. The discrete cells of the first and third columns connected to the respective anchors 186, 188 each have three sides which together conform to a hexagonal shape but are only part hexagons. The other discrete cells of the first and third columns are hexagonal. The discrete cell of the second column connected to the central plate 184 has three sides which together conform to a hexagonal shape but is only a part hexagon. The other discrete cells of the second column are hexagonal. The discrete cells of the meshes 180, 182 all have at least three sides which together conform to a hexagonal shape of the same size, which helps to more evenly distribute mechanical loads, stresses and strains across the meshes 180, 182.

Figure 10:
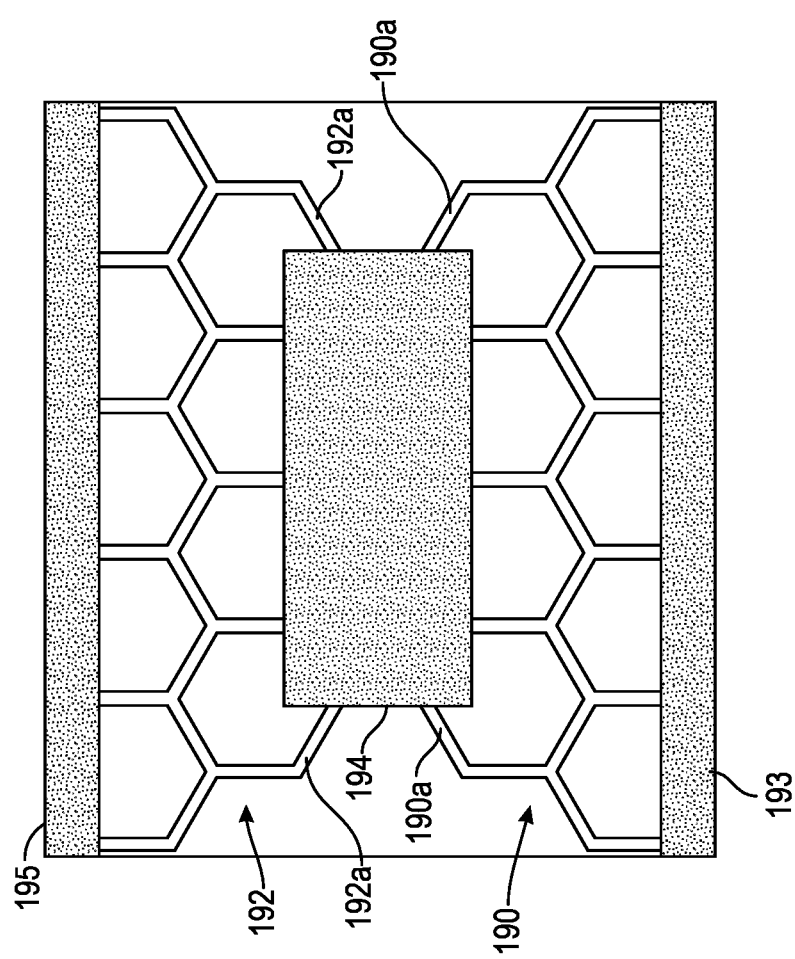

FIG. 10 is a schematic plan view of yet another variation of the bridge 10 of the switch 1 of FIGS. 2, 3. The bridge of FIG. 10 comprises a pair of skeletal meshes 190, 192 which are identical to each other and which mechanically couple the longer edges of a central electrically conductive (rectangular) switching plate 194 to the substrate by way of respective anchors 193, 195, the plate 194 having opposing planar rectangular upper and lower surfaces supported along their lengths by the skeletal meshes 190, 192. The skeletal meshes 190, 192 each comprise a plurality of discrete cells tessellated in a tessellation plane. The meshes 190, 192 each have opposing planar first and second sides (being co-planar with or on parallel planes to the tessellation planes of the meshes 190, 192) extending between the plate 194 and the respective anchors 193, 195 with pores extending between openings on the first and second sides. The first and second sides of the meshes 190, 192 each have widths (perpendicular to the respective directions in which they extend from the plate 194 and the respective anchors 193, 195) which increase symmetrically along their lengths from the plate 194 to the respective anchors 193, 195. The solid material of the meshes 190, 192 extending around the pores is provided with substantially uniform and constant thickness between the first and second sides as the meshes extend from the plate 194 to the respective anchors 193, 195.

Each of the skeletal meshes 190, 192 comprises two rows of cells: a first row connected to a respective longer edge of the rectangular central plate 194; and a second row connected to the first row and to a respective anchor 193, 195. The number of cells per row increases by one between the first and second rows from four in the first row to five in the second row, thereby providing nine cells per mesh 190, 192. Outer cells 190a, 192a of the first row extend beyond the shorter edges of the rectangular central plate 194. The cells of the meshes 190, 192 (and their respective pores) all (have at least four sides which together) conform to a hexagonal shape of the same size in the tessellation plane, which helps to more evenly distribute mechanical loads, stresses and strains through the meshes. Each of the cells of the meshes 190, 192 have at least four sides which together conform to a hexagonal shape in the tessellation plane having a greatest extent of at least a quarter of the length of the longer sides of the rectangular plate 194 (i.e. the greatest extent of planar upper and lower surfaces of the plate 194). However, each of the cells of the first and second rows is only a part hexagon. It will be understood that the plate 194 need not be rectangular (see FIGS. 17, 18 which are described in more detail below). It may be that each of the cells conforms to a hexagonal shape in the tessellation plane having a greatest extent of at least a quarter of the greatest extent of planar upper and lower surfaces of the plate 194. This causes the bridge to deform more easily. The outer edges of the meshes 190, 192 which extend between the conductive plate 194 and the respective anchors 193, 195 are provided by the edges of the discrete cells of the meshes 190, 192 and are therefore stepped.

Figure 11:
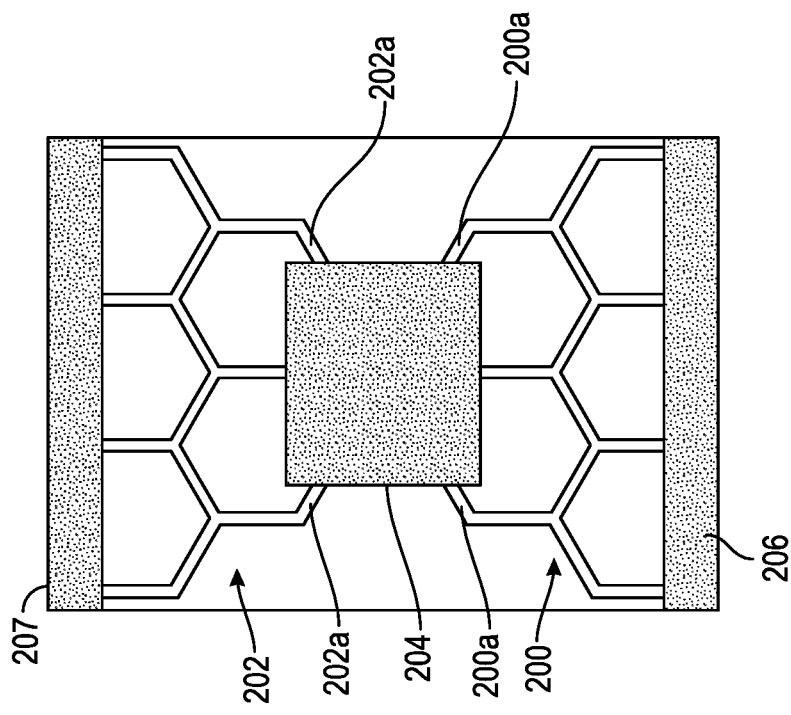
Figure 12:
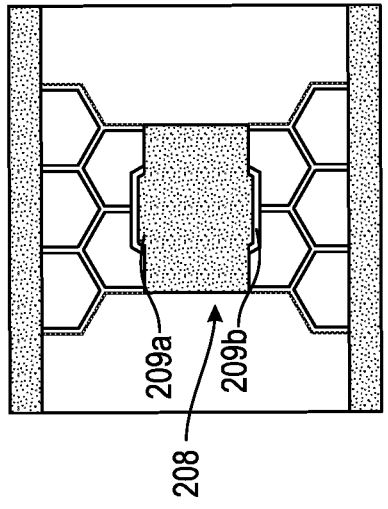

FIG. 11 is a schematic plan view of yet another variation of the bridge 10 of the switch 1 of FIGS. 2, 3. The bridge of FIG. 11 is similar to that of FIG. 10, having skeletal meshes 200, 202 which are identical to each other, which comprise a plurality of discrete cells tessellated in a tessellation plane and which mechanically couple the opposing longer edges of a (rectangular) central electrically conductive switching plate 204 to a substrate, each mesh 200, 202 comprising two rows of cells: a first row connected to a respective longer edge of the rectangular central plate 204; and a second row connected to a respective anchor 206, 207. The number of cells per row increases by one between the first and second rows from two in the first row to three in the second row, thereby providing five cells per mesh 200, 202. Outer cells 200a, 202a of the first row extend beyond the shorter edges of the rectangular central plate 204. The cells of the meshes 200, 202 (and their respective pores) all (have four or more sides which together) conform to a hexagonal shape of the same size in the tessellation plane. Each of the cells of the meshes 200, 202 (and their respective pores) have four or more sides which together conform to a hexagonal shape in the tessellation plane having a greatest extent of at least a half of the length of the longer sides of the rectangular plate 204. It will be understood that the plate 204 need not be rectangular. For example, FIG. 12 shows an alternative bridge which is identical to that shown in FIG. 11 but having an alternative central plate 205 which is hexagonal (i.e. which has opposing upper and lower planar surfaces which are hexagonal) rather than rectangular in shape. The hexagonal central plate 205 conforms to a hexagonal shape which is greater in size than that conformed to by the cells of the meshes 200, 202. The cells of the meshes 200, 202 all conform to a hexagonal shape in the tessellation plane having a greatest extent (and indeed an extent in the same direction as the greatest extent of the plate) of at least a half of the greatest extent of the planar upper and lower surfaces of the plate 205. Larger hexagons cause the bridge to deform more readily than smaller hexagons.

The outer edges of the meshes 200, 202 which extend between the conductive plate 204 and the respective anchors are provided by the edges of the discrete cells of the meshes 200, 202 and are therefore stepped in profile.

Figure 13:
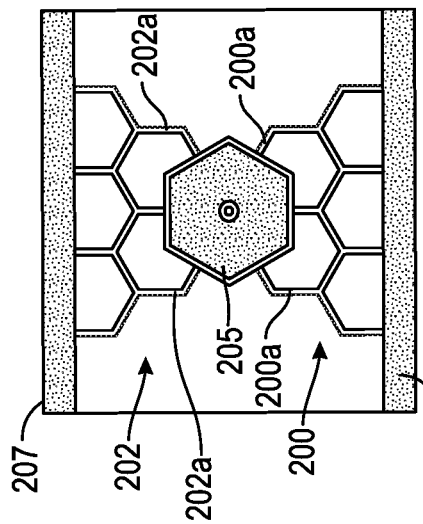

FIG. 13 shows an alternative bridge which is identical to that shown in FIGS. 11 and 12 but having an alternative central plate 208. The plate 208 has a substantially rectangular shape (i.e. has opposing planar rectangular upper and lower surfaces) but further comprises co-planar protrusions 209a, 209b extending from the centres of the longer sides of the rectangular shape. The protrusions 209a, 209b have three sides which together conform to a hexagonal shape in the planes of the upper and lower surfaces of the plate 206. The discrete cells of the skeletal meshes of the bridge of FIG. 13 all have at least four sides which together conform to a hexagonal shape in the tessellation plane having an extent in the same direction as the longer edges of the plate of (exactly) half of the extent of the longer edges of the plate 206. The hexagonal shape to which the sides of the protrusions together conform is greater in size than that to which the cells of the meshes conform.

Figure 14:
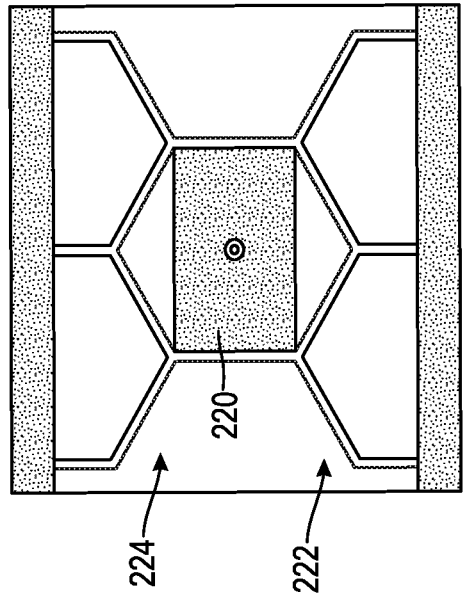

FIG. 14 is a schematic plan view of yet another variation of the bridge 10 of the switch 1 of FIGS. 2, 3. Again, the bridge of FIG. 14 comprises a pair of skeletal meshes 210, 212 which comprise a plurality of discrete cells tessellated in a tessellation plane and which mechanically couples a central electrically conductive switching plate 214 to a substrate by way of a respective pair of anchors 216, 218. The central plate 214 has planar upper and lower surfaces which are hexagonal. The meshes 210, 212 are identical to each other and each comprise a pair of interconnected discrete cells arranged in a row which extend beyond the width of the plate 214, each of the discrete cells having four sides which together conform to a hexagonal shape in the tessellation plane which is identical (the same size) to the hexagonal shape of the planar upper and lower surfaces of the central plate 214. The discrete cells of the meshes 210, 212 are only partly hexagonal in shape.

The skeletal meshes 210, 212 each have opposing planar first and second sides (being co-planar with or on parallel planes to the tessellation planes of the meshes 210, 212) extending between the plate 214 and the respective anchors 216, 218 with pores extending between openings on the first and second sides. The first and second sides of the meshes 210, 212 each have widths (perpendicular to the respective directions in which they extend from the plate 214 and the respective anchor 216, 218) which increase along their lengths from the plate 214 to the respective anchors 216, 218. The solid material of the meshes 210, 212 extending around the pores is provided with substantially uniform and constant thickness between the first and second sides as the meshes extend) from the plate 214 to the respective anchors 216, 218. The outer edges of the meshes 210, 212 which extend between the conductive plate 214 and the respective anchors 216, 218 are provided by the edges of the discrete cells of the meshes 210, 212 and are therefore stepped. This arrangement is easy to deform and can produce a relatively large capacitance.

Figure 15:
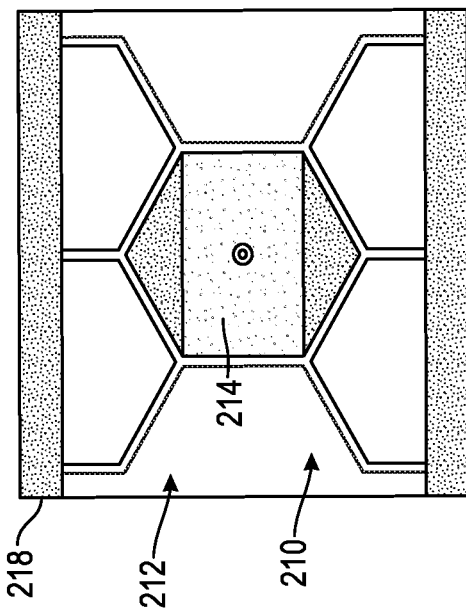

FIG. 15 is a schematic plan view of yet another variation of the bridge 10 of the switch 1 of FIGS. 2, 3. The bridge of FIG. 15 is identical to the bridge of FIG. 14 but having an alternative central plate 220. The alternative central plate 220 is rectangular rather than hexagonal in shape (i.e. the plate 220 has opposing planar rectangular upper and lower surfaces). The meshes 222, 224 of discrete cells which mechanically couple the alternative bridge 220 to the substrate are identical to those of the bridges 210, 212 of FIG. 14 but portions of the bridge between the rectangular plate 220 and the meshes 222, 224 form additional (third) discrete cells which have two sides which together conform to the same hexagonal shape as the discrete cells of the meshes 210, 212 in the tessellation plane. This design provides the advantage that a smaller quantity of material but with increased performance and lower capacitance.

Figure 16:
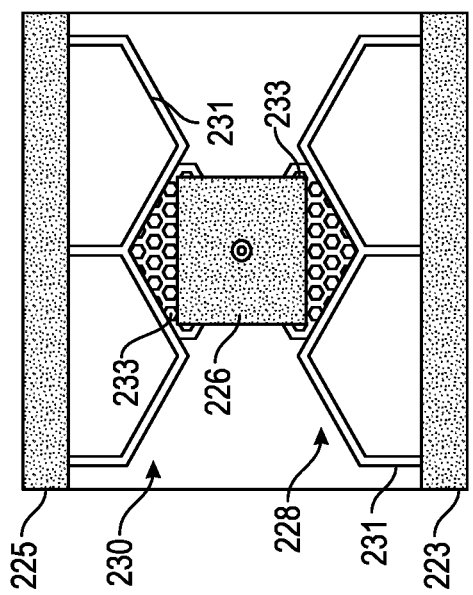

FIG. 16 is a schematic plan view of yet another variation of the bridge 10 of the switch 1 of FIGS. 2, 3. The bridge of FIG. 16 is similar to the bridge of FIG. 15 but has an alternative central plate 226 and alternative skeletal meshes 228, 230 which mechanically couple the alternative central plate 226 to the substrate by way of anchors 223, 225, the skeletal meshes 228, 230 having have been adapted to accommodate the alternative plate 226. The central plate 226 is again rectangular but with shorter longer edges than the plate 220 of FIG. 15. The skeletal meshes 228, 230 are identical to each other and each comprise a pair of interconnected first discrete cells 231 arranged in a row and tessellated in a tessellation plane, each of the said first discrete cells having four sides which together conform to a hexagonal shape in the tessellation plane which has a greatest extent which is greater than the greatest extent of the planar upper and lower surfaces of the plate 226. The first discrete cells of the skeletal meshes 228, 230 are only partly hexagonal in shape and are connected at a first end to the respective anchors 223, 225. The first discrete cells 231 of the skeletal meshes 228, 230 are each connected at a second end opposite the first end to the conductive plate 226 by a respective plurality of second discrete cells 233. The second discrete cells 233 each have, or at least have two or more sides which together conform to, a hexagonal shape in the tessellation plane which has a smaller size than the hexagonal shape to which the first discrete cells 231 conform (indeed, the second discrete cells 233 conform to a hexagonal shape having a perimeter in the tessellation plane of less than 10% that of the hexagonal shape to which the first discrete cells 231 conform). Each of the skeletal meshes 228, 230 comprises two rows of discrete second cells 233 extending between the plate 226 and the first discrete cells 231; a first row connected to a respective longer edge of the rectangular plate and to portions of the first discrete cells 231; and a second row connected to the first row and to portions of the first discrete cells 231. Further discrete cells are provided extending between the first row and the shorter edges of the rectangular plate 226 and between the second row and the first discrete cells 231.

The second row comprises fewer discrete cells than the first row. Each of the skeletal meshes 228, 230 comprises fourteen discrete cells. This arrangement has been found to better distribute stress away from the central varactor. A heterogenous arrangement of cells can be preferable to distribute stress.

Figure 17:
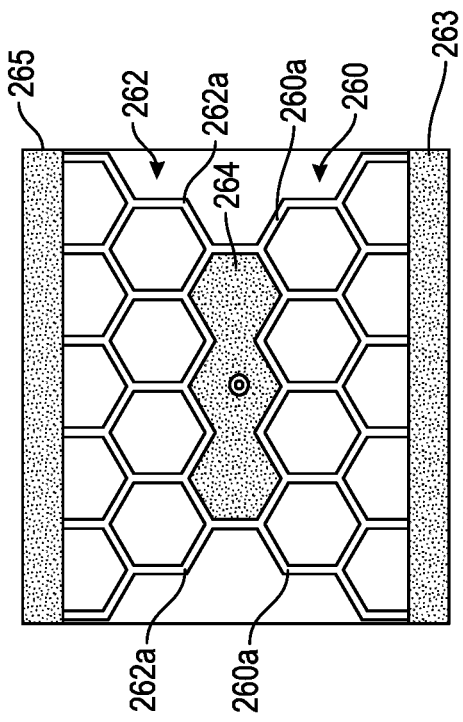

FIG. 17 is a schematic plan view of a yet further variation of the bridge 10 of the switch 1 of FIGS. 2, 3. The bridge of FIG. 17 is similar to that of FIG. 10 in that it comprises a pair of skeletal meshes 260, 262 which are identical to each other and which mechanically couples a central electrically conductive switching plate 264 to a substrate by way of respective anchors 263, 265. The skeletal meshes 260, 262 each comprise a plurality of discrete cells tessellated in a tessellation plane. The electrically conductive switching plate 264 of FIG. 17 has fourteen sides which together conform to a shape comprising three hexagons abutting each other in a row. The skeletal meshes 260, 262 each have opposing planar first and second sides (being co-planar with or on parallel planes to the tessellation planes of the meshes 260, 262) extending between the plate 264 and the respective anchors 263, 265 with pores extending between openings on the first and second sides. The first and second sides of the meshes 260, 262 each have widths (perpendicular to the respective directions in which they extend from the plate 264 and the respective anchor 263, 265) which increase along their lengths from the plate 264 to the respective anchors 263, 265. The solid material of the meshes 260, 262 extending around the pores is provided with substantially uniform and constant thickness between the first and second sides as the meshes extend from the plate 264 to the respective anchors 263, 265.

Each of the skeletal meshes 260, 262 comprises two rows of discrete cells: a first row connected to a respective longer edge of the central plate 264; and a second row connected to the first row and to a respective anchor. The discrete cells of the first row are hexagonal in the tessellation plane. The discrete cells of the second row have four sides which together conform to a hexagonal shape in the tessellation plane but are only part hexagons. The number of discrete cells per row increases by one between the first and second rows from four in the first row to five in the second row, thereby providing nine discrete cells per mesh 260, 262. Outer discrete cells 260a, 262a of the first row extend beyond opposing shorter edges of the central plate 264. The discrete cells of the meshes 260, 262, and the hexagons of the row of three hexagons to which the central plate 264 conforms, all conform to a hexagonal shape of the same size. Each of the discrete cells of the meshes 260, 262 have at least four sides which conform to a hexagonal shape having a greatest extent of at least a third (typically greater than a third) of the length of the longer sides of the rectangular plate 194.

Figure 18:
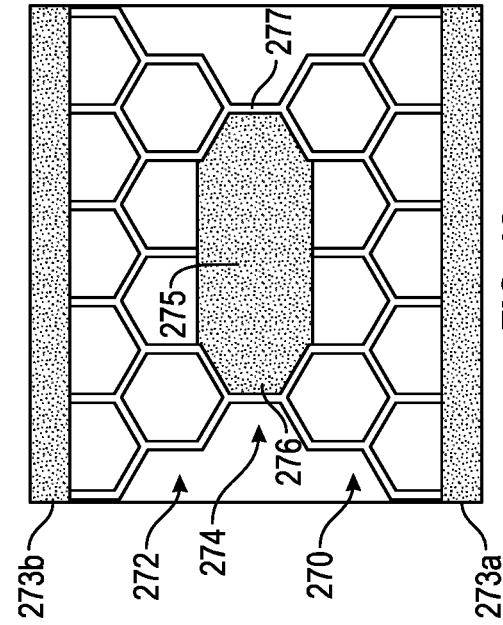

FIG. 18 is a schematic plan view of a yet further variation of the bridge 10 of the switch 1 of FIGS. 2, 3. The bridge of FIG. 18 is similar to that of FIGS. 10 and 17 in that it comprises a pair of skeletal meshes 270, 272 which mechanically couples a central electrically conductive switching plate 274 to a substrate by way of respective anchors 273a, 273b. The skeletal meshes 270, 272 each comprise a plurality of discrete cells tessellated in a tessellation plane. The electrically conductive switching plate 274 of FIG. 18 comprises a rectangular portion 275 (i.e. a portion having opposing planar rectangular upper and lower surfaces) and a pair of co-planar protrusions 276, 277 which extend from the shorter ends of the rectangular portion, the protrusions 276, 277 each having three sides which conform to a hexagonal shape in the planes of planar upper and lower surfaces of the plate 274. The skeletal meshes 270, 272 each have opposing planar first and second sides (being co-planar with or on parallel planes to the tessellation planes of the meshes 270, 274) extending between the plate 274 and the respective anchors 273a, 273b with pores extending between openings on the first and second sides. The first and second sides of the meshes 270, 272 each have widths (perpendicular to the respective directions in which they extend from the plate 274 and the respective anchors 273a, 273b) which increase along their lengths from the plate 274 to the respective anchors 273a, 273b. The solid material of the meshes 270, 272 extending around the pores is provided with substantially uniform and constant thickness between the first and second sides as the meshes extend from the plate 274 to the respective anchors 273a, 273b.

Each of the skeletal meshes 270, 272 comprises two rows of discrete cells: a first row connected to a respective longer edge of the central plate 274; and a second row connected to the first row and to a respective anchor 273a. The number of discrete cells per row increases by one between the first and second rows from four in the first row to five in the second row, thereby providing nine discrete cells per mesh 270, 272. Outer discrete cells 270a, 272a of the first row are hexagonal in the tessellation plane and extend beyond the shorter edges of the central plate 274. The remaining discrete cells each have at least four sides which conform to hexagonal shapes in the tessellation plane but are only part hexagons. The discrete cells of the meshes 270, 272 and the protrusions 276, 277 all conform to a hexagonal shape of the same size.

Indeed, two of the sides of each of the protrusions 276, 277 form sides of the hexagonal outer discrete cells of the first rows of the meshes 270, 272. Each of the discrete cells of the meshes 270, 272 conform to a hexagonal shape in the tessellation plane having a greatest extent of at least a quarter (typically greater than a quarter) of the length of the longer sides of the planar upper and lower surfaces of the plate 274. This design provides superior capacitance to that of the variation depicted in FIG. 17.

Figure 19:
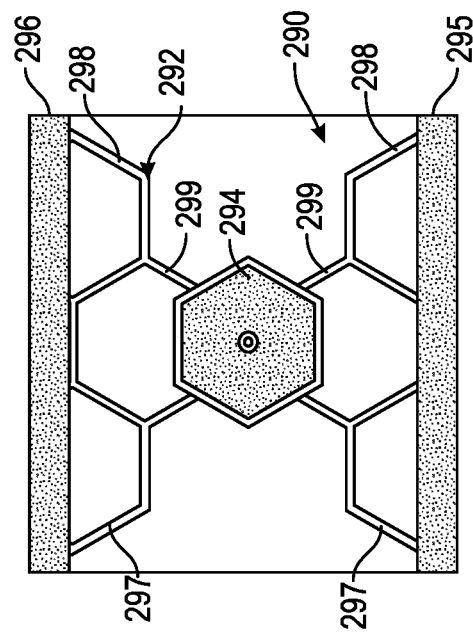

FIG. 19 is a schematic plan view of a yet further variation of the bridge 10 of the switch 1 of FIGS. 2, 3. The bridge of FIG. 19 comprises a pair of skeletal meshes 290, 292 which mechanically couples a central electrically conductive switching plate 294 to a substrate by way of respective anchors 295, 296. The skeletal meshes 290, 292 each comprise a plurality of discrete cells tessellated in a tessellation plane. The electrically conductive switching plate 294 of FIG. 19 has hexagonal planar upper and lower surfaces. The skeletal meshes 290, 292 each have opposing planar first and second sides (being co-planar with or on parallel planes to the tessellation planes of the meshes 290, 292) extending between the plate 294 and the respective anchors 295, 296 with pores extending between openings on the first and second sides. The first and second sides of the meshes 290, 292 each have widths (perpendicular to the respective directions in which they extend from the plate 294 and the respective anchors 295, 296) which are substantially constant along their lengths from the plate 294 to the respective anchors 295, 296. The solid material of the meshes 290, 292 extending around the pores is provided with substantially uniform and constant thickness between the first and second sides as the meshes extend from the plate 294 to the respective anchors 295, 296.

Each of the skeletal meshes 290, 292 comprises a pair of outer discrete cells 297, 298 connected to a respective anchor 295, 296, arranged together in a row and connected to each other by a central discrete cell 299 connected to the switching plate 294 offset from the pair of outer discrete cells 297, 298 towards the switching plate 294. The discrete cells of the meshes 290, 292 and the plate 294 each have two or more sides which together conform to hexagons of the same size in the tessellation plane, but the discrete cells themselves do not form complete hexagons; they form only part hexagons. Respective walls of the conductive switching plate 294 form respective walls of the central discrete cells 299 of the meshes 290, 292. The design provides the additional advantage that it causes the varactor to be relatively flat with the minimum number of supporting cells.

Figure 20:
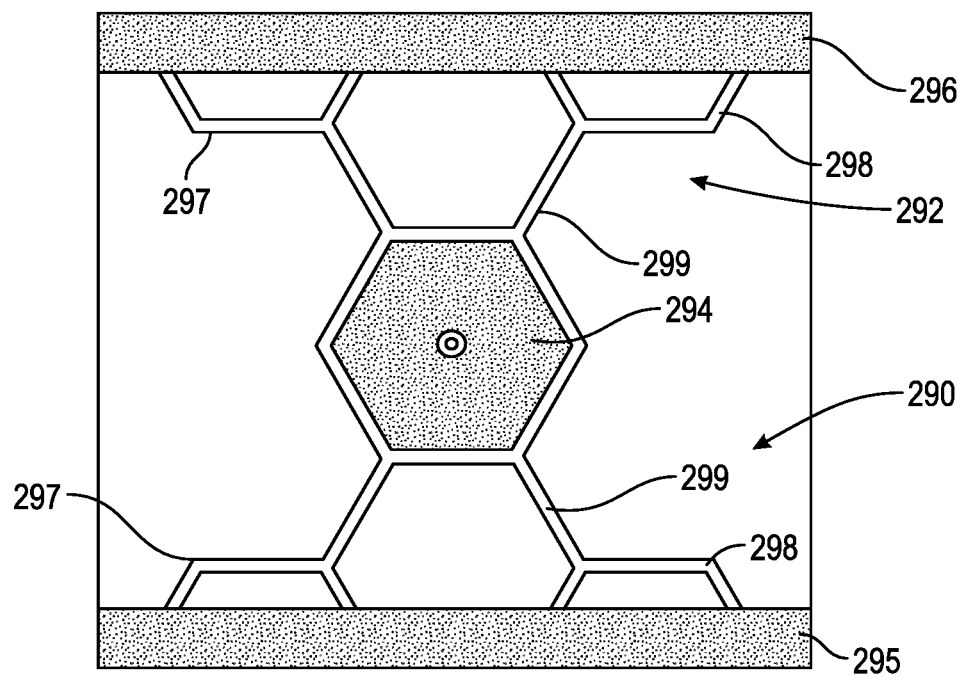

FIG. 20 shows a similar arrangement to FIG. 19, but with a larger offset between the outer discrete cells and the central discrete cell within each of the skeletal meshes 290, 292.

Figure 21:
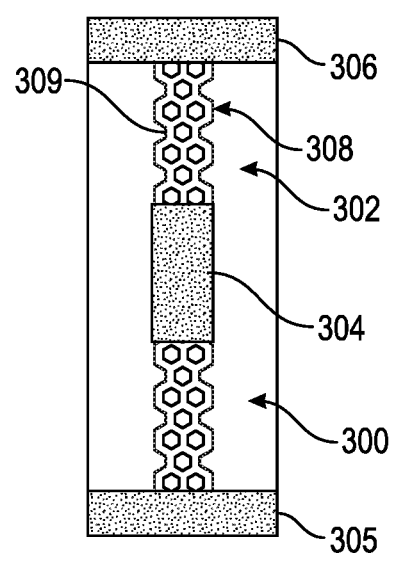

FIG. 21 is a schematic plan view of a yet further variation of the bridge 10 of the switch 1 of FIGS. 2, 3. A pair of identical skeletal meshes 300, 302 mechanically couples a (rectangular) central electrically conductive switching plate 304 to a substrate by way of respective anchors 305, 306, the plate 304 having opposing planar rectangular upper and lower surfaces and being supported by the meshes 300, 302 across its width. The skeletal meshes 300, 302 each comprise a plurality of discrete cells tessellated in a tessellation plane. The skeletal meshes 300, 302 are connected to the shorter edges of the rectangular plate 304. The skeletal meshes 300, 302 each have opposing planar first and second sides (being co-planar with or on parallel planes to the tessellation planes of the meshes 300, 302) extending between the plate 304 and the respective anchors 305, 306 with pores extending between openings on the first and second sides. The first and second sides of the meshes 300, 302 each have widths (perpendicular to the respective directions in which they extend from the plate 304 and the respective anchors 305, 306) which are substantially constant along their lengths from the plate 304 to the respective anchors 305, 306. The solid material of the meshes 300, 302 extending around the pores is provided with substantially uniform and constant thickness between the first and second sides as the meshes extend from the plate 304 to the respective anchors 305, 306.

Each of the skeletal meshes 300, 302 comprise four pairs of discrete cells 308, the discrete cells of each pair being arranged together in a row. The pairs of discrete cells are aligned with and offset from the each other in the tessellation plane in the respective directions in which the meshes 300, 302 extend from the plate 304 to the respective anchors 305, 306. The discrete cells within the offset pairs 308 are connected to each other by central connecting discrete cells 309 which extend between the offset pairs. The central connecting cells 309 also connect adjacent offset pairs; indeed, the central discrete connecting cells 309 share cell walls with adjacent offset pairs. First and second offset pairs 308 provided at opposing ends of the skeletal meshes 300, 302 connect the skeletal meshes 300, 302 to the central electrically conductive switching plate 304 and to the respective anchors 305, 306.

This design has the advantage of being compact and allows a high capacitance ratio in acceptable operational conditions.

Figure 22:
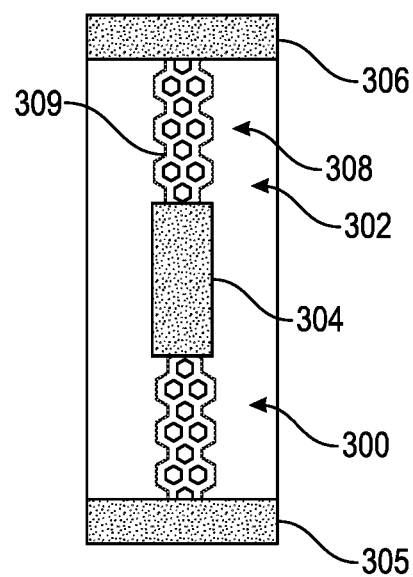

FIG. 22 shows a similar arrangement, but with the central connecting cells 309 provided at the opposing ends of the meshes 300, 302 to connect them to the central electrically conductive switching plate 304 and to the respective anchors 305, 306. This design is compact and achieves a good capacitance ratio (between the up and down states).

Figure 23:
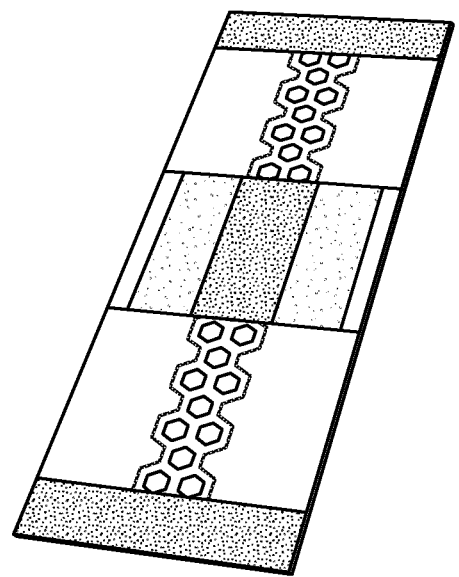
FIGS. 23 and 24 are perspective views of the MEMS bridges of FIGS. 21 and 22 respectively.
Figure 24:
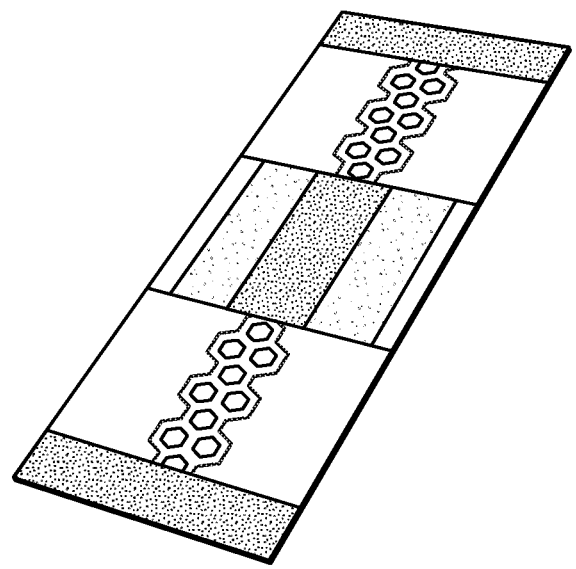

FIGS. 23 and 24 show embodiments in which only a signal line, and not the ground conductors, are provided in the trench underneath the MEMS bridge. The signal line is covered with silicon nitride insulator. As a result of this configuration, the arms of the MEMS bridge are longer than would otherwise be the case. This configuration is useful as a varactor, but the elongated arms can lead to greater resistive losses.

Figure 25:
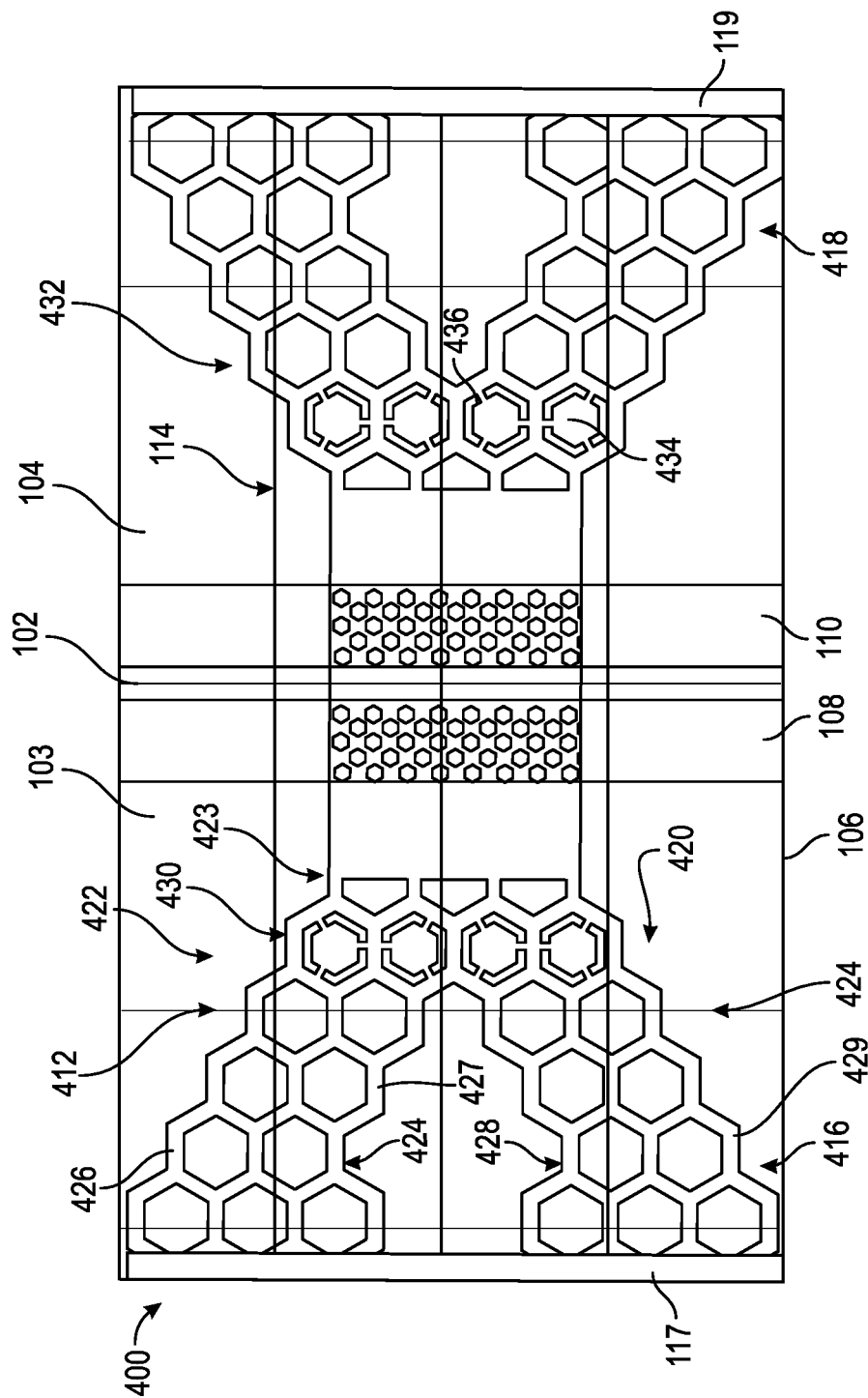
FIG. 25 is a plan view of a variation of the MEMS bridge of FIGS. 1 to 4 where each of the resilient planar supports have two support arms and where the discrete cells closest to the electrically conductive central switching portion are provided with pores having electrical elements therein.

FIG. 25 shows a capacitive RF MEMS switch 400 similar to that shown in FIG. 4; indeed, the switch 400 is identical to the switch 100 shown in FIG. 4 but for an adapted bridge 412. Identical features will be provided with identical reference numerals. The bridge 412 comprises the same central (rectangular) electrically conductive switching plate 114 as the switch 100, but alternative skeletal meshes 416, 418 are provided to mechanically couple the plate 114 to the anchors 117, 119. Alternative skeletal meshes 416, 418 are identical to each other so only the first skeletal meshes 416 will be described here, it being understood that the second skeletal meshes 418 is identical and works in the same way.

The skeletal meshes 416 comprise first and second skeletal mesh arms 420, 422 having respective first ends 420a, 422a connected to a shorter edge of the plate 114 and respective second ends 420b, 422b opposite the respective first ends 420a, 422a which are connected to the anchor 117. The skeletal mesh arms 420, 422 extend symmetrically between the plate 114 and the anchor 117 with respect to the plate 114. Each of the skeletal mesh arms 420, 422 comprises a plurality of discrete cells which are tessellated in respective tessellation planes (which are typically co-planar) and have hexagonal shapes, or shapes having at least four sides which conform to a hexagonal shape, in the respective tessellation plane. The first and second skeletal mesh arms 420, 422 have opposing planar first and second sides extending between the plate 114 and the respective anchors 117, 119 with pores extending between openings on the first and second sides. The first and second sides of the skeletal mesh arms 420, 422 have widths which increase along their lengths from the plate 114 to the anchor 117. The edges of the mesh 416 which extend between the conductive plate 114 and the anchor 117 are provided by the edges of the discrete cells of the mesh arms 420, 422 and are therefore stepped.

The first and second skeletal mesh arms 420, 422 are connected to the plate 114 by a shared row 423 of discrete cells which comprises three discrete cells, each having four sides which conform to a hexagonal shape in the tessellation plane. Each of the skeletal mesh arms 420, 422 further comprises four rows 424 of discrete hexagonal cells which are offset from each other in the tessellation plane both towards the anchor 117 and away from the other of the skeletal mesh arms 420, 422 of the skeletal mesh 416 so as to form a gap (typically in the tessellation plane) between the first and second skeletal mesh arms 420, 422 such that the first and second skeletal mesh arms 420, 422 together form a V-shape in the tessellation plane. The gap initially increases in size from the shared row 423 towards the anchor 117 to a maximum extent which is significantly larger than the greatest extent of an individual cell in the tessellation plane, but then reduces in size adjacent the anchor. The ends of the arms 420, 422 have respective rows comprising three discrete cells, while the other three of the four rows have two discrete cells, to thereby provide a robust connection to anchor 117.

This V-shaped arrangement provides the mesh 416 with four exposed edges 426-429 as compared to two exposed edges in the meshes described in the other arrangements above. Providing additional edges helps to distribute mechanical loads, stresses and strains better through the meshes.

It will be understood that, because the skeletal meshes 416, 418 each comprise a pair of skeletal mesh arms forming a V-shape, and because the skeletal meshes 416, 418 are arranged symmetrically about the plate 114, the skeletal mesh arms 416, 418 together form an X-shape in the tessellation plane.

The cells of the first rows 430, 432 of the first and second skeletal mesh arms 420, 422 (of both the skeletal meshes 416, 418) adjacent to the plate 114 are each provided with electrically conductive plates 434 in their respective pores. The electrically conductive plates 434 are provided with hexagonal shapes in the tessellation plane and are electrically coupled to the electrically conductive layer of the skeletal mesh arms 420, 422 by elongate electrically conductive links 436. The plates 434 and the links 436 are typically integrally formed with the cells of the meshes 416, 418. By providing additional conductive material in the skeletal mesh arms 420, 422, the effect of the DC actuation voltage is enhanced. This can be particularly important in the present embodiment due to the absence of electrically conductive material in the gap between the skeletal mesh arms 420, 422.

Figure 26:
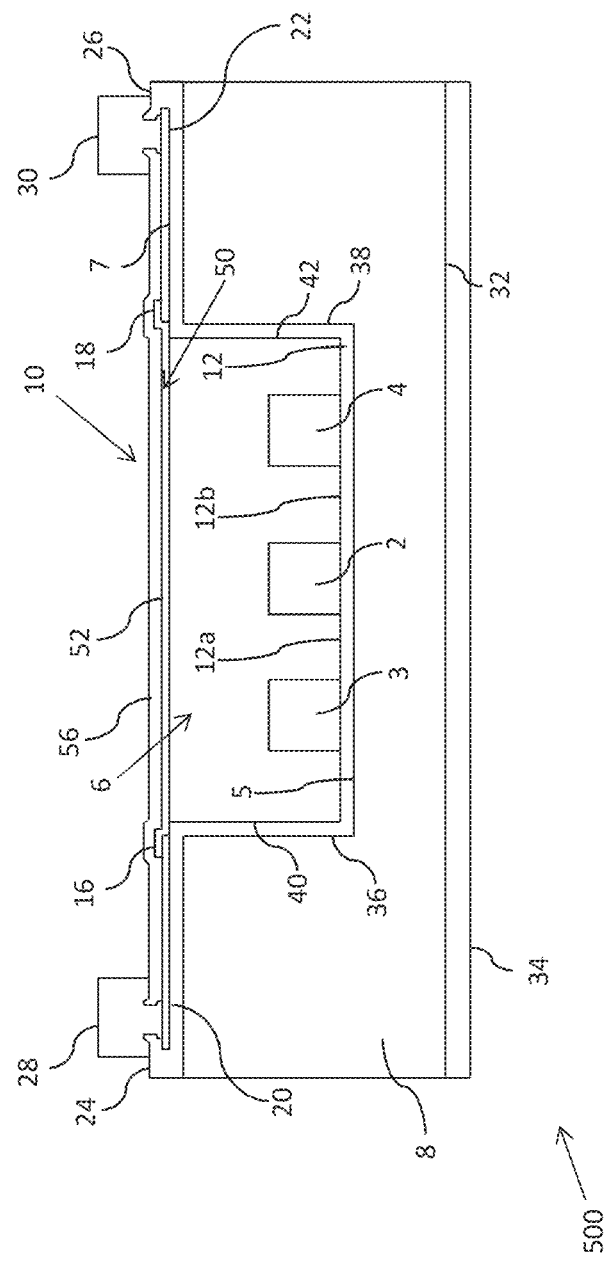
FIG. 26 is a sectional view of a MEMS ohmic switch comprising a MEMS bridge having an electrically conductive central switching portion in an up state (first position) and resilient planar supports extending from either side of the central portion, mechanically coupling it to the substrate.

FIG. 26 is a sectional view of an RF MEMS ohmic switch 500. The ohmic switch 500 is identical to the capacitive MEMS switch 1 shown in FIG. 1 but for the absence of the insulating layers over the conductive line 2 and the ground conductors 3, 4. When the conductive plate 60 is in the down state, it engages the conductive line 2 directly. The conductive plate 60 is provided with a planar lower surface which is flat and parallel to upper planar surfaces of the conductive line 2 and the ground conductors 3, 4 when the plate 60 is in the down state. This ensures a good contact between the plate 60 and the conductive line 2 and the ground conductors 3, 4 in order to change the state of the switch 500. This is in contrast to the majority of known ohmic switches in series, where the switches are typically in an "on" state when a bridge is in a down state, which completes the circuit. In this embodiment, the switch is in an "off" state when the bridge is in a down state.

FIGS. 27 to 37 illustrate a method of manufacturing the RF MEMS switch 1 described above with respect to FIGS. 1 to 3. In a first step (see FIG. 27), a high resistivity undoped silicon substrate 600 is provided. A silicon oxide hard mask 602 is then provided on upper and lower surfaces 604, 606 of the substrate, the portion of the mask 602 provided on the upper surface 604 having a gap 608 in an intermediate portion thereof between first and second sides 610, 612 of the substrate 600, the first and second sides 610, 612 extending between the upper and lower surfaces 604, 606. Next (see FIG. 28) a trench 614 is etched in the upper surface 604 through the gap 608 in the mask 602 (typically using tetramethylammonium hydroxide), the trench extending through a portion of the substrate (but not fully) between the first and lower surfaces 604, 606. The trench 614 has a planar upper surface 616 and a pair of side walls 618, 620 which extend perpendicularly from the planar upper surface 616 to the upper surface 604 of the substrate 600.

In a next step (see FIG. 29), the silicon oxide mask 602 is stripped with (typically through the use of (e.g. buffered) hydrofluoric acid (HF)) from the upper and lower surfaces 604, 606 of the substrate and a continuous solid insulating layer 622 (typically parylene, alternatively silicon nitride) is deposited on the upper surface 604 of the substrate, the upper surface 616 of the trench and the side walls 618, 620 of the trench 614. A continuous solid insulating layer 624 is also deposited on the lower surface 606 of the substrate 604. Next (see FIG. 30), the conductive signal line 2 and the ground conductors 3, 4 are laid using a lift-off mask (not shown) on the portion of the insulating layer 622 provided over the surface 616 of the trench, the conductive signal line 2 and the ground conductors 3, 4 being separated (and electrically isolated) from each other in a plane of the upper surface of the insulating layer 622.

In a next stage (FIG. 31), insulating layers 626 (again, typically silicon nitride or parylene) are deposited over the conductive line 2 and the ground conductors 3, 4, typically by depositing a layer of insulating material across the portion of the insulating layer 622 over the surface 616 of the trench 614 and etching (e.g. using hydrogen fluoride pyridine and a mask) the layer of insulating material around the conductive line 2 and the ground conductors 3, 4. In a next step (FIG. 32), the trench 614 is filled with a sacrificial material (e.g. one or more polymers such as PMMA, parylene, polyimide, photoresist, etc.) 630 and the insulating layer 622 and the sacrificial material 630 are polished such that an upper surface 632 of the sacrificial material 630 is flush with an upper surface 634 of the portion of the insulating layer 622 provided over the upper surface 604 of the substrate 600. Next (FIG. 33) electrically conductive pads 20, 22 are laid either side of the trench 614 on the upper surface 634 of the portion insulating layer 622 provided on the upper surface 604 of the substrate 600. Next (FIG. 34), the electrically conductive layer 50 (e.g. aluminium) is deposited over the upper surface 632 of the sacrificial material and portions of the conductive pads 20, 22 on either side of the trench 614 using a lift-off mask. The lift-off mask is provided with gaps in the shape of the tessellated hexagonal cells of the skeletal meshes 74, 76 and the conductive plate 60. Electrical contacts 636, 638 are provided on the conductive pads 20, 22.

Next (FIG. 35), insulating layer 56 is deposited on the conductive layer 50, again using a mask having gaps in the shape of the tessellated hexagonal cells of the skeletal meshes 74, 76 and the conductive plate 60. In this embodiment a nitride mask is used. The nitride mask is conformal deposited and later etched with a light mask. The insulating layer 56 also extends over portions of the conductive pads 20, 22 but gaps 640, 642 are provided in the insulating layer 56 above the electrical contacts 636, 638. Next (FIG. 36), the electrically conductive connectors 28, 30 for applying the actuation DC bias are connected to the electrical contacts 636, 638 through the gaps 640, 642. Finally (FIG. 37) the sacrificial material in the trench 614 is removed by etching using hydrogen fluoride pyridine to form the bridge 10.

It will be understood that the switches 100, 500 may be manufactured in the same way. In addition, any of the bridges of FIGS. 5 to 25 could be manufactured in the same way in place of the bridge 10 (or bridge 112 as the case may be). For the bridge of FIG. 25, the skeletal arms 420, 422 may be formed by depositing the bridge layers 50, 56 in the shape of the mesh arms 420, 422; alternatively, the mesh arms 420, 422 may be formed by cutting out a portion of a continuous skeletal mesh formed by depositing the bridge layers 50, 56.

For example, it will be understood that the resilient planar supports (in this example, comprising skeletal meshes) of the bridges do not need to comprise electrically conductive material. In this case, the electrically conductive pads 20, 22 and connectors 28, 30 may be omitted. For example, instead of applying the DC actuation bias to connectors 28, 30, the DC actuation bias could instead be applied to the signal line 2, 102 and/or the ground conductors 3, 4, 103, 104 to electrostatically attract the conductive plate of the bridge towards the signal line 2, 102/ground conductors 3, 4, 103, 104. In this case, the resilient planar supports may be formed from (e.g. a single layer of) electrically insulating material (e.g. parylene or silicon nitride).

It will also be understood that the discrete cells of the resilient planar support (here in the form of a skeletal mesh) need not be, or conform, to hexagonal shapes in the tessellation plane (although it may be preferable that they do). For example, the discrete cells of the resilient planar support (i.e. the skeletal mesh) may be, or conform, to alternative polygonal shapes in the tessellation plane.

Although each of the embodiments above comprise MEMS bridges fixed to the substrate on either side of the signal line by anchors, it may be that the MEMS bridges are alternatively cantilevered (e.g. fixed to the substrate at only one end by an anchor).

Although the central conductive plates of some of the bridges described above are shown without stress relief holes, it will be understood that typically they are provided with stress relief holes therethrough (e.g. between upper and lower planar surfaces of the plates).

Figure 38:
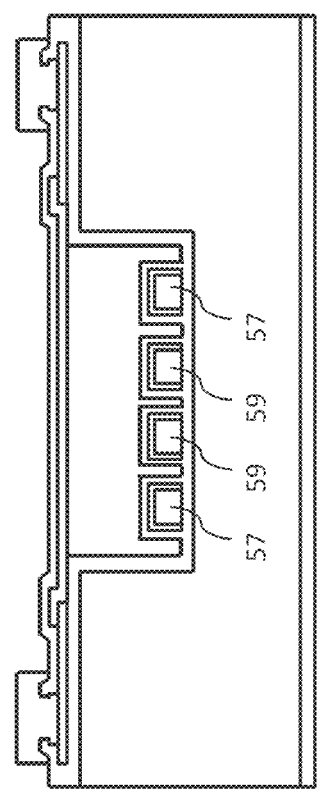
FIG. 38 is a plan view of an embodiment of two separate signal lines under the bridge.

Some embodiments may have more than one signal conductor underneath the MEMS bridge, between the ground conductors. For example, the switch of FIG. 38 corresponds generally to that of FIG. 1 except that it has two signal conductors 59 under the MEMS bridge, between ground conductors 57.

In some embodiments, the two signal conductors are provided under the same switching signal conductor region and so when the bridge (and electrically conductive switching portion) is in the second position they are effectively connected through two capacitors (each capacitor being between the respective signal conductor and the switching signal conductor region). In some embodiments, there are two switching signal conductor regions which are not conductively connected to each other, one located over each signal line. Each of the two switching signal conductor regions is conductively connected to (typically formed with) a respective switching ground conductor region which is located over the ground conductor on the respective side of the two signal conductors. Therefore, when the bridge is in the second position, each of the two signal conductors is connected to a respective (adjacent) ground conductor through a respective pair of capacitors (for each signal conductor, one capacitor between the respective signal conductor and the respective switching signal conductor region and one capacitor between the respective ground conductor and the respective switching ground conductor region).

In some embodiments, the bridge of any of the examples may be formed hermetically sealed between substrate layers by the method of FIGS. 39 to 41. A cap substrate 7 has a MEMS bridge 10 having a conductive layer 50 and insulating layer 56 formed between a trench 6 and aperture 9, with electrically conductive pads 20, 22 and electrical contacts 28, 30 formed away from the aperture 9. The side walls of the aperture have insulating layer 40, 42 formed thereon. A base substrate 8 has signal conductor 2 and ground conductors 3 formed thereon. As illustrated in FIG. 41, the cap substrate is then inverted and sealed hermetically against the base substrate (typically in the presence of a vacuum or a selected gas) with the aperture of the cap substrate fitting over the signal conductor and ground conductors. Thus, the MEMS bridge is formed hermetically sealed between the two substrates.

In embodiments of the invention according to the first aspect, the electrically conductive switching conductor regions of the MEMS bridge are isolated (not in conducting electrical communication with) the anchors of the bridge. In some embodiments, the bridge has conductors (actuatable conductors) to assist with pull-down of the bridge which are in conducting communication with the anchors of the bridge.

Isolation of the electrically conductive switching portion/switching conductor regions produces a useful low loss MEMS unit cell, useful as a phase shifter (or ohmic switch with the removal of insulating layers).

FIG. 42 is a cross-section of the central portion of a MEMS device which functions as a MEMS phase shifter, or unit cell of a more complex circuit. The bridge extends to either side and connected to contacts as per FIG. 1 or FIG. 39. Substrate 708 has signal line 702 between ground conductors 703 and 704, forming a co-axial waveguide. An insulating layer 710, for example of parylene, silicon nitride or single crystal silicon, is provided over the signal and ground conductors, including dimples 712 to reduce stiction in subsequent operation. The bridge 50 has a non-conducting layer 720 with a conductive metal actuatable layer 722, 723, which typically takes the form of a mesh described below, and a separate conductive metal switching portion 724 (the electrically conductive switching portion, comprising the switching signal conductor region and switching ground conductor region). The actuatable layer is selectively electrostatically attracted to the substrate ground conductor and/or pull-down substrate conductors/pads during operation. There are gaps 822, 823 between the conductive metal actuatable layer and the conductive metal switching portion so that the there is no continuous electrically conducting pathway from the conductive metal switching portion to the anchors and the switching portion is electrically isolated.

Although in FIG. 42 the insulating layer 710 and dimples 712 are provided on the signal conductor and ground conductor of the substrate, they might instead be provided on the MEMS bridge, overlying conductive metal actuatable layer 722, 723 and conductive metal switching portion 724. Alternatively, to form an ohmic switch (rather than a capacitive switch), there may be no or reduced insulation between the metal switching portion 724, signal conductor 702 and at least a portion of the ground conductor 703, 704 to form a switch which is operable to directly connect the signal conductor to the ground conductors. Optionally insulating material and/or dimples may be provided between the actuatable conductor and ground.

FIG. 43 is a plan view of the tracks on the substrate under MEMS bridge 50 of FIG. 42. As will be described further below, the distance between the signal conductor 702 and the adjacent ground conductors 703 and 704 is greater underneath the MEMS bridge, to reduce the inductance of the signal conductor and reduce reflection due to impedance mismatch when the bridge is lowered. The signal conductor receives an RF signal through an input 802a to a constant cross section waveguide portion 804a. The signal is conducted through a tapering region 806 to a further constant cross section waveguide portion 804c and then a broadening region 808 and then to a further constant cross section waveguide portion 804c and output 802b. Region 52 of the waveguide is located under the MEMS bridge and has a characteristic impedance which is greater than that of an offset region 54. It may be that the impedance of waveguide portion 804a and the broadening region 808 have a value of 50 Ohms, and the section of the signal line between these portions 804b has an impedance value of 75 Ohms.

Figure 45:
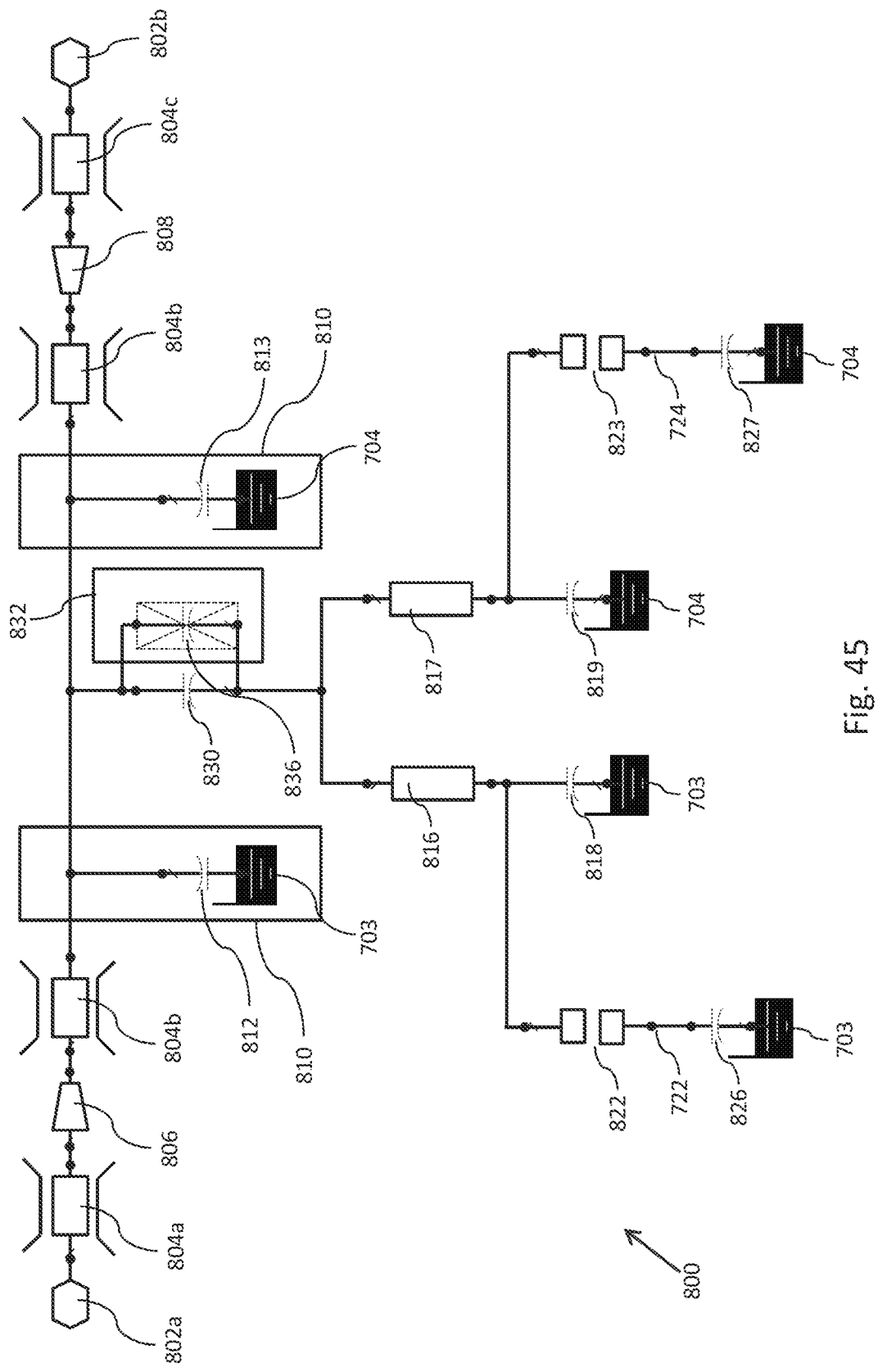
FIG. 45 is a circuit diagram of a MEMS phase shifter/MEMS unit cell.

FIG. 45 is a corresponding circuit diagram of a MEMS unit cell/phase shifter. Sections of the signal line 802a, 804a, 806, 804b, 808, 804c and 802b are as described above. Capacitances 812, 813 are capacitances between the signal line and grounds. Capacitance 830 is the capacitance between the middle of the electrically conducting switching portion, functioning as the switching signal conductor region, and the signal line 3. This capacitance is low when the bridge (and electrically conductive switching portion) is in the first raised position but is much higher 836, when the bridge is in the second lower position represented by box 832. Metal regions 816 and 817 are portions of the electrically conducting switching portion and there is a capacitance 818, 819 between the edges of this switching portion (which function as the switching ground conductor regions) and the ground conductors 703, 704. Again, when the bridge is in the second lower position, these capacitances are much increased. FIG. 44A shows the capacitances between the signal line and ground. Capacitances 818 and 819 are in parallel and their combined capacitance is in series with capacitance 830/836.

Accordingly, when the bridge is actuated to the second, lowered, position by the application of sufficient potential difference between the actuatable conductors and the ground conductors, the capacitance between the signal conductor and ground is much increased. As a result, the MEMS switch acts as a varactor and has the effect of applying a phase shift to signals passing along the signal line. FIG. 44B shows the circuit in practice. The phase shift ($\Delta\phi$) per unit length, due to the change of distributed MEMS transmission line (DMTL) characteristic impedance arising from the variation in the capacitance of the MEMS bridge is given by:

$$Z_{lu} = \sqrt{\frac{L_t}{C_t + C_u/s}}$$

$$Z_{ld} = \sqrt{\frac{L_t}{C_t + C_d/s}}$$

$$\Delta\phi = \frac{\omega Z_0 \sqrt{\varepsilon_{r,eff}}}{C}\left(\frac{1}{Z_{ld}} - \frac{1}{Z_{lu}}\right) \text{rad/m}$$

$$\frac{1}{C_b} = \frac{1}{C_{bg}} + \frac{1}{C_{bs}}$$

$$Z_l = \sqrt{\frac{L_t}{C_t + C_b/S}}$$

Where $L_t$ is the inductance per unit length of the transmission line, $C_t$ is the capacitance per unit length of the transmission line, $C_u$ is the up (first) state capacitance, Cd is the down (second) state capacitance, s is the unit length of the cell, $\varepsilon_{r,eff}$ is the effective relative dielectric constant, $Z_{lu}$ is the impedance of the line with the bridge in the up stand and $Z_{ld}$ is the impedance of the line in the bridge down state. $C_b$ is the capacitance of the bridge, $C_{bg}$ is the capacitance of the bridge over the ground portion and $C_{bs}$ is the capacitance of the bridge over the signal portion, $Z_o$ is the characteristic impedance of the track and C is the speed of light.

Figure 46:
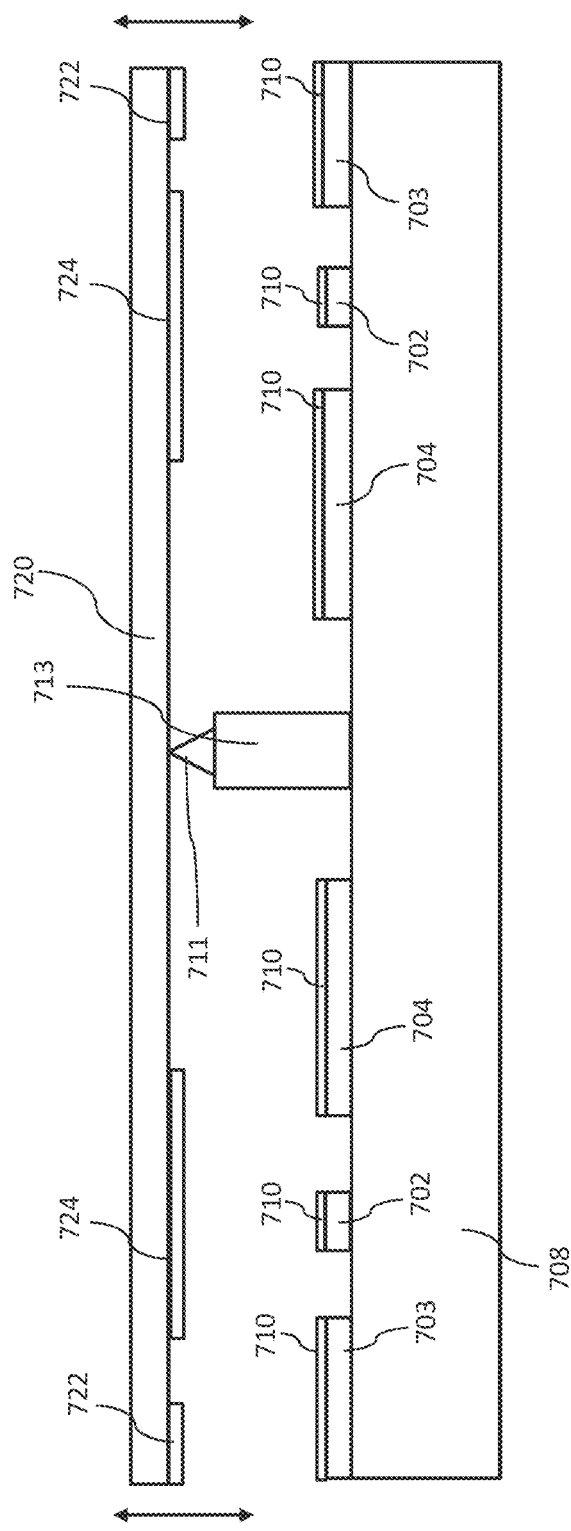
FIG. 46 is a cross section through an example MEMS device in the form of a teeter-totter switch.

FIG. 46 illustrates an embodiment in which a MEMS switch is provided in the form of a teeter-totter switch. The switch has a central portion 713 including a pivot 711 around which bridge member 720 can rotate, and at each side of the central portion there is signal conductor 702 and two ground conductors 703, 704, arranged such that each respective signal conductor is between a pair of ground conductors, thereby forming separate waveguides on either side of the pivot. The bridge 720 has two electrically conductive switching portions 724, one on either side of the pivot, and two actuatable conductors 722, beyond the electrically conductive switching portions. In use, one or other of the electrically conductive switching portions is in contact with the insulator overlaying the corresponding signal conductor, and the other electrically conductive switching portion is spaced apart from the corresponding signal conductor. Thus, one or other electrically conductive switching portion will connect the respective switching conductor to the adjacent ground conductors through capacitances. (The other will also do so, but with very much lower capacitances due to the greatly increased spacing).

Figure 47:
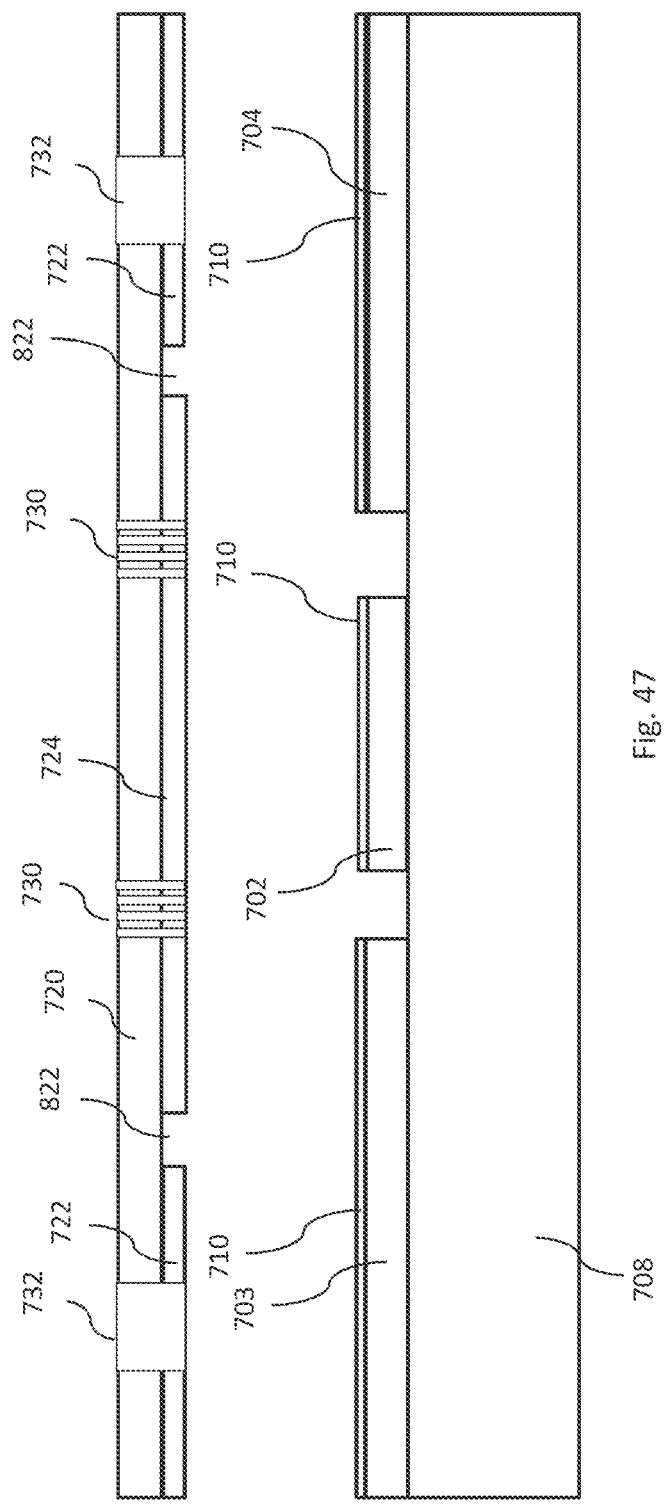
FIG. 47 is a cross section through an example MEMS device having apertures through bridge.

FIG. 47 illustrates an embodiment in which the bridge has apertures therethrough, for example as shown in FIGS. 1 through 25. Parts correspond to FIG. 42 with the addition of apertures 730 through the bridge in the region of the electrically conductive switching portion 724 and larger apertures (e.g. hexagonal) through the actuatable conductor. In each case, the apertures extend through both the metal layer and the insulating layer.

Figure 48:
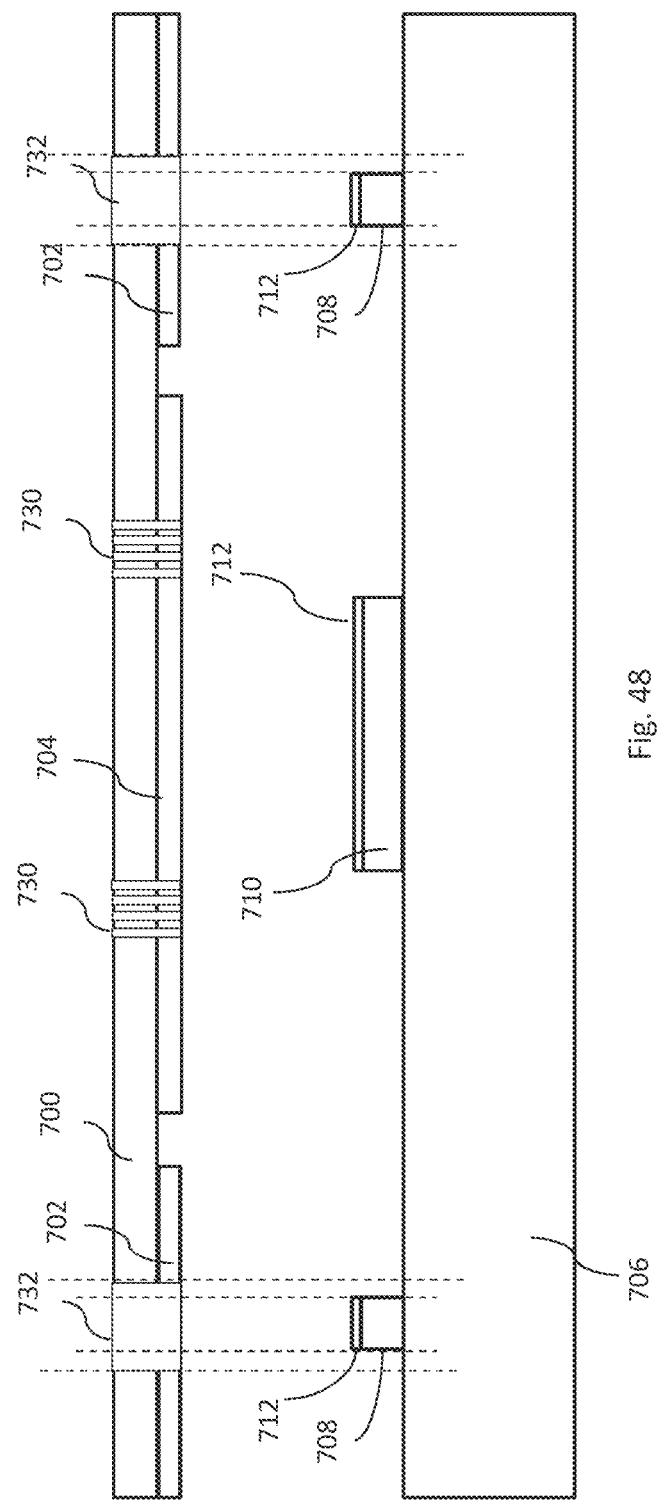
FIG. 48 is a cross section through a MEMS device having apertures through the bridge with the ground located in interstices opposite apertures in the bridge.

In the embodiment of FIG. 48, the ground conductors are patterned to occupy the interstices opposite the apertures in the actuatable conductor, with gaps opposite the metal regions. This interleaving reduces the build-up of charge in the actuatable conductor (or surrounding insulator) and stiction which would otherwise occur, for example due to the use of dielectric layers and dimples to avoid the bridge collapsing against the substrate. For optimum configuration it is necessary to consider the position of the bridge in the second, pulled-down configuration and for the metal of the ground conductor to avoid overlapping with the metal of the bridge in the second, pulled-down position.

Figure 49:
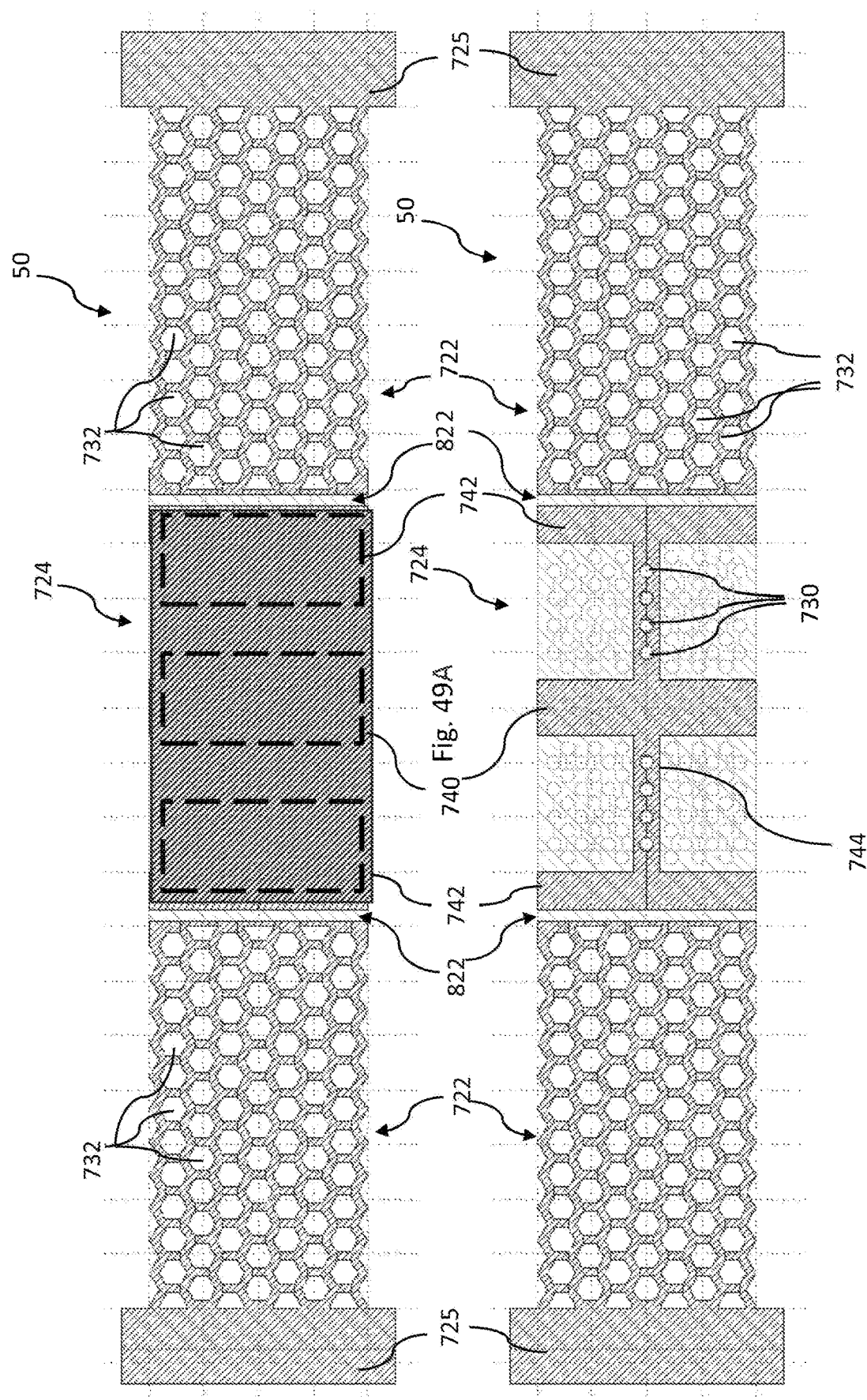
FIGS. 49A and 49B are plan views of MEMS bridges.

FIG. 49A provides a plan view of a MEMS bridge suitable for the devices of FIGS. 42, 47 and 48, and incorporating the mesh regions of FIGS. 1 through 25. A central plate 724 functions as electrically conductive switching portion. Actuatable conductors 722 extend through the arms of the bridge and are in the form of a skeletal web with hexagonal apertures. The actuatable conductors connect to actuation pads 725 at the bridge anchors. Regions 740 and 742 of the electrically conductive switching portion, which overlay the signal conductor and ground conductors in use function as the switching signal conductor region and the switching ground conductor region, which in this example are integrated.

In the embodiment of FIG. 49B, the electrically conductive switching portion is formed with a central switching signal conductor region 740 extending laterally across the middle of the bridge with parallel switching ground conductor regions 742 extending laterally and longitudinally connecting conductor portions 744 connecting the switching signal conductor region and switching ground conductor regions. This H shape requires less metal than a solid rectangular switching region. In this example, the electrically conductive switching portion also includes apertures 730 to reduce stress during deformation.

Figure 50:
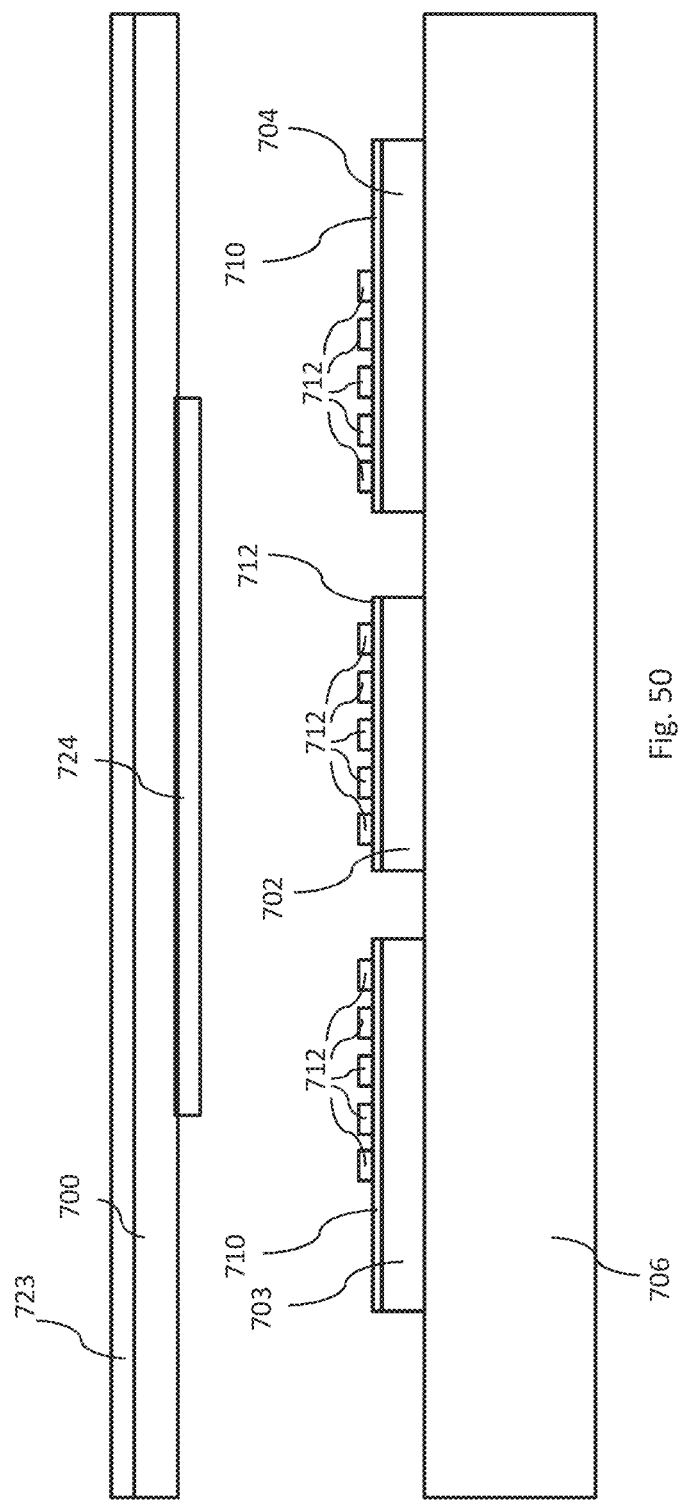
FIG. 50 is a cross-section of a MEMS bridge in which the conductive metal actuatable region is located on the upper surface of the MEMS bridge.

FIG. 50 illustrates an embodiment generally as per FIG. 42 but with the difference that in the MEMS bridge, although the electrically conductive switching portion is formed on the surface of the MEMS bridge facing the signal and ground conductors, metallised region 723 is instead on the opposite surface of the MEMS bridge, away from the signal and ground conductors. Metallised region 723 may be patterned as shown above, for example with one of the hexagonal mesh patterns and, again, apertures may extend through the MEMS bridge. The metallised region 723 may also be used to pull down the bridge by the application of a potential difference between the metallised region 723 and the ground 703, and so the metallised region functions as an actuatable conductor. Accordingly, in this example, there is a conductive metal region 723 spanning the MEMS bridge but the electrically conductive switching portion 724, and so the switching signal conductor region and the switching ground conductor region are electrically isolated from the metallised region 723 and the anchors of the bridge.

Figure 51:
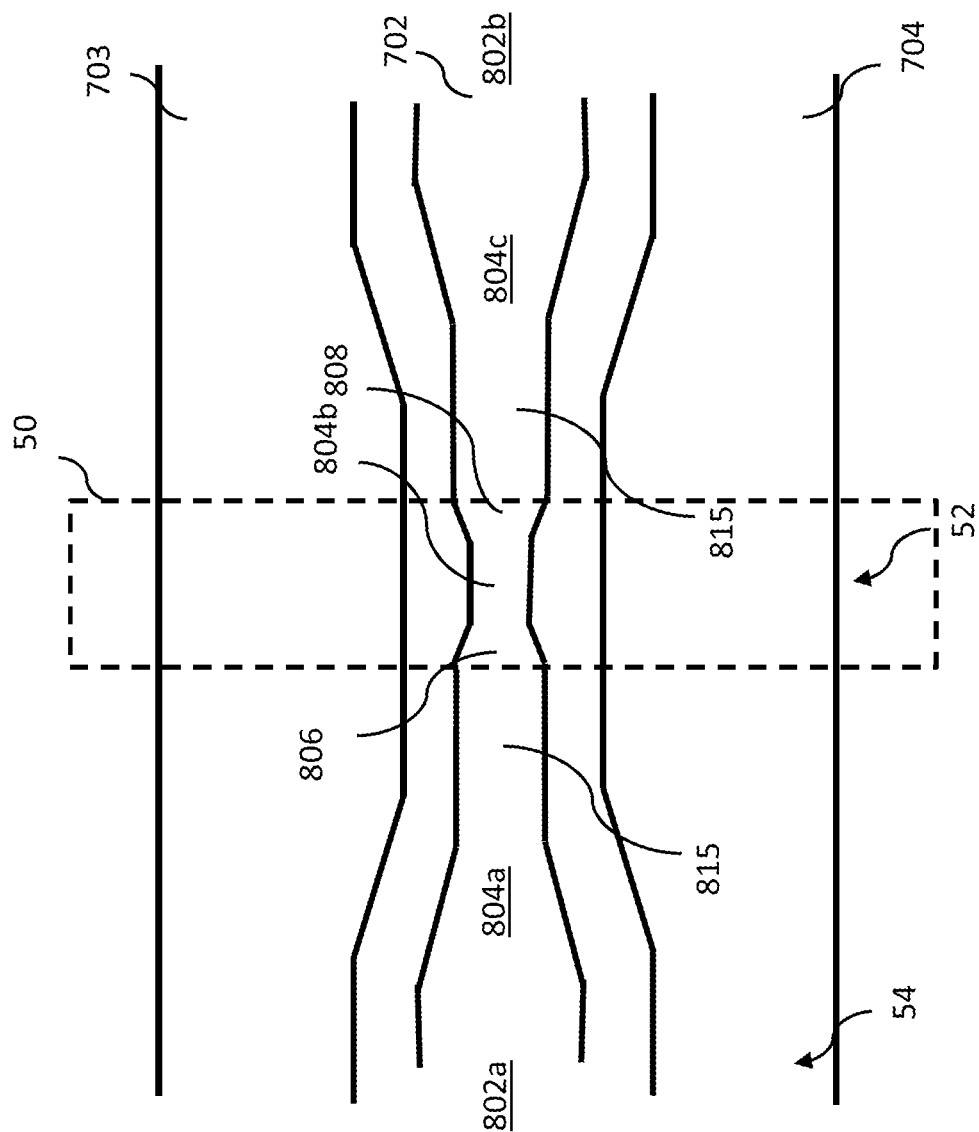
FIG. 51 is a plan view of the signal and ground tracks under a MEMS bridge in a capacitive MEMS switch.

FIG. 51 illustrates an embodiment in which the thickness of the signal conductor 702 and the gap between the signal line and the adjacent ground conductors 704 is varied so that the characteristic impedance of the (co-planar) waveguide formed by the signal line and ground conductors in a bridged portion 52, overlaid by the MEMS bridge, is greater than in an offset portion 54. In an example, the characteristic impedance of the offset portion of the waveguide is 50 Ω and in the centre of the bridged portion is 75 Ω. There may be one or more intermediate characteristic impedance regions 815, having an impedance between that of the offset and bridge portions. In an example, the characteristic impedance of the offset portion of the waveguide is 50 Ω and in the centre of the bridged portion is 75 Ω and at intermediate characteristic impedance region 815 it is 62 Ω. The impedance tapers by narrowing of the signal conductor, which increases the characteristic impedance, and also by increasing the gap between the signal conductor and ground conductors which again increases characteristic impedance.

When the bridge is lowered to the second position, the impedance of the waveguide drops, due to the much increased (usually by several orders of magnitude) capacitance between the signal and ground conductors. As a result of the increased impedance in the offset portion, when the bridge is lowered, the impedance mismatch between the offset portion and bridge portion is reduced, leading to a reduction in reflection of RF signal. Typically, the characteristic impedance of the bridged portion is determined such that the impedance of the waveguide through the bridge goes from higher than the impedance in the offset portion to lower than the impedance in the offset portion, thereby reducing the magnitude of the greatest impedance difference between the offset and bridged portions found in either the bridge up or down positions.

In some embodiments, for example as illustrated in FIG. 52, the ground plane is patterned with gaps in the conductive metal layer underneath the vertices of the mesh actuatable arms of the bridge. The patterned regions 861 function as pull-down substrate conductors. The example illustrated in FIG. 52 is for use under a mesh of hexagons with each arm of the bridge splitting in two, being a variant of the embodiment of FIG. 25. FIG. 53 shows the details of the patterning. A hexagonal arrangement of gaps 860 is formed in the otherwise continuous metal layer 862 of the ground plane. Hexagonal interstitial metal regions 864 are formed which fit within the hexagonal cells 868, between struts 870 extending between vertices 872 of the metal pull-down region of the bridge 874. In FIG. 53 the overlying hexagonal web of the actuatable conductor of the bridge is shown only in part, on the right-hand side, for clarity. For electrical conductivity in the plane there are connecting portions 866 between interstitial metal regions 864 and so there is some metal extending under the struts of the metal web, but the majority of the metal of the web is not located directly over the metal of the ground plane. This reduces charging and stiction while still enabling efficient pull-down. The bridge and ground plane are configured such that the arrangement shown in FIG. 53 applies with the bridge in its pulled-down position, there may be some transverse movement of the vertices and struts of the web between the up and pulled-down positions.

With reference to FIG. 54, dimples 876 in the insulating material overlaying the metal of the ground conductor are provided over the connecting portions 866 between interstitial metal regions. This is a suitable location to support the MEMS bridge and to prevent stiction while ensuring separation between the metal of the MEMS bridge and the ground conductor. As illustrated in FIG. 42, dimples can also be provided on the signal conductor, and portions of the ground conductor which are located underneath the switching ground conductor region/electrically conductive switching portion in use.

Figure 55:
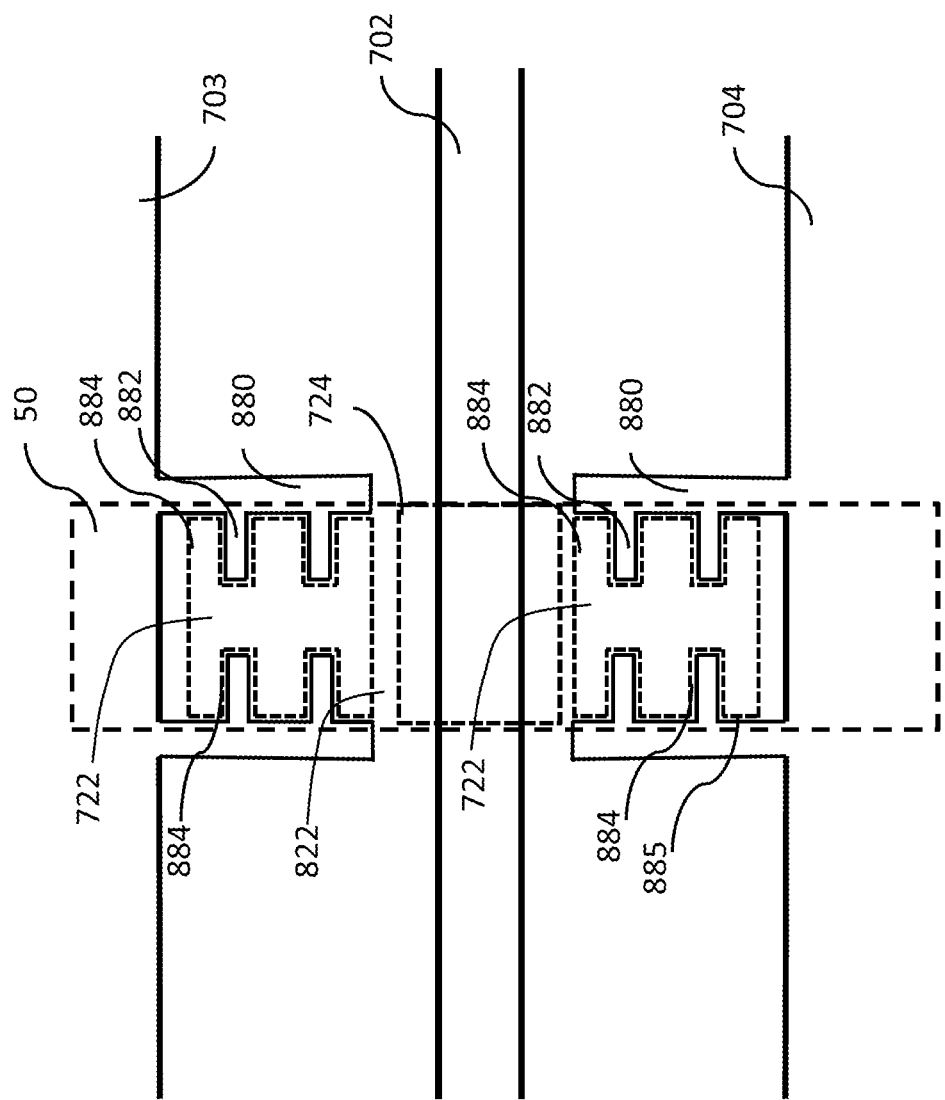
FIG. 55 is a plan view of a MEMS capacitive switch with interdigitated pull-downs.

FIG. 55 is a plan view showing another configuration which seeks to reduce overlap between the actuatable conductors 722 and the ground conductor 703 which the bridge is pulled down onto in the second, lowered position. As before, electrically conductive switching portion 724 is separated from and electrically isolated from actuatable conductors 722. Both are supported under insulator to form bridge 50. Bridge components are shown with dotted lines and substrate features with solid lines. The actuatable conductors 702 have recesses 884 in their side walls 885 and the ground conductor 703 has laterally extending arms 880 with fingers 882 which extend into and interdigitate with the recesses 884 of the actuatable conductors.

Again, the configuration is such that the actuatable conductor minimises or avoids overlap with the ground conductors when the bridge is in the down state. Phase shifter unit cells according to FIG. 45 and FIGS. 42-44 and 47-52 can be used to build a controllable modular phase shifter 900 as shown in FIG. 56 and FIG. 57. An input 902 is connected to an output 904 and switchable unit cells phase shifters 908 which are connected in series. The phase shifters are each according to FIG. 45 and are configured to shift the phase of a received RF signal passing through a signal conductor 914 by a relatively small amount, such that the combined phase can be varied to any of a number of discrete values between 0 and 360° depending which phase shifters have the MEMS bridges in the second (down) position. Groups of phase shifters are connected together and controlled as a block. For example, in the embodiment of FIGS. 56 and 57, one block of 4 phase shifter unit cells 910A, another block of 8 phase shifter unit cells 910B, another block of 16 phase shifter unit cells 910C and another block of 32 phase shifter unit cells 910D are provided. Each block is individually controlled by application of a digital control signal which applies a controllable DC voltage between the actuatable conductor and ground conductors of the MEMS bridge of each unit cell in the respective group (e.g. switching between 0 and 40 V). For example, the actuatable conductors of each MEMS bridge in the respective group may be connected in parallel and switchable between two different voltages (e.g. 0 V and 40 V). This provides a 4-bit controllable phase shifter with the blocks of 4, 8, 16 and 32 unit cells providing a phase shift of 22.5°, 45°, 90° and 180° respectively. The same DC voltage is applied between the actuatable conductors and ground conductor of each (switchable) MEMS bridge in the respective group. The electrical properties of each unit cell (e.g. capacitances when the MEMS bridge is down and the characteristic impedance of the coaxial waveguide signal line) are thereby selected to provide a phase shift of 5.625°.

Item 906 is an inductor, added here to show the effects of a through-wafer interconnect. Items 914A, B, C and D are conductive pads for making electrical connections to apply DC voltages between the actuatable conductor and ground conductor of each of the unit cells 910A, 910B, 910C, 910D.

In order to enable the MEMS bridges to be closely packed together on a 2D substrate surface, they are arranged in rows with occasional conductive bridges 912 which simply provide a conductive connection across a signal line.

Nevertheless, ideally the cells within an individual block are not laid out consecutively in the rows shown in in FIG. 57 but are distributed, or at least in part split up, amongst the cells which together form the controllable phase shifter. The different blocks of cells (individual phase shifters) are typically interspersed. This reduces impedance mismatch effects which would otherwise arise if large blocks of consecutive phase shifters were implemented one after the other along a signal line.

Figure 58:
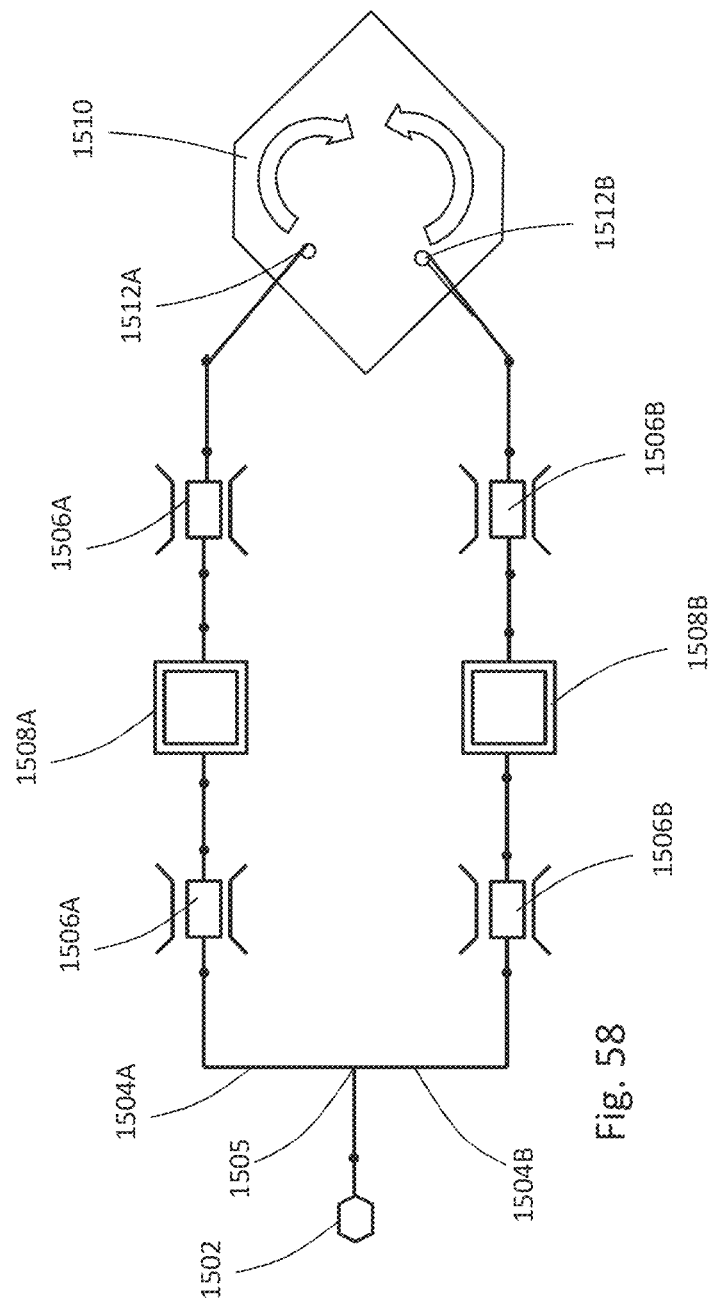
FIG. 58 is a schematic diagram of a polarisation control circuit to apply an RF signal to an antenna with selectable polarisation.

FIG. 58 illustrates a polarisation circuit which use the MEMS phase shifter unit cells of FIG. 45, combined in groups in series, generally as per FIGS. 55 and 56 to apply a signal to the terminals of an antenna 1500 with a phase difference (typically a multiple of 90°) therebetween so as to provide a linear, circular or elliptical polarisation to the antenna. The antennas are patch antennas with two ports, for example as shown in WO 2008152428 (Arslan et al.) or WO 2018115895 (Haridas et al.).

A signal 1502 is received, split into branches 1504A, 1504B at a junction 1505 and conducted through coplanar waveguides 1506A, 1506B to respective phase shifters 1508A, 1508B and thereby to terminals 1512A, 1512B of the antenna. By setting the phase shifters 1508A. 1508B to different phase shifts relative to each other it is possible to select linear, circular or elliptical polarisation. (For elliptical polarisation the amplitude of one of the signals is changed, for example using the attenuator circuit of FIG. 60A or FIG. 60B).

| Phase Shift 1508A | Phase Shift 1508B | Effect |
| --- | --- | --- |
| 0° | 0° | Linear polarisation (e.g. vertical) |
| 0° | 90° | Right hand circular polarisation |
| 0° | 180° | Linear polarisation (e.g. horizontal) |
| 0° | 270° | Left handed circular polarisation |
| 90° | 90° | Linear polarisation (e.g. vertical) |
| 90° | 180° | Right hand circular polarisation |
| 90° | 270° | Linear polarisation (e.g. horizontal) |
| 90° | 0° | Left handed circular polarisation |

It may be that the phase shifters cause a fixed phase shift, or it may that one or both phase shifters have a phase shift which is selectable from at least two values. In some embodiments, one of the branches does not require a phase shift in which case phase shifter 1508A may be omitted and the signal in branch 1504A may simply be passed to the terminal 1512A.

In an embodiment, phase shifter 1508A is a fixed 90° phase shifter and phase shifter 1508B is switchable between 0°, 90°, 180° and 270°. In another embodiment, phase shifter 1508A is switchable between 0° and 90° and phase shifter 1508B is switchable between 0°, 90°, 180° and 270°.

A switchable phase shifter is implemented by connecting groups of phase shifters according to FIG. 45 in series and controlling them in groups, such that all of the bridges within each group are actuated together. This can be implemented using a circuit such as shown in FIGS. 56 and 57, although typically with groups of 90° or 180° phase shift.

Figure 59A:
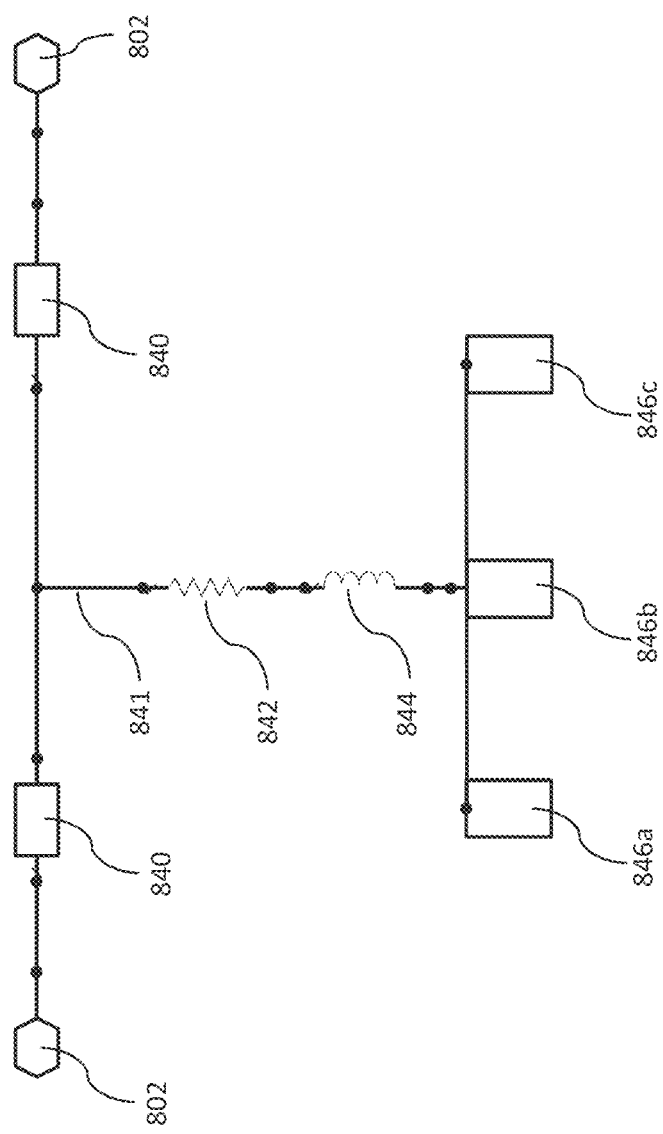

FIG. 59A illustrates an attenuator circuit and FIG. 59B illustrates an alternative attenuator circuit. FIG. 59A illustrates a circuit wherein a signal line 840 extends between connections 802. A branch conductor 841 extends through a series resistor 842 and inductance 844 (typically determined by the properties of a signal conductor, e.g. width, separation from ground conductors, dielectric constant of adjacent substrate etc.), to three capacitive MEMS switches 846a, 846b, 846c, for example according to FIGS. 42 and 45. Similarly, FIG. 59B illustrates a circuit wherein a signal line 840 extends between connections 802. A branch conductor 841 extends through an inductor 844, to three capacitive MEMS switches 846a, 846b, 846c and three resistors in parallel, and thereafter to ground. When the bridges of the MEMS switches are in the first position (up state) the capacitance of the MEMS switches is low and the circuit formed by the branch conductor, resistor, inductance and MEMS switches presents an open circuit to, and does not attenuate, RF signals passing along the signal conductor. However, when the bridges of the MEMS switches are in the second position (down state) the capacitance of the MEMS switches is much higher, the capacitances and inductance form a series resonant circuit and the circuit branch provides a low impedance and the RF signal interacts with the resistance 842, which thereby attenuates the RF signal passing through 802. The inductors and capacitances are selected depending on the frequency of the RF signal for which the circuits are designed. Although either the circuit illustrated in FIG. 59A or that in FIG. 59B may be suitable, the circuit of FIG. 59B is generally preferable because in FIG. 59A it has been surprisingly found that current passes through the resistor twice when the bridge is in the up state, leading to losses equivalent to the resistor value, by moving the resistor(s) to the positions indicated in FIG. 59B (i.e. instead of the position indicated in FIG. 59A) these losses are mitigated.

Figure 60B:
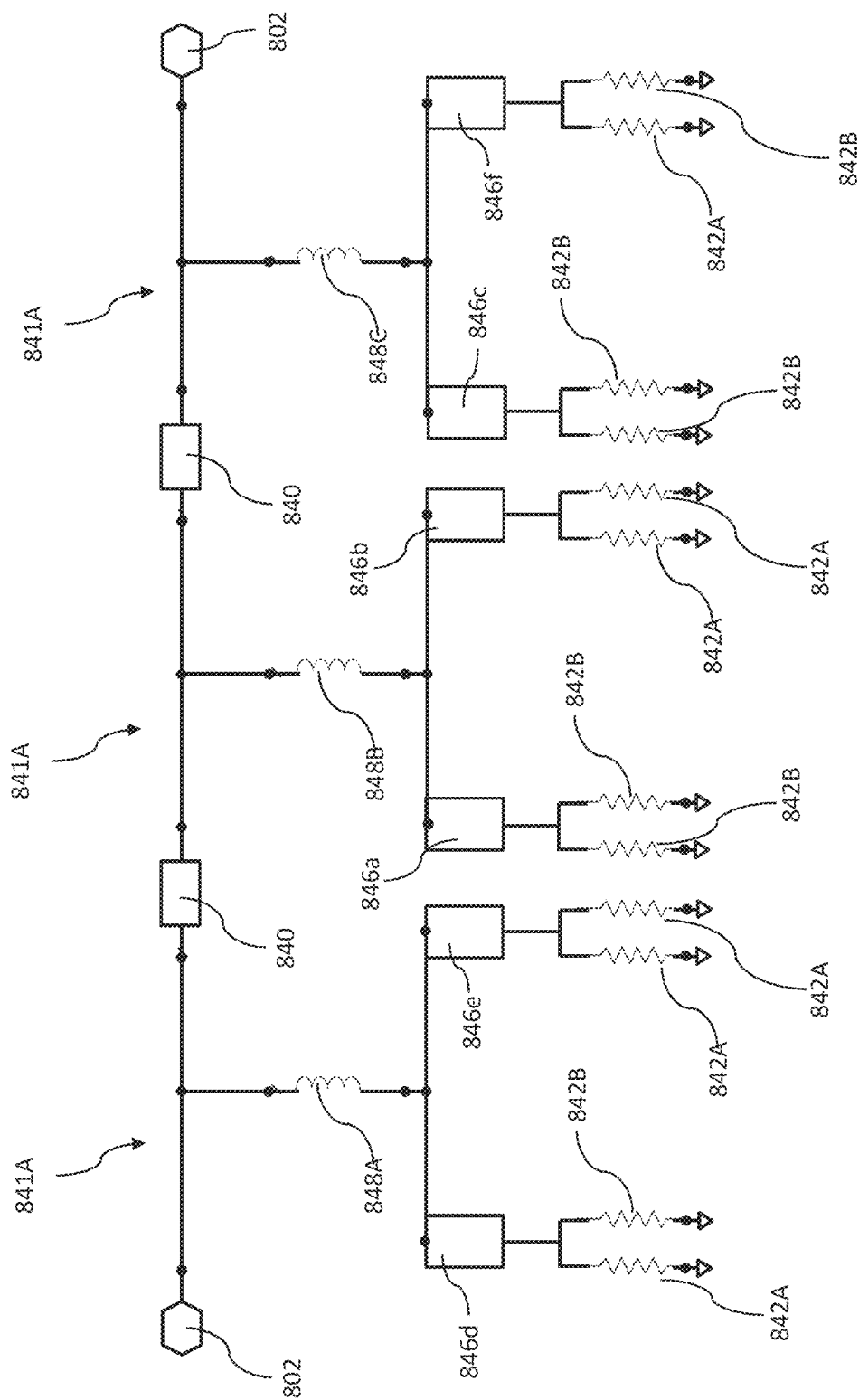

FIG. 60A illustrates a controllable attenuator with three consecutive attenuator cells 841A, 841B, 841C along signal line 840, each cell has a branch with individually actuatable bridges 846A-F (in pairs) which connect to ground, providing attenuator bits. Each cell 841A, 841B, 841C of FIG. 60A also has inductance 842A, B, C and resistance 848A, B, C. Similarly, FIG. 60B illustrates a controllable attenuator with three cells 841A, 841B, 841C along a signal line 840, each cell likewise having a branch with individually actuatable bridges 846A-F (in pairs) which connect to ground via resistance 848A, 848B and, wherein each cell 841A, 841B, 841C also has inductance 842A, 842B, 842C. The cells of FIG. 60A function as the individual cell of FIG. 59A and the cells of FIG. 60B function as the individual cell of FIG. 59B—when the bridge is in the upstate the capacitance has a low value (giving a high impedance Xc) and presents a good isolation to the signal. However, when the respective MEMS bridges are in the down state, the capacitance is increased, the respective inductance is matched with the capacitance to provide a low impedance path for the signal through the branch and the added resistance 848A, 848B, 848C causes a resistive loss of signal. The example shown can function as a three-bit attenuator (with the cells having impedances spaced apart by powers of 2) with suitable selection of component values.

FIG. 62A is a plan view of a circuit element which functions as a bidirectional SPDT switch for an RF signal and FIG. 63A is a schematic view. The SPDT switch uses switchable stub circuits 930A, 930B having a conductor with a relatively narrow portion 932 having a predetermined inductance, and a wider portion 934 extending to ground under the MEMS bridges 50 of three MEMS devices according to FIGS. 42 and 45.

When the MEMS bridges of one of the switchable stub circuits are in the up state the capacitances of the MEMS switches have a low value, giving a high impedance Xc and the switchable stub circuit present good isolation to RF signal. However, when the MEMS bridges of one of the switchable stub circuits are actuated to the down (second) position, the capacitances are increased, the inductance of the conductors 934 is matched with the capacitance to provide a low impedance path for signal at the frequency of RF signal for which the circuit is designed.

For an SPDT switch, there is a junction 938 and a quarter wavelength between the junction and the ground through the series resonant switches 930A, 930B of FIG. 61A. When the switchable stub circuit is in a first state (MEMS switches in up state), it creates an open circuit, which presents a short circuit at the junction, thereby presenting good conducting path to the RF signal which passes to the corresponding port. When an individual switchable stub circuit is a second state (MEMS switches in down state), it creates a short circuit, which presents an open circuit at the junction, thereby reflecting RF signal which therefore passes along the other branch. The switchable stub circuits are maintained in opposite states and switched concurrently to route the RF signal.

Figure 62C:
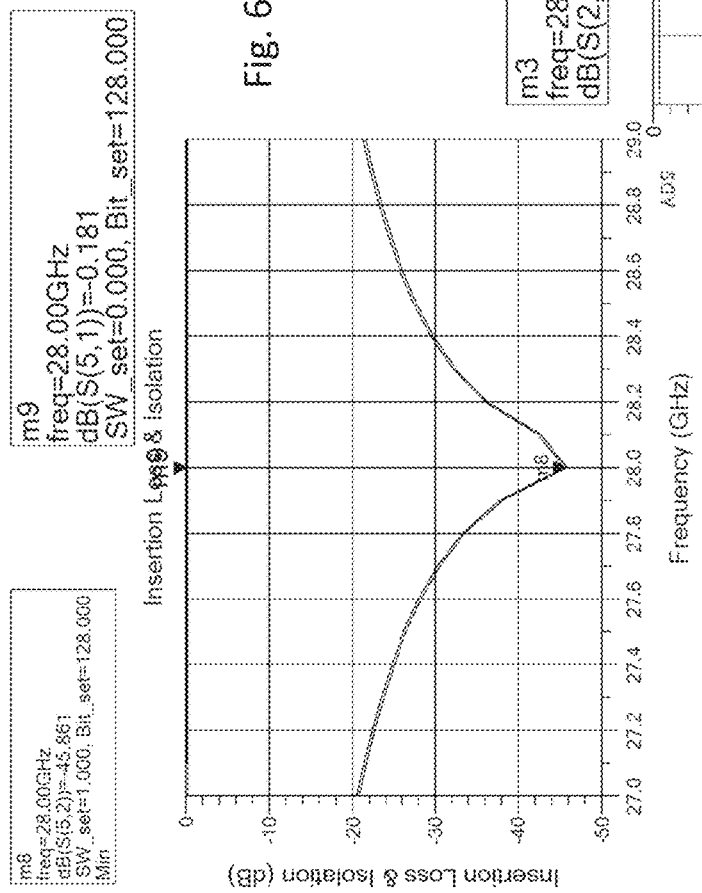
FIG. 62C is a graph showing the expected performance of the SPDT using the MEMS in the switchable stub circuit in the first configuration.

In more detail, with reference to FIG. 62A, a common port (e.g. signal input) 920 receives an RF signal which can be directed to either first 922 or switched port 924 (equating to the single pole and the double throw of the SPDT switch). Signal conductors 924A, 924B, 924C form coplanar surface waveguides with ground conductor 926. Gaps 927 are provided between the signal conductor and ground. Static bridges 928 extend across the gaps to distribute ground. Series resonant switch elements 930A, 930B include switchable stub circuits 932 described above. MEMS bridges 934 as described above, are provided in these switchable stub circuit branches. The MEMS bridges are selectively engageable to be pulled down, switching an individual switchable stub circuit from presenting a good isolation to the RF signal, to a resonant circuit (the second state) in which they effectively present a short circuit to RF signal of the frequency for which the circuit is designed. The control circuitry is set such that one of the switches 930A or 930B is set to the first state and the other is in the second state, which states can be swapped as required. The electrical length between the junction 938 in the signal conductor and ground through one of the stub circuits is set to a quarter of the wavelength of the RF carrier signal. This means that when one stub circuit 930A or 930B is in the second (short circuit) state, the RF signal is directed along the branch towards the other stub circuit (and correspondingly the other port). When 930A is in the second (short circuit) state the signal is directed to port 924 and when 930B is in the second (short circuit) state the signal is directed to port 922. Thus, an efficient and controllable SPDT switch can be implemented. FIG. 62C shows the expected performance of the SPDT using the MEMS in the switchable stub circuit in the first configuration.

Figure 62D:
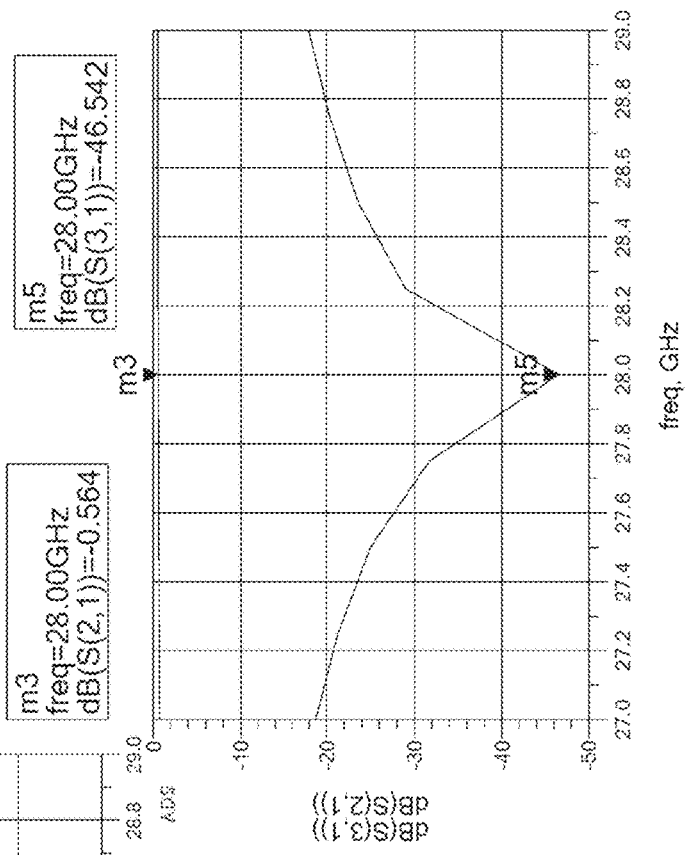
FIG. 62D is a graph showing the expected performance of a bidirectional SPDT using the MEMS in the switchable stub circuit in the alterative configuration.

FIG. 62B is a plan view of a circuit element which functions as a bidirectional SPDT switch for an RF signal and FIG. 63B is a schematic view. The SPDT switch uses switchable circuits 931A, 931B having a conductor 933A, 933B, each of which has a relatively narrow portion 932 having a predetermined inductance, and parallel to the MEMS bridges 50 of the MEMS devices according to FIGS. 42 and 45. The MEMS bridges and inductance form respective switchable circuits. FIG. 62D shows the expected performance of the bidirectional SPDT using the MEMS in the switchable stub circuit in this alternative configuration.

When the MEMS bridges 50 of one of the switchable circuits are in the up state the capacitances of the MEMS switches have a low value, the inductance of the conductors 933A, 933B is matched with the capacitance to provide a low impedance path for signal at the frequency of RF signal for which the circuit is designed.

However, when the MEMS bridges of one of the switchable circuits are actuated to the down (second) position, the capacitances of the branch conductor circuits 931A, 931B are increased, giving high impedance and the switchable circuit presents good isolation to RF signal.

For this SPDT switch, there is a junction 938, which does not need a quarter wavelength between the junction and the ground through the series resonant switches 930A, 930B of FIG. 61A. Instead the switch is directly connected in series across the conductor, thereby reducing the overall size of the device. When a branch conductor circuit is in a first state (MEMS switches in up state), it presents a short circuit, presenting low insertion loss to the RF signal which passes to the corresponding port. When an individual switchable branch conductor circuit is in a second state (MEMS switches in down state), it presents an open circuit, reflecting RF signal which therefore passes along the other branch. The switchable branch conductor circuits are maintained in opposite states and switched concurrently to route the RF signal.

In more detail, with reference to FIG. 62B, a common port (e.g. signal input) 920 receives an RF signal which can be directed to either first 922 or switched port 924 (equating to the single pole and the double throw of the SPDT switch). Signal conductors 933A, 933B, 933C form coplanar surface waveguides with ground conductor 926. Gaps 927 are provided between the signal conductor and ground. Static bridges 928 extend across the gaps to distribute ground. Series resonant switch elements 931A, 931B include switchable circuits 931A, 931B described above. MEMS bridges 50 as described above, are provided in series in these switchable circuit branches. The MEMS bridges are selectively engageable to be pulled down, switching an individual switchable branch conductor circuit from presenting a good conducting path to the RF signal, to a resonant circuit (the second state) in which they effectively present an open circuit to RF signal of the frequency for which the circuit is designed. The control circuitry is set such that one of the switches 931A or 931B is set to the first state and the other is in the second state, which states can be swapped as required. This means that when one circuit 931A or 931B is in the second (open circuit) state, the RF signal is directed along the branch towards the other branch conductor circuit (and correspondingly the other port). When 931A is in the first (short circuit) state the signal is directed to port 922 and when 931B is in the first (short circuit) state the signal is directed to port 924. Thus, an efficient and controllable SPDT switch can be implemented.

Figures 64, 65:
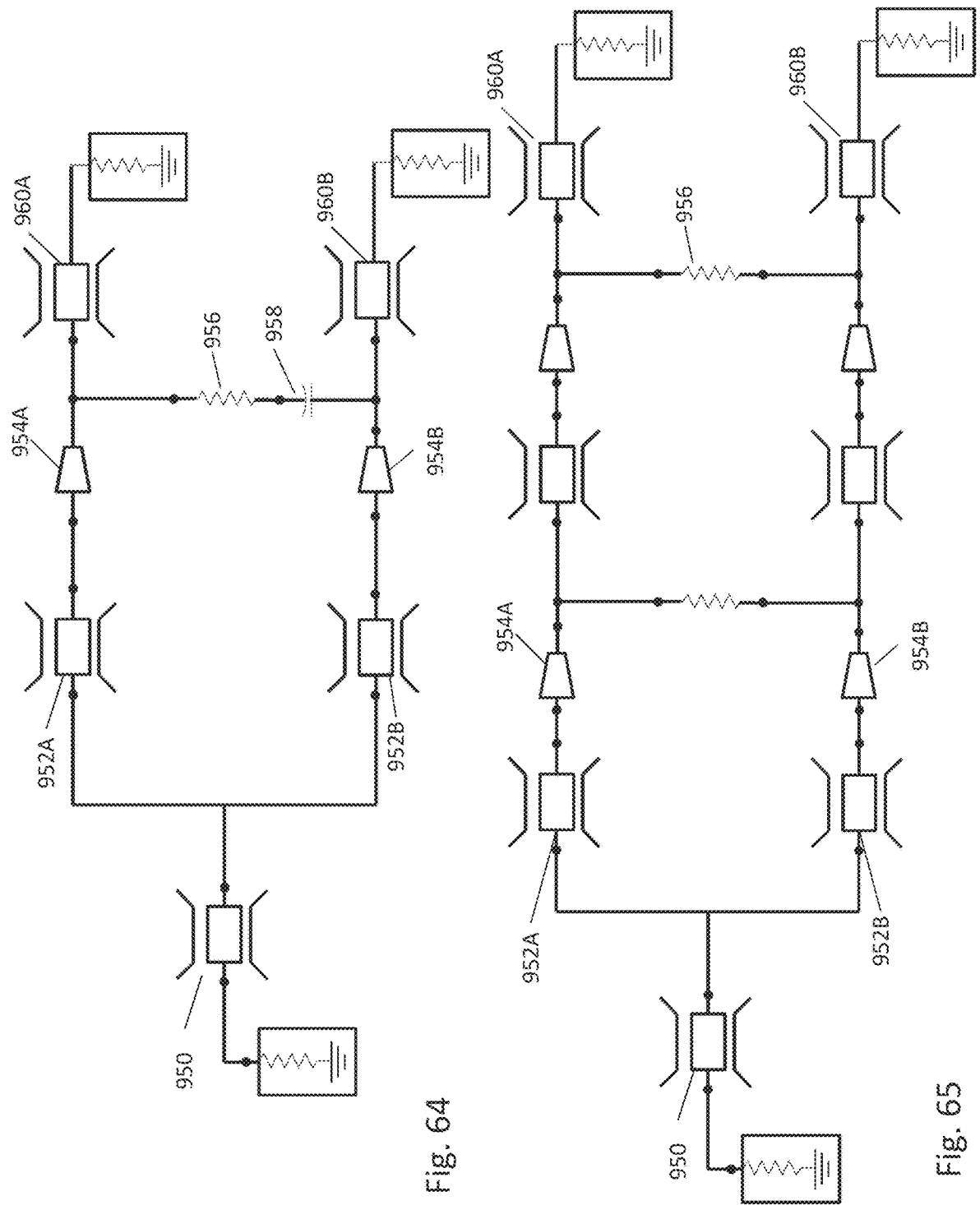
FIG. 64 is a circuit diagram of a known Wilkinson power divider and FIG. 65 is a variant with multiple branches and higher bandwidth.

FIGS. 64 and 65 show circuit diagrams of a traditional splitter or Wilkinson power divider. FIG. 64 is a circuit diagram of a traditional lumped element Wilkinson power divider in which a coplanar transmission line 950 is split into two quarter wavelength length waveguide regions 952A, 952B, passed through a tapering region 954A, 954B to give a predetermined inductance and the two branches are connected through a series resistor 956 and capacitor 958 to give a selected reactance between the branches. The outputs are decoupled and power is split. However, the divider has quite a narrow and fixed frequency band. FIG. 65 shows a variation with an additional branch. The addition of further branches can increase the bandwidth but takes up substrate space.

Figure 66:
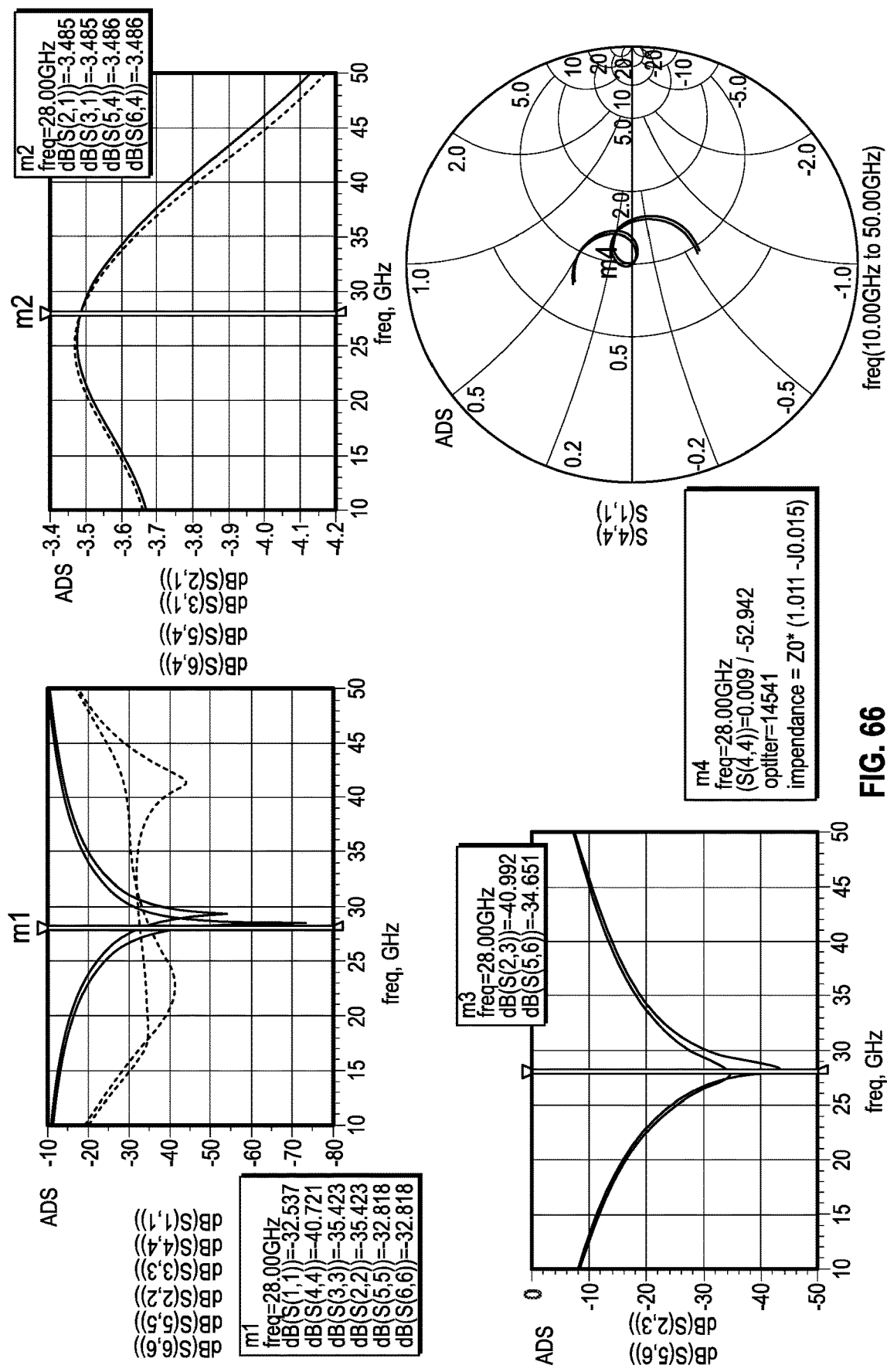
FIG. 66 shows the S-parameters of the circuit of FIG. 64 (bottom left) and FIG. 65 (top left) and the insertion loss of the circuit of FIG. 64 (top right). The x-axis is signal frequency in GHz, the y-axis is signal power (left side graphs) and signal loss (top right graph).

FIG. 66 illustrates the performance of a Wilkinson divider in its S-parameters. Here we see the return loss splitters of FIGS. 64 (bottom left) and 65 (top left). The insertion loss between the input port and the two output ports is illustrated in the top right of FIG. 66.

FIG. 67 is a schematic diagram of a lumped element power divider according to the present invention which employs the MEMS devices described above and according to FIG. 45. There is a combined port 950 and two split ports 960A which can function as an input and two outputs, or as two inputs and one output. Coaxial waveguide 950 splits into two transmission lines 952A and 952B at a common port junction 951.

Each transmission line has two transmission line segments (974A, 974B or 974C, 974D) which are connected to each other through junction elements, in this case formed by resistors 975, which connect the transmission line segments. The electrical length between the common port junction 951 and the first junction element, and between the junction elements, along the respective transmission line segments is important and the optimum performance is obtained with RF frequencies for which the respective electrical lengths are quarter wavelength.

The transmission lines 974A, 974B, 974C, 974D, have inherent inductance and capacitance shown as lumped circuit elements determined for example by the width of the signal conductor, spacing between signal and ground conductors, dielectric constant of the substrate and so forth. Each transmission line segment has a MEMS bridge 50 which can be actuated to the second (down state) position, connecting the transmission line to ground through a significant capacitance, having the effect of changing the electrical length of the transmission line segment.

Figure 69:
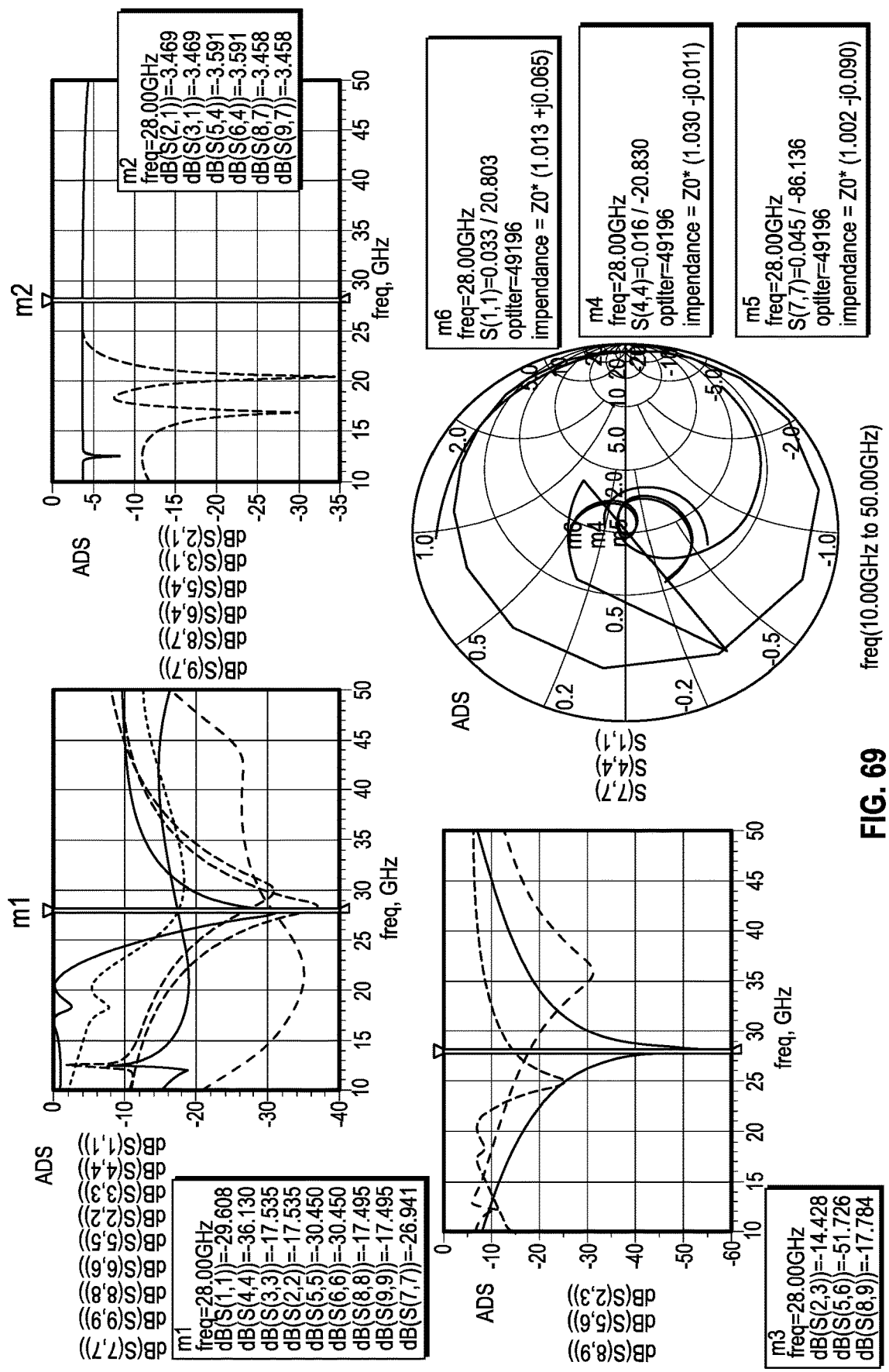

The MEMS bridges may be selectively pulled down thereby applying a significant parallel capacitance on the transmission line. This has the effect of changing the electrical length of the respective transmission line segment. As a result, a tuneable power splitter is provided. Each branch has two transmission line segments with MEMS bridges (branch 952A has 974A and 974C, and branch 952B has 974B and 974D). There are therefore three possible centre frequencies and the circuit can be tuned to all three frequencies by virtue of the MEMS devices. FIG. 68 shows an embodiment of a power divider which uses MEMS devices described above as series capacitors instead of the inductors of FIG. 67. The performance of the MEMS lumped element power divider is shown in FIG. 69, where we now see a much wider bandwidth of the circuit and similar performance of the insertion loss and isolation.

Figure 70:
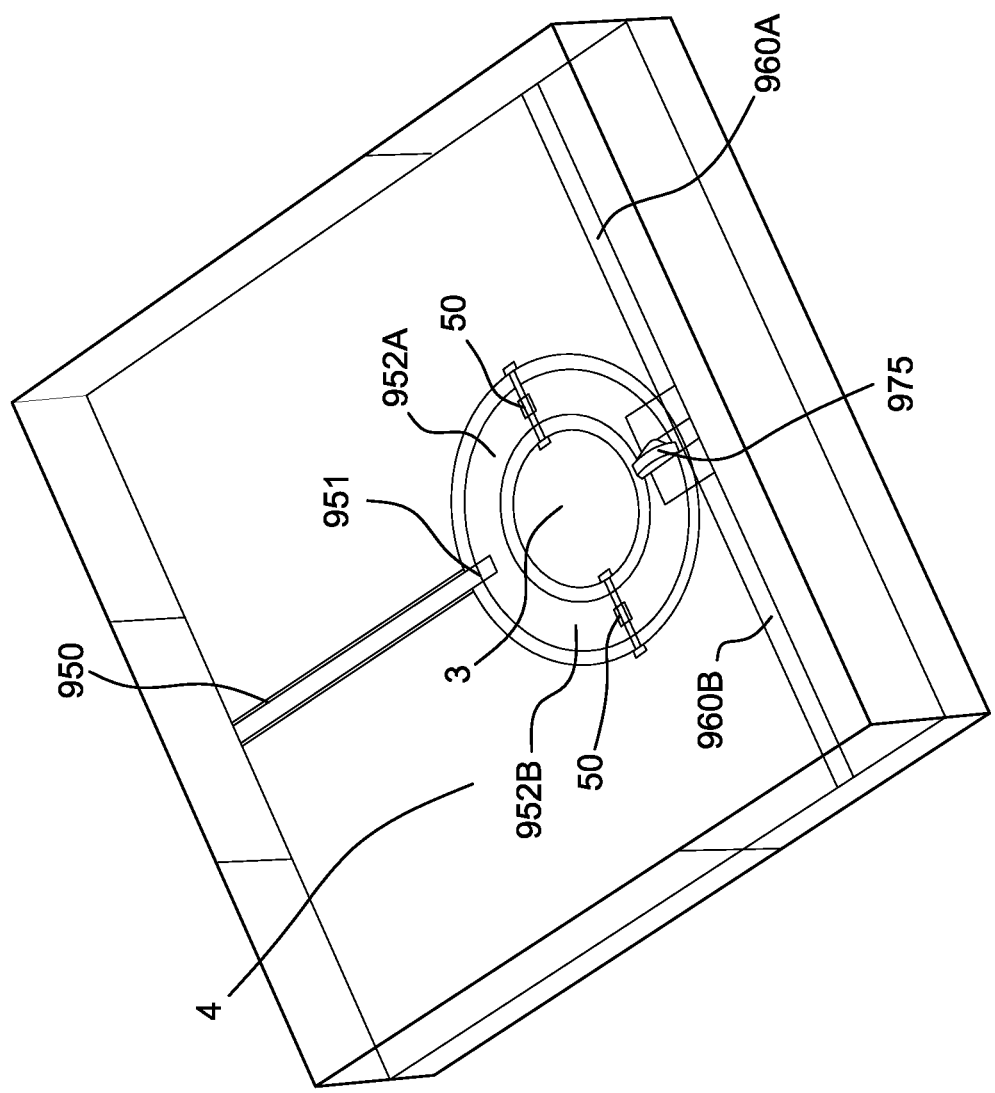
FIG. 70 shows a 3D model for a MEMS tuneable power divider.
Figure 71:
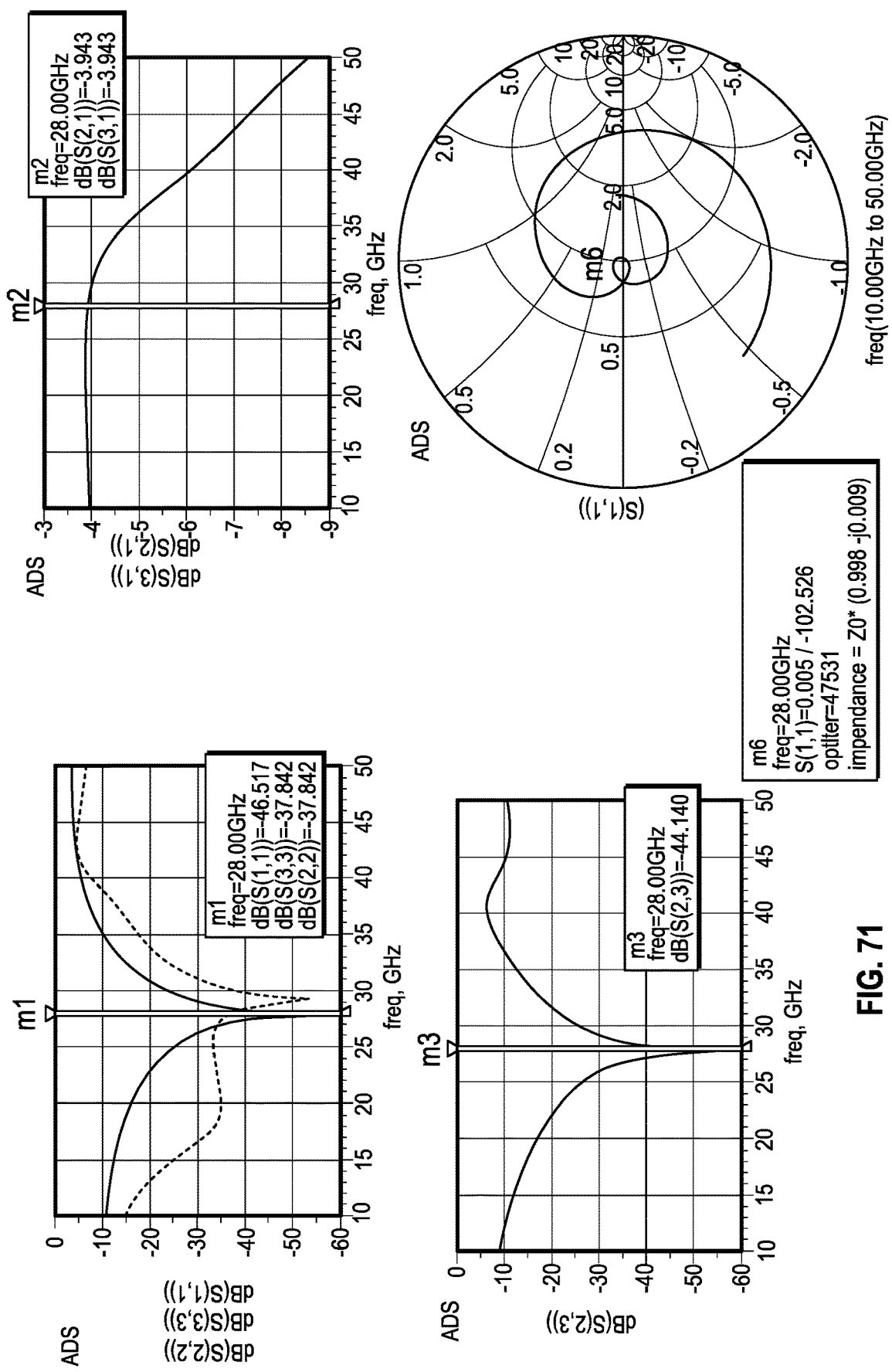
FIG. 71 shows a series of S-parameter plots for the circuit of FIG. 67 with the MEMS added to the power divider.

FIG. 70 shows how the circuit of FIG. 67 can be laid out in a practical example, with MEMS bridge 50 acting as a parallel capacitor over the transmission line. FIG. 71 shows the performance of an example embodiment with a centre frequency of 28 GHz. When the MEMS bridge is added to the power divider, the return loss shows a much larger bandwidth than before (from 10-35 GHz). There is an insertion loss due to the MEMS, but the isolation is still maintained.

Figure 72:
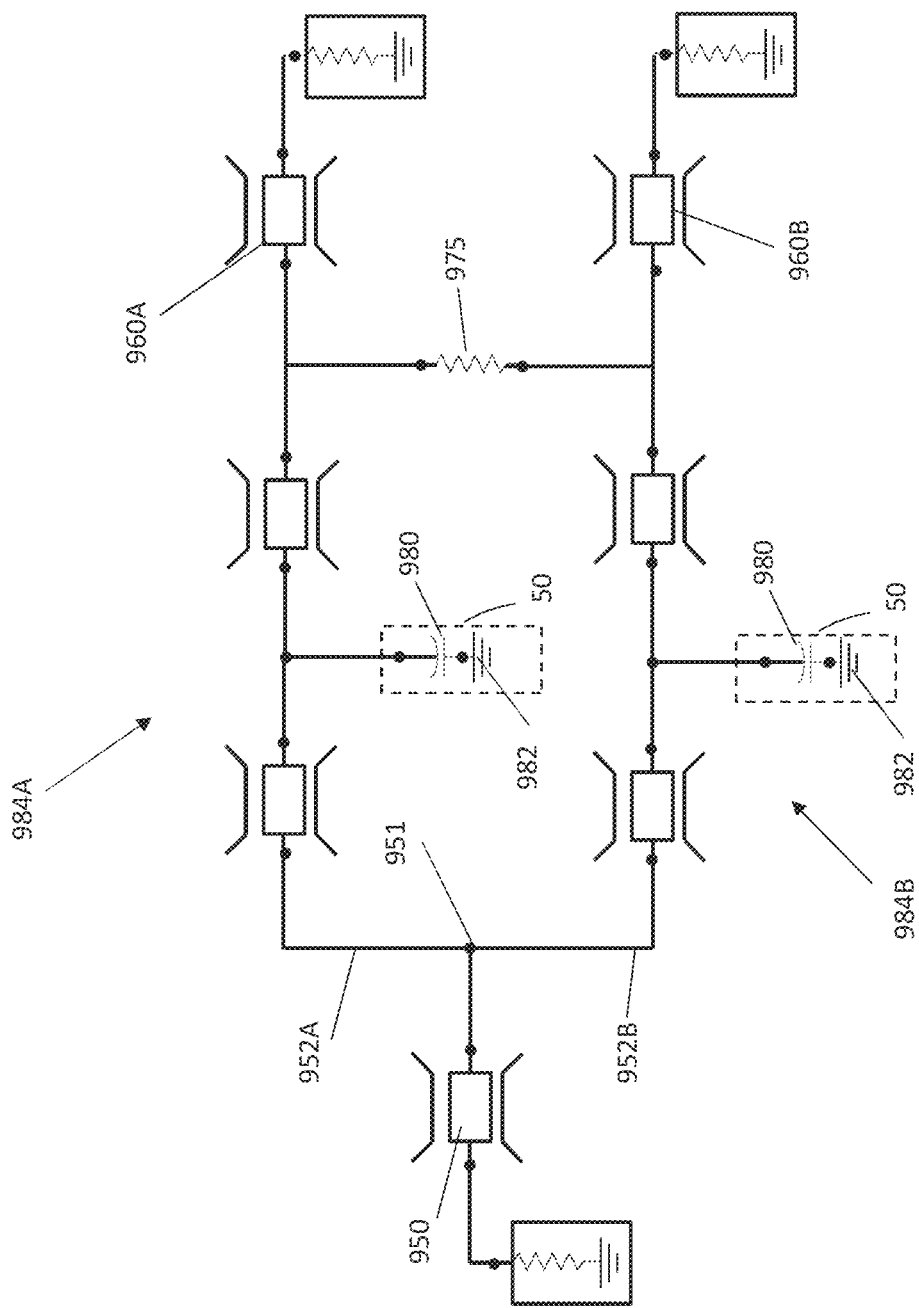

FIG. 72 is an alternative embodiment in the form of a lumped element power divider. Here a simplified model was used with only a single MEMS device (capacitive switch) 50 in between the quarter wave transformer applying a connection to ground 982 through a selective capacitance 980 (being the overall capacitance of the capacitor circuit shown in FIG. 44A) when the bridge is in the second (down) state to each of two transmission line segments 984A, 984B connected through resistor 975. This has the effect of switching the electrical length of each transmission line segment 984A, 984B and thereby the optimum frequency of the circuit. This demonstrates that a single MEMS device (as a capacitive switch) in the branch can tune the frequency response of the entire circuit.

Figure 73:
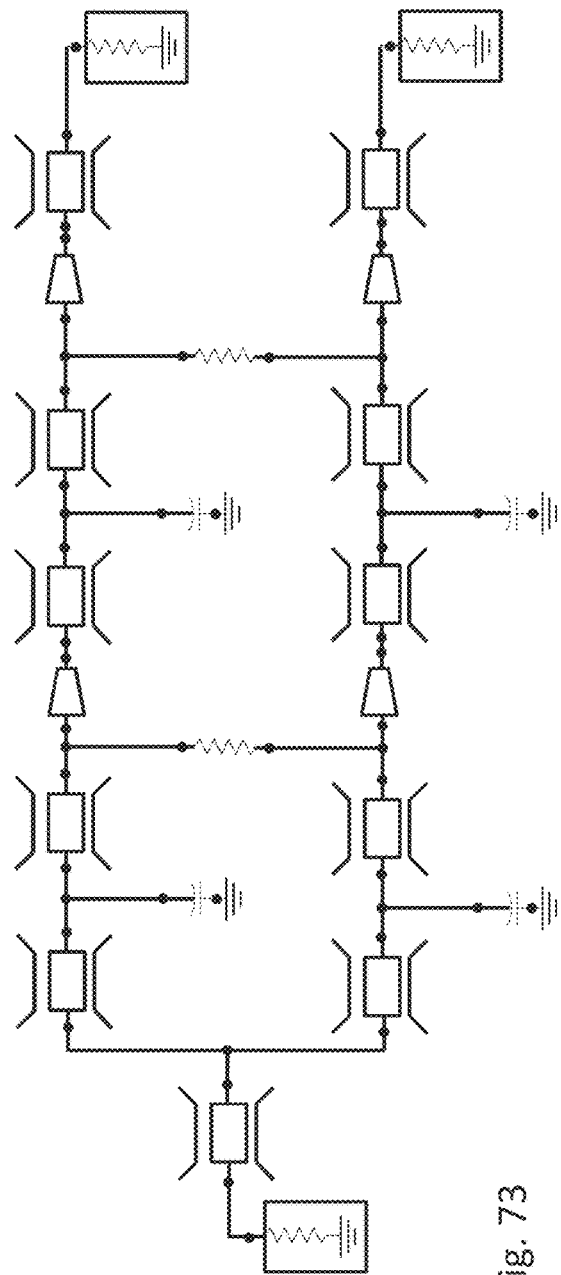
FIG. 73 is a schematic circuit diagram of a multi-stage version of the MEMS divider of FIG. 67
Figure 74:
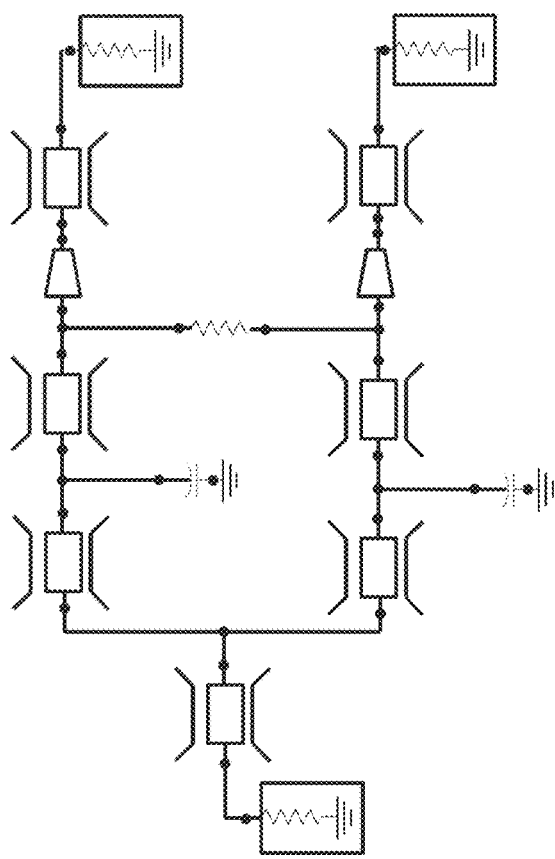
FIG. 74 is a schematic circuit diagram of a multi-stage version of the lumped element MEMS divider of FIG. 68.
Figure 75:
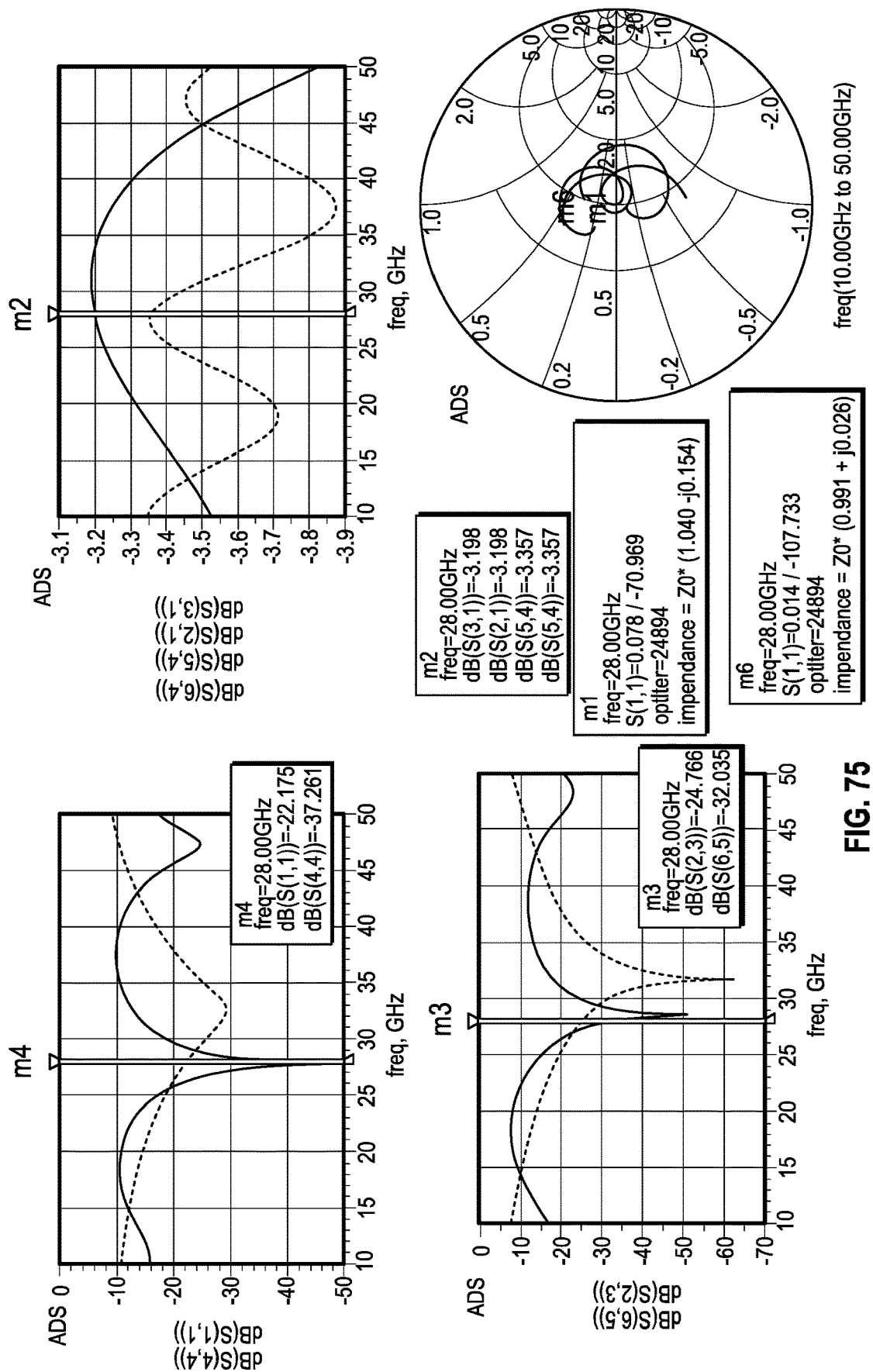
FIG. 75 is a series of S-parameter plots for the circuit of FIG. 68.

FIG. 73 illustrates a multistage variation of the power divider with a MEMS device acting as a capacitive switch in series between the quarter wave transformers. In addition, a MEMS device is used as a tapering region. FIG. 74 shows an embodiment of the multistage variation of FIG. 73 with one less branch. FIG. 75 illustrates the performance of the power dividers of FIGS. 73 and 74. It can be seen from FIG. 75 that, by utilising the MEMS device as described above in a power divider, it is possible to implement a tuneable filter into the power divider. This is achieved by altering the number of branches within the network.

Figure 76:
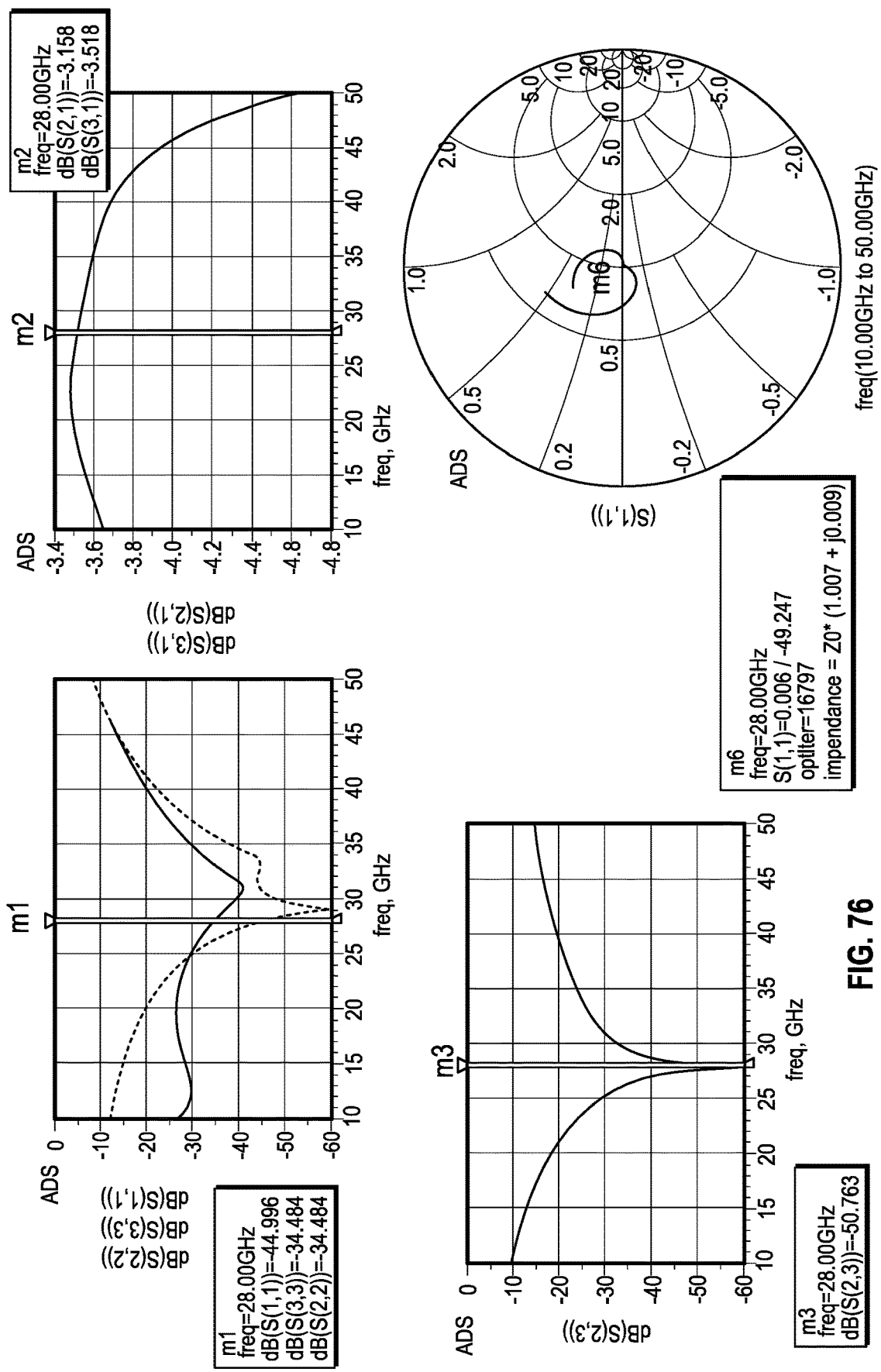
FIGS. 76 to 78 are a set of plots of the behaviour of 28 GHz, 20 GHz and 39 GHz MEMS splitters of FIG. 73.
Figure 77:
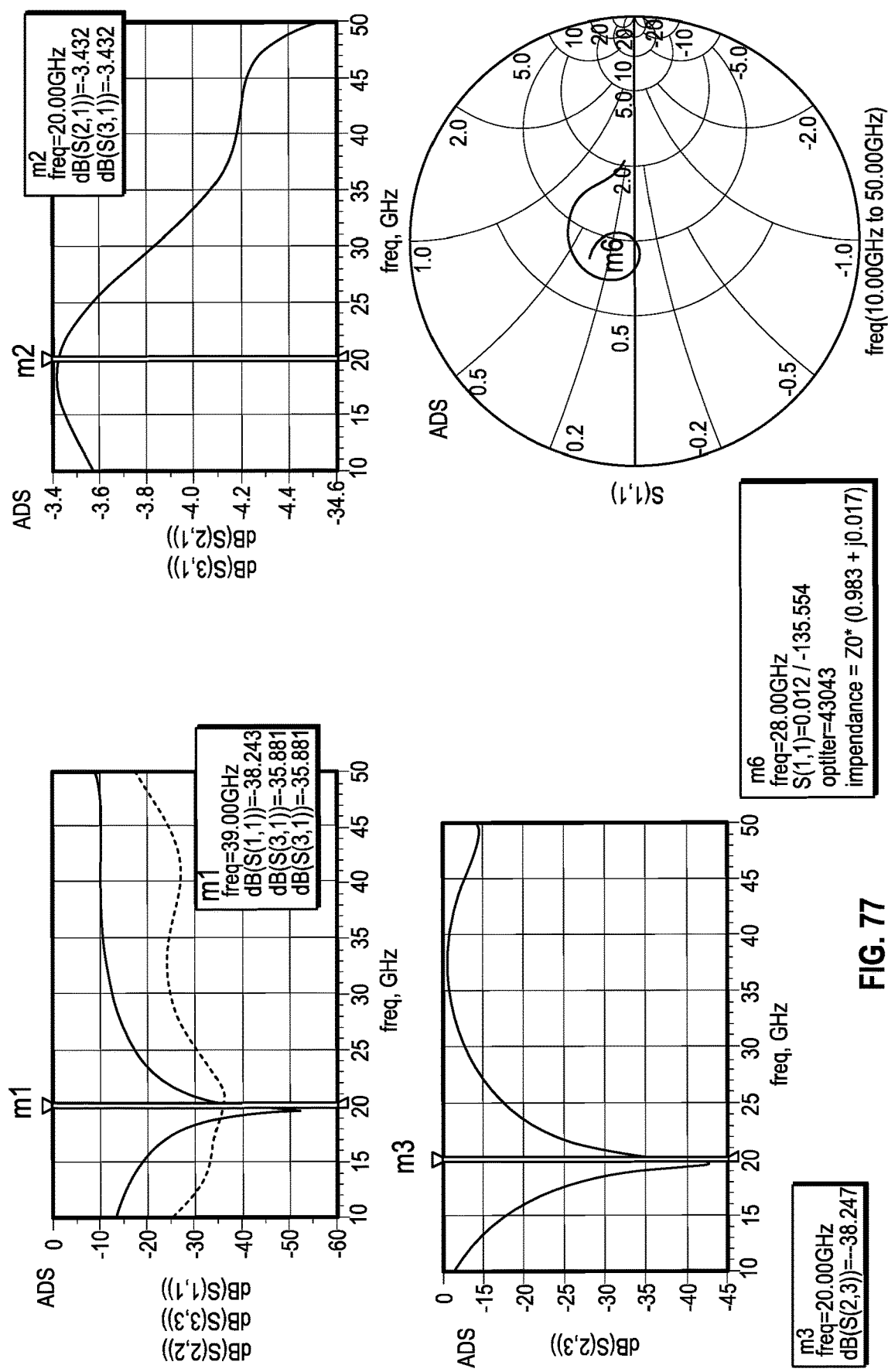
Figure 78:
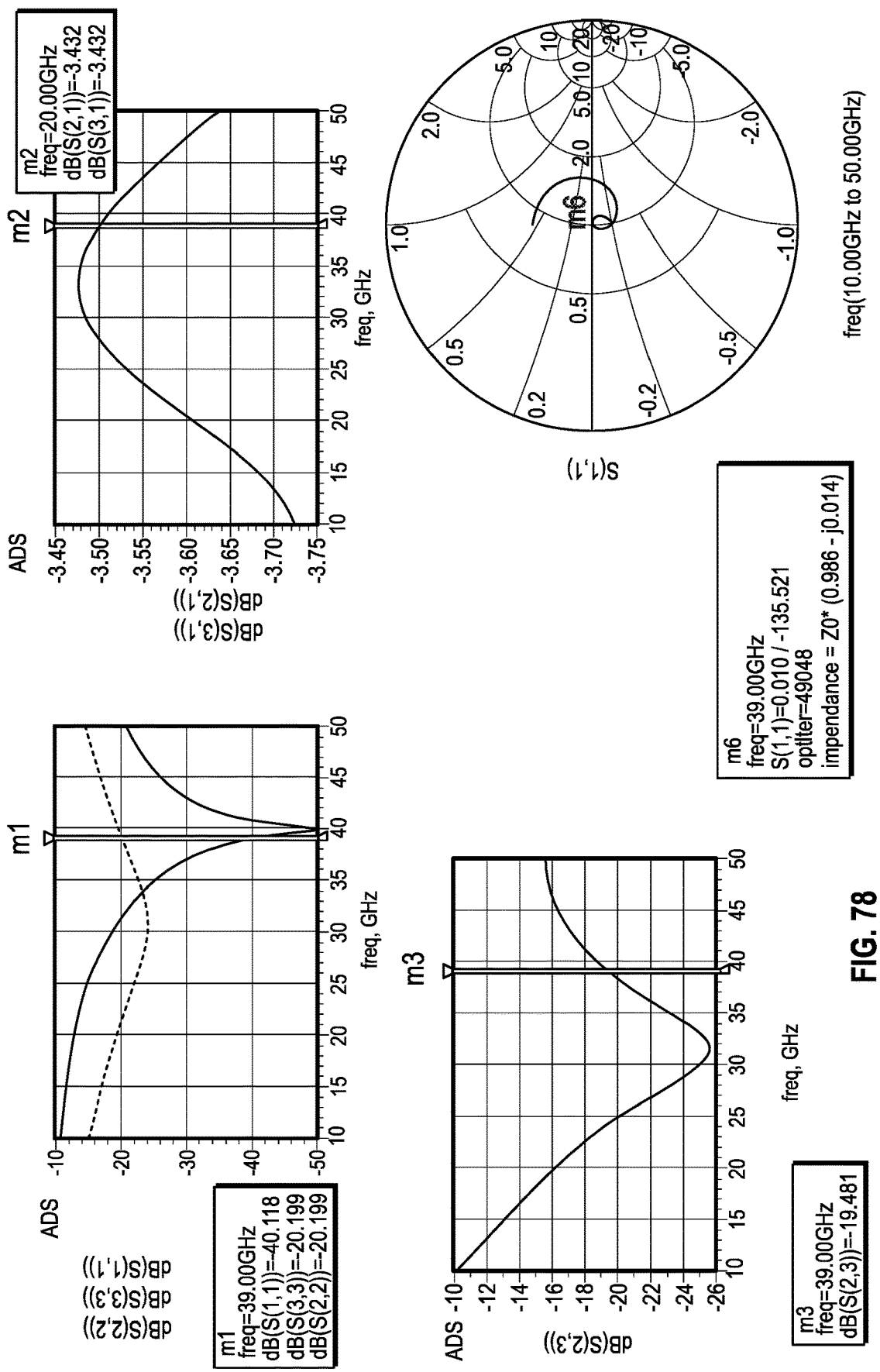

FIGS. 76, 77 and 78 illustrate the performance of three power dividers of differing frequencies utilising the MEMS device as described above. FIG. 76 is for a 28 GHz MEMS power divider, FIG. 77 is a 20 GHz MEMS power divider, and FIG. 78 is a 39 GHz MEMS power divider. It can be noted that similar performance is presented for each MEMS power divider, with similar insertion loss and return loss, simply by tuning the MEMS in the circuit. In this case, the MEMS devices are used as MEMS varactors such that the centre frequency of the splitter network can be tuned by a set or bank of MEMS varactors. The power divider can also be made into compact forms saving 200% area compared to a typical multi-stage power divider required to provide a wider bandwidth, by using MEMS varactors in series or shunt circuits combining the two or more branches of the power divider networks.

Although the above is described in terms of a power divider, it will be appreciated that the circuit may be used as a combiner network, or a splitter combiner network.

Further variations and modifications may be made within the scope of the invention herein described.

The invention claimed is:

1. A microelectromechanical systems (MEMS) device comprising: a substrate; a signal conductor supported on the substrate; ground conductors supported on the substrate on either side of the signal conductor; and a MEMS bridge at least one end of which is mechanically connected to the substrate by way of at least one anchor, the MEMS bridge comprising an electrically conductive switching portion formed on a resilient planar support comprising an electrically insulating material, the electrically conductive switching portion comprising a switching signal conductor region and a switching ground conductor region, the switching signal conductor region being provided over the signal conductor and the switching ground conductor region being provided over a said ground conductor, the electrically conductive switching region being movable, relative to the substrate and by elastic deformation of the resilient planar support, between first and second positions, to thereby change the impedances between the switching signal conductor region and the signal conductor and between the switching ground conductor region and the respective ground conductor, wherein there is no continuous electrically conductive path extending from the switching signal conductor region to the at least one anchor.

2. A MEMS device according to claim 1, wherein the impedances which change are capacitances and the MEMS device is a MEMS capacitive switch or a phase shifter.

3. A MEMS device according to claim 1, wherein the switching ground conductor region comprises a plurality of switching ground conductor regions on either side of the switching signal conductor region, whereby signal paths are provided to ground from the signal line through the capacitor formed between the signal line and the switching signal conductor region and through the parallel capacitors formed between the switching ground conductor regions and the ground conductors.

4. A MEMS device according to claim 1 which is cantilevered, having one anchor and no continuous electrically conductive path extending from the switching signal conductor region to the anchor, or the MEMS bridge has opposing first and second ends which are connected to the substrate by respective anchors and there is no continuous electrically conductive path extending from the switching signal conductor region to either of the anchors or the MEMS device is a teeter-totter switch wherein the MEMS bridge is mechanically connected to the substrate through a pivot.

5. A MEMS device according to claim 1, wherein the MEMS bridge comprises the resilient planar support which extends between the anchor(s) and the electrically conductive switching portion and wherein the MEMS bridge is deformable from a first position in which the switching signal conductor region and the switching ground conductor region(s) are spaced from the respective signal conductor and ground conductor(s) to a second position in which the switching signal conductor region and the switching ground conductor region(s) are closer to the respective signal conductor and ground conductor(s) than in the first position by way of an electrostatic actuation force, wherein the capacitances between the switching signal conductor region and the signal conductor and between the switching ground conductor region(s) and the ground conductor(s) are greater when the MEMS bridge is in the second position than when the MEMS bridge is in the first position.

6. A MEMS device according to claim 1, wherein the electrically conductive switching portion comprises the switching signal conductor region and the switching ground conductor region and an electrically conductive connecting region which extends between the switching signal conductor region and the switching ground conductor region, wherein the said electrically conductive connecting region has a width which is less than the widths of the switching signal conductor region and/or the switching ground conductor region.

7. A MEMS device according to claim 1, wherein there are one or more further signal conductors between the ground conductors, on either side of the signal conductor.

8. A MEMS device according to claim 1, wherein a solid electrically insulating layer is provided between the switching signal conductor region and the signal conductor, wherein when electrically conductive switching portion is in the second position, the electrically conductive switching portion of the MEMS bridge and the signal conductor sandwich the solid insulating layer and more than 60% of a surface area of the electrically conductive switching portion of the bridge which faces the signal conductor engages the said solid insulating layer.

9. A MEMS device according to claim 1, wherein the resilient planar support further comprises a mesh, the mesh comprising a plurality of discrete cells which have more than four sides, wherein the MEMS bridge comprises a mesh of electrically conductive material and the substrate has a ground conductor or substrate switching conductor supported thereon, under the mesh, wherein the conductor under the mesh comprises one or more gaps which are complementary with the apertures of the mesh.

10. A MEMS device according to claim 1, wherein the electrically conductive switching portion comprises one or more stress relief holes extending therethrough, the electrically conductive switching portion has a first surface facing the conductive line and a second surface opposite the first surface, the said holes extend through solid material of the conductive plate between the first and second surfaces and have openings on the first surface wherein a surface area of the said solid material on the first surface of the electrically conductive switching portion is greater than a total area of the said openings on the first surface of the electrically conductive switching portion.

11. A MEMS device according to claim 1, wherein the MEMS bridge comprises one or more actuatable conductors and the substrate comprises one or more pull-down substrate conductors, wherein the one or more pull-down substrate conductors and the at least one resilient planar support and/or the one or more actuatable conductors are configured to be at least partially interleaved with each other when the electrically conductive switching portion is in the second position.

12. A MEMS device according to claim 1, wherein the signal conductor and the ground conductors form a co-planar waveguide and wherein the co-planar waveguide comprises a bridged portion over which the MEMS bridge extends and an offset portion offset from the bridged portion along the length of the signal conductor, wherein the bridged portion of the co-planar waveguide has a characteristic impedance having a magnitude greater than the magnitude of the characteristic impedance of the offset portion at least when the MEMS bridge is in the first position, and wherein the characteristic impedance of the signal conductor tapers up in magnitude as it extends from the offset portion to the bridged portion.

13. A MEMS device according to claim 1 which is an ohmic switch, wherein the switching signal conductor region engages the signal conductor when the MEMS bridge is in the second position.

14. A phase shifter comprising a plurality of MEMS devices according to claim 1 connected along a signal conductor, each of which causes a phase shift to selectively be applied to a (RF) signal conducted along the signal conductor, the phase shifts combining to cause an overall phase shift, wherein the MEMS devices of the plurality of MEMS devices are configured in a plurality of groups of one or more MEMS devices which are switchable as a group by the application of a potential difference, wherein the MEMS devices of two or more said groups of two or more MEMS devices are interspersed along the length of the signal conductor.

15. A method of operating a MEMS device according to claim 1 comprising applying a potential difference between at least one conductor on the substrate and at least one conductor on the MEMS bridge to deform the resilient planar support to thereby move the electrically conductive switching portion from a first position to a second position by electrostatic actuation, wherein the electrically conductive switching portion is closer to the substrate in the second position than in the first position.

16. A method of manufacturing a MEMS device according to claim 1, the method comprising: providing a substrate; providing a signal conductor supported by the substrate; providing a MEMS bridge comprising an electrically conductive switching portion and a resilient planar support, wherein the electrically conductive switching portion is mechanically coupled to the substrate by the support, the MEMS bridge being movable between first and second positions by deformation of the support.

17. A method of manufacturing a MEMS device according to claim 16, the method comprising forming a first substrate supporting a signal conductor and one or more ground lines, forming a second substrate having a channel, a MEMS bridge across the channel, the channel extending to either side of the MEMS bridge, and sealing the first and second substrates together to form a sealed cavity including the MEMS bridge extending over the signal conductor, so that the sealed cavity retains the MEMS bridge, the signal conductor and the one or more ground lines.

18. An antenna circuit comprising an antenna element having first and second terminals, the circuit having a signal input for transmission of an RF signal or output for receiving an RF signal and a junction for splitting or combining a signal into or from first and second signal line branches, the first and second signal line branches extending between the junction and the first and second terminals respectively, one or both of the branches comprising a phase shifter configured to cause a phase difference in signals applied to or received from the first and second terminals, wherein the phase shifter comprises a MEMS device according to claim 1, wherein one or both phase shifters are configured to selectably apply a phase difference of 0°, 90°, 180° or 270° between the signals applied to or received from the first and second terminals wherein the antenna element is thereby reconfigurable between two or more of left circular polarised, right circular polarised or linearly polarised antenna configurations.

19. An attenuator circuit comprising a substrate supporting a signal conductor for transmitting RF signals, a branch conductor extending from the signal conductor to ground through a branch circuit comprising one or more resistors, one or more inductances and one or more MEMS devices being a capacitive MEMS switch, wherein the one or more MEMS devices are operable between a first state and a second state wherein the capacitance of the one or more MEMS devices are higher in the second state than the first state, configured such that when the one or more capacitive MEMS switches are in the first state, the branch circuit does not significantly attenuate RF signals in the signal conductor and wherein in the second state, the branch circuit presents a path to ground through the resistor and thereby attenuates the RF signals, wherein the one or more MEMS devices are capacitive MEMS switches according to claim 1.

20. A switch circuit for RF signals comprising a substrate supporting a signal conductor extending from a common port to a junction with first and second branch conductive lines supported on the substrate and extending from the junction to respective first and switched ports, the circuit further comprising first and second switchable stub circuits connected to the first and second branch conductive lines respectively between the junction and the respective switched port, each switchable stub circuit comprising one or more MEMS devices being MEMS capacitive switches according to claim 1, and having a first configuration in which the switchable stub circuit presents an open circuit to RF signals at a predetermined wavelength in the respective branch conductive line, and a second configuration in which the switchable stub circuit presents a short circuit to ground to RF signals at the predetermined wavelength in the respective branch conductive line such that the electrical length at the predetermined wavelength from the junction to the respective switchable stub circuit is an integer multiple of one quarter of the predetermined wavelength.

21. A MEMS device according to claim 11, wherein the one or more pull-down substrate conductors are regions of the ground conductor.

22. A MEMS device according to claim 11, wherein:
the one or more pull-down substrate conductors and the resilient planar support and/or the one or more actuatable conductors have interdigitating regions and/or the resilient planar support; and/or
the one or more actuatable conductors comprise a plurality of apertures and the one or more pull-down substrate conductors have interstitial conductor regions located within the apertures.

23. A MEMS device according to claim 1, wherein the electrically conductive switching portion comprises a continuous conductor including the switching signal conductor region and the switching ground conductor region.

24. A radio frequency (RF) microelectromechanical systems (MEMS) circuit comprising a substrate, a signal conductor supported on the substrate and ground conductors supported on the substrate, on either side of the signal conductor, and comprising a plurality of MEMS devices, wherein each of the MEMS devices comprises: a MEMS bridge at least one end of which is mechanically connected to the substrate by way of at least one anchor, the MEMS bridge comprising an electrically conductive switching portion formed on a resilient planar support comprising an electrically insulating material, the electrically conductive switching portion comprises a continuous conductor comprising a switching signal conductor region and a switching ground conductor region, the switching signal conductor region being provided over the signal conductor and the switching ground conductor region being provided over a said ground conductor, the electrically conductive switching region being movable, relative to the substrate and by elastic deformation of the resilient planar support, between first and second positions, to thereby change the impedances between the switching signal conductor region and the signal conductor and between the switching ground conductor region and the respective ground conductor, wherein there is no continuous electrically conductive path extending from the switching signal conductor region to the at least one anchor,
wherein the plurality of MEMS devices are configured in a plurality of groups of one or more MEMS devices which are switchable as a group by the application of a potential difference and wherein the MEMS devices of two or more said groups of two or more MEMS devices are interspersed along the length of the signal conductor.

25. An RF MEMS circuit according to claim 24, wherein the resilient planar support of each MEMS device comprises a mesh, the mesh comprising a plurality of discrete cells which have more than four sides, wherein the MEMS bridge of each MEMS device comprises a mesh of electrically conductive material and the substrate has a ground conductor or substrate switching conductor supported thereon, under the mesh, wherein the conductor under the mesh comprises one or more gaps which are complementary with the apertures of the mesh.

26. An RF MEMS circuit according to claim 24, wherein the electrically conductive switching portion of each MEMS device comprises one or more stress relief holes extending therethrough, the electrically conductive switching portion has a first surface facing the conductive line and a second surface opposite the first surface, the said holes extend through solid material of the conductive plate between the first and second surfaces and have openings on the first surface wherein a surface area of the said solid material on the first surface of the electrically conductive switching portion is greater than a total area of the said openings on the first surface of the electrically conductive switching portion.

27. An RF MEMS circuit according to claim 24 comprising a phase shifter comprising the plurality of MEMS devices of the RF MEMS circuit according to any one preceding claim connected along the signal conductor, each of which causes a phase shift to selectively be applied to a (RF) signal conducted along the signal conductor, the phase shifts combining to cause an overall phase shift.

28. An RF MEMS circuit according to claim 24 comprising an antenna circuit comprising an antenna element having first and second terminals, the circuit having a signal input for transmission of an RF signal or output for receiving an RF signal and a junction for splitting or combining a signal into or from first and second signal line branches, the first and second signal line branches extending between the junction and the first and second terminals respectively, one or both of the branches comprising a phase shifter configured to cause a phase difference in signals applied to or received from the first and second terminals, wherein the phase shifter comprises the plurality of MEMS devices of the RF MEMS circuit according to any one of claims 1 to 13, or is a phase shifter according to claim 14, wherein one or both phase shifters are configured to selectably apply a phase difference of 0°, 90°, 180° or 270° between the signals applied to or received from the first and second terminals wherein the antenna element is thereby reconfigurable between two or more of left circular polarised, right circular polarised or linearly polarised antenna configurations.

29. An RF MEMS circuit according to claim 24 comprising an attenuator circuit comprising the substrate supporting the signal conductor for transmitting RF signals, a branch conductor extending from the signal conductor to ground through a branch circuit comprising one or more resistors, one or more inductances and a plurality of MEMS devices being capacitive MEMS switches, wherein the plurality of MEMS devices are operable between a first state and a second state wherein the capacitance of the plurality of MEMS devices are higher in the second state than the first state, configured such that when the capacitive MEMS switches are in the first state, the branch circuit does not significantly attenuate RF signals in the signal conductor and wherein in the second state, the branch circuit presents a path to ground through the resistor and thereby attenuates the RF signals, wherein the plurality of MEMS devices are the plurality of MEMS devices of the RF MEMS circuit being capacitive MEMS switches.

30. An RF MEMS circuit according to claim 24 comprising a switch circuit for RF signals comprising the substrate supporting the signal conductor extending from a common port to a junction with first and second branch conductive lines supported on the substrate and extending from the junction to respective first and switched ports, the circuit further comprising first and second switchable stub circuits connected to the first and second branch conductive lines respectively between the junction and the respective switched port, each switchable stub circuit comprising the plurality of MEMS devices of the RF MEMS circuit being MEMS capacitive switches, and having a first configuration in which the switchable stub circuit presents an open circuit to RF signals at a predetermined wavelength in the respective branch conductive line, and a second configuration in which the switchable stub circuit presents a short circuit to ground to RF signals at the predetermined wavelength in the respective branch conductive line such that the electrical length at the predetermined wavelength from the junction to the respective switchable stub circuit is an integer multiple of one quarter of the predetermined wavelength.

31. An RF MEMS circuit according to claim 24 comprising a switch circuit for RF signals comprising the substrate supporting the signal conductor extending from a common port to a junction with first and second branch conductive lines supported on the substrate and extending from the junction to respective first and second switched ports, the circuit further comprising first and second switchable circuits connected to the first and second branch conductive lines respectively between the junction and the respective switched port, each switchable circuit comprising the plurality of MEMS devices of the RF MEMS circuit being MEMS capacitive switches, and having a first configuration in which the switchable circuit presents a short circuit to RF signals at a predetermined wavelength in the respective branch conductive line, and a second configuration in which the switchable circuit presents an open circuit to RF signals at the common port.

32. An RF MEMS circuit according to claim 24 comprising an RF splitter and/or combiner circuit formed on the substrate and having a common and at least two split ports thereon, the common port and at least two split ports connected by transmission lines comprising the signal conductor supported on the substrate and ground conductors supported on the substrate on either side of the signal conductor, the circuit configured to split an input RF signal received through the common port into equal phase outputs at the two split ports and/or to combine equal phase inputs received at the two split ports into a combined signal output through the common port, the circuit comprising the plurality of MEMS devices of the RF MEMS circuit, the MEMS devices being MEMS capacitive switches having MEMS bridges actuatable between first and second positions to vary a capacitance, wherein the frequency response of the RF splitter and/or combiner circuit is selectable in dependence on the positions of the MEMS bridges.

* * * * *